United States Patent
Kang et al.

(10) Patent No.: US 12,520,718 B2
(45) Date of Patent: Jan. 6, 2026

(54) ORGANIC ELECTROLUMINESCENT COMPOUND, A PLURALITY OF HOST MATERIALS AND ORGANIC ELECTROLUMINESCENT DEVICE COMPRISING THE SAME

(71) Applicant: ROHM AND HAAS ELECTRONIC MATERIALS KOREA LTD., Chungcheongnam-do (KR)

(72) Inventors: Hee-Ryong Kang, Gyeonggi-do (KR); Sang-Hee Cho, Gyeonggi-do (KR); So-Young Jung, Gyeonggi-do (KR); Jin-Ri Hong, Gyeonggi-do (KR); So-Mi Park, Gyeonggi-do (KR)

(73) Assignee: DuPont Specialty Materials Korea Ltd. (KR)

(*) Notice: Subject to any disclaimer, the term of this patent is extended or adjusted under 35 U.S.C. 154(b) by 1029 days.

(21) Appl. No.: 17/488,130

(22) Filed: Sep. 28, 2021

(65) Prior Publication Data

US 2022/0123223 A1    Apr. 21, 2022

(30) Foreign Application Priority Data

Oct. 19, 2020  (KR) .......... 10-2020-0135064
Aug. 13, 2021  (KR) .......... 10-2021-0107451

(51) Int. Cl.
| | | |
|---|---|---|
| H01L 51/00 | (2006.01) | |
| H10K 85/60 | (2023.01) | |
| H10K 50/11 | (2023.01) | |
| H10K 101/00 | (2023.01) | |

(52) U.S. Cl.
CPC ......... *H10K 85/636* (2023.02); *H10K 85/622* (2023.02); *H10K 85/623* (2023.02); *H10K 85/624* (2023.02); *H10K 85/626* (2023.02); *H10K 85/654* (2023.02); *H10K 85/6572* (2023.02); *H10K 85/6574* (2023.02); *H10K 85/6576* (2023.02); *H10K 50/11* (2023.02); *H10K 2101/90* (2023.02)

(58) Field of Classification Search
None
See application file for complete search history.

(56) References Cited

U.S. PATENT DOCUMENTS

| | | |
|---|---|---|
| 2019/0214573 A1 | 7/2019 | Ryu et al. |
| 2019/0296243 A1 | 9/2019 | Suh et al. |
| 2020/0028089 A1 | 1/2020 | Cho et al. |
| 2021/0359216 A1 | 11/2021 | Kim et al. |
| 2022/0102645 A1 | 3/2022 | Kim et al. |

FOREIGN PATENT DOCUMENTS

| | | | |
|---|---|---|---|
| CN | 107445910 A | | 12/2017 |
| CN | 108299388 A | | 7/2018 |
| CN | 110156777 A | | 8/2019 |
| CN | 115191039 A | | 10/2022 |
| JP | 2015074649 A | | 4/2015 |
| TW | I703205 B | * | 9/2020 |
| WO | 2020013448 A1 | | 1/2020 |

OTHER PUBLICATIONS

Search Report from China National Intellectual Property Administration, Application No. 202111195945.X, Application Date: Oct. 14, 2021.

* cited by examiner

*Primary Examiner* — Tae H Yoon
(74) *Attorney, Agent, or Firm* — G. Creston Campbell

(57) ABSTRACT

The present disclosure relates to an organic electroluminescent compound represented by formula 2', a plurality of host materials comprising at least one first host compound and at least one second host compound, and an organic electroluminescent device comprising the same. By comprising the organic electroluminescent compound or a specific combination of compounds of the present disclosure, it is possible to provide an organic electroluminescent device having improved driving voltage, luminous efficiency, power efficiency, and/or lifespan characteristics.

5 Claims, No Drawings

ORGANIC ELECTROLUMINESCENT COMPOUND, A PLURALITY OF HOST MATERIALS AND ORGANIC ELECTROLUMINESCENT DEVICE COMPRISING THE SAME

TECHNICAL FIELD

The present disclosure relates to an organic electroluminescent compound, a plurality of host materials and an organic electroluminescent device comprising the same.

BACKGROUND ART

A small molecular green organic electroluminescent device (OLED) was first developed by Tang, et al., of Eastman Kodak in 1987 by using TPD/ALq3 bi-layer consisting of a light-emitting layer and a charge transport layer. Thereafter, the development of OLEDs was rapidly effected and OLEDs have been commercialized. At present, OLEDs primarily use phosphorescent materials having excellent luminous efficiency in panel implementation. An OLED having high luminous efficiency and/or long lifespan is required for long time use and high resolution of a display.

In order to enhance luminous efficiency, driving voltage and/or lifespan, various materials or concepts for an organic layer of an organic electroluminescent device have been proposed. However, they were not satisfactory in practical use. Therefore, it is required to develop OLEDs having more improved performance, such as improved driving voltage, luminous efficiency, power efficiency, and/or lifespan characteristics, compared to the OLEDs previously disclosed.

Korean Patent Application Laying-Open No. 2018-0038834 and Korean Patent Publication No. 2079239 disclose compounds comprising phenanthrene and azine, but fail to specifically disclose organic electroluminescent compounds or a specific combination of host materials claimed herein.

DISCLOSURE OF INVENTION

Technical Problem

The objective of the present disclosure is to provide a compound having a new structure suitable for using it as an organic electroluminescent material. Another objective of the present disclosure is to provide an organic electroluminescent device having a low driving voltage, high luminous efficiency, high power efficiency, and/or excellent lifespan characteristics by comprising a plurality of host materials including a specific combination of compounds.

Solution to Problem

As a result of intensive research to solve the above technical problems, the present inventors found that the above objective can be achieved by an electroluminescent compound represented by the following formula 2'. In addition, the present inventors found that the above objective can be achieved by a plurality of host materials comprising at least one first host compound and at least one second host compound, wherein the first host compound is represented by the following formula 1, and the second host compound is represented by the following formula 2.

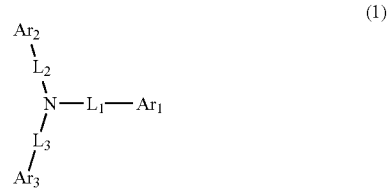

(1)

In formula 1, $L_1$ to $L_3$ each independently represent a single bond, a substituted or unsubstituted C30)alkylene, a substituted or unsubstituted (C6-C30)arylene, a substituted or unsubstituted (3- to 30-membered)heteroarylene, or a substituted or unsubstituted (C3-C30)cycloalkylene;

$Ar_1$ to $Ar_3$ each independently represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted fused ring group of a (C3-C30) aliphatic ring(s) and a (C6-C30) aromatic ring(s), or $-L_a$-N$(Ar_a)(Ar_b)$;

$L_a$ each independently represents a single bond, a substituted or unsubstituted (C6-C30)arylene, or a substituted or unsubstituted (3- to 30-membered)heteroarylene; and $Ar_a$ and $Ar_b$ each independently represent hydrogen, a substituted or unsubstituted C30)alkyl, a substituted or unsubstituted (C2-C30)alkenyl, a substituted or unsubstituted fused ring group of a (C3-C30) aliphatic ring(s) and a (C6-C30) aromatic ring(s), a substituted or unsubstituted (C6-C30)aryl, or a substituted or unsubstituted (3- to 30-membered)heteroaryl; and with the proviso that the case where all of $L_1$ to $L_3$ represent single bonds, and all of $Ar_1$ to $Ar_3$ represent hydrogen is excluded;

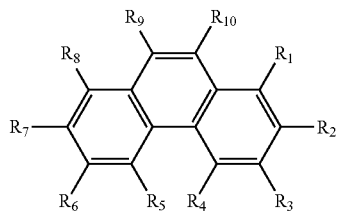

(2)

In formula 2, $R_1$ to $R_{10}$ are each independently represented by

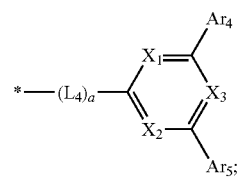

or represent hydrogen, deuterium, a halogen, a cyano, a substituted or unsubstituted (C1-C30)alkyl, a substituted or unsubstituted (C3-C30)cycloalkyl, a substituted or unsubstituted (3- to 7-membered)heterocycloalkyl, a substituted or unsubstituted (C6-C30)aryl, a substituted or unsubstituted (3- to 30-membered)heteroaryl, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted fused ring group of a (C3-C30) aliphatic ring(s) and a (C6-C30) aromatic ring(s), or -$L_b$-N(Ar$_c$)(Ar$_d$); or may be linked to an adjacent substituent(s) to form a ring(s), with a proviso that at least one of $R_1$ to $R_{10}$ is represented by

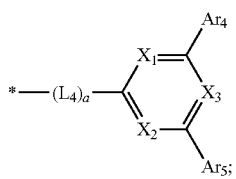

$L_b$ each independently represents a single bond, a substituted or unsubstituted (C6-C30)arylene, or a substituted or unsubstituted (3- to 30-membered)heteroarylene;

Ar$_c$ and Ar$_d$ each independently represent hydrogen, a substituted or unsubstituted (C1-C30)alkyl, a substituted or unsubstituted (C2-C30)alkenyl, a substituted or unsubstituted fused ring group of a (C3-C30) aliphatic ring(s) and a (C6-C30) aromatic ring(s), a substituted or unsubstituted (C6-C30)aryl, or a substituted or unsubstituted (3- to 30-membered)heteroaryl;

$L_4$ represents a single bond, a substituted or unsubstituted (C6-C30)cycloalkylene, a substituted or unsubstituted (C6-C30)arylene, or a substituted or unsubstituted (3- to 30-membered)heteroarylene;

$X_1$ to $X_3$ each independently represent N or CH, with a proviso that at least one of $X_1$ to $X_3$ is N.

Ar$_4$ and Ar$_5$ each independently represent a substituted or unsubstituted (C6-C30)cycloalkyl, a substituted or unsubstituted (C6-C30)aryl, a substituted or unsubstituted (3- to 30-membered)heteroaryl, or a substituted or unsubstituted fused ring group of a (C3-C30) aliphatic ring(s) and a (C6-C30) aromatic ring(s); and a represents an integer of 1 to 3, where if a is an integer of 2 or more, each of $L_4$ may be the same or different.

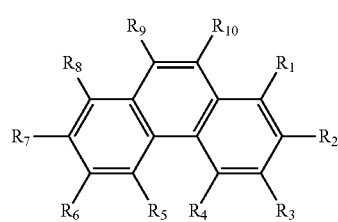

In formula 2',
$R_1$ to $R_{10}$ are each independently represented by

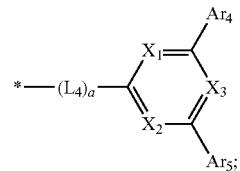

or represent hydrogen, deuterium, a halogen, a cyano, a substituted or unsubstituted (C1-C30)alkyl, a substituted or unsubstituted (C3-C30)cycloalkyl, a substituted or unsubstituted (3- to 7-membered)heterocycloalkyl, a substituted or unsubstituted (C6-C30)aryl, a substituted or unsubstituted (3- to 30-membered)heteroaryl, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, or a substituted or unsubstituted fused ring group of a (C3-C30) aliphatic ring(s) and a (C6-C30) aromatic ring(s), with a proviso that at least one of $R_1$ to $R_{10}$ is represented by

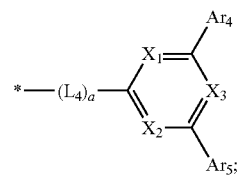

$L_4$ represents a single bond, a substituted or unsubstituted (C6-C30)cycloalkylene, or a substituted or unsubstituted (C10)arylene;

all of $X_1$ to $X_3$ represent N;

Ar$_4$ and Ar$_5$ each independently represent a substituted or unsubstituted (C6-C30)cycloalkyl, a substituted or unsubstituted (C6-C30)aryl, a substituted or unsubstituted (3- to 30-membered)heteroaryl, or a substituted or unsubstituted fused ring group of a (C3-C30) aliphatic ring(s) and a (C6-C30) aromatic ring(s), and Ar$_4$ and Ar$_5$ are the same as or different from each other;

with a proviso that when each of Ar$_4$ and Ar$_5$ represents an unsubstituted phenyl, an unsubstituted naphthyl, an unsubstituted biphenyl, an unsubstituted terphenyl, an unsubstituted phenanthrenyl, an unsubstituted triphenylenyl, an unsubstituted 1-dibenzofuranyl, an unsubstituted 1-dibenzothiophenyl, a phenyl substituted with a 1-dibenzofuranyl(s), a phenyl substituted with a 1-dibenzothiophenyl(s), a phenyl substituted with a 9-carbazolyl(s), an unsubstituted carbazolyl, a substituted or unsubstituted dibenzodioxynyl, a dibenzothiophenyl fused to benzofuran, or a dibenzothiophenyl fused to benzothiophene, and $L_4$ represents a single bond, $L_4$ is not linked at the position of $R_9$ or $R_{10}$;

with a proviso that when $L_4$ represents a single bond and is linked at the position of $R_2$ or $R_7$, Ar$_4$ and Ar$_5$ each independently represent a phenyl unsubstituted or substituted with a (C6-C30)cycloalkyl(s); a naphthyl unsubstituted or substituted with a dibenzofuranyl(s), a dibenzothiophenyl(s) or a phenanthrenyl(s), an unsubstituted biphenyl; an unsubstituted terphenyl (except for the structure

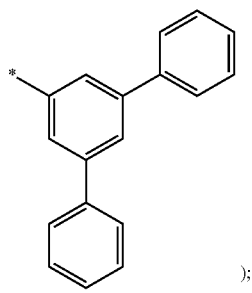 [SMILES: *c1cc(-c2ccccc2)cc(-c2ccccc2)c1]

an unsubstituted phenanthrenyl; an unsubstituted triphenylenyl; an unsubstituted chrysenyl; an unsubstituted (C22)aryl; an unsubstituted 9,9-diphenylfluorenyl, an unsubstituted 7,7-dimethylbenzofluorenyl; an unsubstituted 9,9-diphenylsilafluorenyl; an fluorenyl substituted with a phenyl(s) and a (C6-C30)cycloalkyl(s); a fused ring group of a (C3-C10) aliphatic ring(s) and a (C6-C12) aromatic ring(s) substituted with a methyl(s); an unsubstituted phenylnaphthyl; an unsubstituted naphthylphenyl; an unsubstituted dibenzofuranyl; or an unsubstituted dibenzothiophenyl; and a represents an integer of 1 to 3, where if a is an integer of 2 or more, each of $L_4$ may be the same or different.

Advantageous Effects of Invention

The organic electroluminescent compound according to the present disclosure exhibits performance suitable for using it in an organic electroluminescent device. In addition, by comprising a plurality of host materials according to the present, an organic electroluminescent device having a low driving voltage, high luminous efficiency, high power efficiency, and/or excellent lifespan characteristics compared to conventional organic electroluminescent devices is provided, and it is possible to produce a display or a lighting device using the same.

MODE FOR THE INVENTION

Hereinafter, the present disclosure will be described in detail. However, the following description is intended to explain the present disclosure, and is not meant to restrict the scope of the present disclosure.

The term "organic electroluminescent compound" in the present disclosure means a compound that may be used in an organic electroluminescent device. The organic electroluminescent compound may be comprised in any layer constituting an organic electroluminescent device, as necessary.

The term "organic electroluminescent material" in the present disclosure means a material that may be used in an organic electroluminescent device, and may comprise at least one compound. The organic electroluminescent material may be comprised in any layer constituting an organic electroluminescent device, as necessary. For example, the organic electroluminescent material may be a hole injection material, a hole transport material, a hole auxiliary material, a light-emitting auxiliary material, an electron blocking material, a light-emitting material (including a host material and a dopant material), an electron buffer material, a hole blocking material, an electron transport material, an electron injection material, etc.

The term "a plurality of organic electroluminescent materials" in the present disclosure means an organic electroluminescent material comprising a combination of at least two compounds, which may be comprised in any layer constituting an organic electroluminescent device. It may mean both a material before being comprised in an organic electroluminescent device (for example, before vapor deposition) and a material after being comprised in an organic electroluminescent device (for example, after vapor deposition). For example, a plurality of organic electroluminescent materials may be a combination of at least two compounds, which may be comprised in at least one layer of a hole injection layer, a hole transport layer, a hole auxiliary layer, a light-emitting auxiliary layer, an electron blocking layer, a light-emitting layer, an electron buffer layer, a hole blocking layer, an electron transport layer, and an electron injection layer. Such at least two compounds may be comprised in the same layer or different layers, and may be mixture-evaporated or co-evaporated, or may be individually evaporated.

The term "a plurality of host materials" in the present disclosure means an organic electroluminescent material comprising a combination of at least two host materials. It may mean both a material before being comprised in an organic electroluminescent device (for example, before vapor deposition) and a material after being comprised in an organic electroluminescent device (for example, after vapor deposition). A plurality of host materials of the present disclosure may be comprised in any light-emitting layer constituting an organic electroluminescent device, and at least two compounds comprised in the plurality of host materials of the present disclosure may be comprised together in one light-emitting layer or may respectively be comprised in different light-emitting layers. When at least two host materials are comprised in one layer, for example, they may be mixture-evaporated to form a layer, or may be separately co-evaporated at the same time to form a layer.

Herein, the term "(C1-C30)alkyl(ene)" in the present disclosure is meant to be a linear or branched alkylene) having 1 to 30 carbon atoms constituting the chain, in which the number of carbon atoms is preferably 1 to 20, and more preferably 1 to 10. The above alkyl may include methyl, ethyl, n-propyl, isopropyl, n-butyl, isobutyl, tert-butyl, sec-butyl, etc. The term "(C2-C30)alkenyl" in the present disclosure is meant to be a linear or branched alkenyl having 2 to 30 carbon atoms constituting the chain, in which the number of carbon atoms is preferably 2 to 20, and more preferably 2 to 10. The above alkenyl may include vinyl, 1-propenyl, 2-propenyl, 1-butenyl, 2-butenyl, 3-butenyl, 2-methylbut-2-enyl, etc. The term "(C2-C30)alkynyl" in the present disclosure is meant to be a linear or branched alkynyl having 2 to 30 carbon atoms constituting the chain, in which the number of carbon atoms is preferably 2 to 20, and more preferably 2 to 10. The above alkynyl may include ethynyl, 1-propynyl, 2-propynyl, 1-butynyl, 2-butynyl, 3-butynyl, 1-methylpent-2-ynyl, etc. The term "(C3-C30)cycloalkyl (ene)" is meant to be a mono- or polycyclic hydrocarbon having 3 to 30 ring backbone carbon atoms, in which the number of carbon atoms is preferably 3 to 20, and more preferably 3 to 10. The above cycloalkyl may include cyclopropyl, cyclobutyl, cyclopentyl, cyclohexyl, cyclopentylmethyl, cyclohexylmethyl, adamantyl, etc. The term "(3- to 7-membered)heterocycloalkyl" in the present disclosure is meant to be a cycloalkyl having 3 to 7, preferably 5 to 7 ring backbone atoms, and including at least one heteroatom selected from the group consisting of B, N, O, S, Si, and P, preferably at least one heteroatom selected from the group consisting of O, S, and N. The above heterocycloalkyl may include tetrahydrofuran, pyrrolidine, thiolane, tetrahydropyran, etc. The term "(C6-C30)aryl(ene)" in the present disclosure is meant to be a monocyclic or fused ring radical derived from an aromatic hydrocarbon having 6 to 30 ring backbone carbon atoms, and may be partially saturated. The number of ring backbone carbon atoms is preferably 6 to 25, and more preferably 6 to 18. The above aryl may comprise a spiro structure. The above aryl may include phenyl, biphenyl, terphenyl, naphthyl, binaphthyl, phenylnaphthyl, naphthylphenyl, phenylterphenyl, fluorenyl, phenylfluorenyl, diphenylfluorenyl, dimethylfluorenyl, benzofluorenyl, dibenzofluorenyl, phenanthrenyl, phenylphenanthrenyl, anthracenyl, indenyl, triphenylenyl, pyrenyl, tetracenyl, perylenyl, chrysenyl, naphthacenyl, fluoranthenyl, spirobifluorenyl, azulenyl, tetramethyldihydrophenanthrenyl, etc. Specifically, the aryl may include phenyl, 1-naphthyl, 2-naphthyl, 1-anthryl, 2-anthryl, 9-anthryl, benzanthryl, 1-phenanthryl, 2-phenanthryl, 3-phenanthryl, 4-phenanthryl, 9-phenanthryl, naphthacenyl, pyrenyl, 1-chrysenyl, 2-chrysenyl, 3-chrysenyl, 4-chrysenyl, 5-chrysenyl, 6-chrysenyl, benzo[c]phenanthryl, benzo[g]chrysenyl, 1-triphenylenyl, 2-triphenylenyl, 3-triphenylenyl, 4-triphenylenyl, 1-fluorenyl, 2-fluorenyl, 3-fluorenyl, 4-fluorenyl, 9-fluorenyl, benzo[a]fluorenyl, benzo[b]fluorenyl, benzo[c]fluorenyl, dibenzofluorenyl, 2-biphenylyl, 3-biphenylyl, 4-biphenylyl, o-terphenyl, m-terphenyl-4-yl, m-terphenyl-3-yl, m-terphenyl-2-yl, p-terphenyl-4-yl, p-terphenyl-3-yl, p-terphenyl-2-yl, m-quaterphenyl, 3-fluoranthenyl, 4-fluoranthenyl, 8-fluoranthenyl, 9-fluoranthenyl, benzofluoranthenyl, o-tolyl, m-tolyl, p-tolyl, 2,3-xylyl, 3,4-xylyl, 2,5-xylyl, mesityl, o-cumenyl, m-cumenyl, p-cumenyl, p-tert-butylphenyl, p-(2-phenylpropyl)phenyl, 4'-methylbiphenylyl, 4"-tert-butyl-p-terphenyl-4-yl, 9,9-dimethyl-1-fluorenyl, 9,9-dimethyl-2-fluorenyl, 9,9-dimethyl-3-fluorenyl, 9,9-dimethyl-4-fluorenyl, 9,9-diphenyl-1-fluorenyl, 9,9-diphenyl-2-fluorenyl, 9,9-diphenyl-3-fluorenyl, 9,9-diphenyl-4-fluorenyl, 11,11-dimethyl-1-benzo[a]fluorenyl, 11,11-dimethyl-2-benzo[a]fluorenyl, 11,11-dimethyl-3-benzo[a]fluorenyl, 11,11-dimethyl-4-benzo[a]fluorenyl, 11,11-dimethyl-5-benzo[a]fluorenyl, 11,11-dimethyl-6-benzo[a]fluorenyl, 11,11-dimethyl-7-benzo[a]fluorenyl, 11,11-dimethyl-8-benzo[a]fluorenyl, 11,11-dimethyl-9-benzo[a]fluorenyl, 11,11-dimethyl-10-benzo[a]fluorenyl, 11,11-dimethyl-1-benzo[b]fluorenyl, 11,11-dimethyl-2-benzo[b]fluorenyl, 11,11-dimethyl-3-benzo[b]fluorenyl, 11,11-dimethyl-4-benzo[b]fluorenyl, 11,11-dimethyl-5-benzo[b]fluorenyl, 11,11-dimethyl-6-benzo[b]fluorenyl, 11,11-dimethyl-7-benzo[b]fluorenyl, 11,11-dimethyl-8-benzo[b]fluorenyl, 11,11-dimethyl-9-benzo[b]fluorenyl, 11,11-dimethyl-10-benzo[b]fluorenyl, 11,11-dimethyl-1-benzo[c]fluorenyl, 11,11-dimethyl-2-benzo[c]fluorenyl, 11,11-dimethyl-3-benzo[c]fluorenyl, 11,11-dimethyl-4-benzo[c]fluorenyl, 11,11-dimethyl-5-benzo[c]fluorenyl, 11,11-dimethyl-6-benzo[c]fluorenyl, 11,11-dimethyl-7-benzo[c]fluorenyl, 11,11-dimethyl-8-benzo[c]fluorenyl, 11,11-dimethyl-9-benzo[c]fluorenyl, 11,11-dimethyl-10-benzo[c]fluorenyl, 11,11-diphenyl-1-benzo[a]fluorenyl, 11,11-diphenyl-2-benzo[a]fluorenyl, 11,11-diphenyl-3-benzo[a]fluorenyl, 11,11-diphenyl-4-benzo[a]fluorenyl, 11,11-diphenyl-5-benzo[a]fluorenyl, 11,11-diphenyl-8-benzo[a]fluorenyl, 11,11-diphenyl-7-benzo[a]fluorenyl, 11,11-diphenyl-8-benzo[a]fluorenyl, 11,11-diphenyl-9-benzo[a]fluorenyl, 11,11-diphenyl-10-benzo[a]fluorenyl, 11,11-diphenyl-1-benzo[b]fluorenyl, 11,11-diphenyl-2-benzo[b]fluorenyl, 11,11-diphenyl-3-benzo[b]fluorenyl, 11,11-diphenyl-4-benzo[b]fluorenyl, 11,11-diphenyl-5-benzo[b]fluorenyl, 11,11-diphenyl-6-benzo[b]fluorenyl, 11,11-diphenyl-7-benzo[b]fluorenyl, 11,11-diphenyl-8-benzo[b]fluorenyl, 11,11-diphenyl-9-benzo[b]fluorenyl, 11,11-diphenyl-10-benzo[b]fluorenyl, 11,11-diphenyl-1-benzo[c]fluorenyl, 11,11-diphenyl-2-benzo[c]fluorenyl, 11,11-diphenyl-3-benzo[c]fluorenyl, 11,11-diphenyl-4-benzo[c]fluorenyl, 11,11-diphenyl-5-benzo[c]fluorenyl, 11,11-diphenyl-6-benzo[c]fluorenyl, 11,11-diphenyl-7-benzo[c]fluorenyl, 11,11-diphenyl-8-benzo[c]fluorenyl, 11,11-diphenyl-9-benzo[c]fluorenyl, 11,11-diphenyl-10-benzo[c]fluorenyl, 9,9,10,10-tetramethyl-9,10-dihydro-1-phenanthrenyl, 9,9,10,10-tetramethyl-9,10-dihydro-2-phenanthrenyl, 9,9,10,10-tetramethyl-9,10-dihydro-3-phenanthrenyl, 9,9,10,10-tetramethyl-9,10-dihydro-4-phenanthrenyl, etc.

The term "(3- to 30-membered)heteroaryl(ene)" in the present disclosure is meant to be an aryl(ene) having 3 to 30 ring backbone atoms and including at least one heteroatom(s) selected from the group consisting of B, N, O, S, Si, and P. The number of heteroatoms is preferably 1 to 4. The above heteroaryl(ene) may be a monocyclic ring or a fused ring condensed with at least one benzene ring; may be partially saturated; may be one formed by linking at least one heteroaryl or aryl group to a heteroaryl(ene) group via a single bond(s); and may comprise a Spiro structure. The above heteroaryl may include a monocyclic ring-type heteroaryl such as furyl, thiophenyl, pyrrolyl, imidazolyl, pyrazolyl, thiazolyl, thiadiazolyl, isothiazolyl, isoxazolyl, oxazolyl, oxadiazolyl, triazinyl, tetrazinyl, triazolyl, tetrazolyl, furazanyl, pyridyl, pyrazinyl, pyrimidinyl, pyridazinyl, etc., and a fused ring-type heteroaryl such as benzofuranyl, benzothiophenyl, isobenzofuranyl, dibenzofuranyl, dibenzothiophenyl, benzonaphthofuranyl, benzophenanthrofuranyl, benzonaphthothiophenyl, dibenzoselenophenyl, naphthobenzofuranyl, naphthobenzothiophenyl, benzofuroquinolinyl, benzofuroquinazollnyl, benzofuronaphthyridinyl, benzofuropyrimidinyl, naphthofuropyrimidinyl, benzothienoquinolinyl, benzothienoquinazolinyl, benzothienonaphthyridinyl, benzothienopyrimidinyl, naphthothienopyrimidinyl, pyrimidoindolyl, benzopyrimidoindolyl, benzofuropyrazinyl, naphthofuropyrazinyl, benzothienopyrazinyl, naphthothienopyrazinyl, pyrazinoindolyl, benzopyrazinoindolyl, benzimidazolyl, benzothiazolyl, benzoisothiazolyl, benzophenanthrothiophenyl, benzoisoxazolyl, benzoxazolyl, phenanthrooxazolyl, phenanthrothiazolyl, isoindolyl, indolyl, benzoindolyl, indazolyl, benzothiadiazolyl, quinolyl, isoquinolyl, cinnolinyl, quinazolinyl, benzoquinazolinyl, quinoxalinyl, benzoquinoxalinyl, naphthyridinyl, carbazolyl, benzocarbazolyl, dibenzocarbazolyl, phenoxazinyl, phenothiazinyl, phenanthridinyl, benzodioxolyl, dihydroacridinyl, benzotriazolephenazinyl, imidazopyridinyl, chromenoquinazolinyl, thiochromenoquinazolinyl, dimethylbenzoperimidinyl, indolocarbazolyl, indenocarbazolyl, etc. More specifically, the heteroaryl may include 1-pyrrolyl, 2-pyrrolyl, 3-pyrrolyl, pyrazinyl, 2-pyridyl, 2-pyrimidinyl, 4-pyrimidinyl, 5-pyrimidinyl, 6-pyrimidinyl, 1,2,3-triazin-4-yl, 1,2,4-triazin-3-yl, 1,3,5-triazin-2-yl, 1-imidazolyl, 2-imidazolyl, 1-pyrazolyl, 1-indolidinyl, 2-indolidinyl, 3-indolidinyl, 5-indolidinyl, 6-indolidinyl, 7-indolidinyl, 8-indolidinyl, 2-imidazopyridyl, 3-imidazopyridyl, 5-imidazopyridyl, 6-imidazopyridyl, 7-imidazopyridyl, 8-imidazopyridyl, 3-pyridyl, 4-pyridyl, 1-indolyl, 2-indolyl, 3-indolyl, 4-indolyl, 5-indolyl, 6-indolyl, 7-indolyl, 1-isoindolyl, 2-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, 2-quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 9-carbazolyl, azacarbazolyl-1-yl, azacarbazolyl-2-yl, azacarbazolyl-3-yl, azacarbazolyl-4-yl, azacarbazolyl-5-yl, azacarbazolyl-6-yl, azacarbazolyl-7-yl, azacarbazolyl-8-yl, azacarbazolyl-9-yl, 1-phenanthridinyl, 2-phenanthridinyl, 3-phenanthridinyl, 4-phenanthridinyl, 6-phenanthridinyl, 7-phenanthridinyl, 8-phenanthridinyl, 9-phenanthridinyl, 10-phenanthridinyl, 1-acridinyl, 2-acridinyl, 3-acridinyl, 4-acridinyl, 9-acridinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrol-1-yl, 2-methylpyrrol-3-yl, 2-methylpyrrol-4-yl, 2-methylpyrrol-5-yl, 3-methylpyrrol-1-yl, 3-methylpyrrol-2-yl, 3-methylpyrrol-4-yl, 3-methylpyrrol-5-yl, 2-tert-butylpyrrol-4-yl, 3-(2-phenylpropyl)pyrrol-1-yl, 2-methyl-1-indolyl, 4-methyl-1-indolyl, 2-methyl-3-indolyl, 4-methyl-3-indolyl, 2-tert-butyl-1-indolyl, 4-tert-butyl-1-indolyl, 2-tert-butyl-3-indolyl, 4-tert-butyl-3-indolyl, 1-dibenzofuranyl, 2-dibenzofuranyl, 3-dibenzofuranyl, 4-dibenzofuranyl, 1-dibenzothiophenyl, 2-dibenzothiophenyl, 3-dibenzothiophenyl, 4-dibenzothiophenyl, 1-naphtho-[1,2-b]-benzofuranyl, 2-naphtho-[1,2-b]-benzofuranyl, 3-naphtho-[1,2-b]-benzofuranyl, 4-naphtho-[1,2-b]-benzofuranyl, 5-naphtho-[1,2-b]-benzofuranyl, 6-naphtho-[1,2-b]-benzofuranyl, 7-naphtho-[1,2-b]-benzofuranyl, 8-naphtho-[1,2-b]-benzofuranyl, 9-naphtho-[1,2-b]-benzofuranyl, 10-naphtho-[1,2-b]-benzofuranyl, 1-naphtho-[2,3-b]-benzofuranyl, 2-naphtho-[2,3-b]-benzofuranyl, 3-naphtho-[2,3-b]-benzofuranyl, 4-naphtho-[2,3-b]-benzofuranyl, 5-naphtho-[2,3-b]-benzofuranyl, 6-naphtho-[2,3-b]-benzofuranyl, 7-naphtho-[2,3-b]-benzofuranyl, 8-naphtho-[2,3-b]-benzofuranyl, 9-naphtho-[2,3-b]-benzofuranyl, 10-naphtho-[2,3-b]-benzofuranyl, 1-naphtho-[2,1-b]-benzofuranyl, 2-naphtho-[2,1-b]-benzofuranyl, 3-naphtho-[2,1-b]-benzofuranyl, 4-naphtho-[2,1-b]-benzofuranyl, 5-naphtho-[2,1-b]-benzofuranyl, 6-naphtho-[2,1-b]-benzofuranyl, 7-naphtho-[2,1-b]-benzofuranyl, 8-naphtho-[2,1-b]-benzofuranyl, 9-naphtho-[2,1-b]-benzofuranyl, 10-naphtho-[2,1-b]-benzofuranyl, 1-naphtho-[1,2-b]-benzothiophenyl, 2-naphtho-[1,2-b]-benzothiophenyl, 3-naphtho-[1,2-b]-benzothiophenyl, 4-naphtho-[1,2-b]-benzothiophenyl, 5-naphtho-[1,2-b]-benzothlophenyl, 6-naphtho-[1,2-b]-benzothiophenyl, 7-naphtho-[1,2-b]-benzothiophenyl, 8-naphtho-[1,2-b]-benzothiophenyl, 9-naphtho-[1,2-b]-benzothiophenyl, 10-naphtho-[1,2-b]-benzothiophenyl, 1-naphtho-[2,3-b]-benzothiophenyl, 2-naphtho-[2,3-b]-benzothiophenyl, 3-naphtho-[2,3-b]-benzothiophenyl, 4-naphtho-[2,3-b]-benzothiophenyl, 5-naphtho-[2,3-b]-benzothiophenyl, 1-naphtho-[2,1-b]-benzothiophenyl, 2-naphtho-[2,1-b]-benzothiophenyl, 3-naphtho-[2,1-b]-benzothiophenyl, 4-naphtho-[2,1-b]-benzothiophenyl, 5-naphtho-[2,1-b]-benzothiophenyl, 6-naphtho-[2,1-b]-benzothiophenyl, 7-naphtho-[2,1-b]-benzothiophenyl, 8-naphtho-[2,1-b]-benzothiophenyl, 9-naphtho-[2,1-b]-benzothiophenyl, 10-naphtho-[2,1-b]-benzothiophenyl, 2-benzofuro[3,2-d]pyrimidinyl, 6-benzofuro[3,2-d]pyrimidinyl, 7-benzofuro[3,2-d]pyrimidinyl, 8-benzofuro[3,2-d]pyrimidinyl, 9-benzofuro[3,2-d]pyrimidinyl, 2-benzothio[3,2-d]pyrimidinyl, 6-benzothio[3,2-d]pyrimidinyl, 7-benzothio[3,2-d]pyrimidinyl, 8-benzothio[3,2-d]pyrimidinyl, 9-benzothio[3,2-d]pyrimidinyl, 2-benzofuro[3,2-d]pyrazinyl, 6-benzofuro[3,2-d]pyrazinyl, 7-benzofuro[3,2-d]pyrazinyl, 8-benzofuro[3,2-d]pyrazinyl, 9-benzofuro[3,2-d]pyrazinyl, 2-benzothio[3,2-d]pyrazinyl, 6-benzothio[3,2-d]pyrazinyl, 7-benzothio[3,2-d]pyrazinyl, 8-benzothio[3,2-d]pyrazinyl, 9-benzothio[3,2-d]pyrazinyl, 1-silafluorenyl, 2-silafluorenyl, 3-silafluorenyl, 4-silafluorenyl, 1-germafluorenyl, 2-germafluorenyl, 3-germafluorenyl, 4-germafluorenyl, 1-dibenzoselenophenyl, 2-dibenzoselenophenyl, 3-dibenzoselenophenyl, 4-dibenzoselenophenyl, etc. In the present disclosure, the term "halogen" includes F, Cl, Br, and I.

In addition, "ortho (o-)", "meta (m-)", and "para (p-)" are prefixes, which represent the relative positions of substituents, respectively. Ortho indicates that two substituents are adjacent to each other, and for example, when two substituents in a benzene derivative occupy positions 1 and 2, it is called an ortho position. Meta indicates that two substituents are at positions 1 and 3, and for example, when two substituents in a benzene derivative occupy positions 1 and 3, it is called a meta position. Para indicates that two substituents are at positions 1 and 4, and for example, when two substituents in a benzene derivative occupy positions 1 and 4, it is called a para position.

In addition, "substituted" in the expression "substituted or unsubstituted" in the present disclosure means that a hydrogen atom in a certain functional group is replaced with another atom or another functional group (i.e., a substituent), and also includes that hydrogen atom is replaced with a group formed by a linkage of two or more of the above substituents. For example, the "a group formed by a linkage of two or more substituents" may be pyridine-triazine. That is, pyridine-triazine may be interpreted as one heteroaryl substituent, or as substituents in which two heteroaryl substituents are linked. In formulas of the present disclosure, the substituent(s) of the substituted alkyl(ene), the substituted alkenyl, the substituted aryl(ene), the substituted heteroaryl (ene), the substituted cycloalkyl(ene), the substituted heterocycloalkyl, the substituted alkoxy, the substituted trialkylsilyl, the substituted dialkylarylsilyl, the substituted alkyldiarylsilyl, the substituted triarylsilyl, and the substituted fused ring group of an aliphatic ring(s) and an aromatic ring(s), each independently, represents at least one selected from the group consisting of deuterium; a halogen; a cyano; a carboxyl; a nitro; a hydroxyl; a phosphine oxide; a (C1-C30)alkyl; a halo(C1-C30)alkyl; a (C2-C30)alkenyl; a (C2-C30)alkynyl, a (C1-C30)alkoxy; a (C1-C30)alkylthio; a (C3-C30)cycloalkyl; a (C3-C30)cycloalkenyl; a (3- to 7-membered)heterocycloalkyl; a (C6-C30)aryloxy; a (C6-C30)arylthio; a (3- to 30-membered)heteroaryl unsubstituted or substituted with at least one of deuterium and a (C6-C30)aryl(s); a (C6-C30)aryl unsubstituted or substituted with at least one of deuterium and a (3- to 30-membered)heteroaryl(s); a tri(C1-C30)alkylsilyl, a tri(C6-C30)arylsilyl; a di(C1-C30)alkyl(C6-C30)arylsilyl; a (C1-C30)alkyldi(C6-C30)arylsilyl; a fused ring group of a (C3-C30) aliphatic ring(s) and a (C6-C30) aromatic ring(s); an amino; a mono- or di-(C1-C30)alkylamino; a mono- or di-(C2-C30) alkenylamino; a mono- or di-(C6-C30)arylamino; a mono- or di-(3- to 30-membered)heteroarylamino; a (C1-C30)alkyl (C2-C30)alkenylamino; a (C1-C30)alkyl(C6-C30)arylamino; a (C1-C30)alkyl(3- to 30-membered)heteroarylamino; a (C2-C30)alkenyl(C6-C30)arylamino; a (C2-C30) alkenyl(3- to 30-membered)heteroarylamino; a (C6-C30) aryl(3- to 30-membered)heteroarylamino; a (C1-C30) alkylcarbonyl; a (C1-C30)alkoxycarbonyl; a (C6-C30) arylcarbonyl; a (C6-C30)arylphosphine; a di(C6-C30) arylboronyl; a di(C1-C30)alkylboronyl; a (C1-C30)alkyl (C6-C30)arylboronyl; a (C6-C30)aryl(C1-C30)alkyl; and a (C1-C30)alkyl(C6-C30)aryl. According to one embodiment of the present disclosure, the substituents, each independently, are at least one selected from the group consisting of deuterium, a (C1-C20)alkyl, a (C6-C20)cycloalkyl, a (5- to 25-membered)heteroaryl unsubstituted or substituted with a (C6-C25)aryl(s), and a (C6-C25)aryl. According to another embodiment of the present disclosure, the substituents, each independently, are at least one selected from the group consisting of deuterium, a (C1-C10)alkyl, a (C6-C15)cycloalkyl, a (5- to 20-membered)heteroaryl unsubstituted or substituted with a (C6-C18)aryl(s), and a (C6-C25)aryl. Specifically, the substituents, each independently, may be deuterium, a methyl, a tert-butyl, an adamantyl, a phenyl, a naphthyl, a biphenyl, a phenanthrenyl, a chrysenyl, a phenylfluorenyl, a dibenzofuranyl, a dibenzothiophenyl, a phenylsilafluorenyl, etc.

In the formulas of the present disclosure, a ring formed by a linkage of adjacent substituents means that at least two adjacent substituents are linked to each other to form a substituted or unsubstituted, mono or polycyclic, (3- to 30-membered) alicyclic ring or aromatic ring, or the combination thereof. In addition, the formed ring may comprise at least one heteroatom selected from B, N, O, S, Si, and P, preferably at least one heteroatom selected from N, O, and S. According to one embodiment of the present disclosure, the number of the ring backbone atoms is 5 to 20. According to another embodiment of the present disclosure, the number of the ring backbone atoms is 5 to 15. For example, the ring may be a substituted or unsubstituted, benzene ring, a naphthalene ring, a phenanthrene ring, a fluorene ring, an indene ring, an indole ring, a benzoindole ring, a benzofuran ring, a benzothiophene ring, a dibenzothiophene ring, a dibenzofuran ring, a carbazole ring, etc.

In the formulas of the present disclosure, heteroaryl, heteroarylene, and heterocycloalkyl may each independently comprise at least one heteroatom selected from B, N, O, S, Si, and P. In addition, the heteroatom may be bonded to at least one selected from the group consisting of hydrogen, deuterium, a halogen, a cyano, a substituted or unsubstituted (C1-C30)alkyl, a substituted or unsubstituted (C6-C30)aryl, a substituted or unsubstituted (5- to 30-membered) heteroaryl, a substituted or unsubstituted (C3-C30) cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30) arylamino, and a substituted or unsubstituted (C1-C30)alkyl (C6-C30)arylamino.

The plurality of host materials according to the present disclosure comprises the first host material including the compound represented by formula 1 and the second host material including the compound represented by formula 2, and may be included in a light-emitting layer of the organic electroluminescent device according to the present disclosure.

Hereinafter, the compound represented by formula 1 will be described in more detail.

In formula 1, $L_1$ to $L_3$ each independently represent a single bond, a substituted or unsubstituted (C1-C30)alkylene, a substituted or unsubstituted (C6-C30)arylene, a substituted or unsubstituted (3- to 30-membered)heteroarylene, or a substituted or unsubstituted (C3-C30)cycloalkylene. According to one embodiment of the present disclosure, $L_1$ to $L_3$ each independently represent a single bond, or a substituted or unsubstituted (C6-C12)arylene. According to another embodiment of the present disclosure, $L_1$ to $L_3$ each independently represent a single bond, or an unsubstituted (C6-C12)arylene. For example, $L_1$ to $L_3$ may each independently represent a single bond, a phenylene, a naphthylene, etc.

In formula 1, $Ar_1$ to $Ar_3$ each independently represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30) cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted fused ring group of a (C3-C30) aliphatic ring(s) and a (C6-C30) aromatic ring(s), or -$L_a$-N ($Ar_a$)($Ar_b$). According to one embodiment of the present disclosure, $Ar_1$ to $Ar_3$ each independently represent a substituted or unsubstituted (C6-C30)aryl, a substituted or unsubstituted (3- to 30-membered)heteroaryl, a substituted or unsubstituted (C3-C10)cycloalkyl, or -$L_a$-N($Ar_a$)($Ar_b$). According to another embodiment of the present disclosure, $Ar_1$ to $Ar_3$ each independently represent a (C6-C30)aryl unsubstituted or substituted with at least one of deuterium, a (C1-C6)alkyl(s), and a (C6-C20)aryl(s); a (3- to 30-membered)heteroaryl unsubstituted or substituted with a (C6-C15)aryl(s); an unsubstituted (C3-C10)cycloalkyl; or -$L_a$-N ($Ar_a$)($Ar_b$). For example, $Ar_1$ to $Ar_3$ may each independently represent a phenyl, a phenyl substituted with deuterium, a phenyl substituted with a methyl(s), a phenyl substituted with a tert-butyl(s), a phenyl substituted with a phenylfluorenyl(s), a naphthyl, a phenylnaphthyl, a biphenyl, a terphenyl, an anthracenyl, a phenanthrenyl, a fluoranthenyl, a tetramethyltetrahydrophenanthrenyl, a dimethylfluorenyl, a methylphenylfluorenyl, a diphenylfluorenyl, a dimethylbenzofluorenyl, a spirobifluorenyl, a (C22)aryl, a phenylpyridyl, a benzofuranyl, a benzimidazolyl substituted with a phenyl(s), a dibenzofuranyl, a dibenzothiophenyl, a dibenzofuranyl substituted with a phenyl(s), a carbazolyl substituted with a phenyl(s), a dibenzocarbazolyl, a benzonaphthofuranyl, a benzonaphthothiophenyl, a phenoxazinyl, a phenanthrooxazolyl, a phenanthrooxazolyl substituted with a phenyl(s), a phenanthrooxazolyl substituted with a phenanthrenyl(s), a phenanthrothiazolyl substituted with a phenyl(s), a phenantrothiazolyl substituted with a biphenyl(s), a benzene fused phenanthrooxazolyl substituted with a phenyl(s), a (14-membered) nitrogen-containing heteroaryl substituted with a methyl(s), a (23-membered) nitrogen-containing heteroaryl unsubstituted or substituted with a phenyl(s), a benzene fused (23-membered) nitrogen-containing heteroaryl, a (26-membered) nitrogen-containing heteroaryl unsubstituted or substituted with a phenyl(s), a benzene fused (26-membered) nitrogen-containing heteroaryl, a diphenylamino, etc.

Herein, $L_a$ each independently represents a single bond, a substituted or unsubstituted (C6-C30)arylene, or a substituted or unsubstituted (3- to 30-membered)heteroarylene. According to one embodiment of the present disclosure, $L_a$ each independently represents a single bond.

$Ar_a$ and $Ar_b$ each independently represent hydrogen, a substituted or unsubstituted (C1-C30)alkyl, a substituted or unsubstituted (C2-C30)alkenyl, a substituted or unsubstituted fused ring group of a (C3-C30) aliphatic ring(s) and a (C6-C30) aromatic ring(s), a substituted or unsubstituted (C6-C30)aryl, or a substituted or unsubstituted (3- to 30-membered)heteroaryl. According to one embodiment of the present disclosure, $Ar_a$ and $Ar_b$ each independently represent a substituted or unsubstituted (C6-C12)aryl. According to another embodiment of the present disclosure, $Ar_a$ and $Ar_b$ each independently represent an unsubstituted (C6-C12)aryl. For example. $Ar_a$ and $Ar_b$ may each independently represent a phenyl, etc.
In formula 1, the case where all of $L_1$ to $L_3$ represent single bonds, and all of $Ar_1$ to $Ar_3$ represent hydrogen is excluded.
According to one embodiment of the present disclosure, the formula 1 may be represented by at least one of the following formulas 1-1 to 1-12.
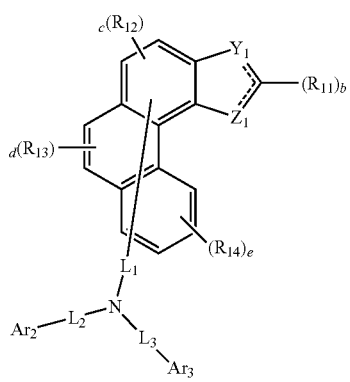
(1-1)
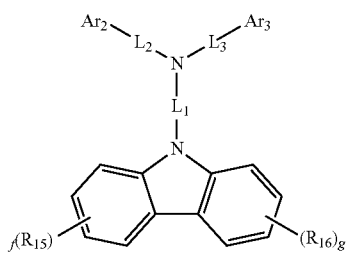
(1-2)
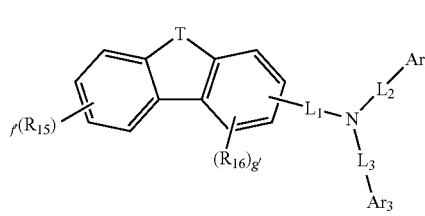
(1-3)
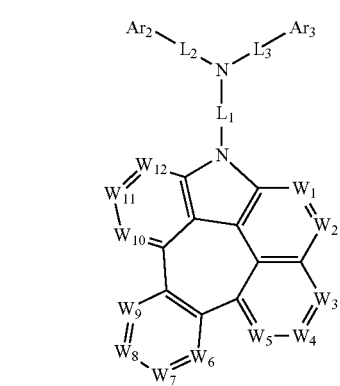
(1-4)
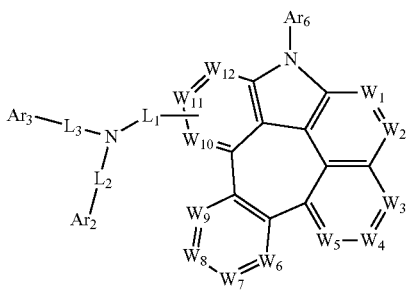
(1-5)
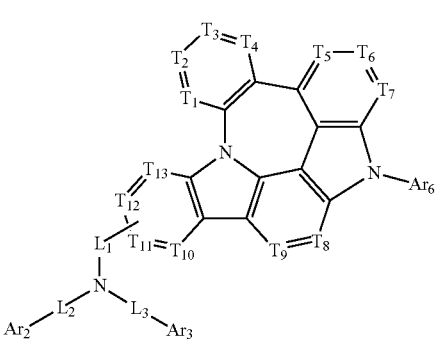
(1-6)
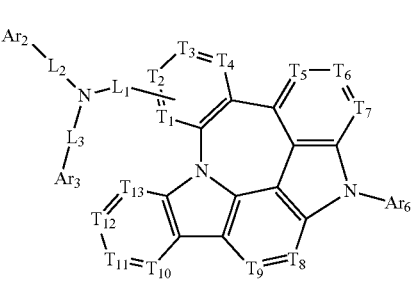
(1-7)
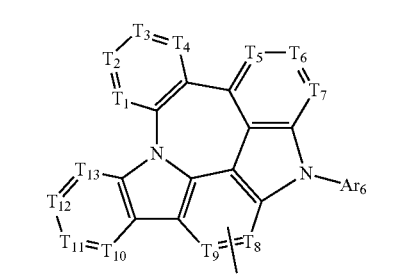
(1-8)
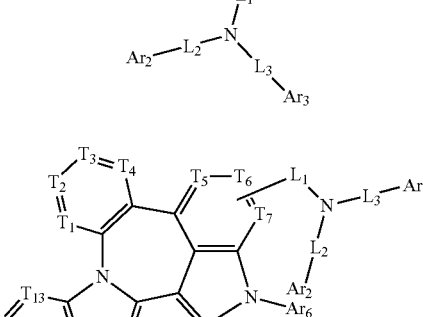
(1-9)

-continued (1-10)

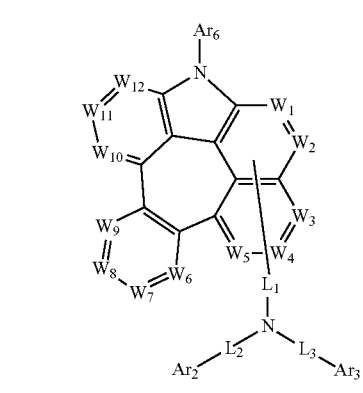

(1-11)

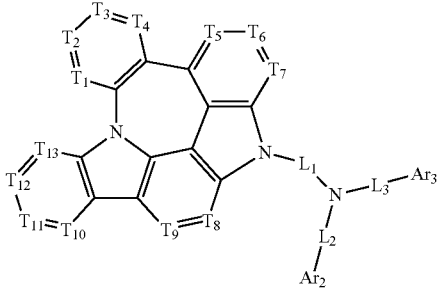

(1-12)

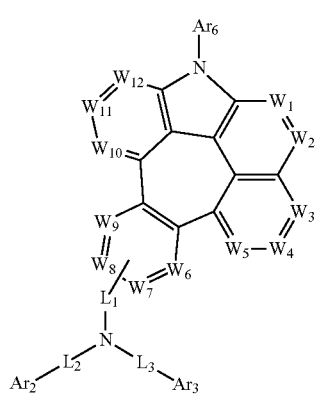

In formulas 1-1 to 1-12, $Y_1$ and $Z_1$ each independently represent —N═, —NR$_{21}$—, —O— or —S—, with a proviso that one of $Y_1$ and $Z_1$ represents —N═, and the other of $Y_1$ and $Z_1$ represents —NR$_{21}$—, —O— or —S—;

T represents CR$_{22}$R$_{23}$, NR$_{24}$, O or S;

$T_1$ to $T_{13}$ and $W_1$ to $W_{12}$ each independently represent N or CV$_1$;

R$_{11}$ represents a substituted or unsubstituted (C6-C30) aryl, or a substituted or unsubstituted (3- to 30-membered) heteroaryl;

R$_{12}$ to R$_{16}$, R$_{21}$ to R$_{24}$ and V$_1$ each independently represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted fused ring group of a (C3-C30) aliphatic ring(s) and a (C6-C30) aromatic ring(s), or -L$_c$-N(Ar$_e$)(Ar$_f$), or may be linked to an adjacent substituent(s) to form a ring(s);

L$_c$ each independently represents a single bond, a substituted or unsubstituted (C6-C30)arylene, or a substituted or unsubstituted (3- to 30-membered)heteroarylene;

Ar$_e$ and Ar$_f$ each independently represent hydrogen, a substituted or unsubstituted (C1-C30)alkyl, a substituted or unsubstituted (C2-C30)alkenyl, a substituted or unsubstituted fused ring group of a (C3-C30) aliphatic ring(s) and a (C6-C30) aromatic ring(s), a substituted or unsubstituted (C6-C30)aryl, or a substituted or unsubstituted (3- to 30-membered)heteroaryl;

Ar$_6$ represents a substituted or unsubstituted (C6-C30) aryl, or a substituted or unsubstituted (3- to 30-membered) heteroaryl;

b represents an integer of 1, c and d each independently represent an integer of 1 or 2, e, f, g and f' each independently represent an integer of 1 to 4, and g' represents an integer of 1 to 3, where if c to g, f' and g' are an integer of 2 or more, each of R$_{12}$ to each of R$_{16}$ may be the same or different; and Ar$_2$, Ar$_3$, and L$_1$ to L$_3$ are as defined in formula 1.

Hereinafter, the compound represented by formula 2 will be described in more detail.

In formula 2, R$_1$ to R$_{10}$ are each independently represented by

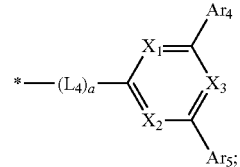

or represent hydrogen, deuterium, a halogen, a cyano, a substituted or unsubstituted (C1-C30)alkyl, a substituted or unsubstituted (C3-C30)cycloalkyl, a substituted or unsubstituted (3- to 7-membered)heterocycloalkyl, a substituted or unsubstituted (C6-C30)aryl, a substituted or unsubstituted (3- to 30-membered)heteroaryl, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted fused ring group of a (C3-C30) aliphatic ring(s) and a (C6-C30) aromatic ring(s), or -L$_b$-N(Ar$_c$)(Ar$_d$); or may be linked to an adjacent substituent(s) to form a ring(s), with a proviso that at least one of R$_1$ to R$_{10}$ is represented by

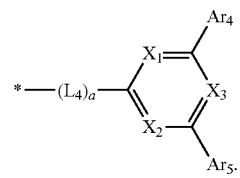

According to one embodiment of the present disclosure, R$_1$ to R$_{10}$ are each independently represented by

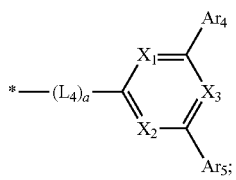

or represent hydrogen, deuterium, a substituted or unsubstituted (C6-C15)aryl, or a substituted or unsubstituted (5- to 5-membered)heteroaryl. According to another embodiment of the present disclosure, $R_1$ to $R_{10}$ are each independently represented by

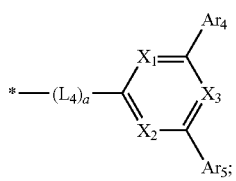

or represent hydrogen, an unsubstituted (C6-C15)aryl, or an unsubstituted (5- to 15-membered)heteroaryl. For example, $R_1$ to $R_{10}$ may be each independently represented by

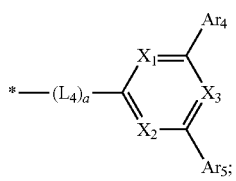

or represent hydrogen, a phenyl, a biphenyl, a naphthyl, a dibenzofuranyl, etc.

Herein, $L_b$ each independently represents a single bond, a substituted or unsubstituted (C6-C30)arylene, or a substituted or unsubstituted (3- to 30-membered)heteroarylene; and $Ar_c$ and $Ar_d$ each independently represent hydrogen, a substituted or unsubstituted (C1-C30)alkyl, a substituted or unsubstituted (C2-C30)alkenyl, a substituted or unsubstituted fused ring group of a (C3-C30) aliphatic ring(s) and a (C6-C30) aromatic ring(s), a substituted or unsubstituted (C6-C30)aryl, or a substituted or unsubstituted (3- to 30-membered)heteroaryl.

In addition, herein, $L_4$ represents a single bond, a substituted or unsubstituted (C6-C30)cycloalkylene, a substituted or unsubstituted (C6-C30)arylene, or a substituted or unsubstituted (3- to 30-membered)heteroarylene. According to one embodiment of the present disclosure, $L_4$ represents a single bond, a substituted or unsubstituted (C6-C15)cycloalkylene, or a substituted or unsubstituted (C6-C20)arylene. According to another embodiment of the present disclosure, $L_4$ represents a single bond, an unsubstituted (C6-C15) cycloalkylene, or a (C6-C20)arylene unsubstituted or substituted with a (C6-C12)aryl(s). For example, $L_4$ may represent a single bond, an adamantylene, a phenylene, a naphthylene, a phenylene substituted with a phenyl(s), -phenyl-naphthyl-, etc.

$X_1$ to $X_3$ each independently represent N or CH, with a proviso that at least one of $X_1$ to $X_3$ is N. According to one embodiment of the present disclosure, all of $X_1$ to $X_3$ represent N.

In formula 2, $Ar_4$ and $Ar_5$ each independently represent a substituted or unsubstituted (C6-C30)cycloalkyl, a substituted or unsubstituted (C6-C30)aryl, a substituted or unsubstituted (3- to 30-membered)heteroaryl, or a substituted or unsubstituted fused ring group of a (C3-C30) aliphatic ring(s) and a (C6-C30) aromatic ring(s). According to one embodiment of the present disclosure. $Ar_4$ and $Ar_5$ each independently represent a substituted or unsubstituted (C6-C15)cycloalkyl, a substituted or unsubstituted (C6-C30)aryl, a substituted or unsubstituted (5- to 15-membered)heteroaryl, or a substituted or unsubstituted fused ring group of a (C3-C10) aliphatic ring(s) and a (C6-C12) aromatic ring(s). According to another embodiment of the present disclosure, $Ar_4$ and $Ar_5$ each independently represent an unsubstituted (C6-C30)cycloalkyl; a (C6-C30)aryl unsubstituted or substituted with at least one of a (C6-C15)cycloalkyl(s), a (C6-C20)aryl(s) and a (5- to 15-membered)heteroaryl(s); a (5- to 15-membered)heteroaryl unsubstituted or substituted with a (C6-C12)aryl(s); or a fused ring group of a (C3-C10) aliphatic ring(s) and a (C6-C12) aromatic ring(s) substituted with a (C1-C6)alkyl(s). For example, $Ar_4$ and $Ar_5$ may each independently represent an adamantyl; a phenyl unsubstituted or substituted with at least one of an adamantly(s), a phenyl(s), a naphthyl(s), a phenylfluorenyl(s), a chrysenyl(s), a dibenzofuranyl(s) and a dibenzothiophenyl(s); a naphthyl unsubstituted or substituted with a phenyl(s) and/or a dibenzofuranyl(s); a biphenyl; a terphenyl; a (C22)aryl; a phenanthrenyl; a triphenylenyl; a fluorenyl unsubstituted or substituted with at least one of a methyl(s), a phenyl and an adamantyl; a dibenzofuranyl; a dibenzothiophenyl; a diphenylsilafluorenyl; a fused ring group of (C3-C10) aliphatic ring(s) and (C6-C12) aromatic ring(s) substituted with a methyl(s), etc.

In formula 2, a represents an integer of 1 to 3, where if a is an integer of 2 or more, each of $L_4$ may be the same or different.

According to one embodiment of the present disclosure, the formula 2 may be represented by at least one of the following formulas 2-1 to 2-5.

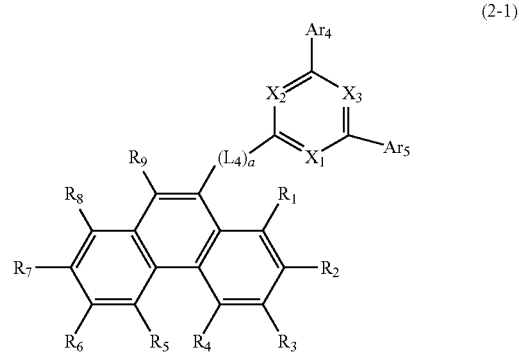

(2-1)

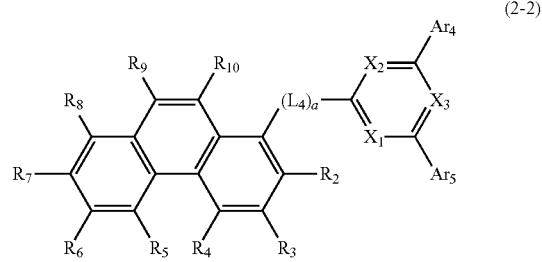

(2-2)

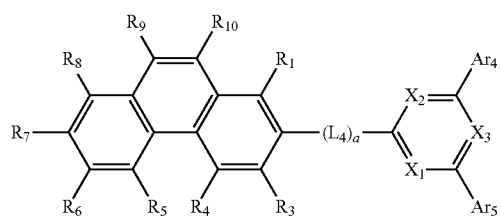
(2-3)
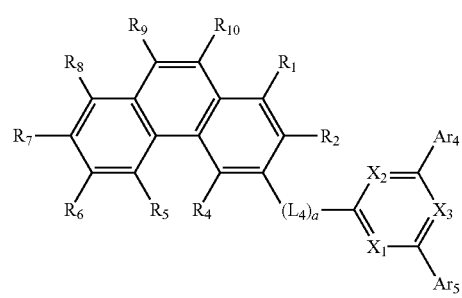
(2-4)
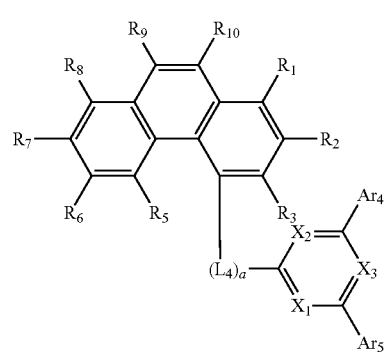
(2-5)
In formulas 2-1 to 2-5, $R_1$ to $R_{10}$, $L_4$, $Ar_4$, $Ar_5$, $X_1$ to $X_3$ and a are as defined in formula 2.
The compound represented by formula 1 may be at least one selected from the following compounds, but is not limited thereto.
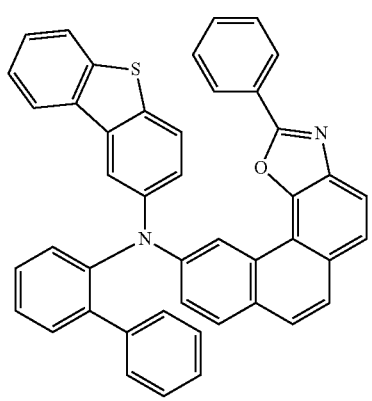
H1-1
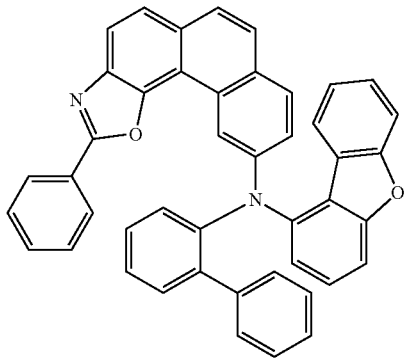
H1-2
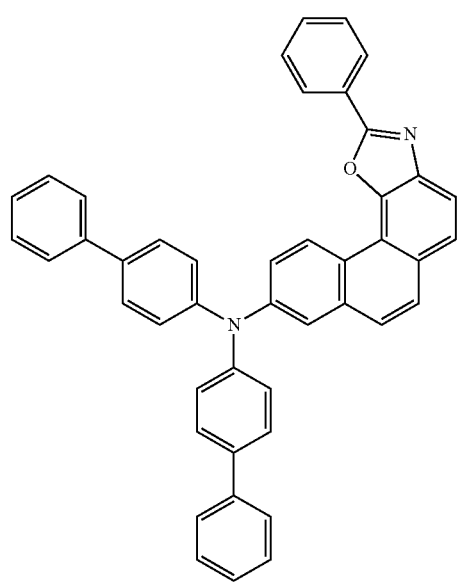
H1-3
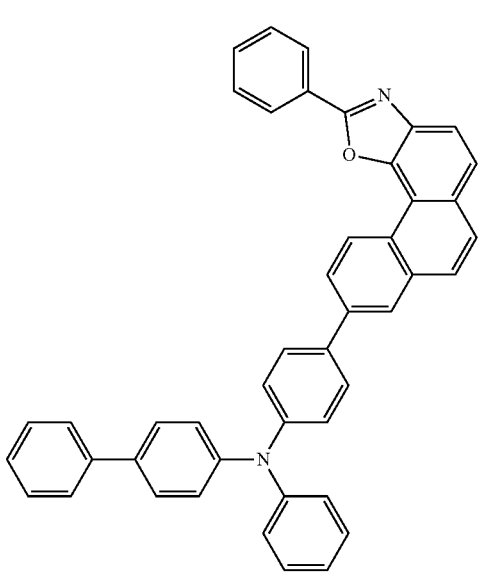
H1-4

-continued
H1-5
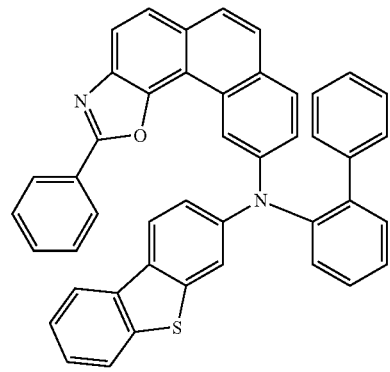
H1-6
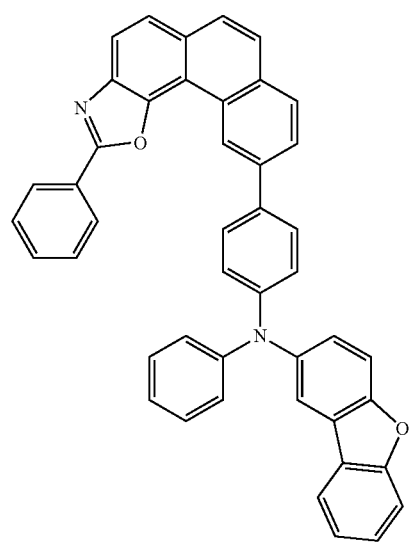
H1-7
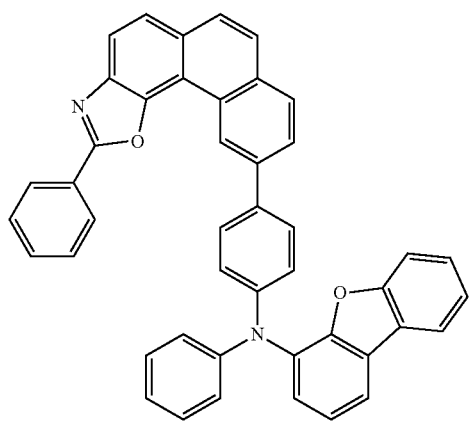
-continued
H1-8
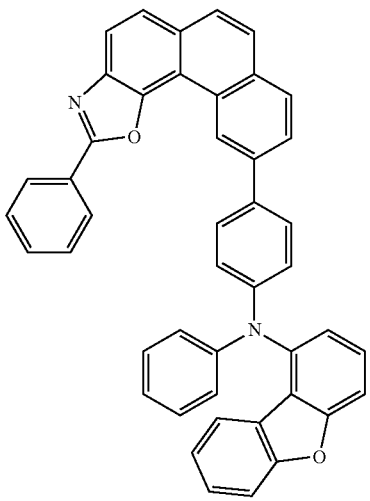
H1-9
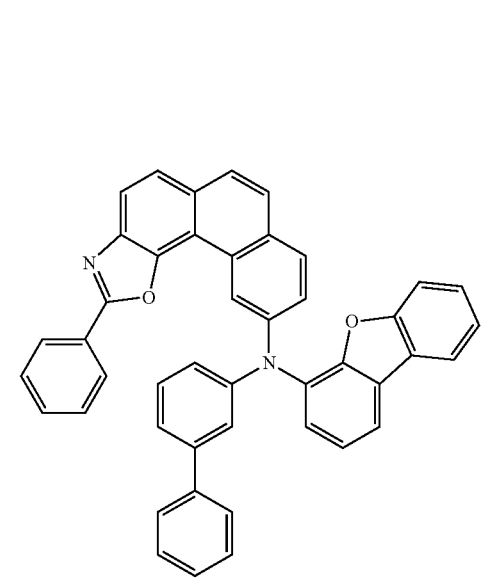
H1-10
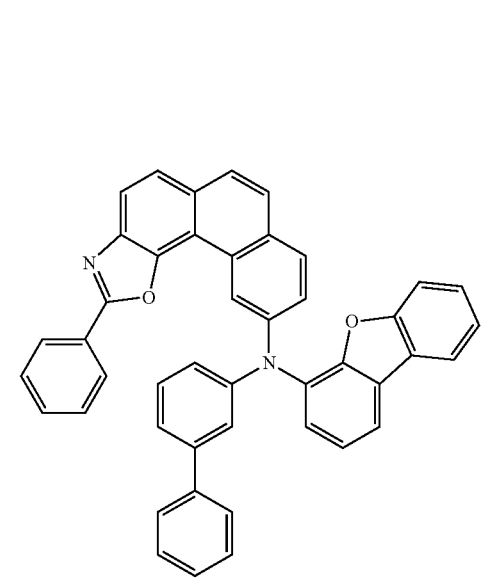

-continued
H1-11
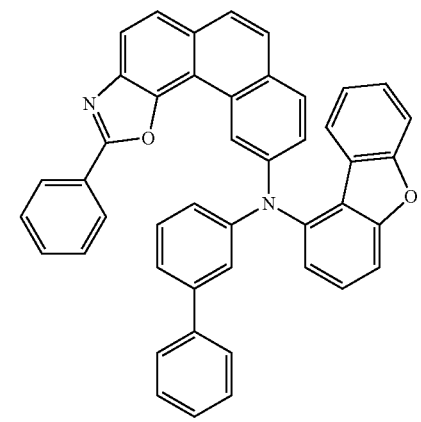
H1-12
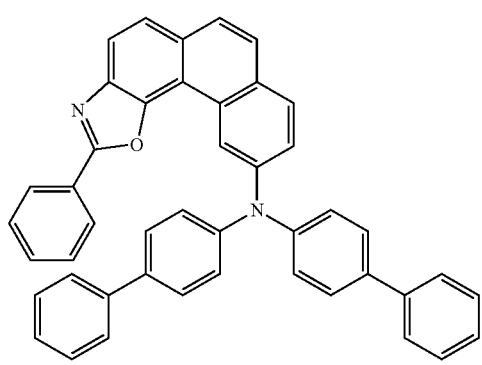
H1-13
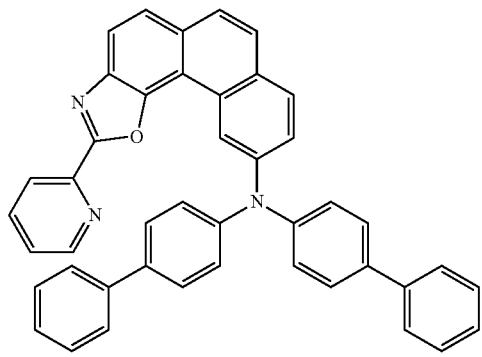
H1-14
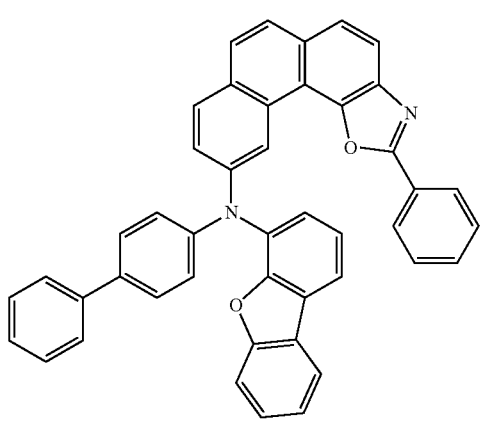
-continued
H1-15
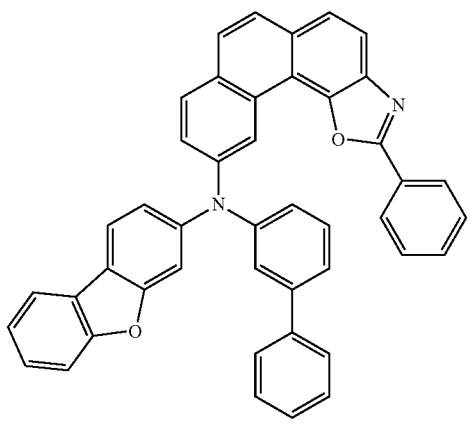
H1-16
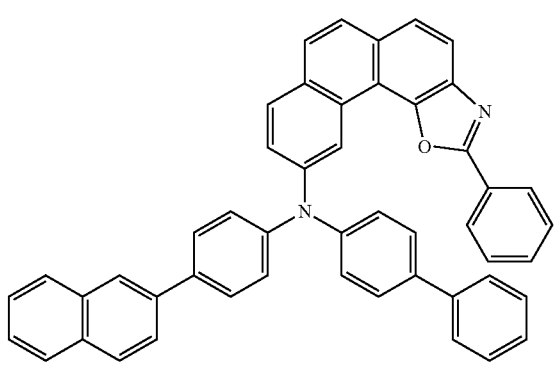
H1-17
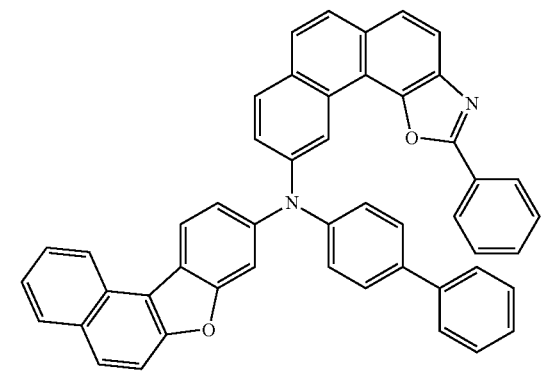
H1-18
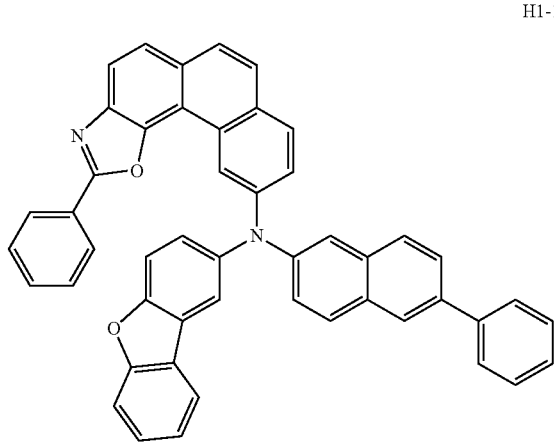

-continued
H1-19
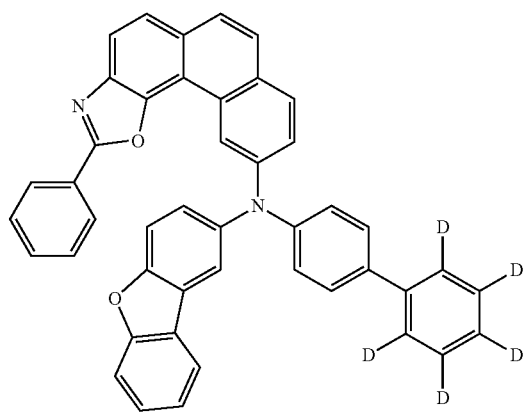
H1-20
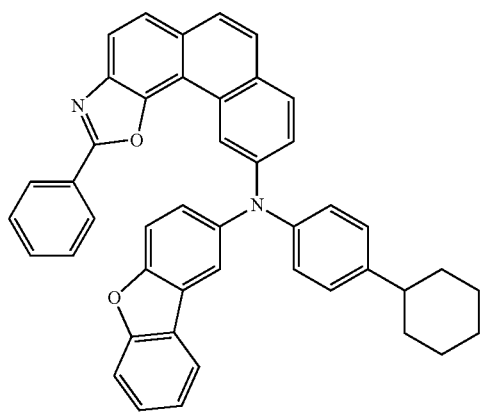
H1-21
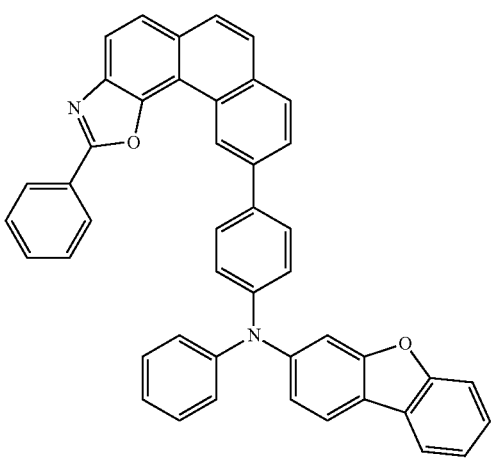
H1-22
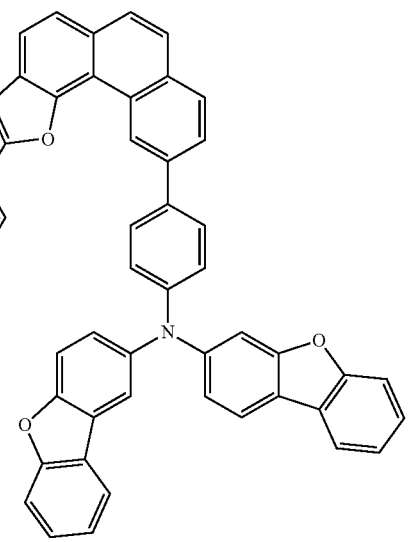
H1-23
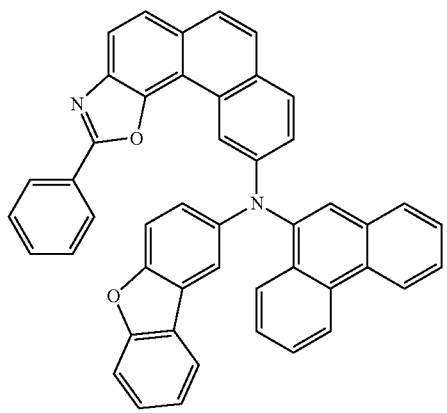
H1-24
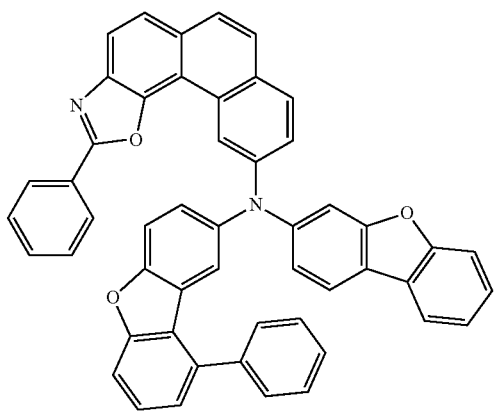

H1-25
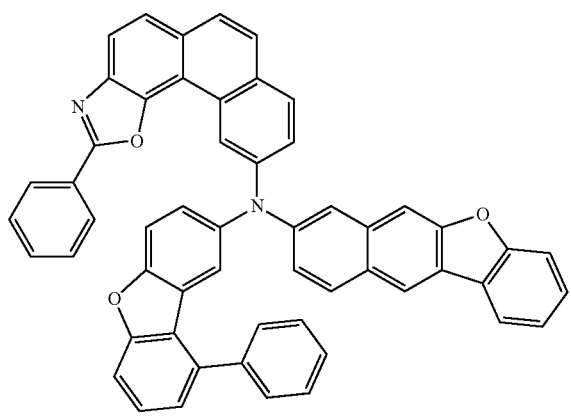
H1-26
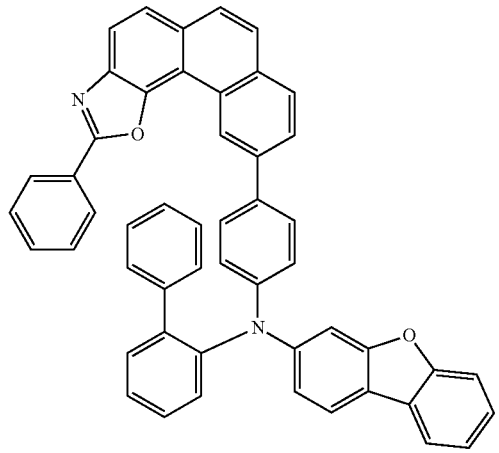
H1-27
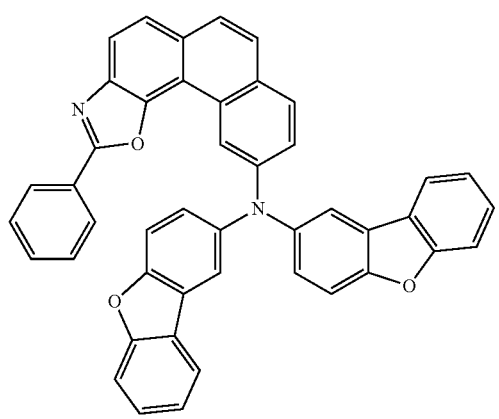
H1-28
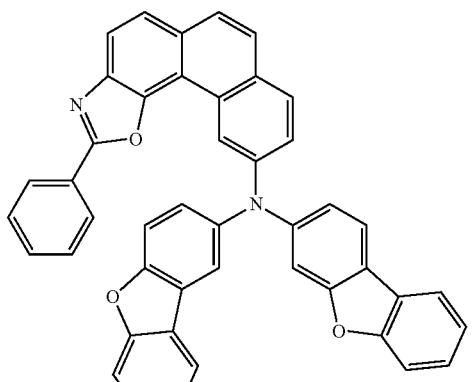
H1-29
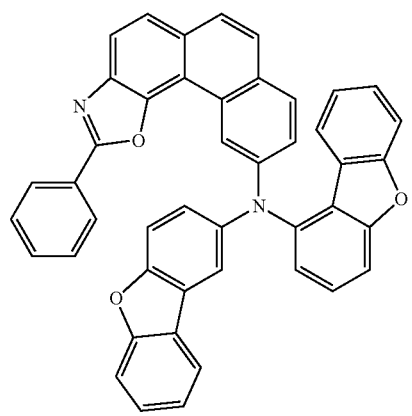
H1-30
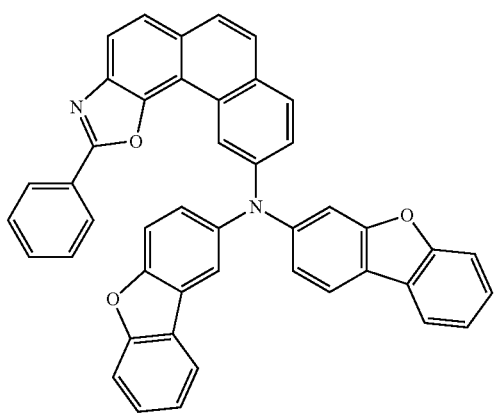
H1-31
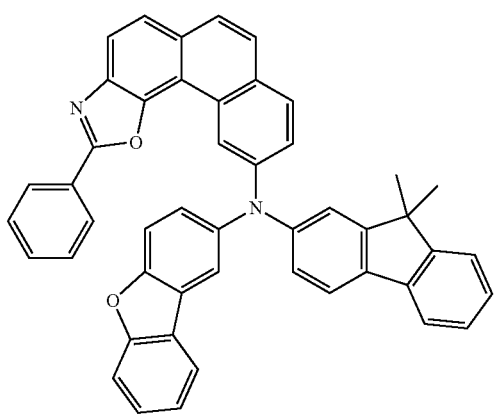

H1-32
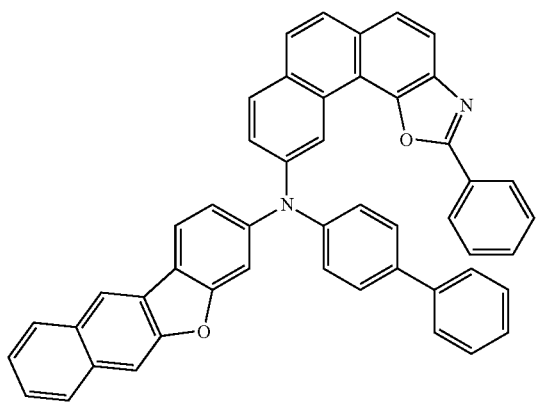
H1-33
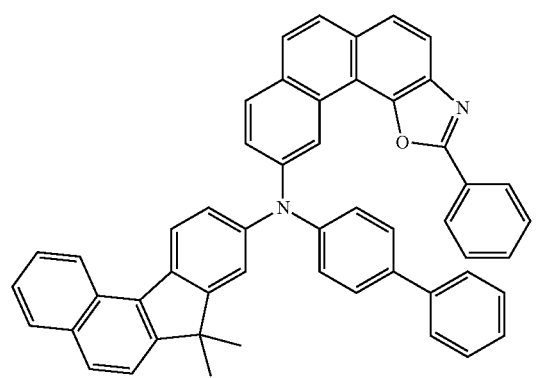
H1-34
H1-35
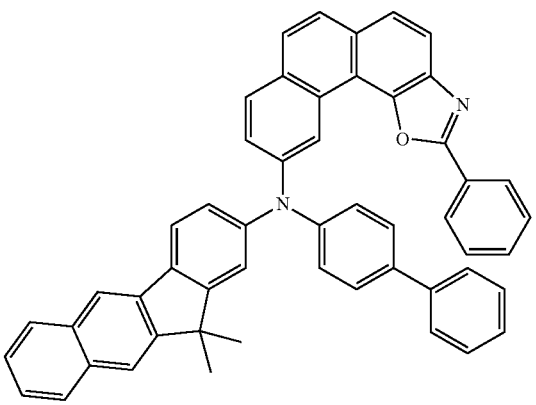
H1-36
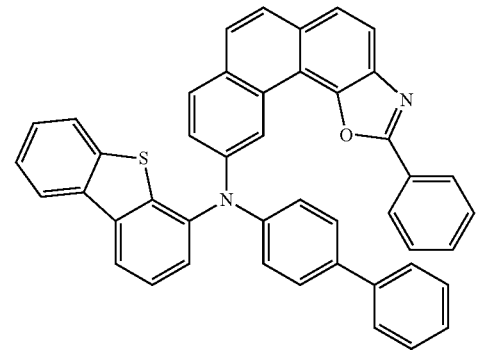
H1-37
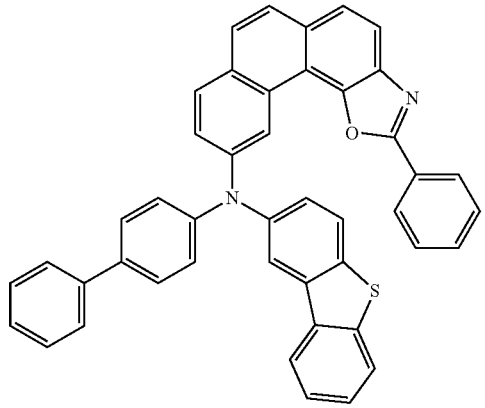
H1-38
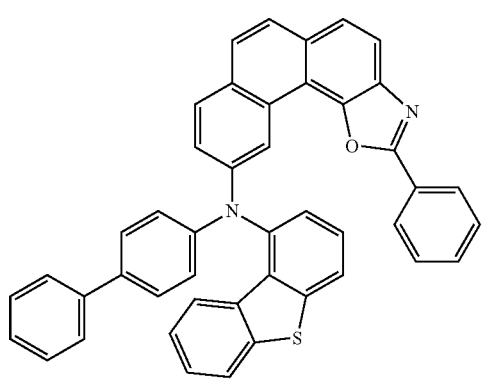

31
-continued
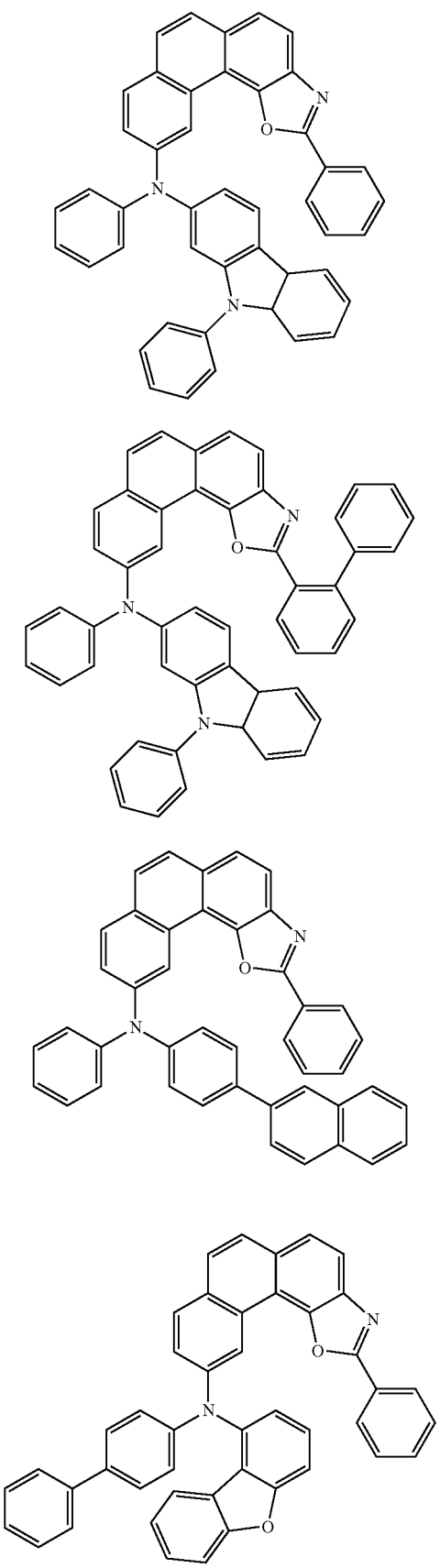
H1-39
H1-40
H1-41
H1-42
32
-continued
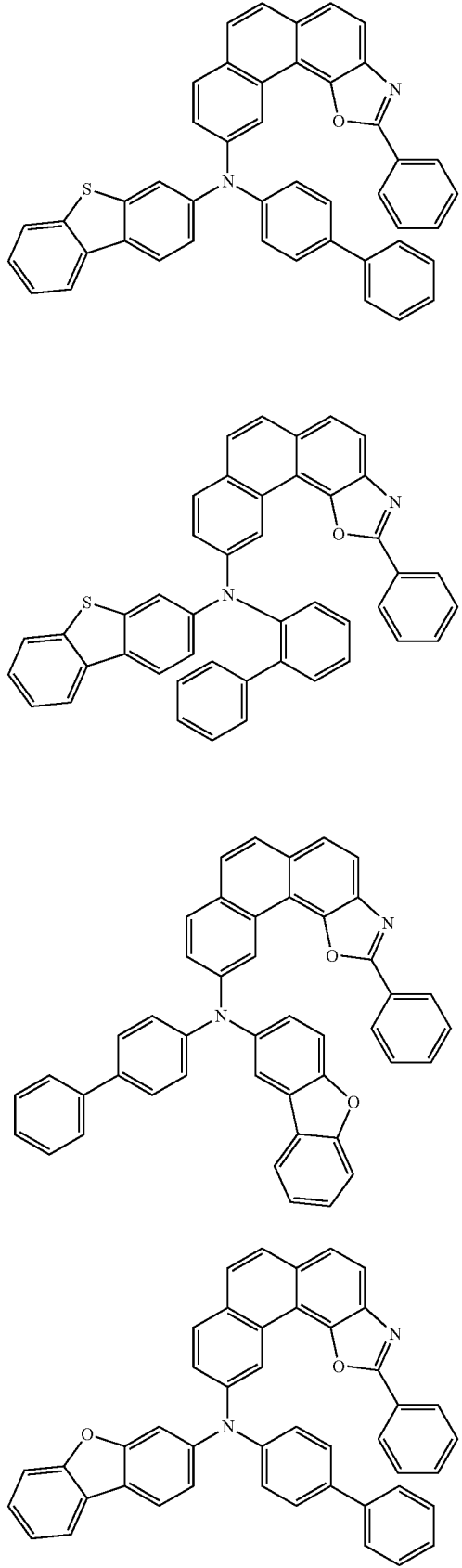
H1-43
H1-44
H1-45
H1-46

H1-47
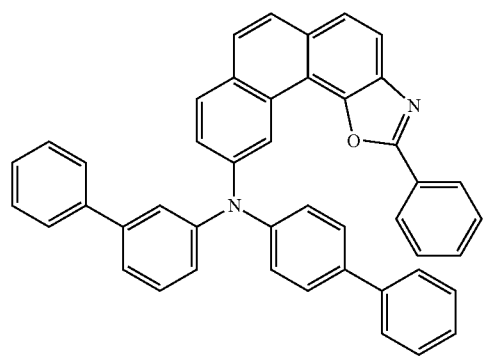
H1-48
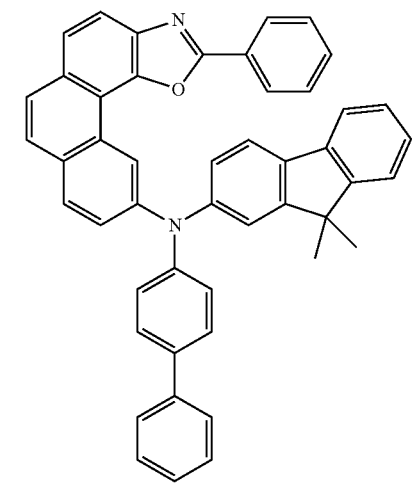
H1-49
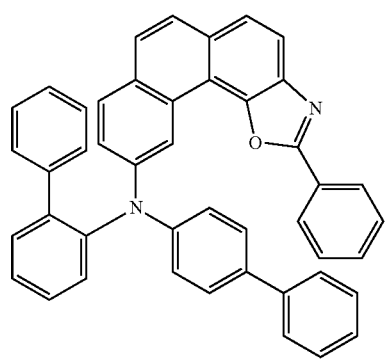
H1-50
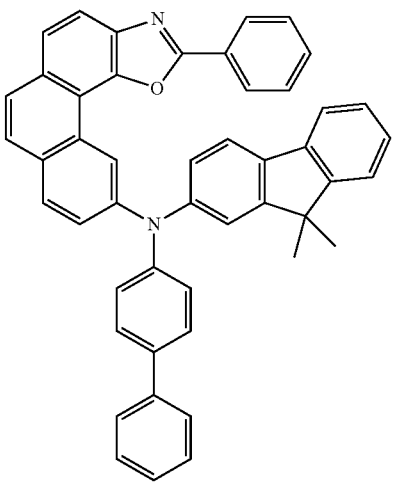
H1-51
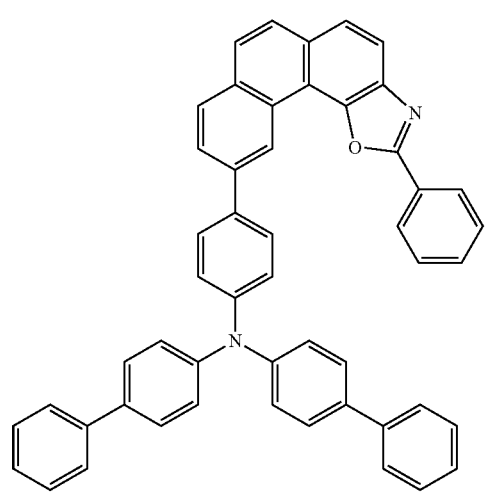
H1-52
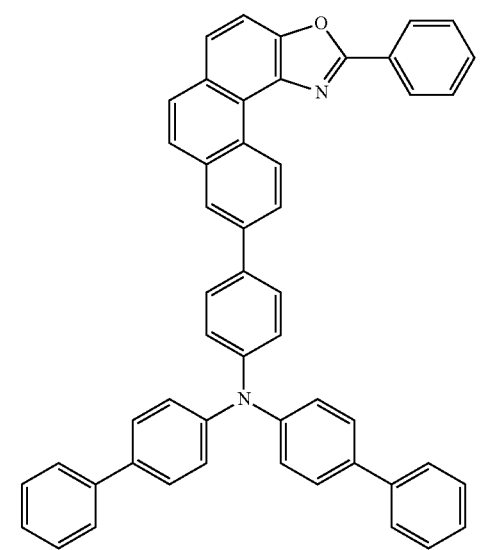

-continued
H1-53
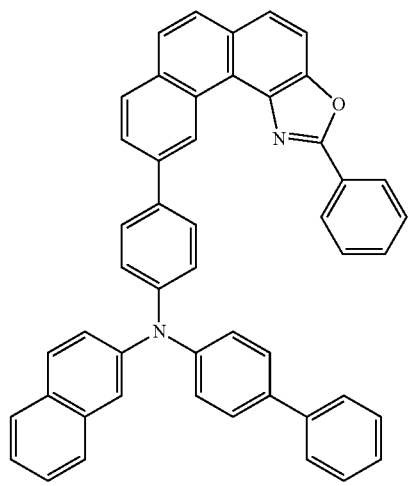
H1-54
H1-55
H1-56
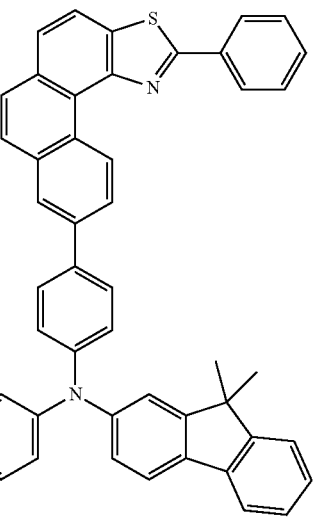
H1-57
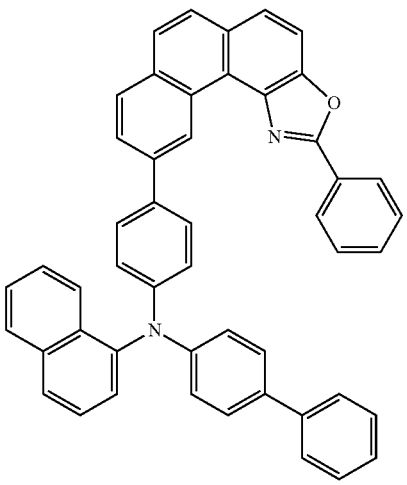
H1-58
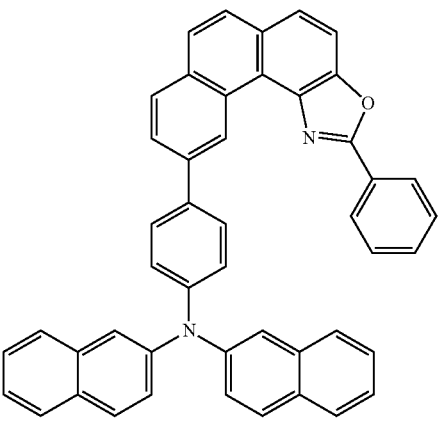

H1-59
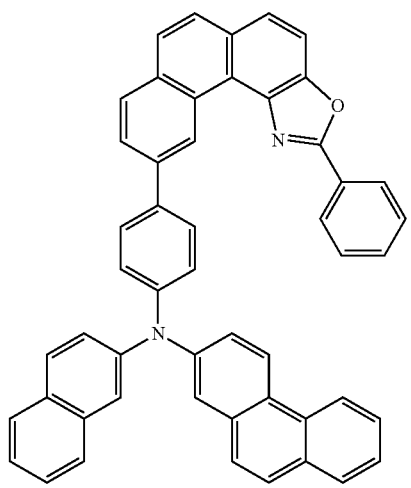
H1-60
H1-61
H1-62
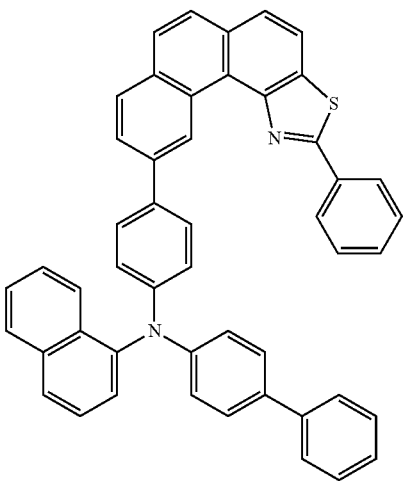
H1-63
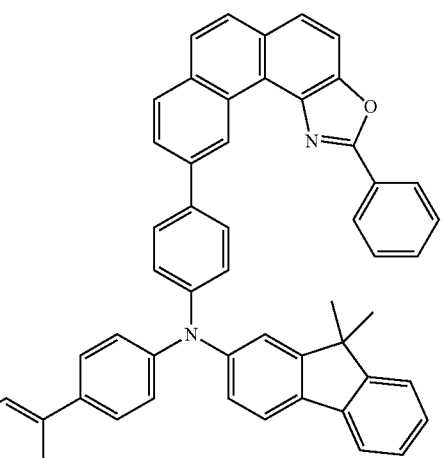
H1-64
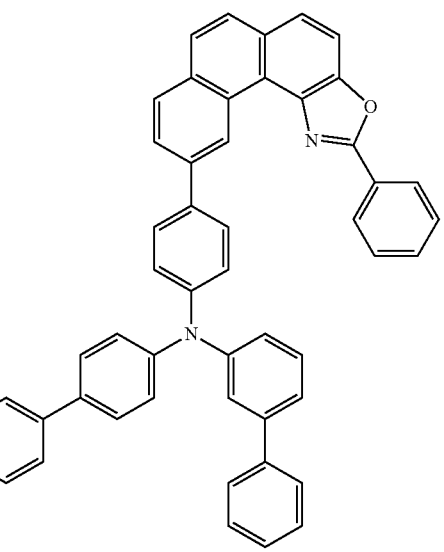

H1-65
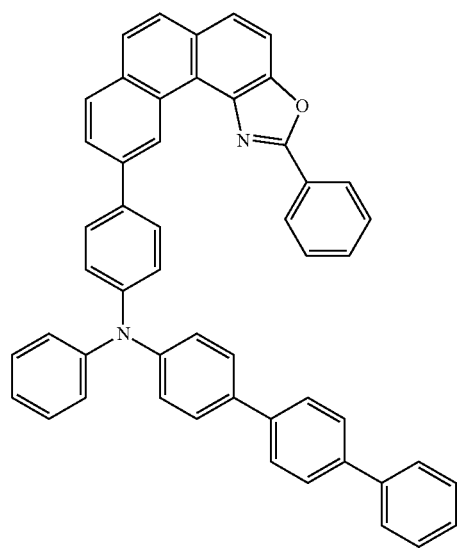
H1-66
H1-67
H1-68
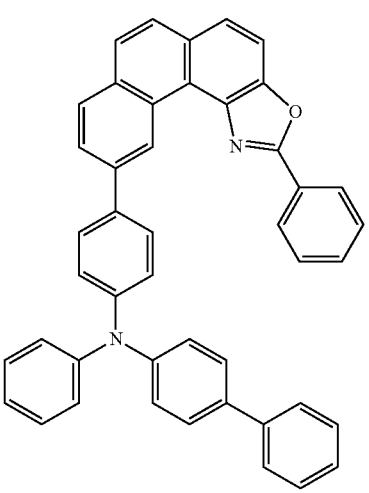
H1-69
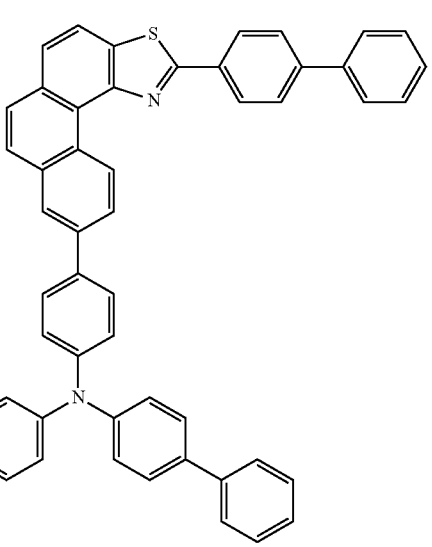
H1-70
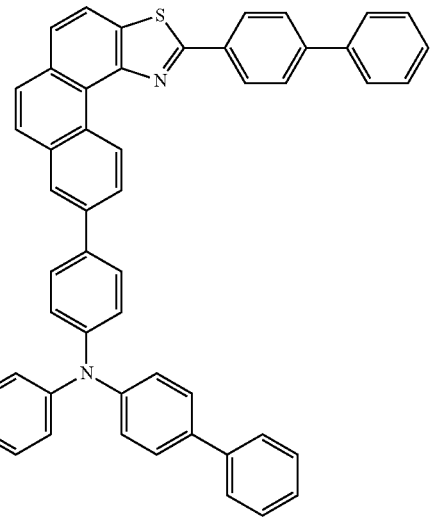

-continued
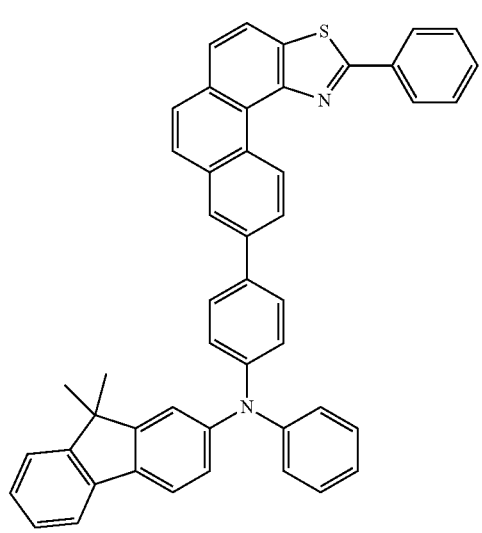
H1-71
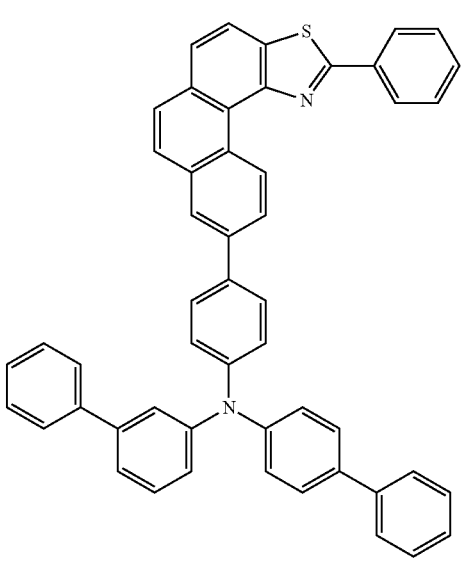
H1-74
H1-72
H1-75
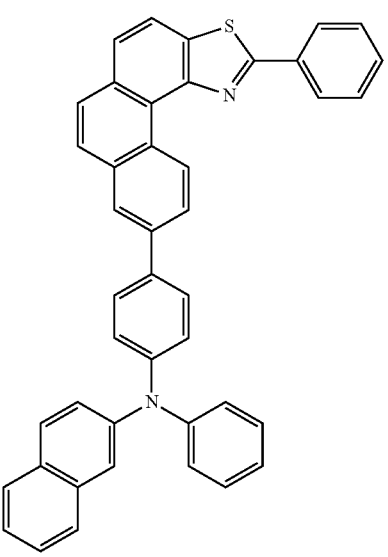
H1-73
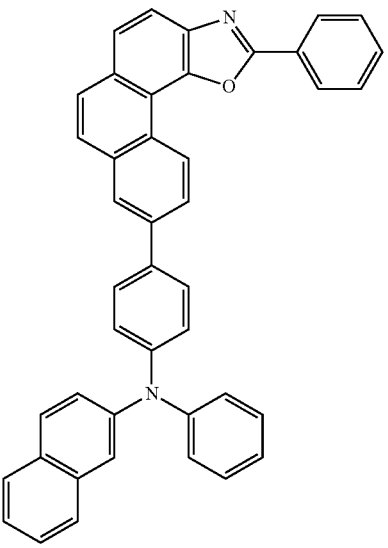
H1-76

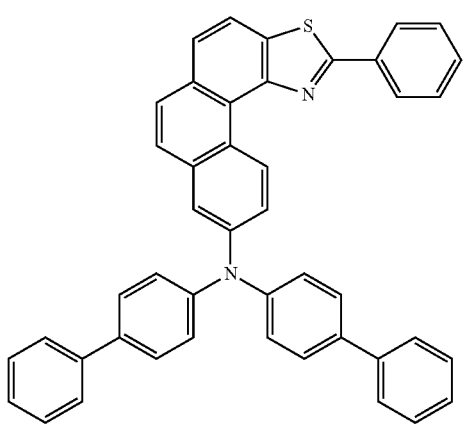
H1-77
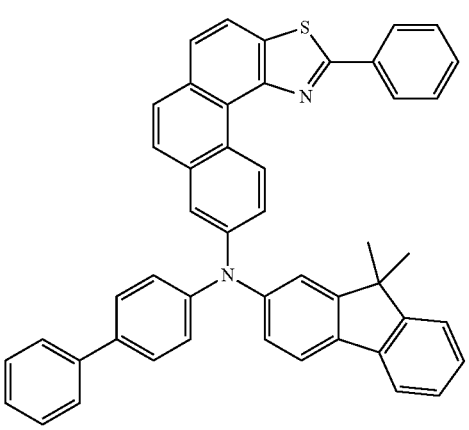
H1-78
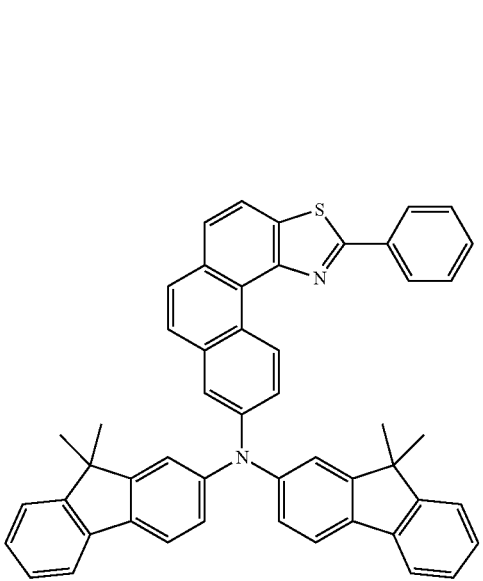
H1-79
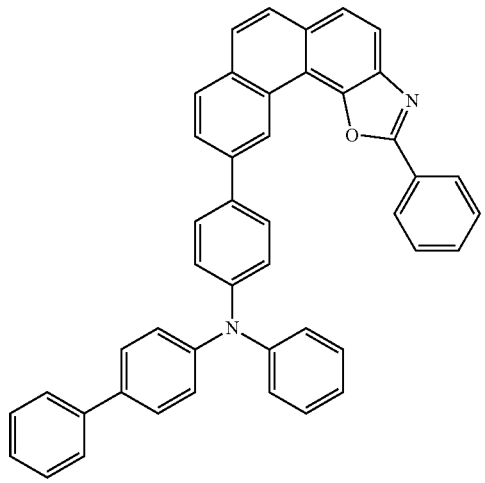
H1-80
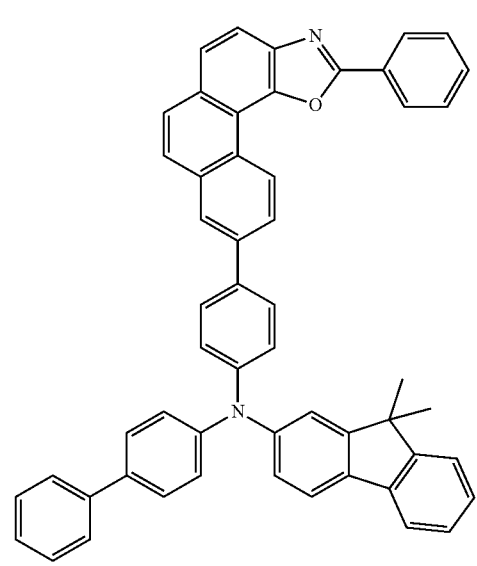
H1-81
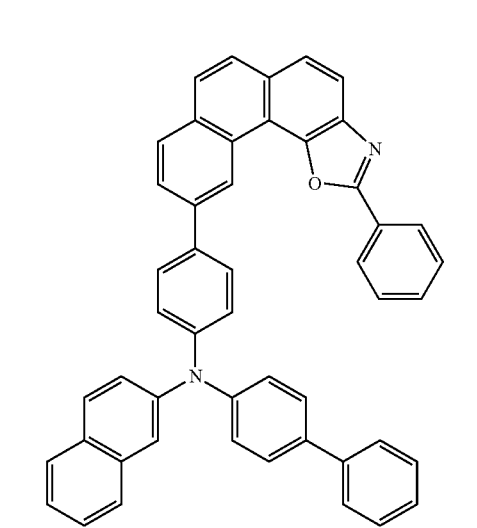
H1-82

-continued
H1-83
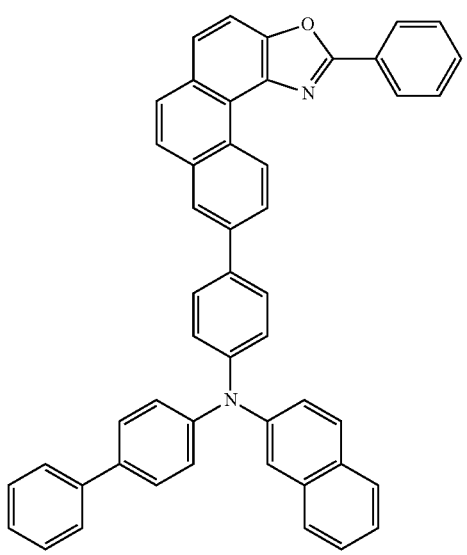
H1-84
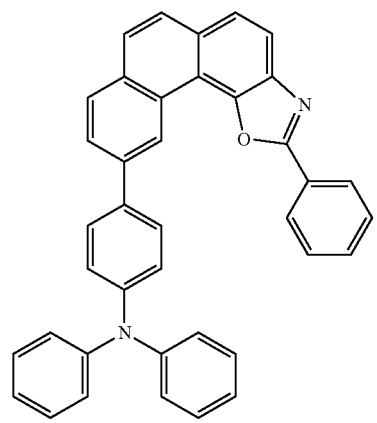
H1-85
H1-86
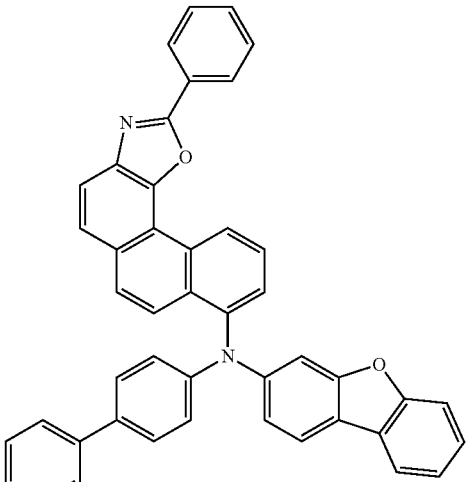
H1-87
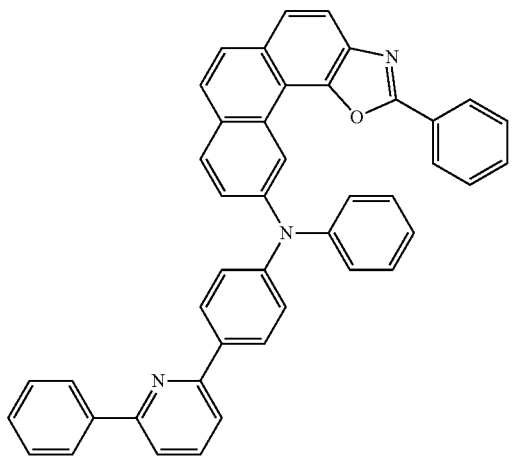
H1-88
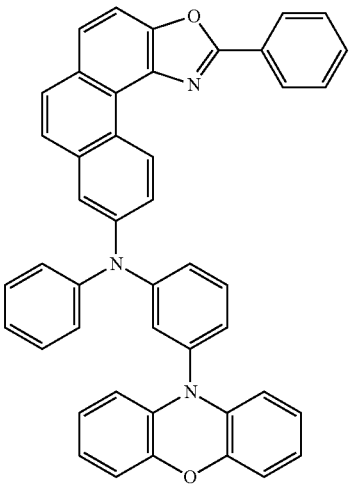

H1-89
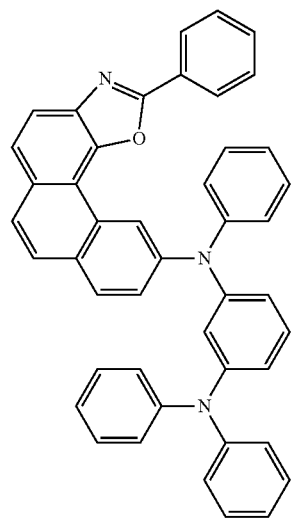
H1-92
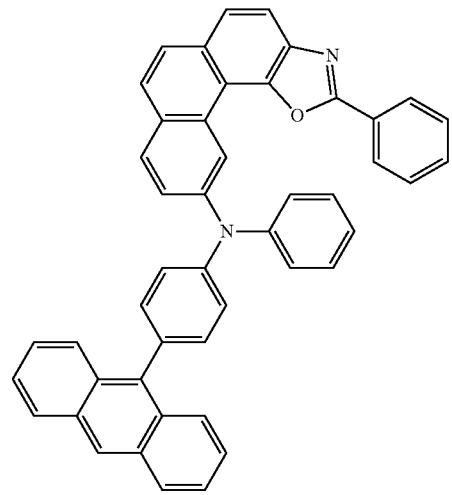
H1-90
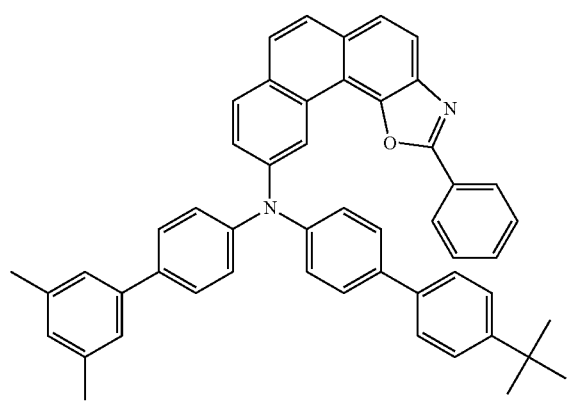
H1-93
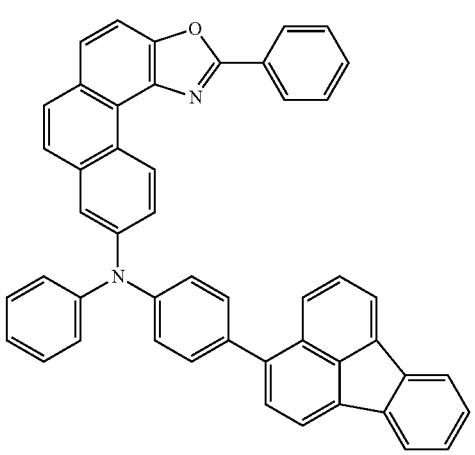
H1-91
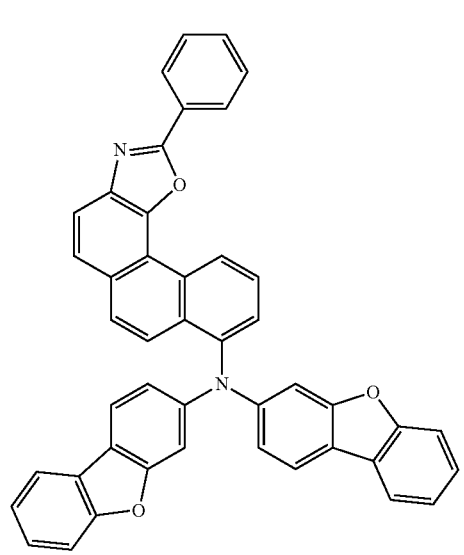
H1-94
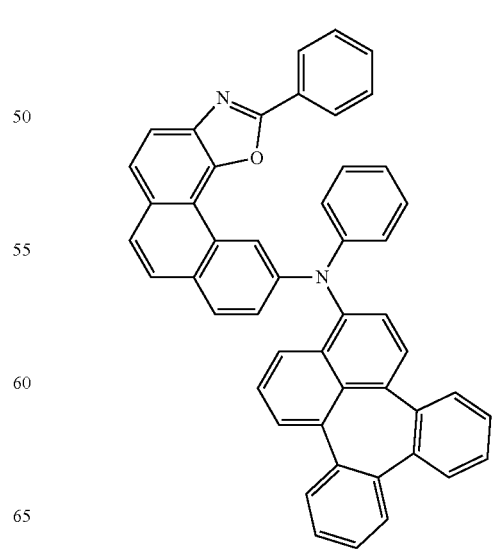

H1-95
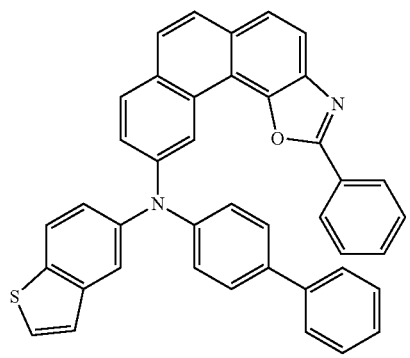
H1-98
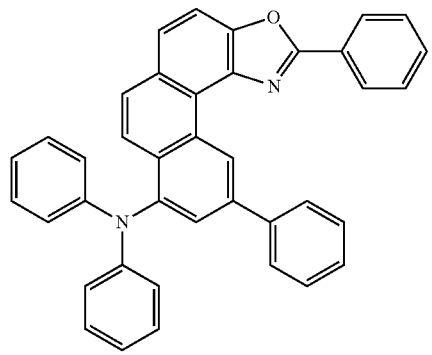
H1-96
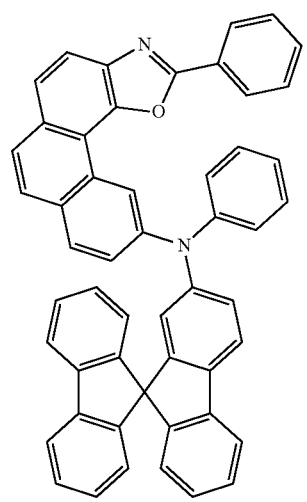
H1-99
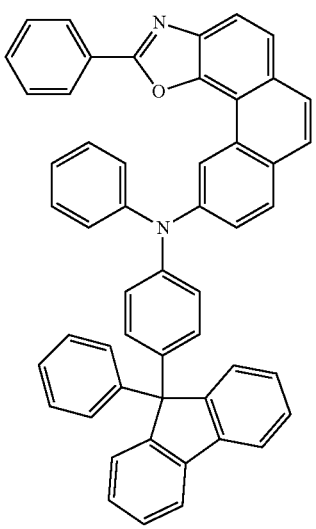
H1-97
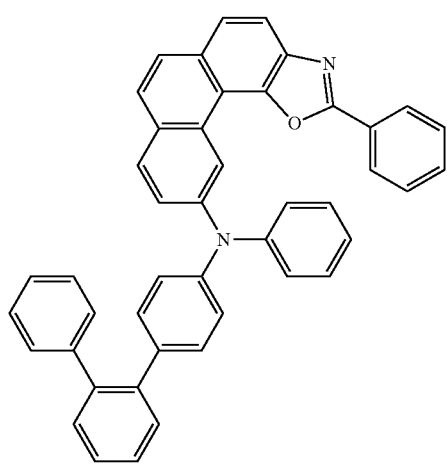
H1-100
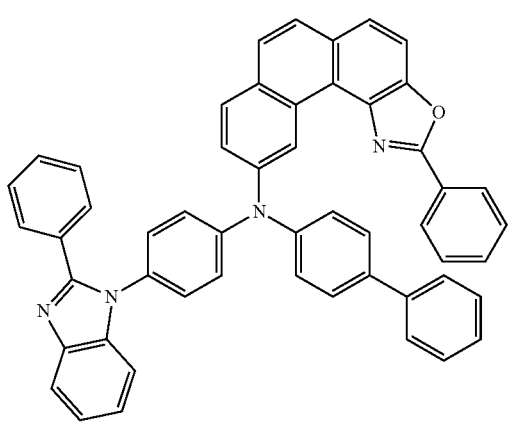

-continued
H1-101
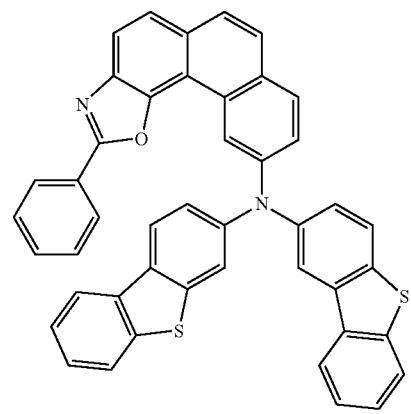
H1-102
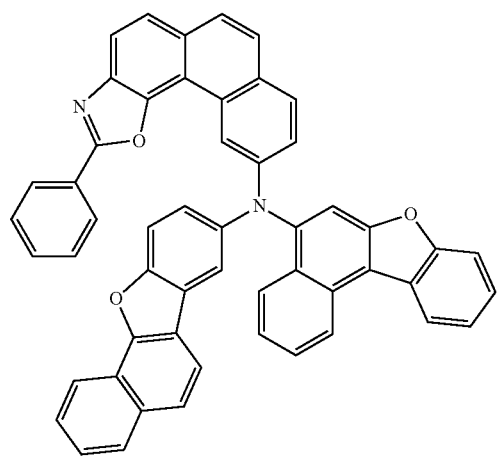
H1-103
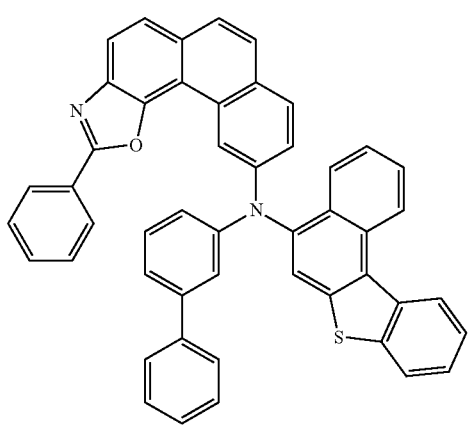
-continued
H1-104
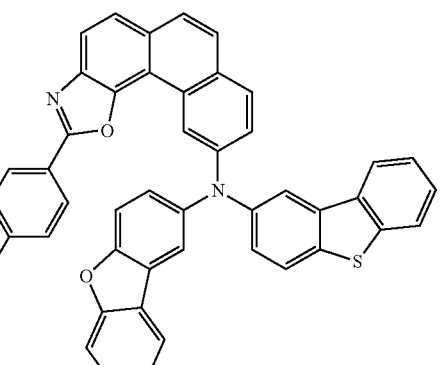
H1-105
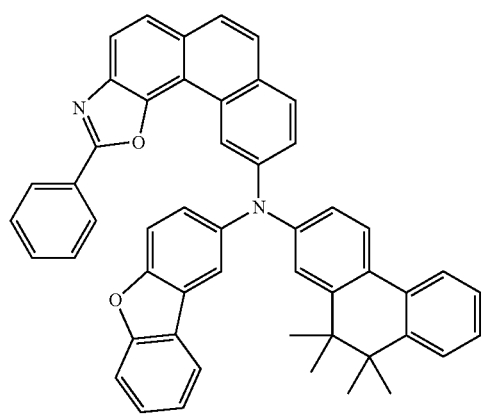
H1-106
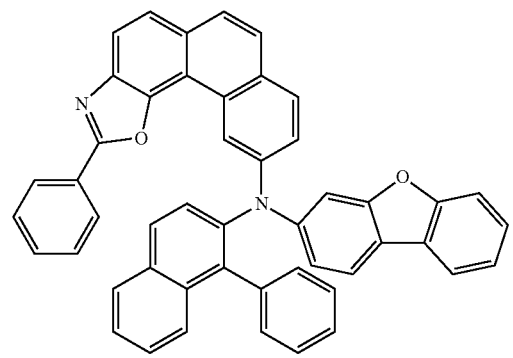
H1-107
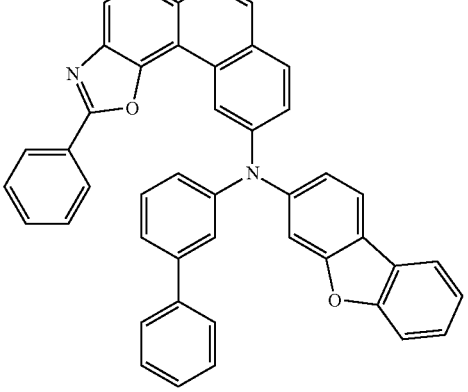

H1-108
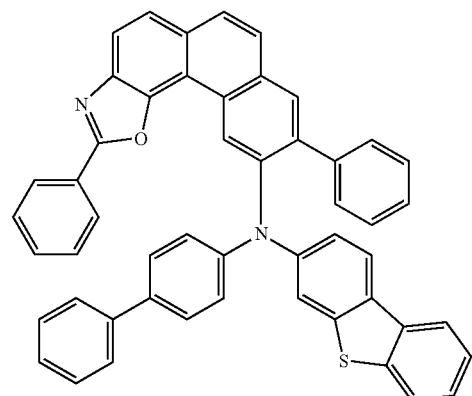
H1-109
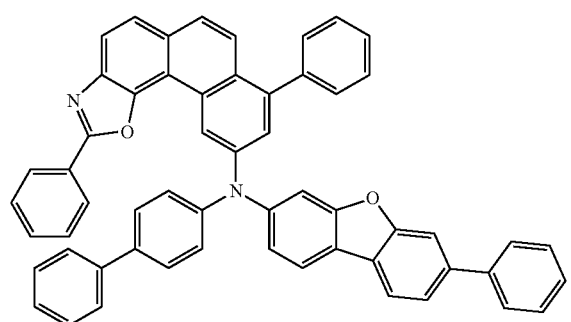
H1-110
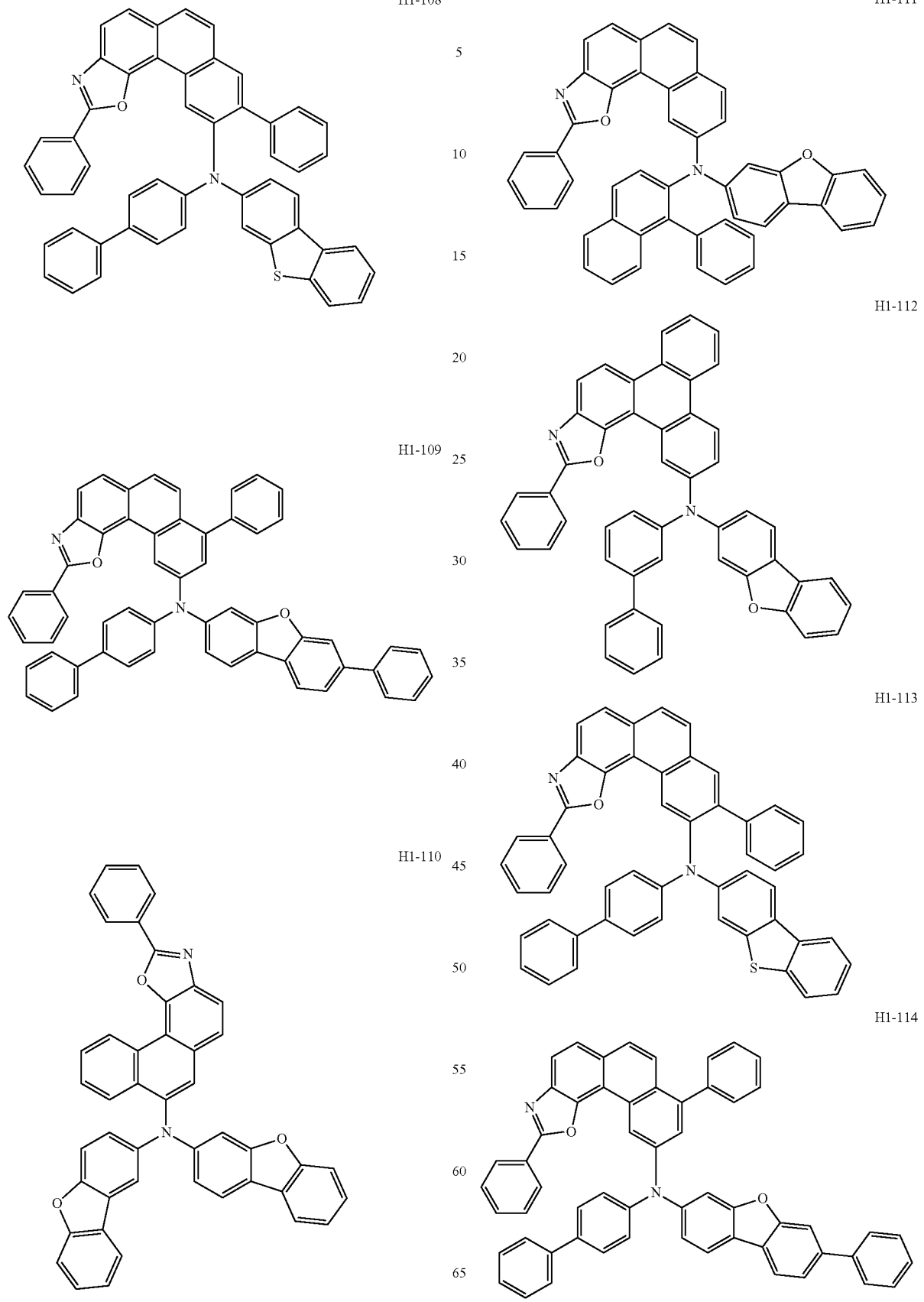
H1-111
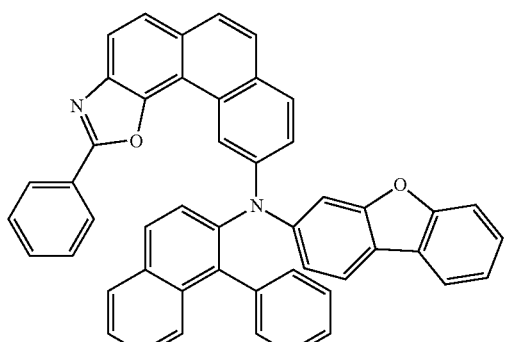
H1-112
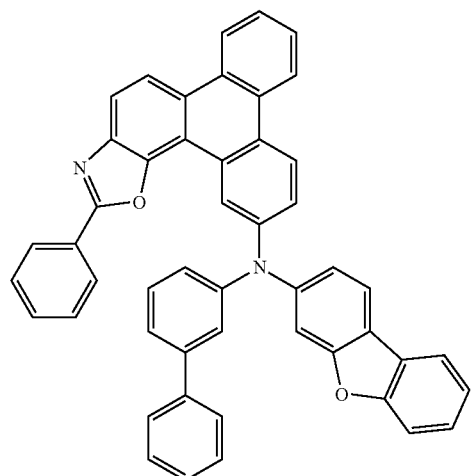
H1-113
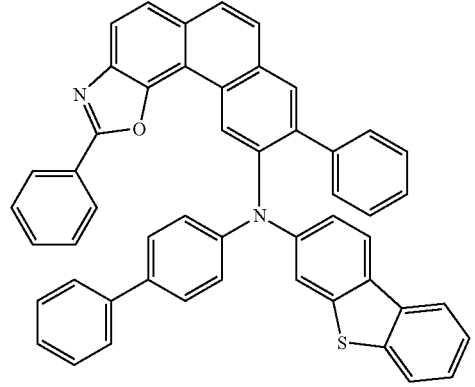
H1-114
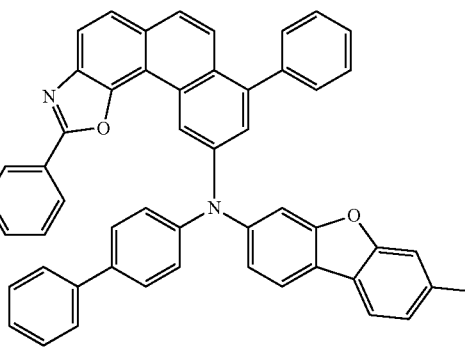

H1-115
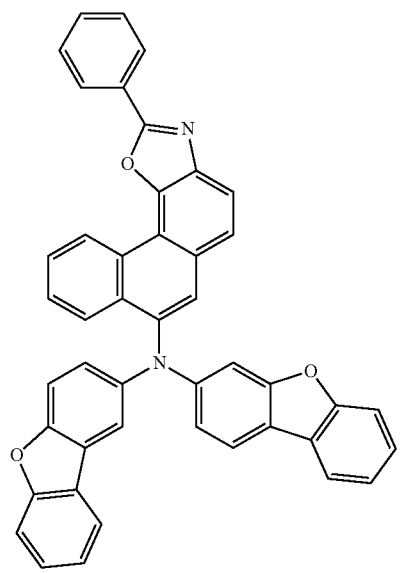
H1-116
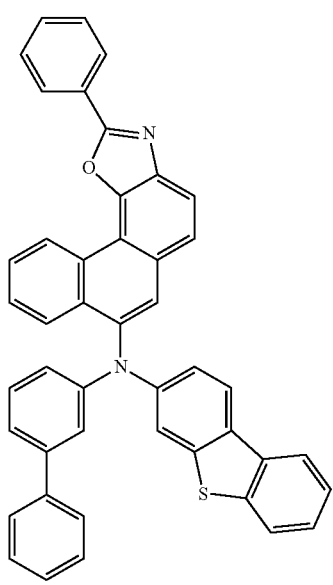
H1-117
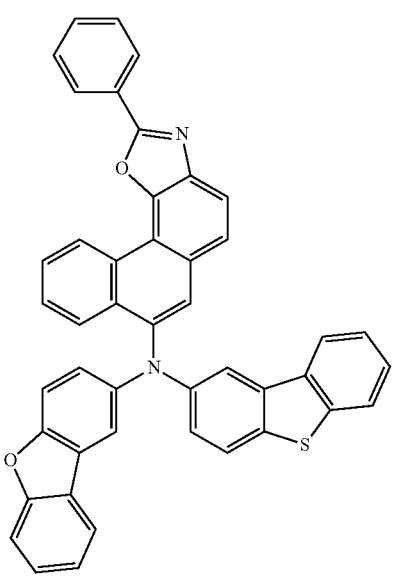
H1-118
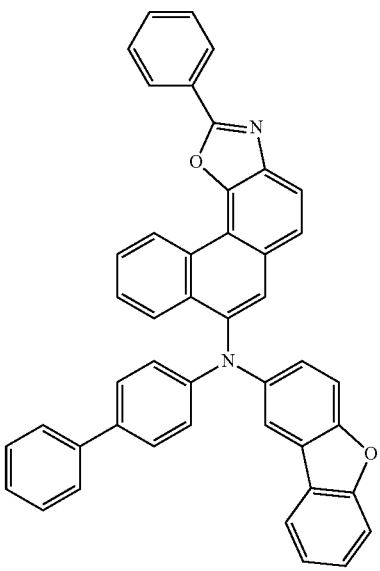

H1-119
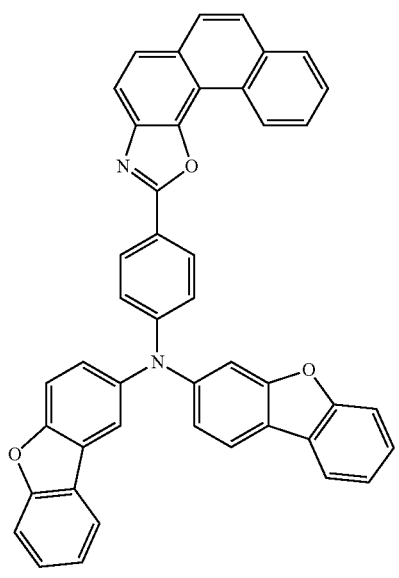
H1-120
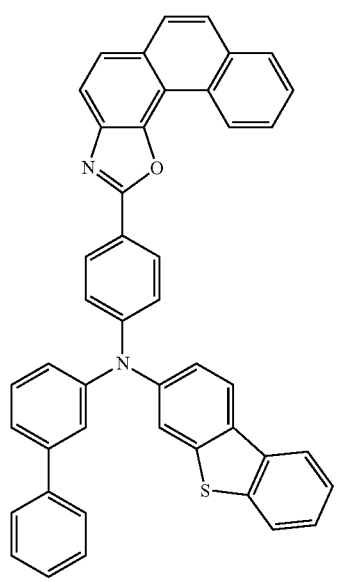
H1-121
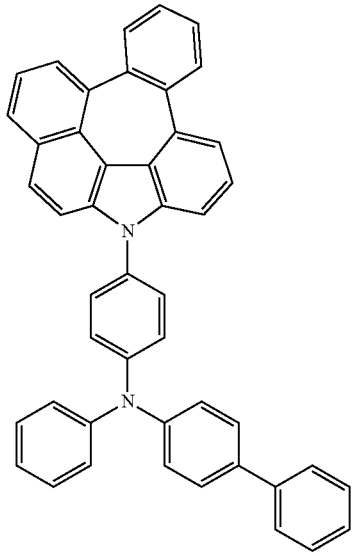
H1-122
H1-123

H1-124
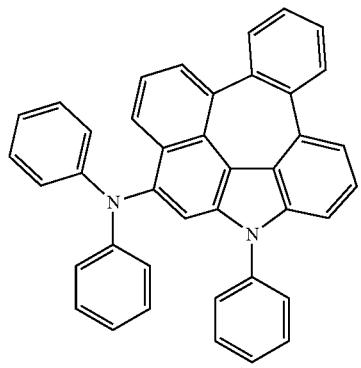
H1-125
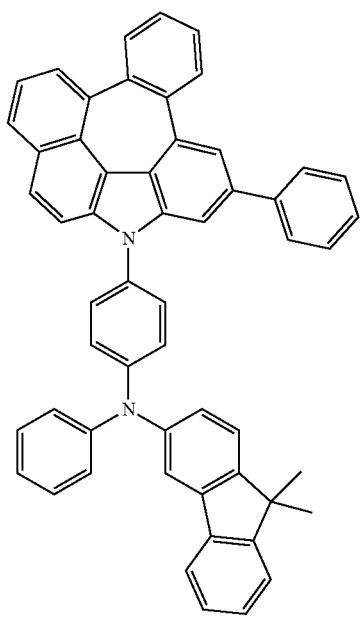
H1-126
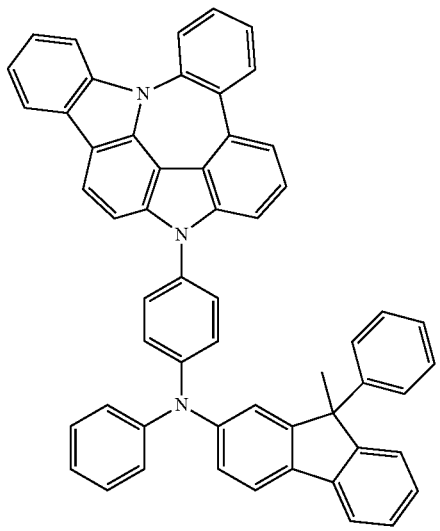
H1-127
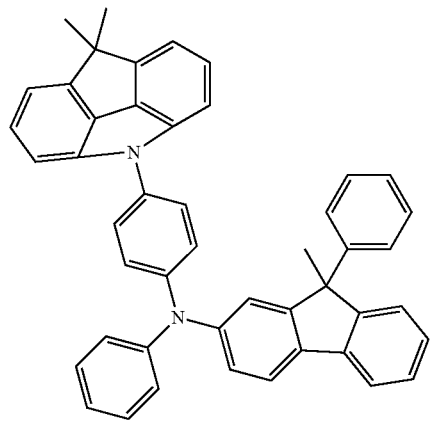
H1-128
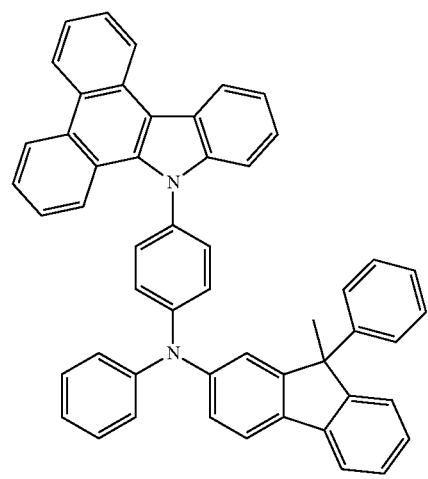
H1-129
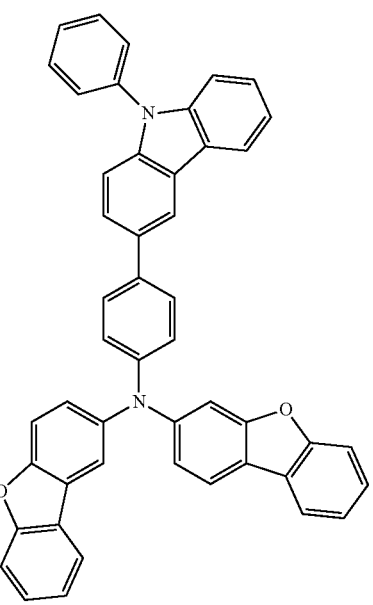

-continued
H1-130
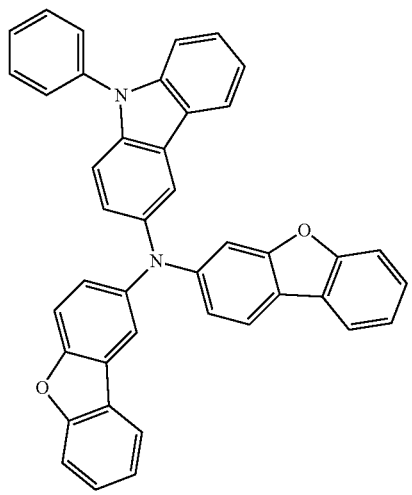
H1-131
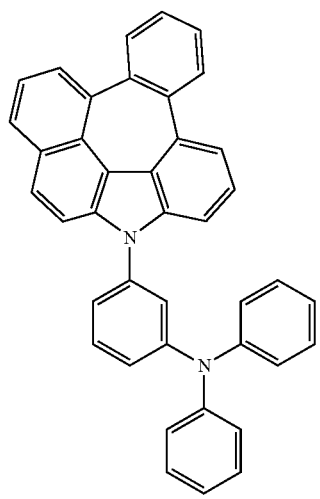
H1-132
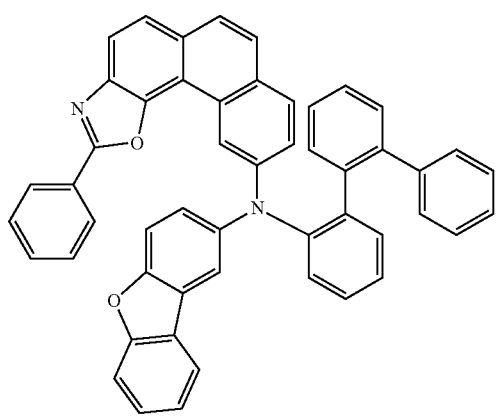
-continued
H1-133
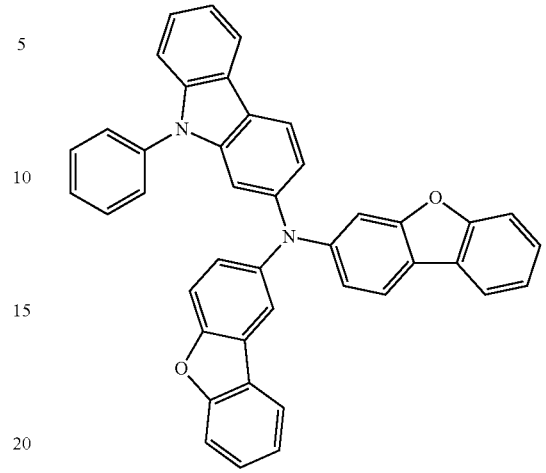
H1-134
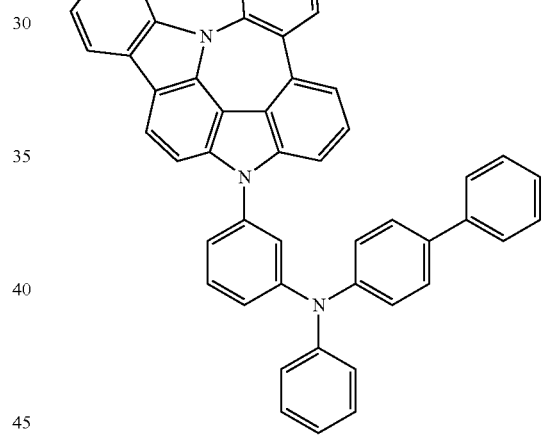
H1-135
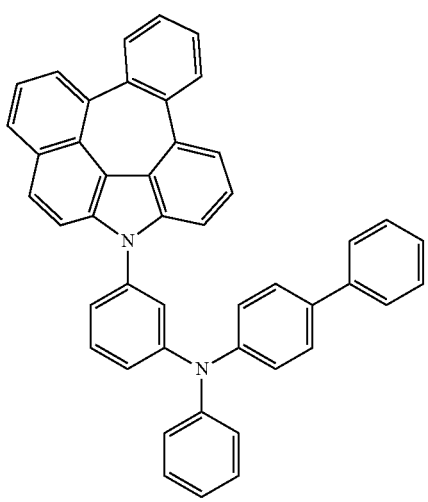

H1-136
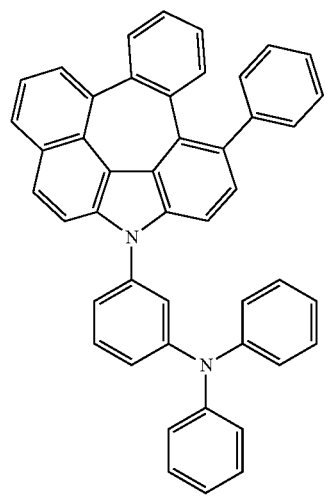
H1-137
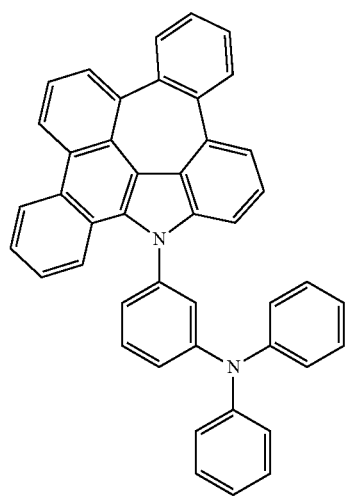
H1-138
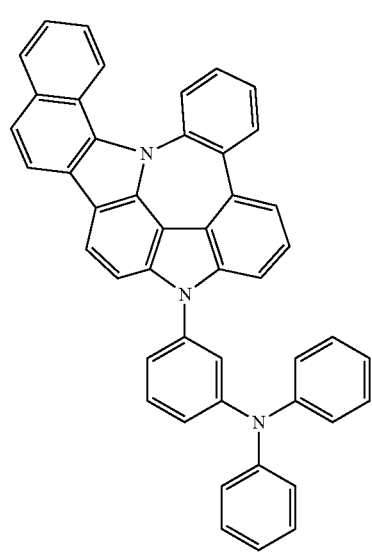
H1-139
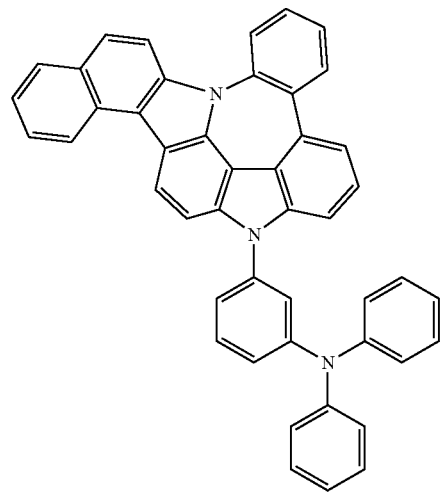
H1-140
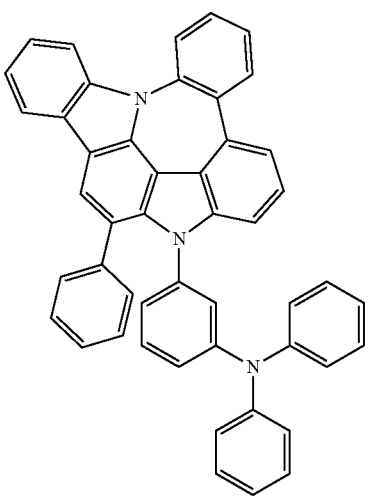
H1-141
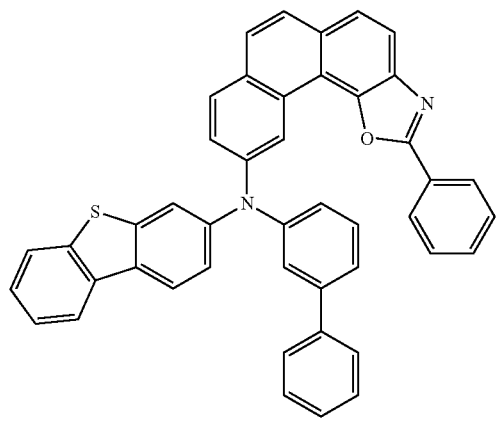

H1-142
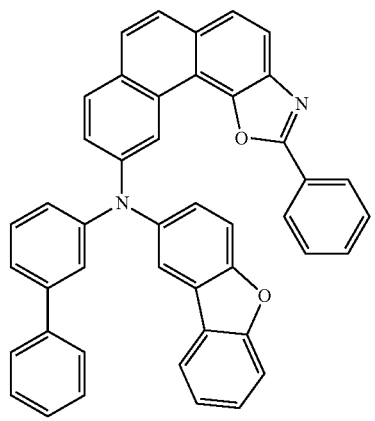
H1-143
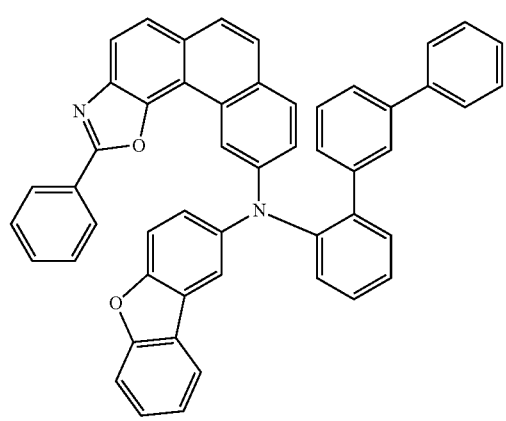
The compound represented by formula 2 may be at least one selected from the following compounds, but is not limited thereto.
H2-1
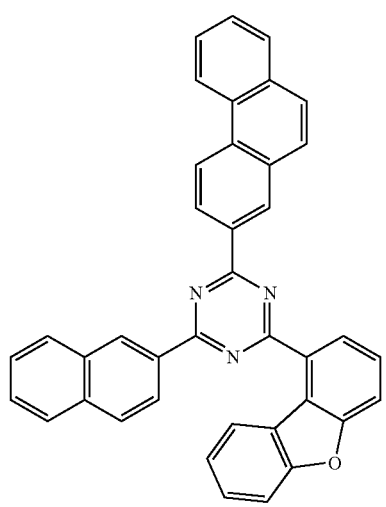
H2-2
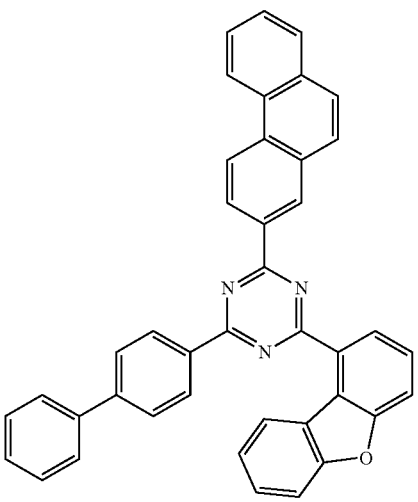
H2-3
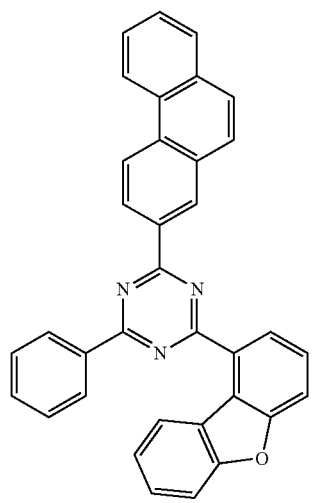
H2-4
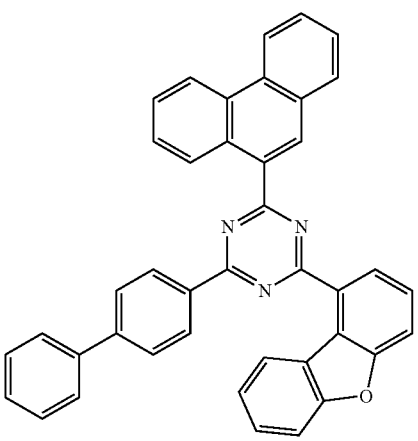

H2-5
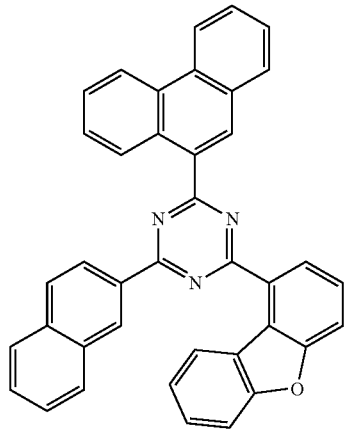
H2-6
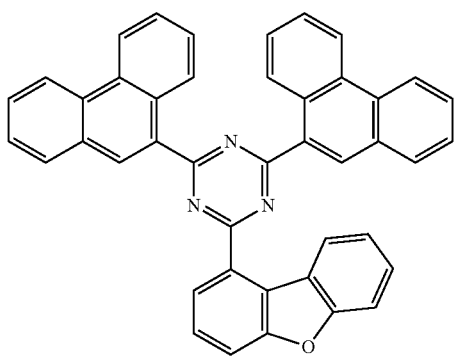
H2-7
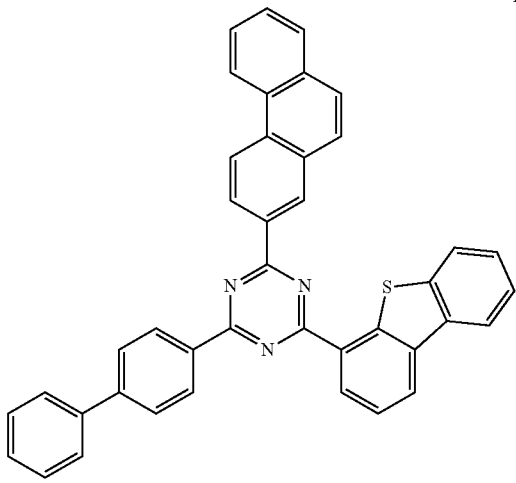
H2-8
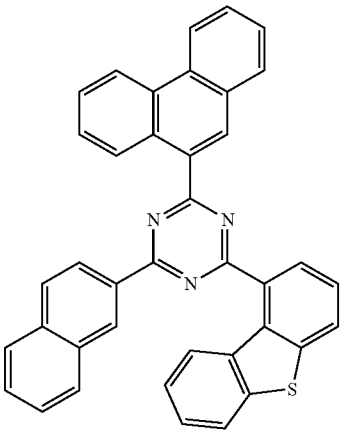
H2-9
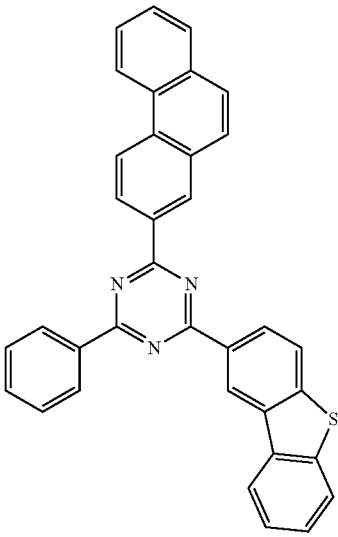
H2-10
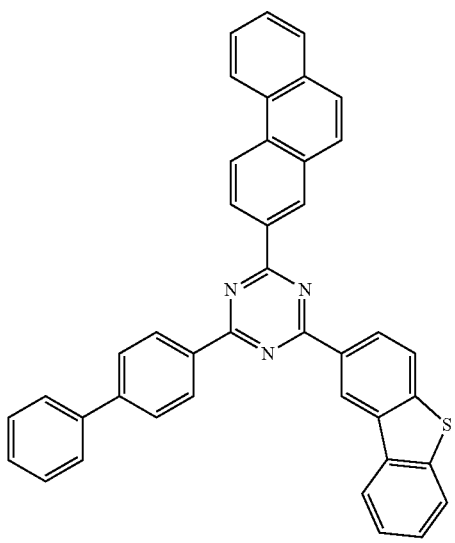

H2-11
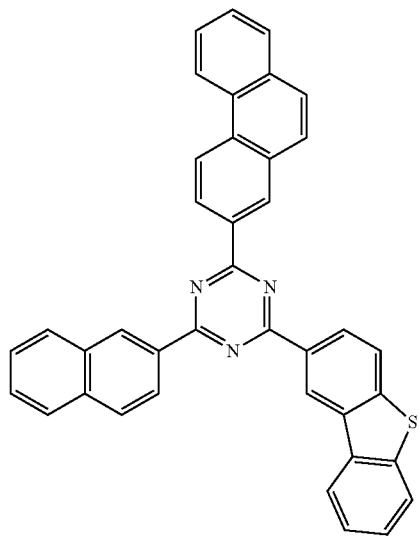
H2-14
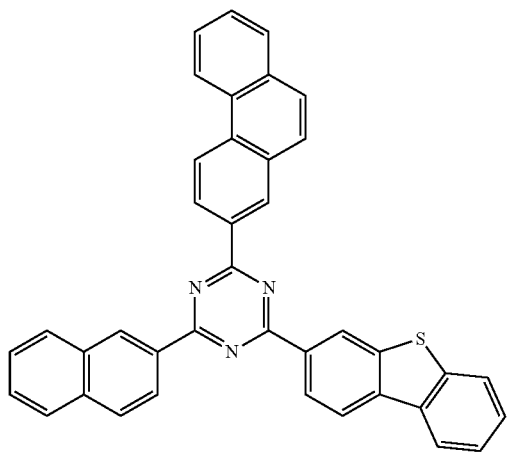
H2-12
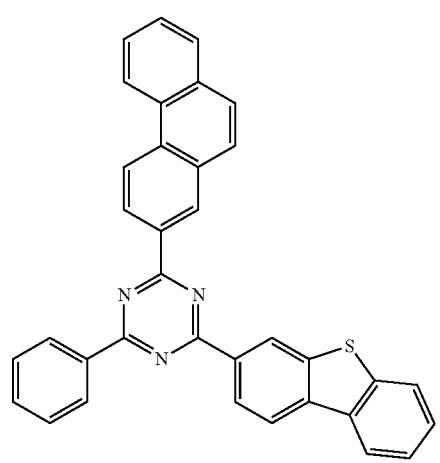
H2-15
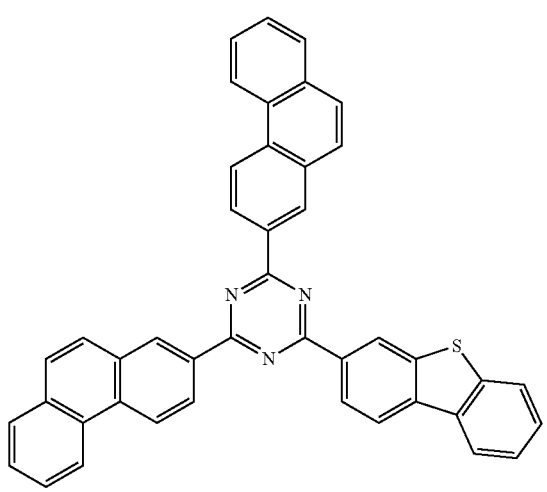
H2-13
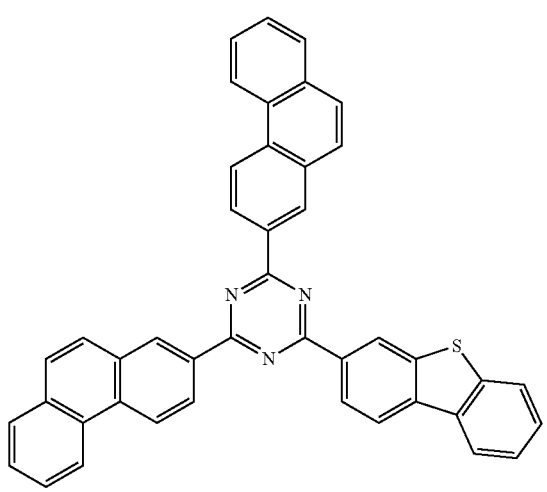
H2-16
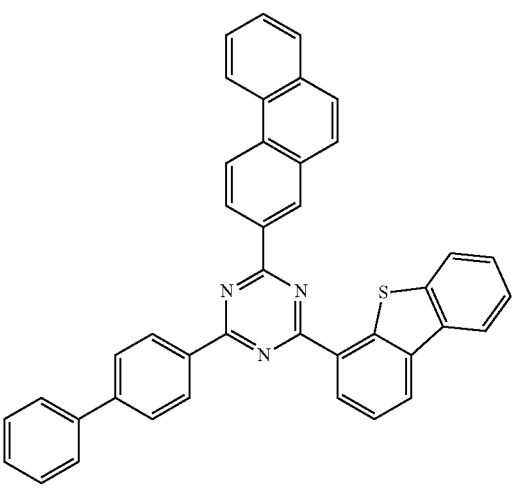

-continued
H2-17
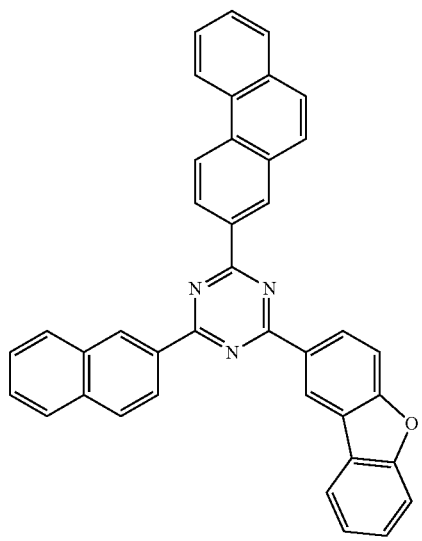
H2-18
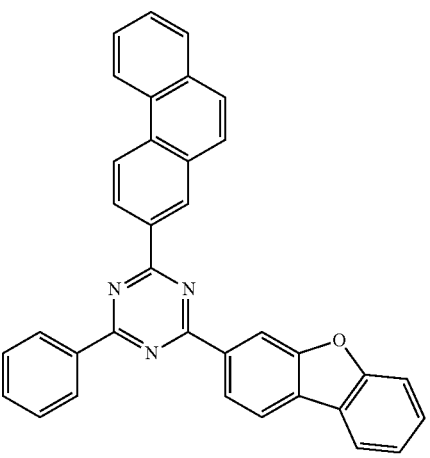
H2-19
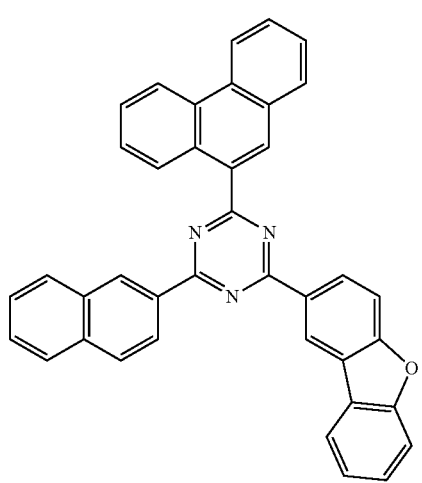
-continued
H2-20
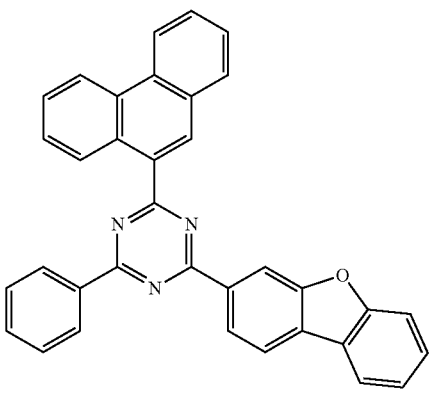
H2-21
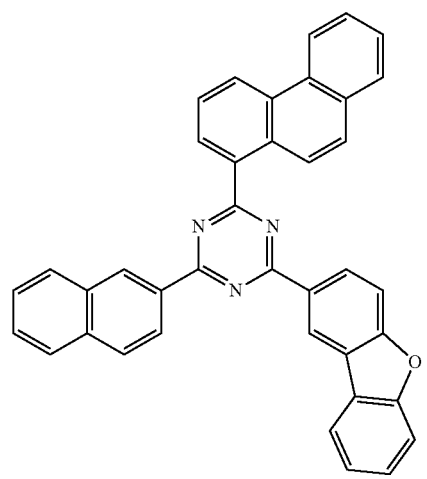
H2-22
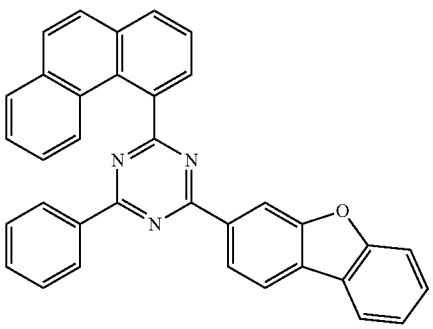
H2-23
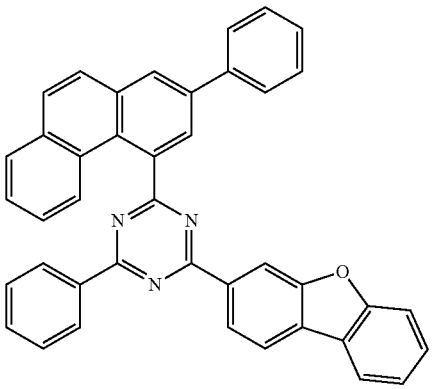

H2-24
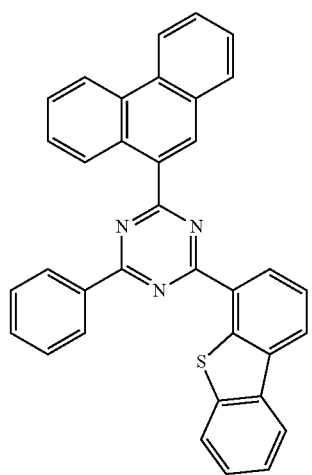
H2-25
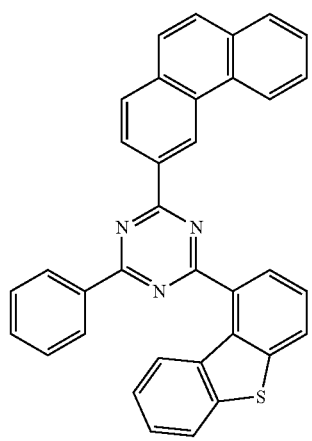
H2-26
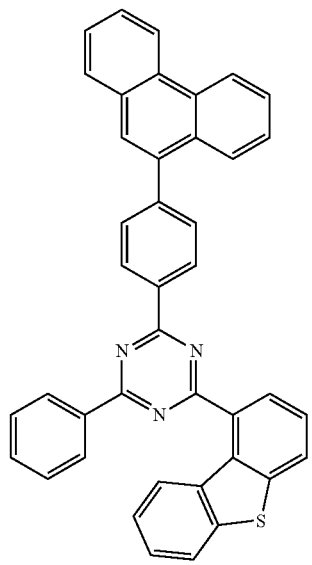
H2-27
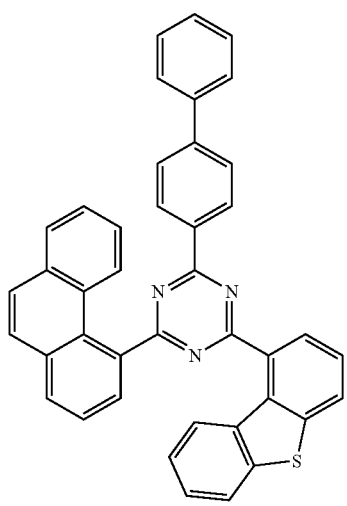
H2-28
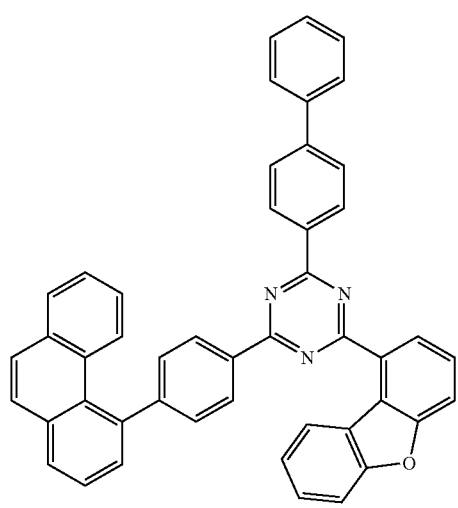
H2-29
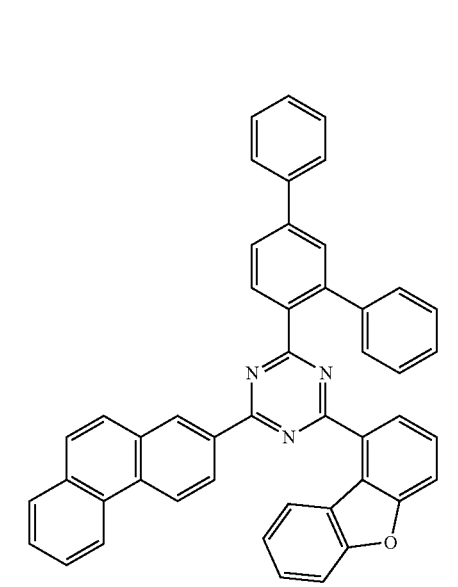

H2-30
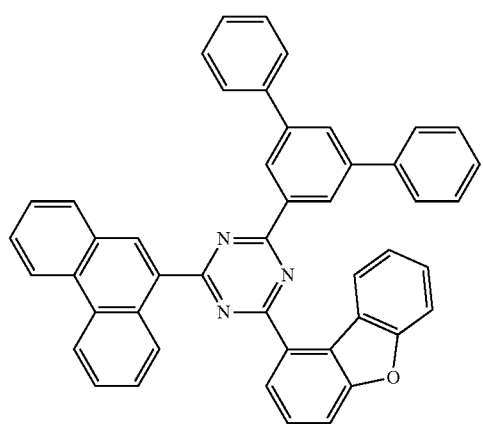
H2-31
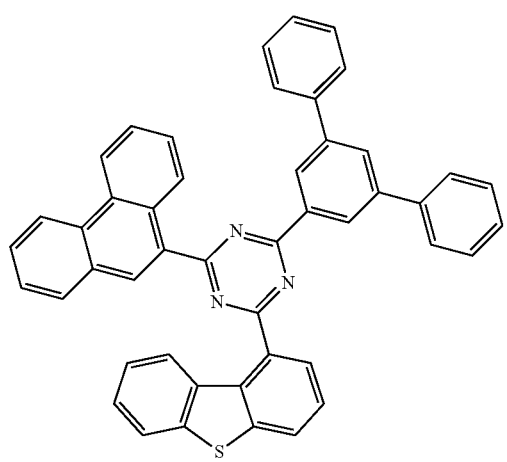
H2-32
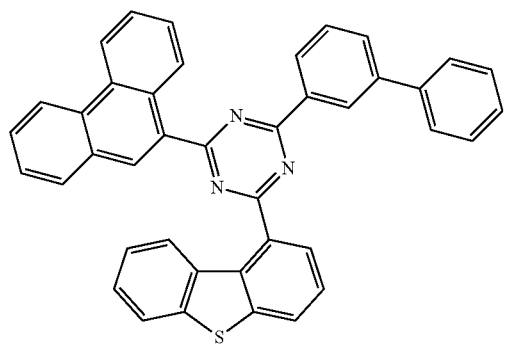
H2-33
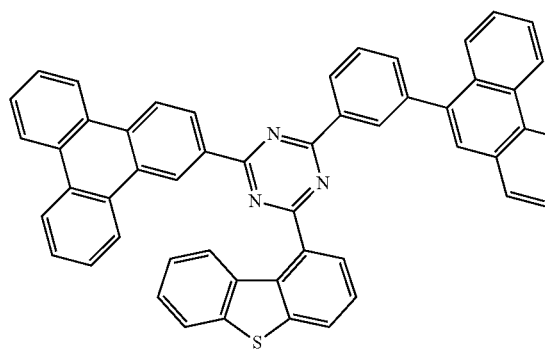
H2-34
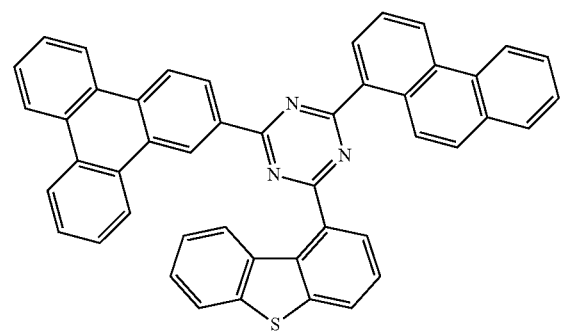
H2-35
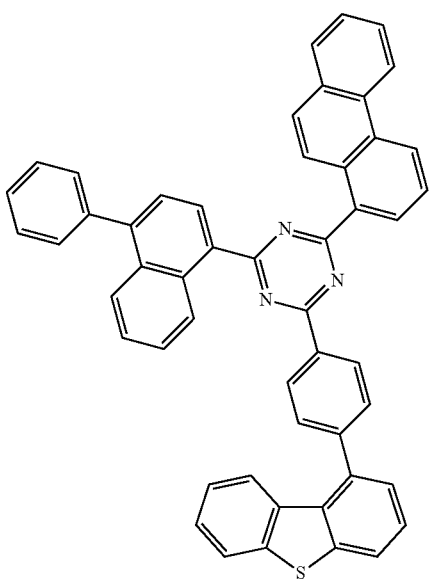
H2-36
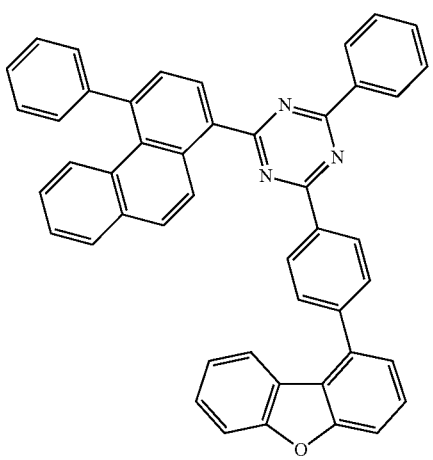

H2-37
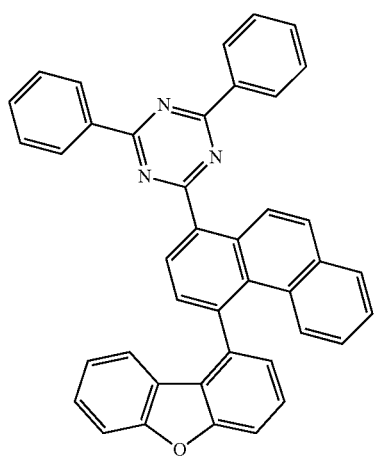
H2-38
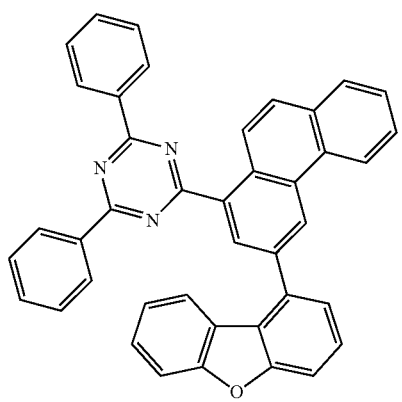
H2-39
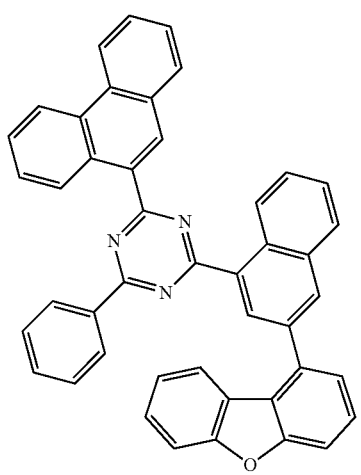
H2-40
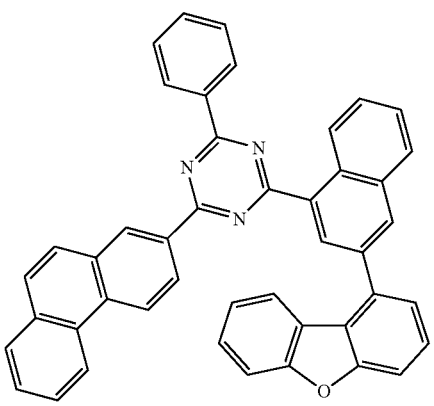
H2-41
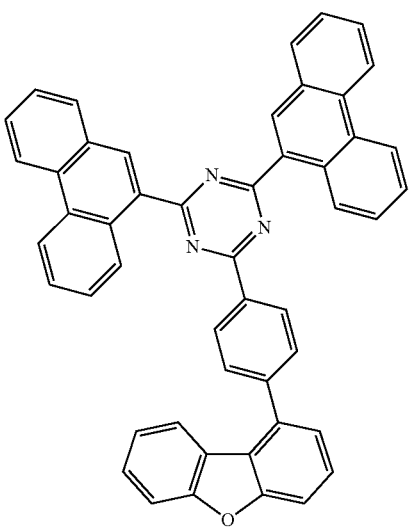
H2-42
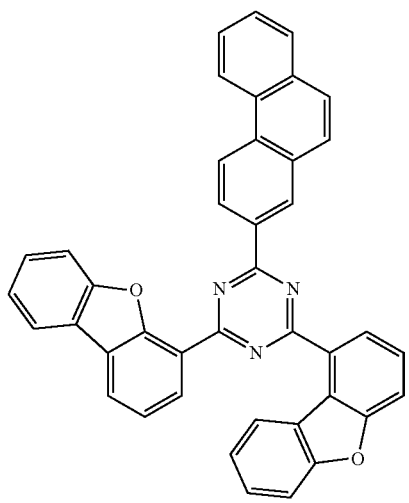

H2-43
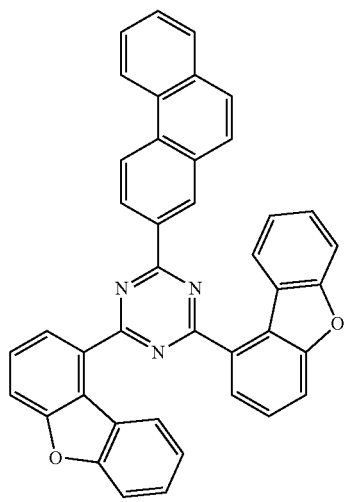
H2-44
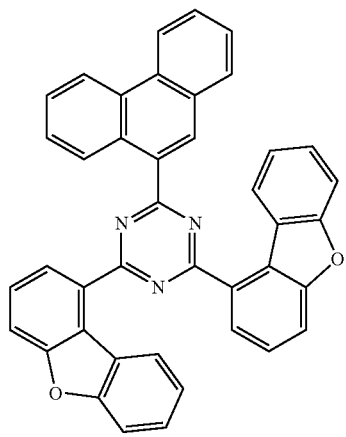
H2-45
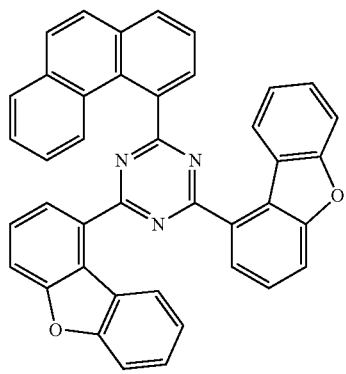
H2-46
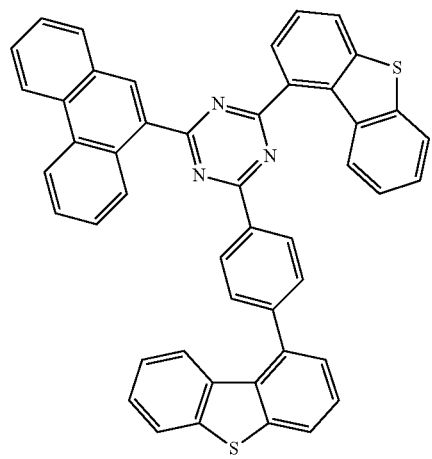
H2-47
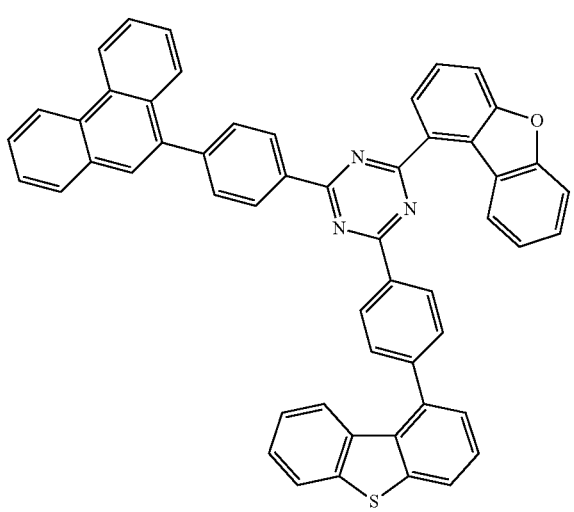
H2-48
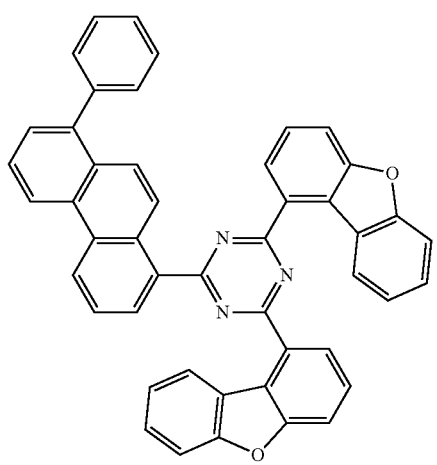

H2-49
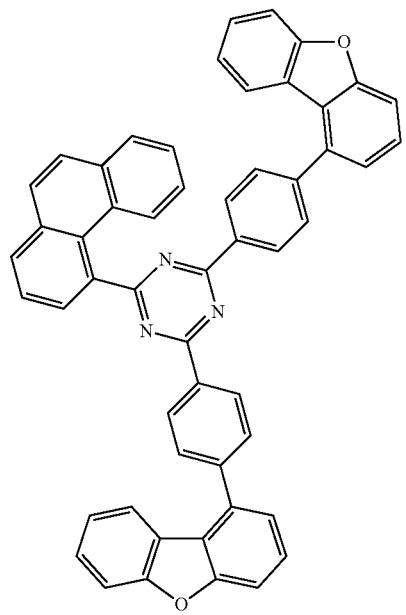
H2-50
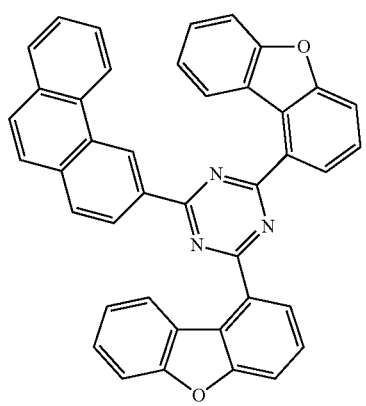
H2-51
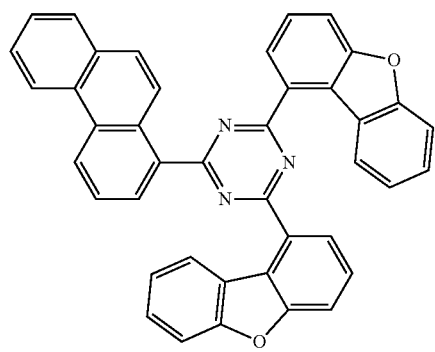
H2-52
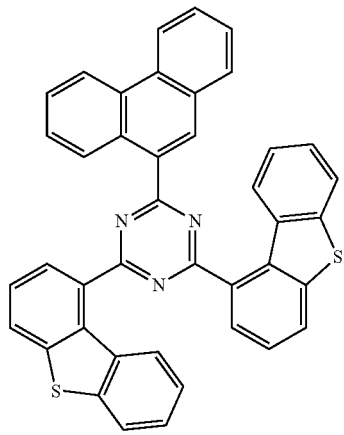
H2-53
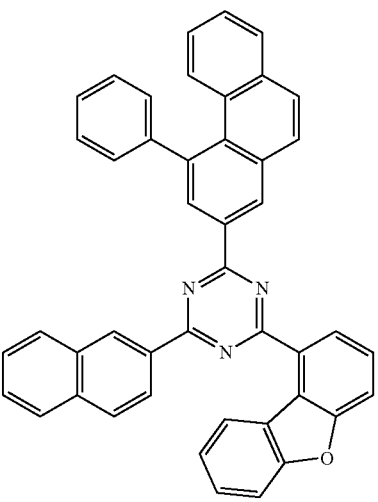
H2-54
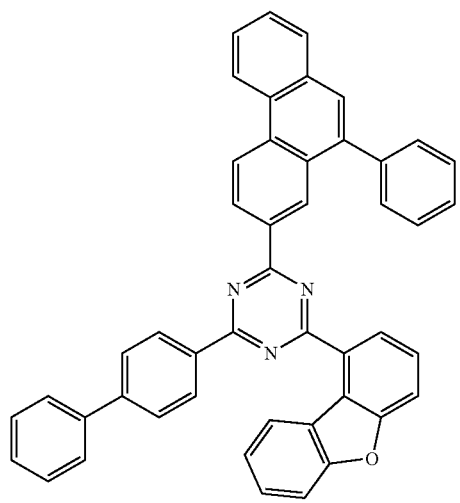

-continued
H2-55
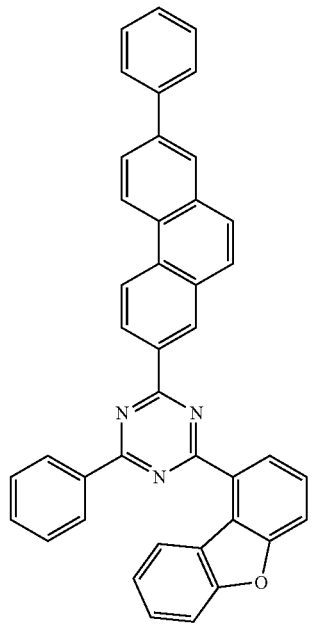
H2-56
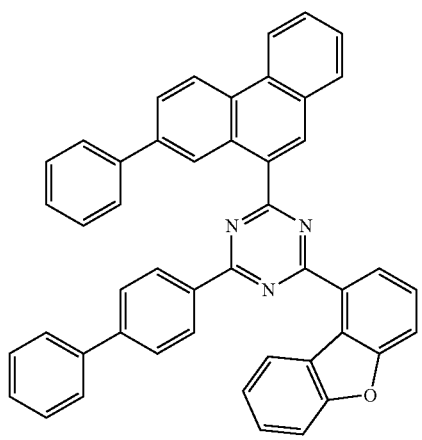
H2-57
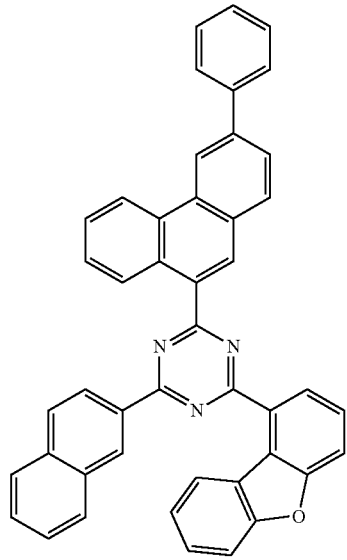
-continued
H2-58
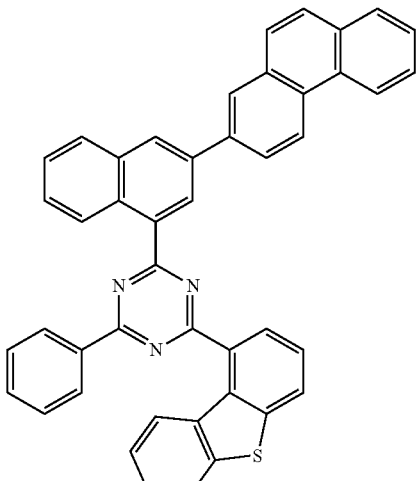
H2-59
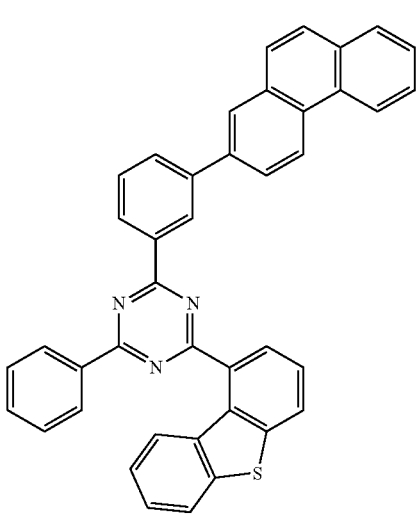
H2-60
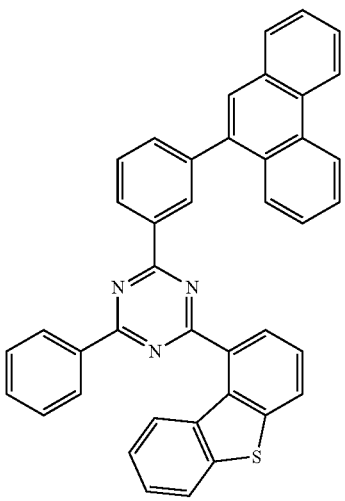

H2-61
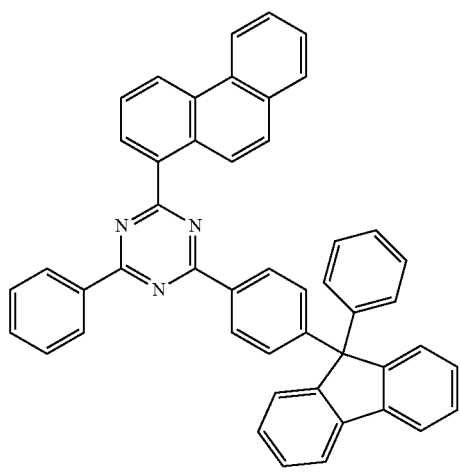
H2-64
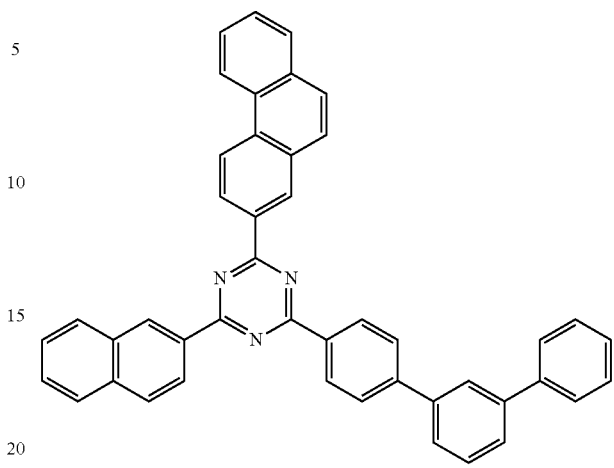
H2-62
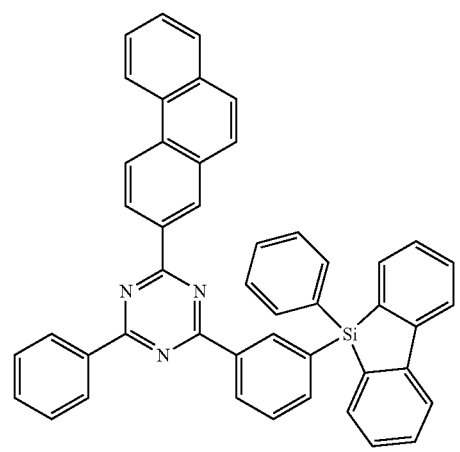
H2-65
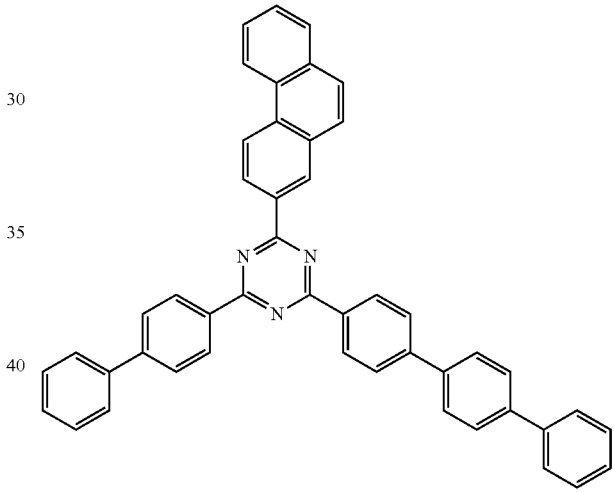
H2-63
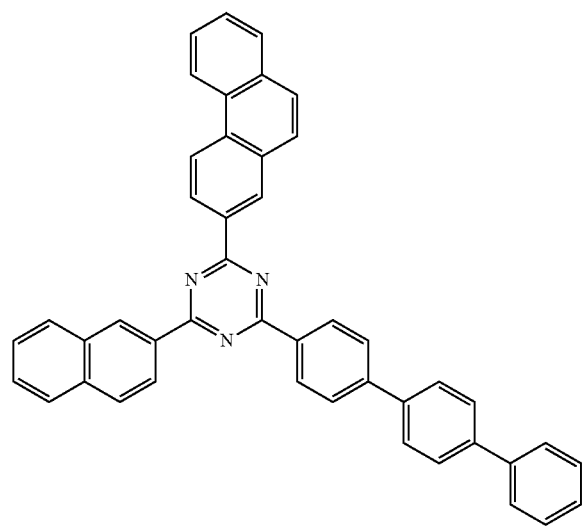
H2-66
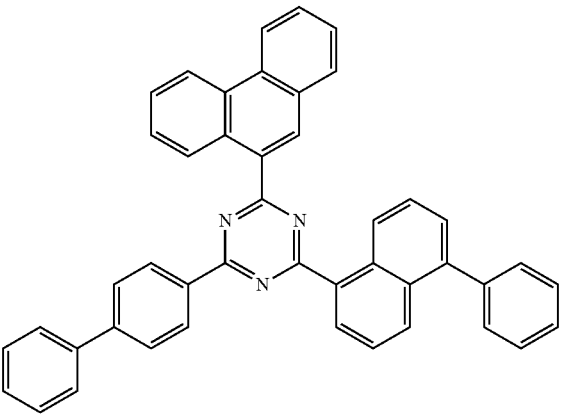

H2-67
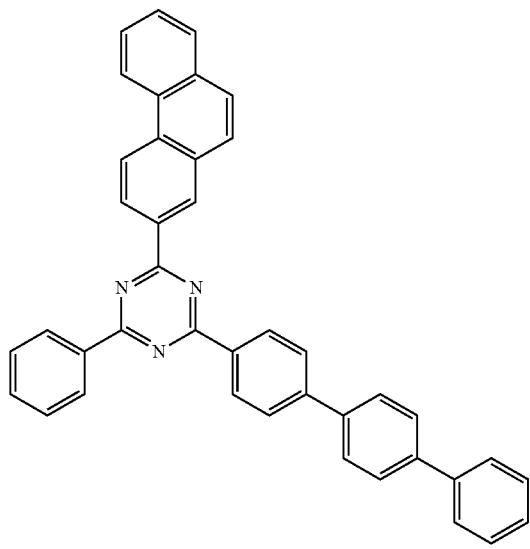
H2-68
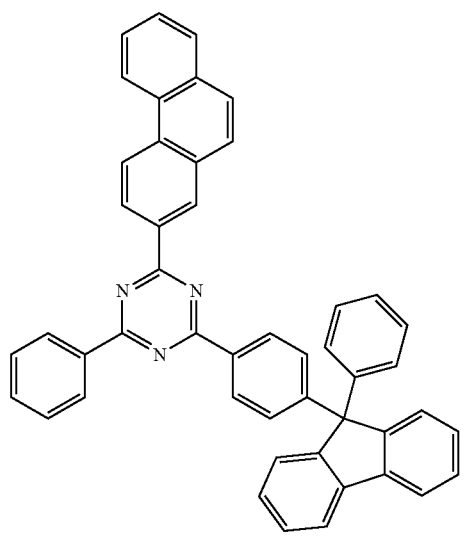
H2-69
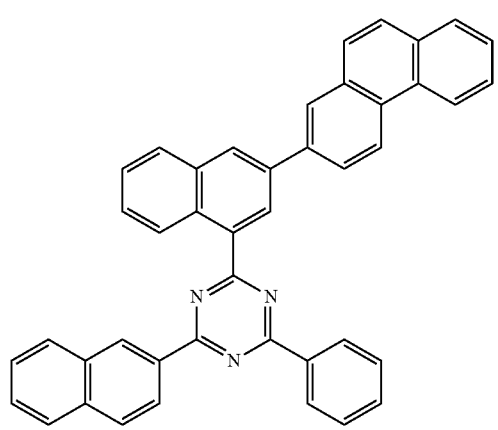
H2-70
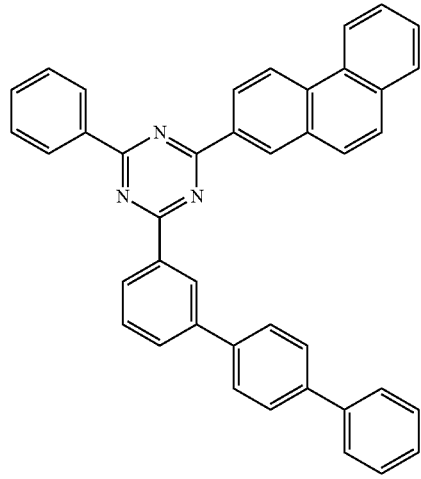
H2-71
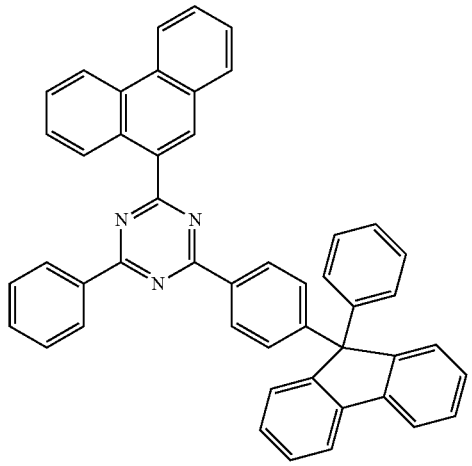
H2-72
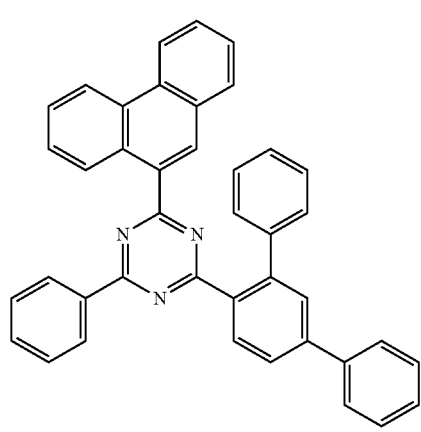

H2-73
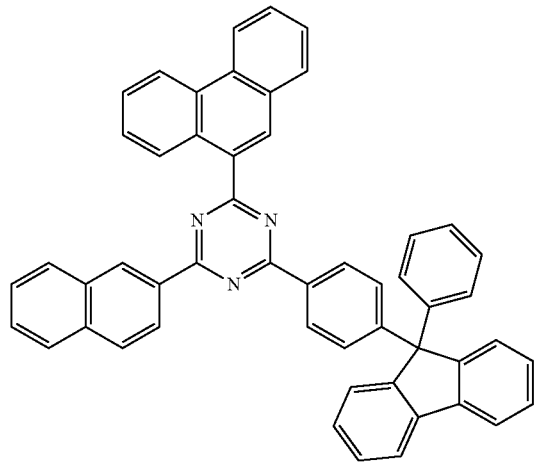
H2-76
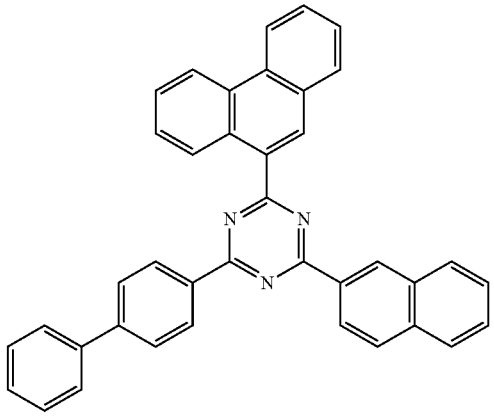
H2-74
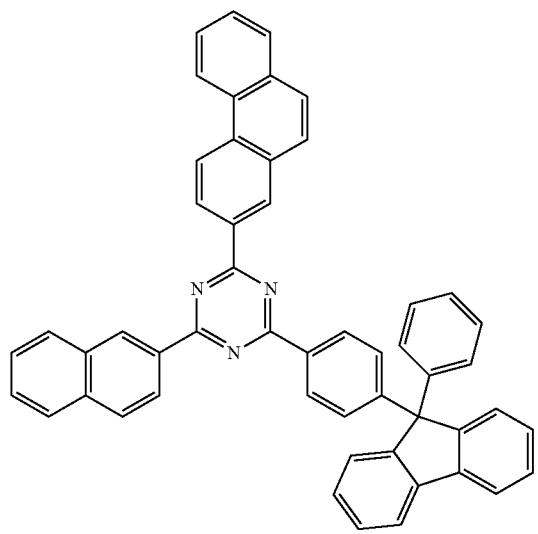
H2-77
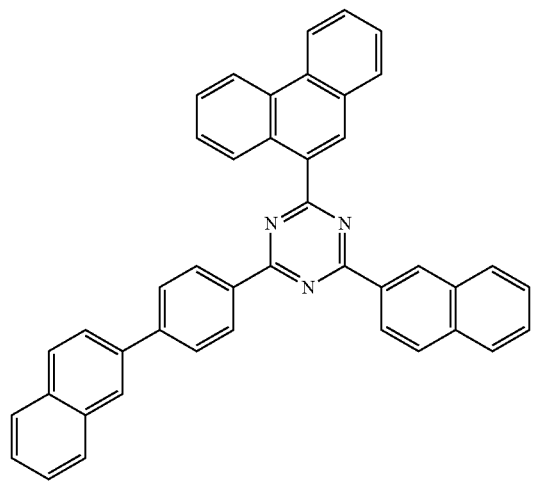
H2-75
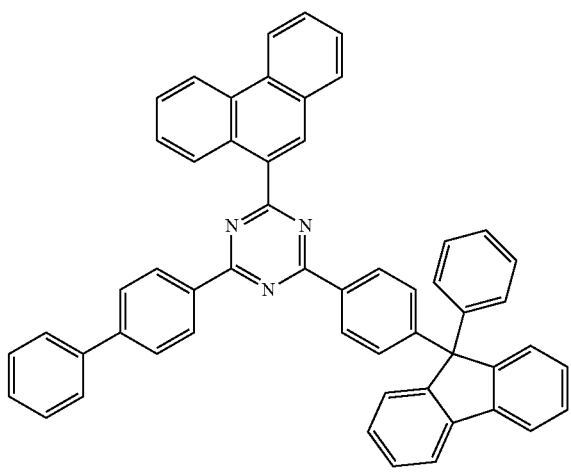
H2-78
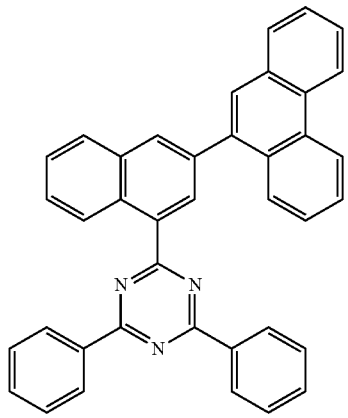

-continued
H2-79
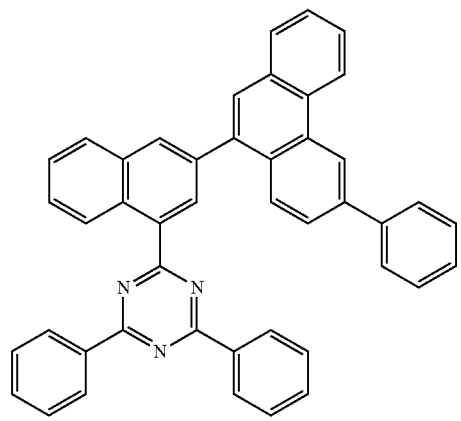
H2-80
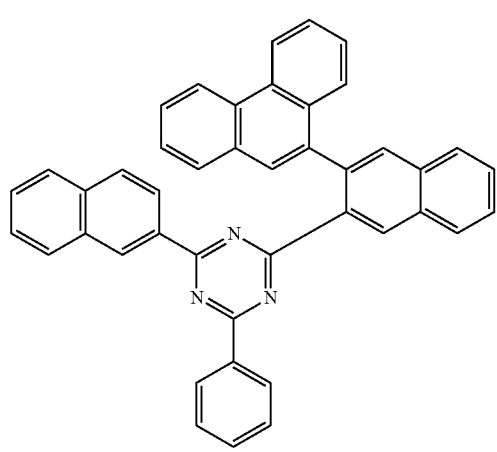
H2-81
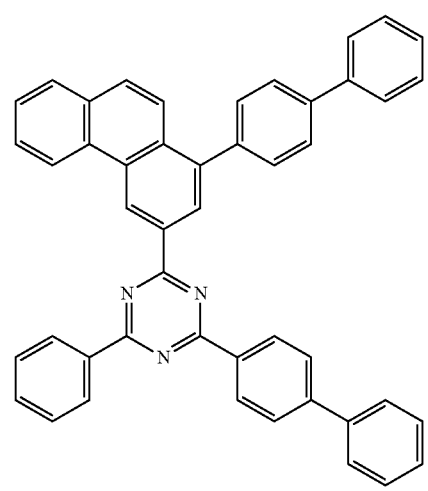
-continued
H2-82
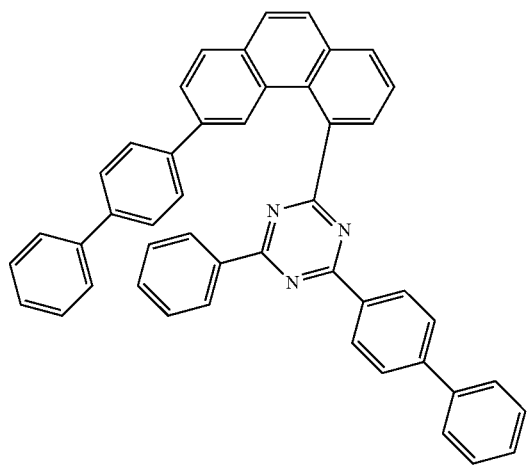
H2-83
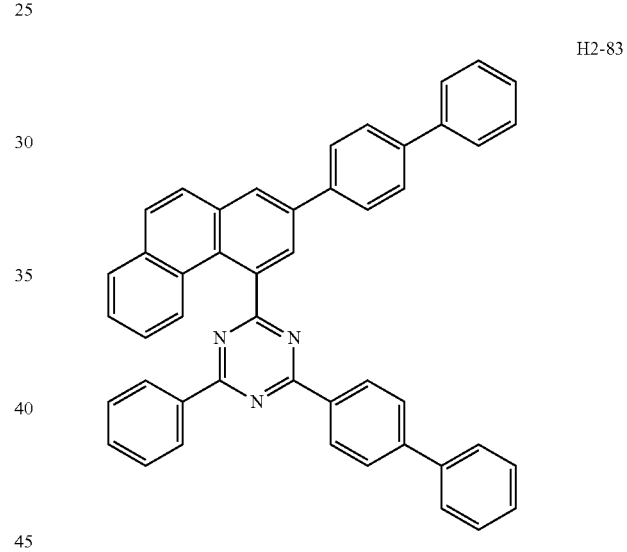
H2-84
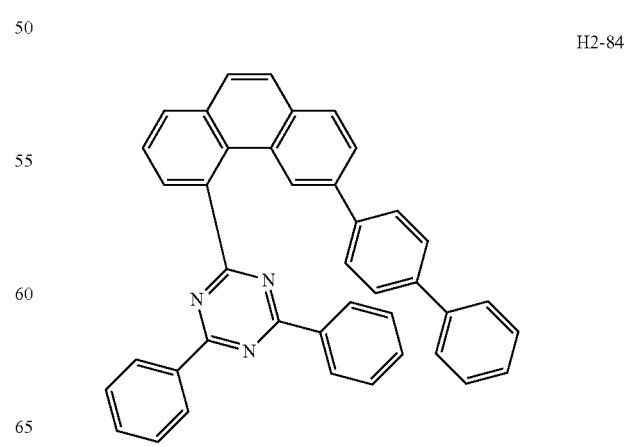

H2-85
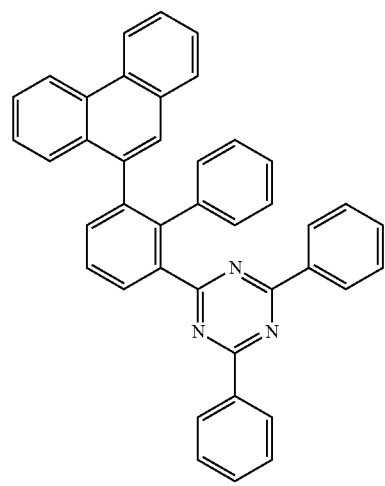
H2-86
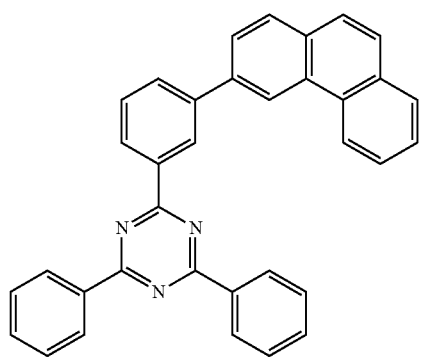
H2-87
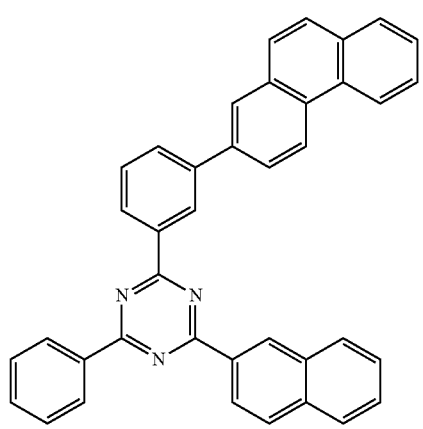
H2-88
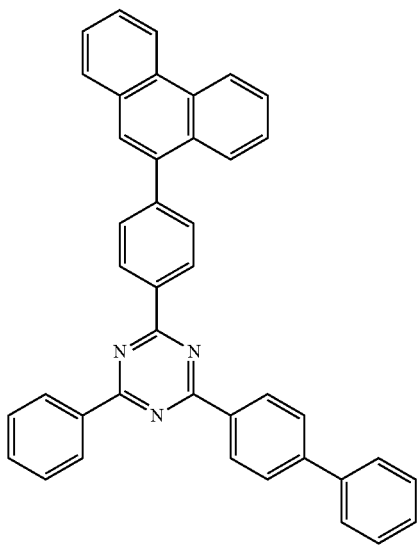
H2-89
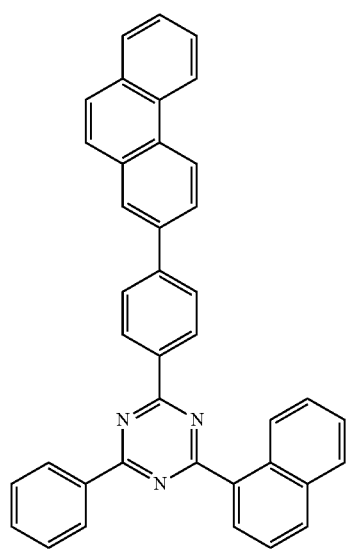
H2-90
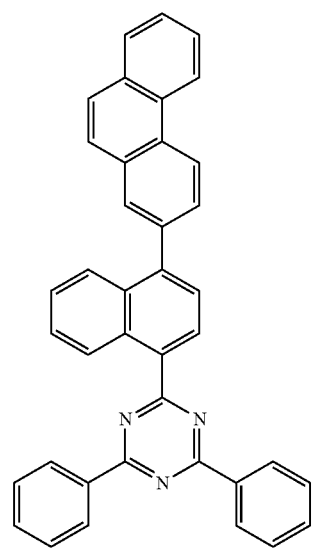

H2-91
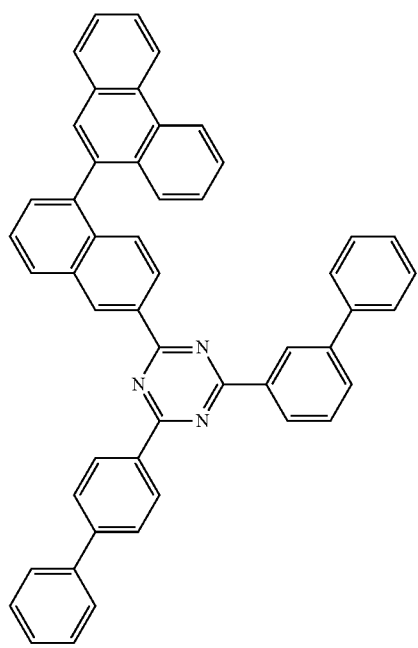
H2-92
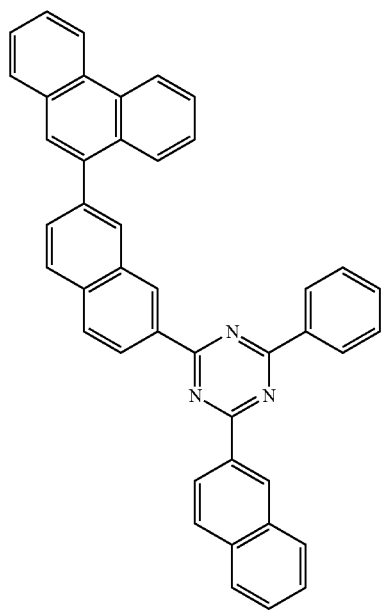
H2-93
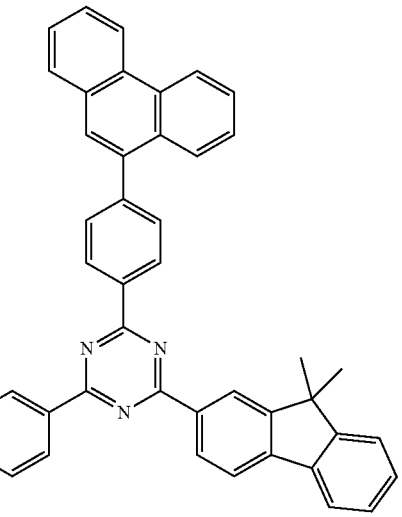
H2-94
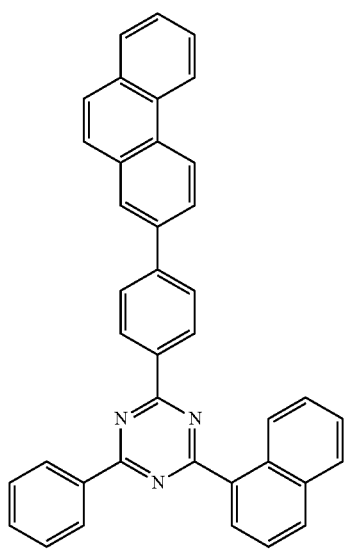
H2-95
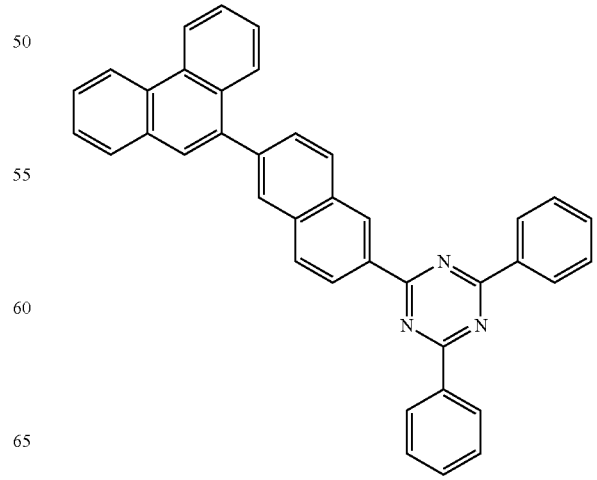

-continued
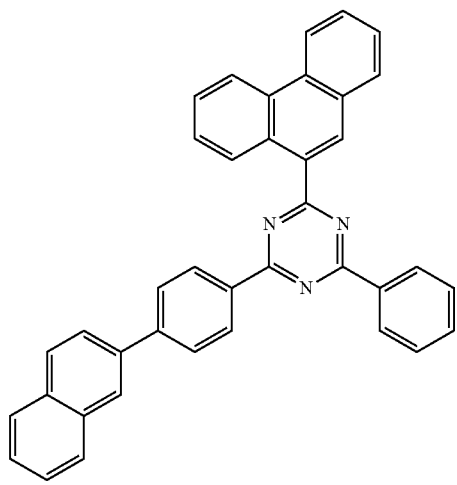
H2-96
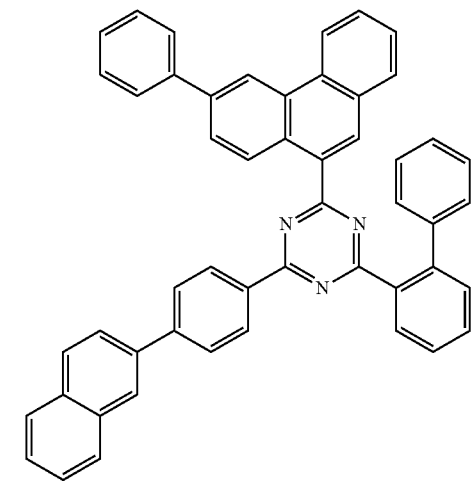
H2-99
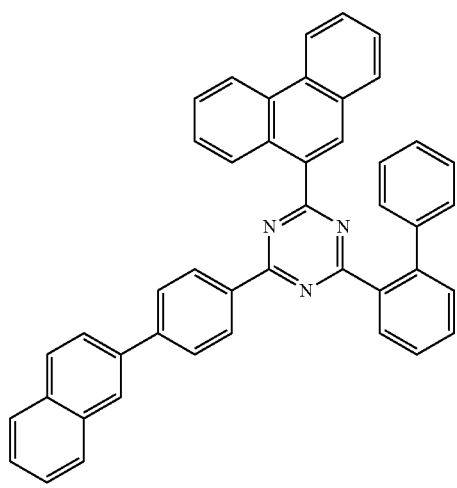
H2-97
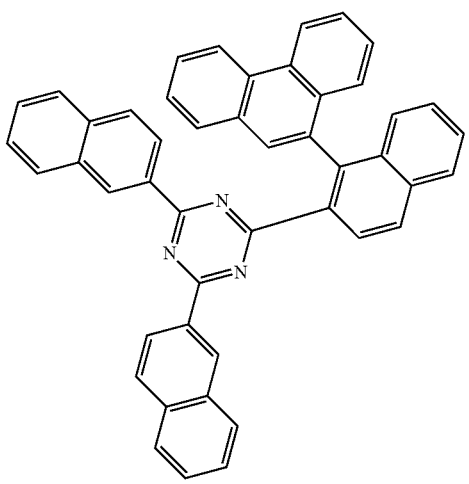
H2-100
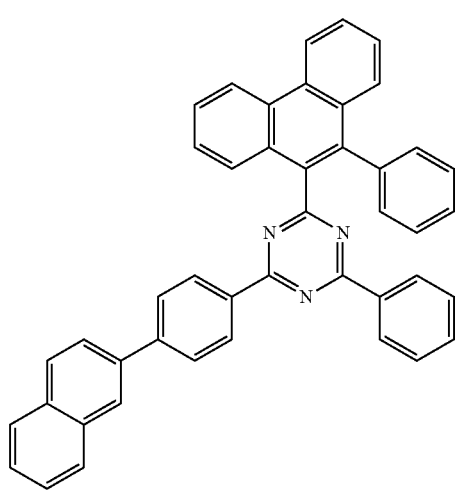
H2-98
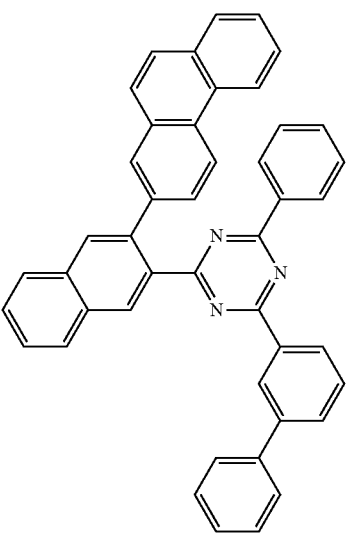
H2-101

H2-102
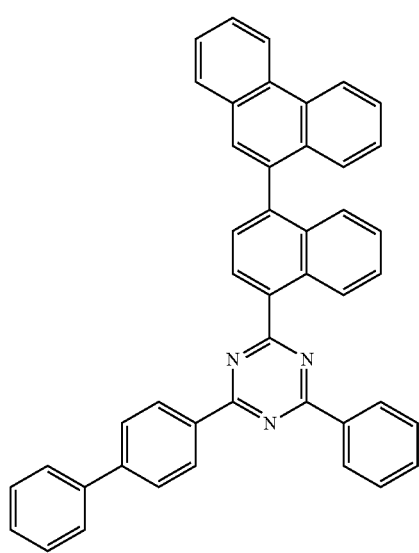
H2-103
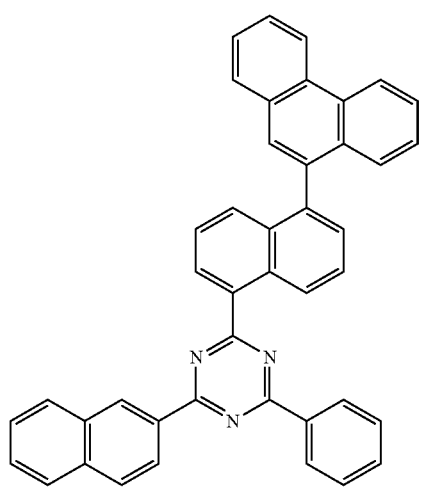
H2-104
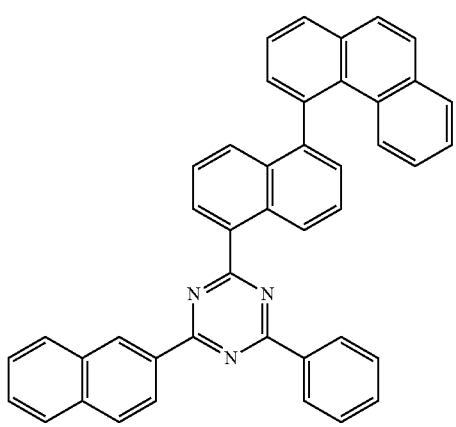
H2-105
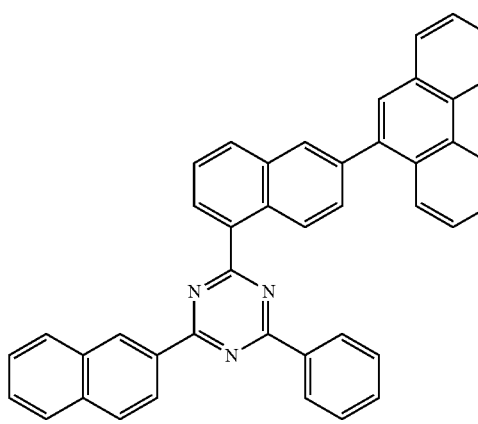
H2-106
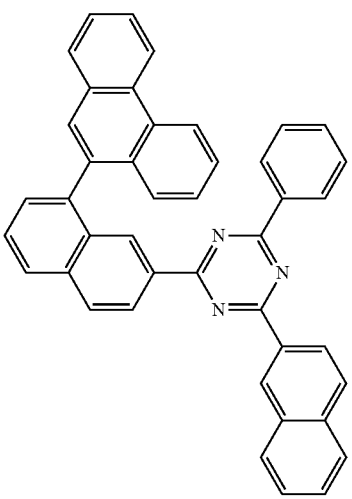
H2-107
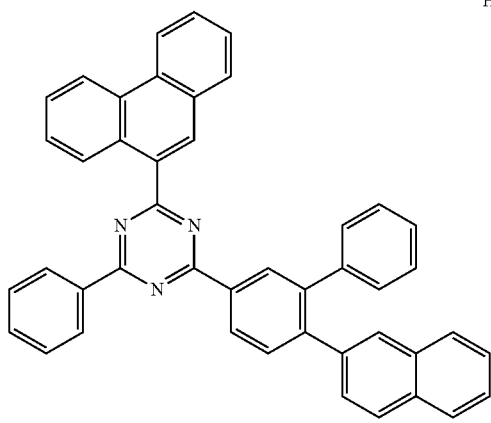

H2-108
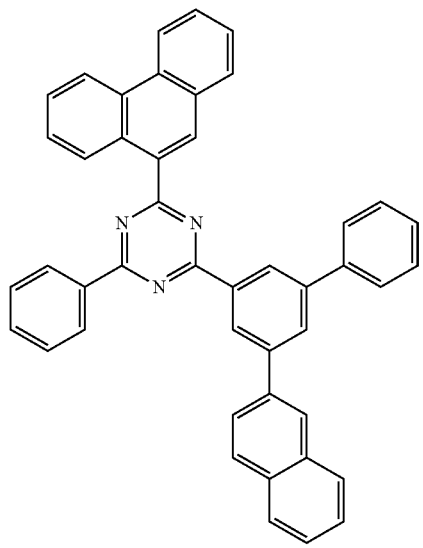
H2-111
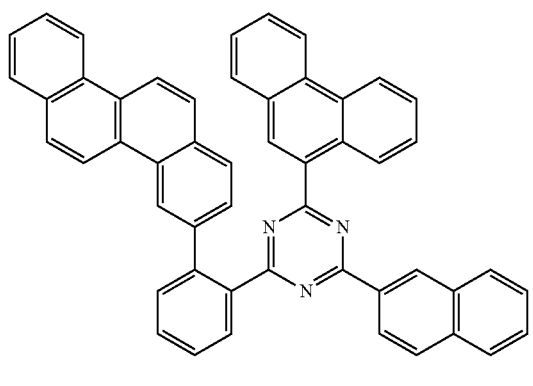
H2-109
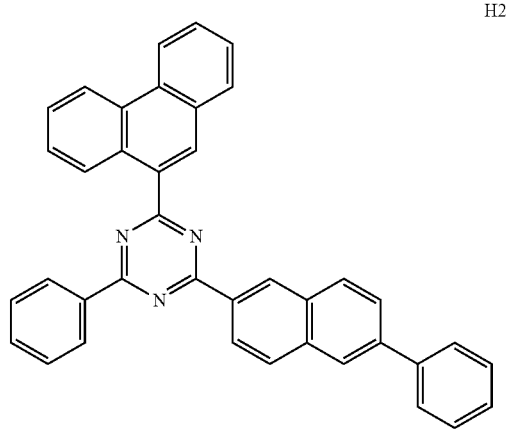
H2-112
H2-110
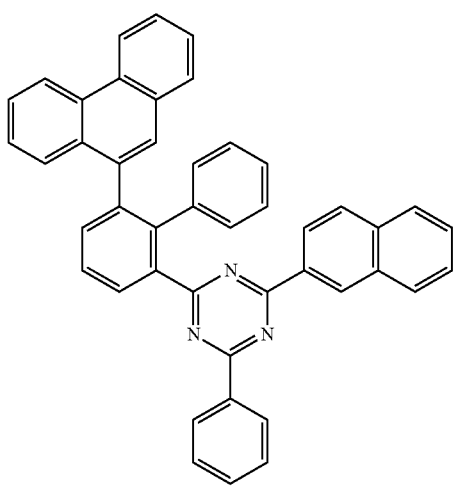
H2-113
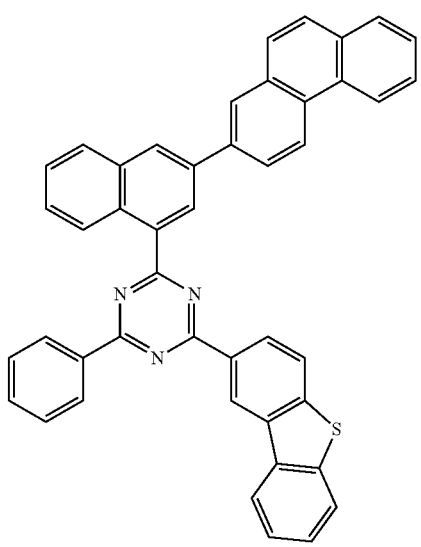

H2-114
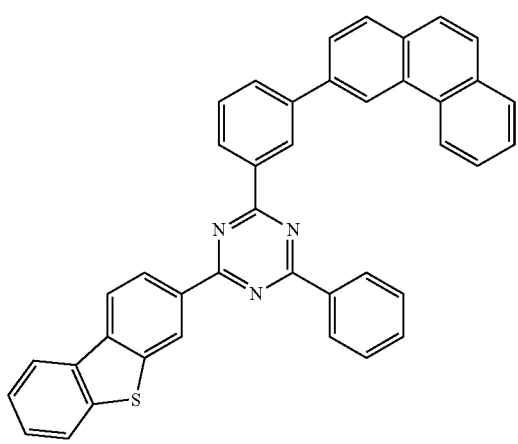
H2-117
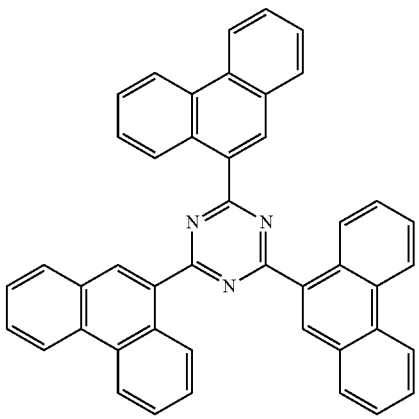
H2-115
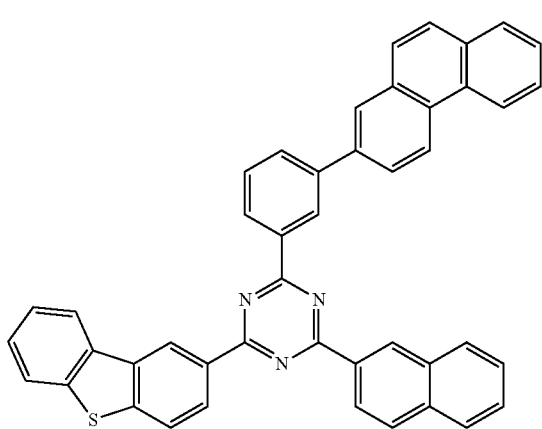
H2-118
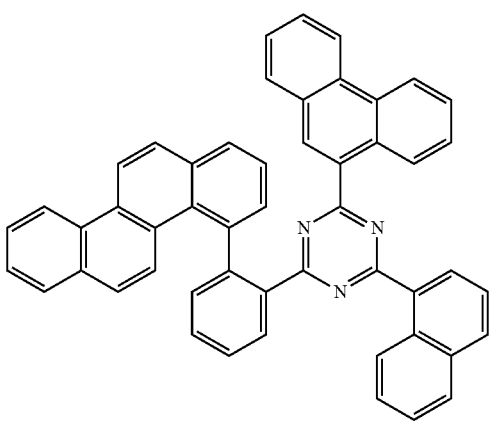
H2-116
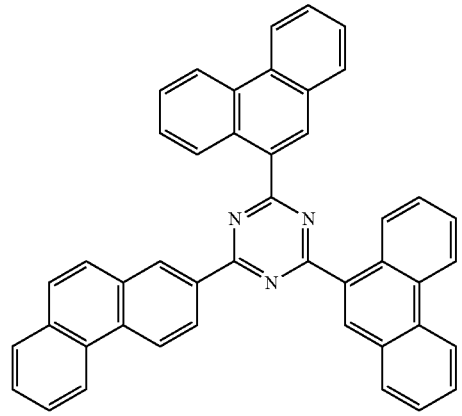
H2-119
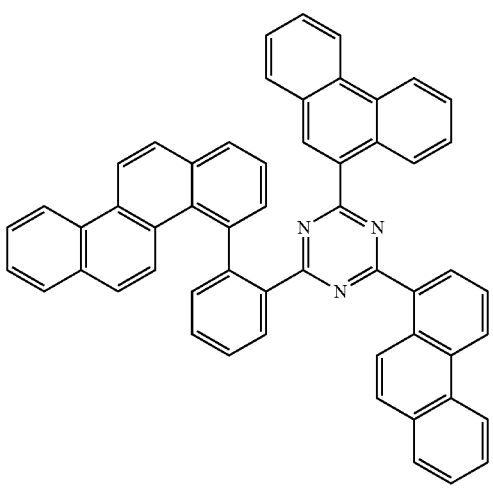

H2-120
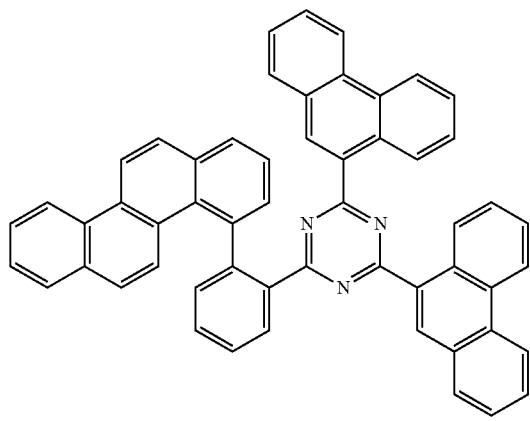
H2-123
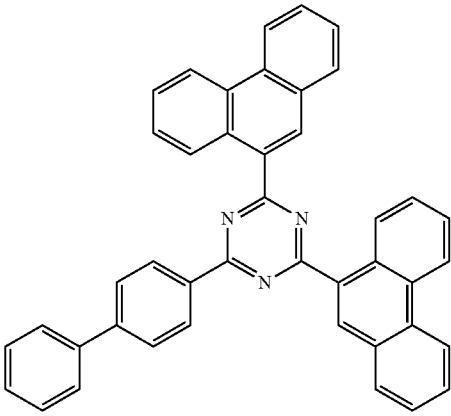
H2-121
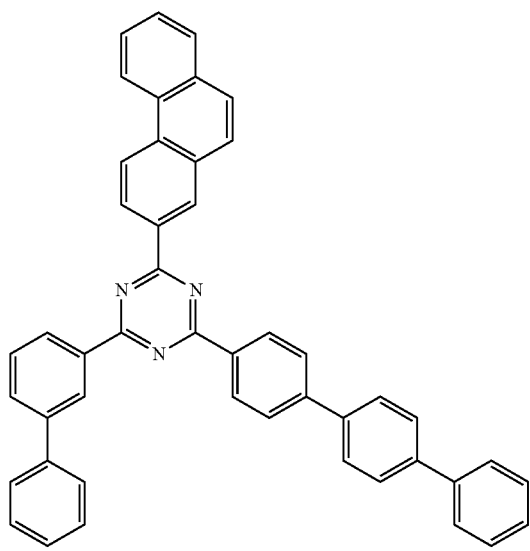
H2-124
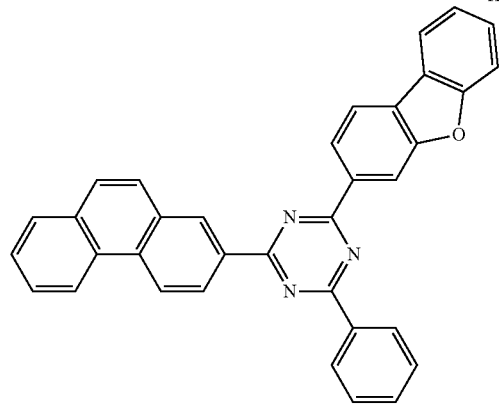
H2-122
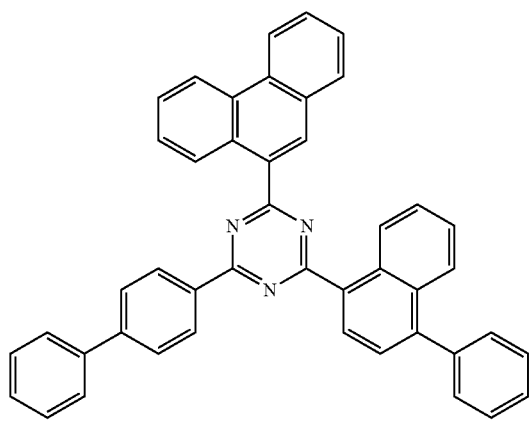
H2-125
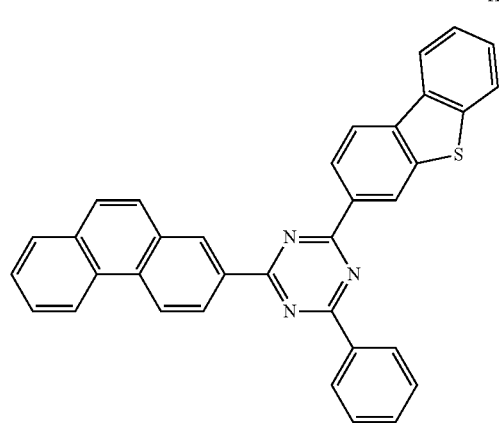

H2-126
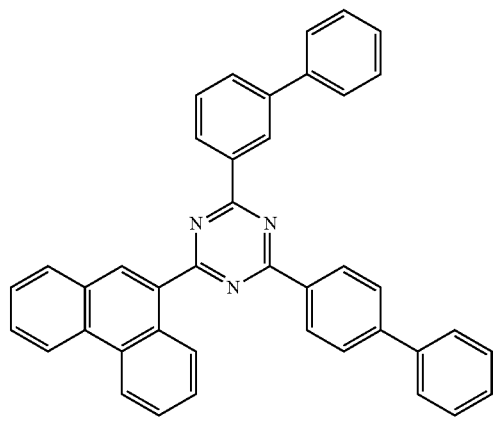
H2-127
H2-129
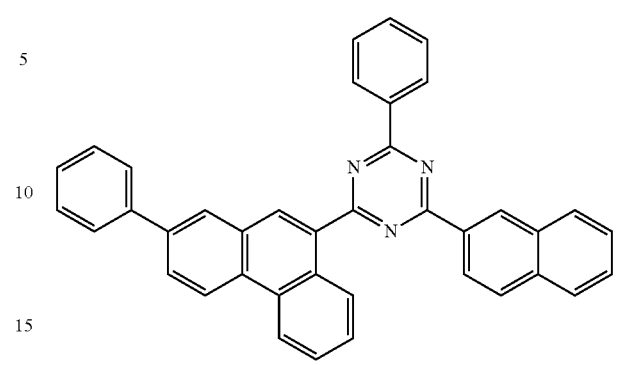
H2-130
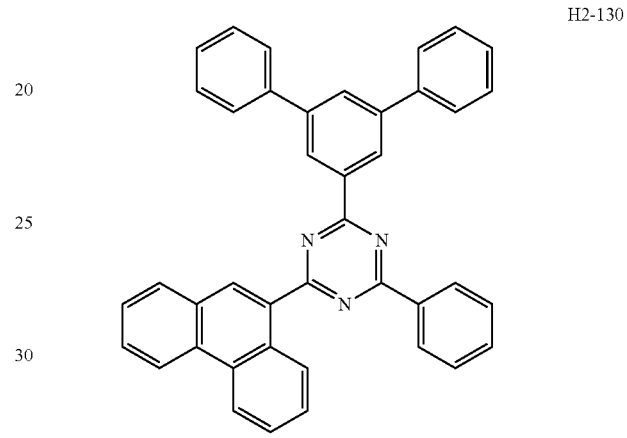
H2-128
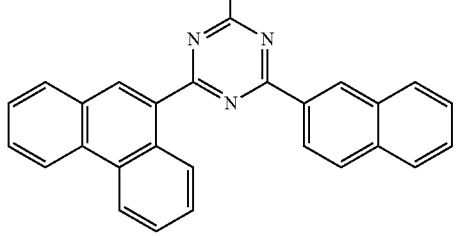
H2-131
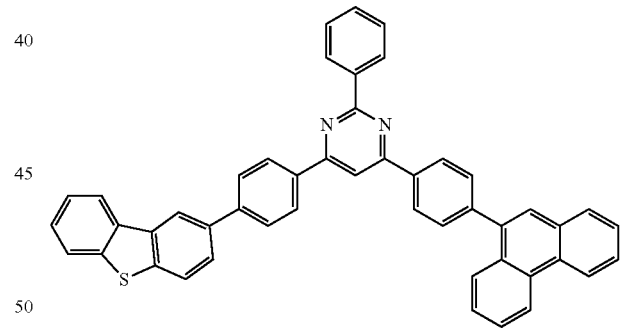
H2-132
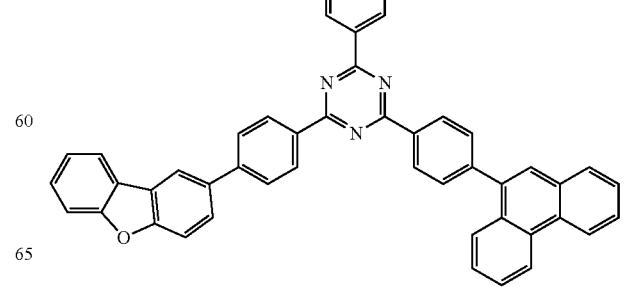

H2-133
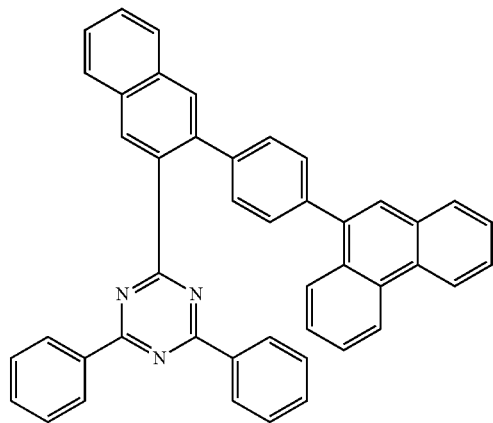
H2-134
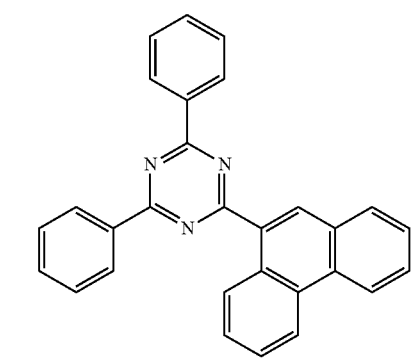
H2-135
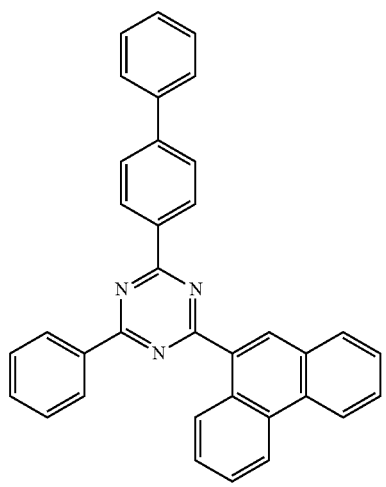
H2-136
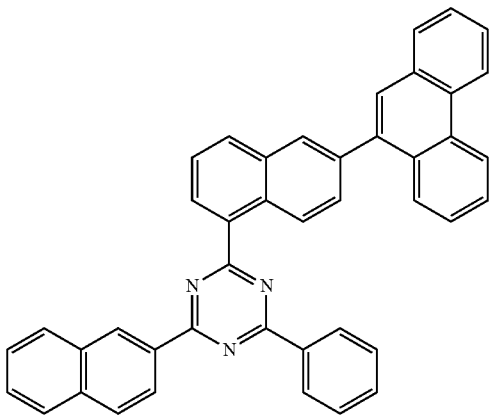
H2-137
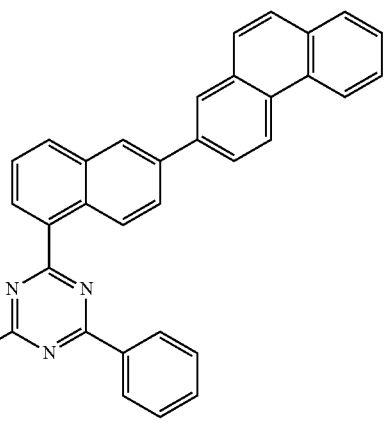
H2-138
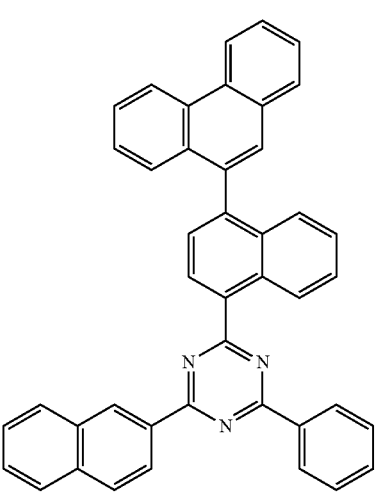

H2-139
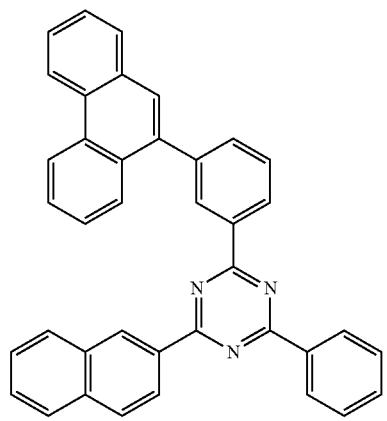
H2-140
H2-141
H2-142
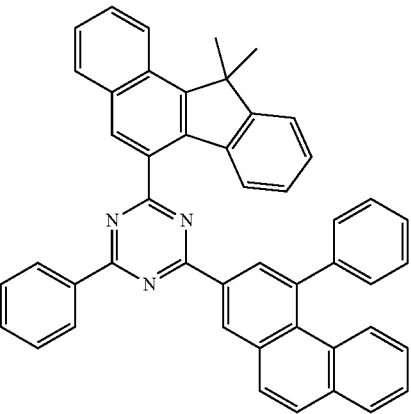
H2-143
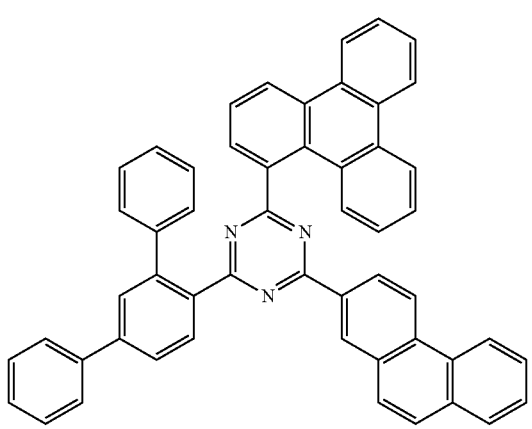
H2-144
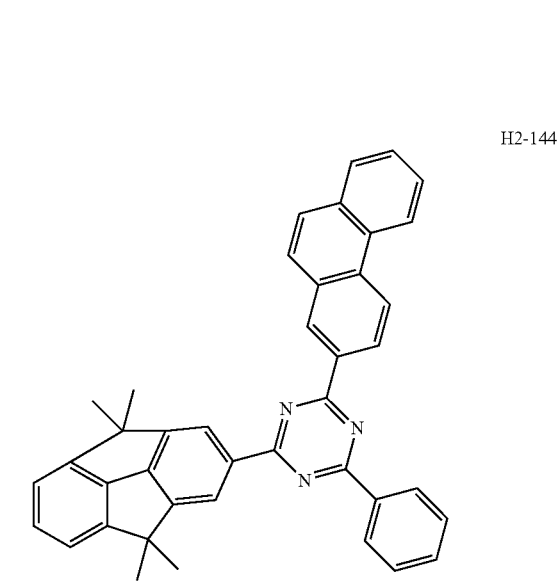

H2-145
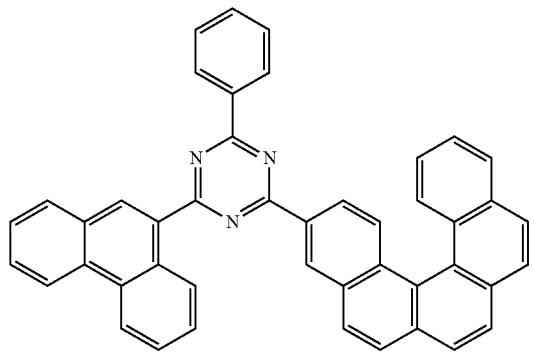
H2-146
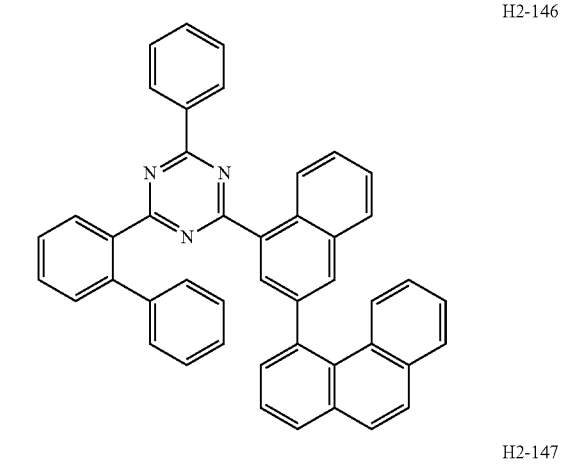
H2-147
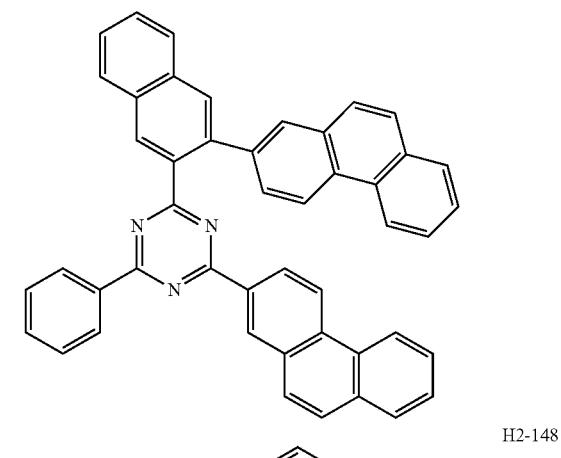
H2-148
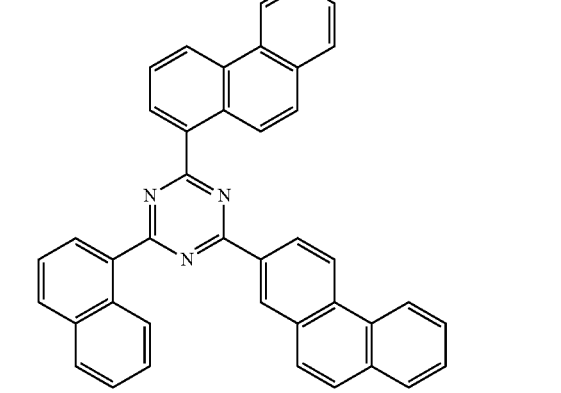
H2-149
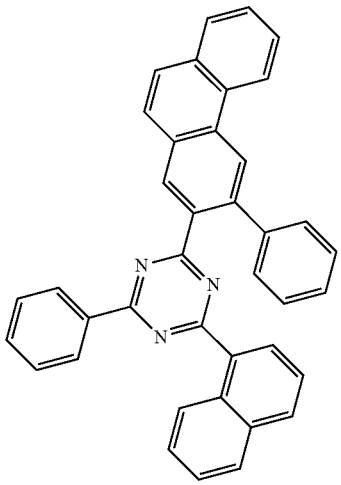
H2-150
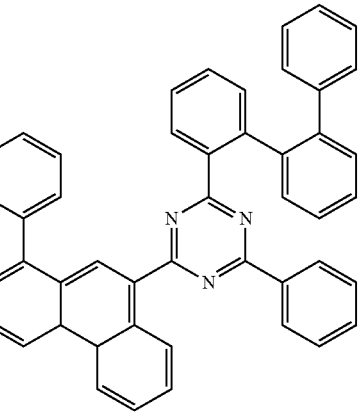
H2-151
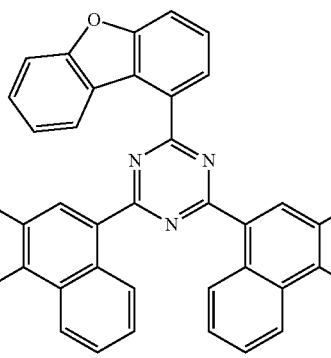
H2-152
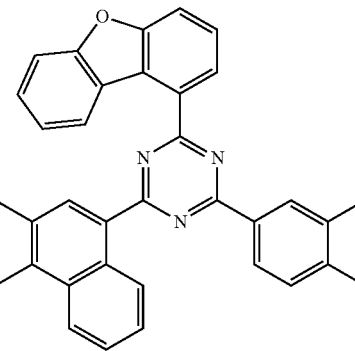

H2-153
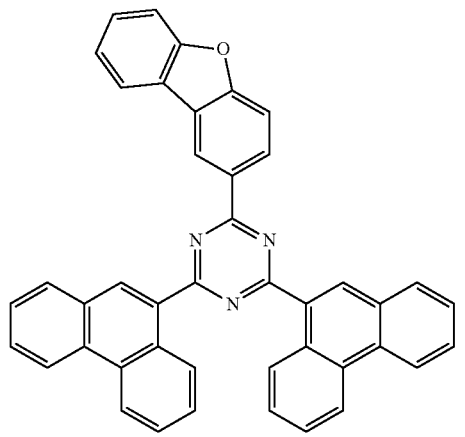
H2-154
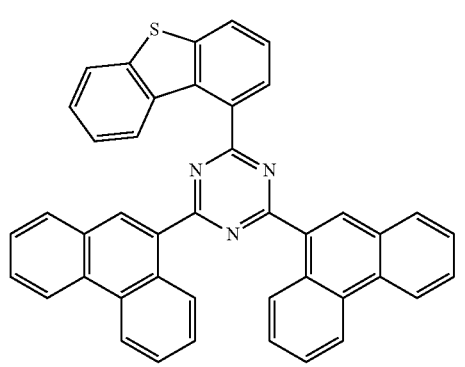
H2-155
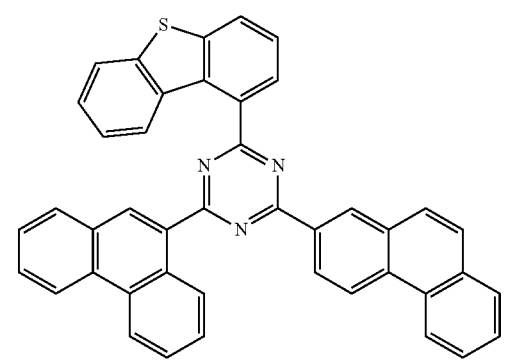
H2-156
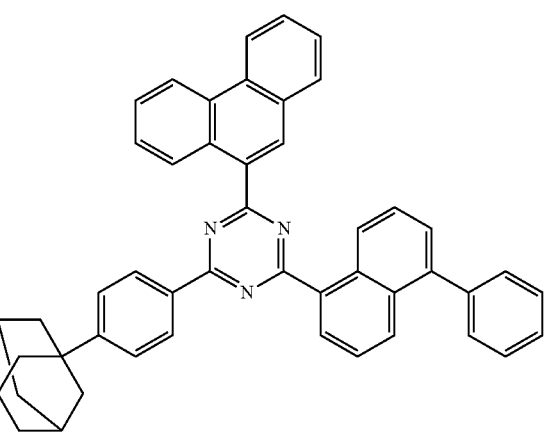
H2-157
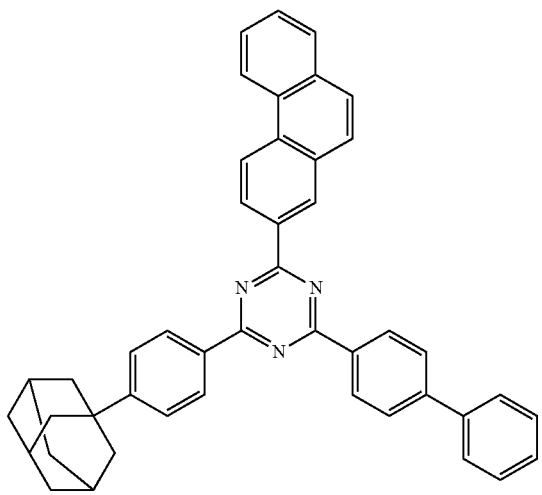
H2-158
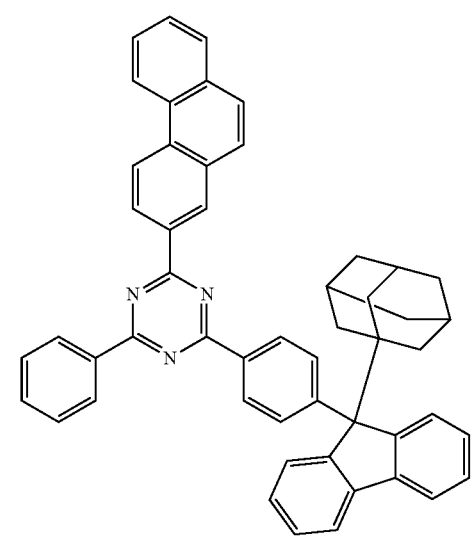
H2-159
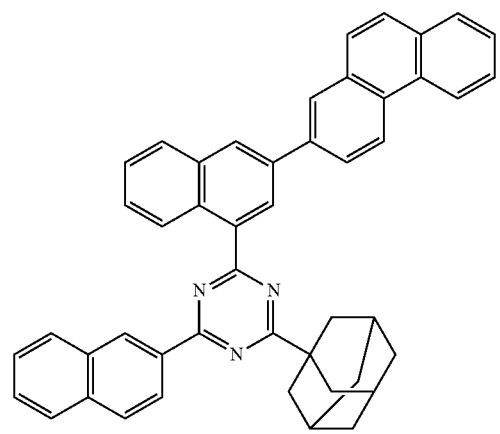

H2-160
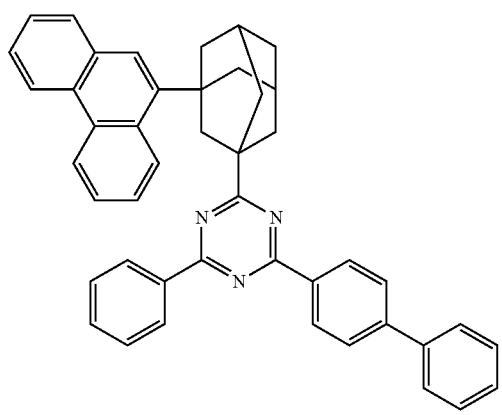
H2-161
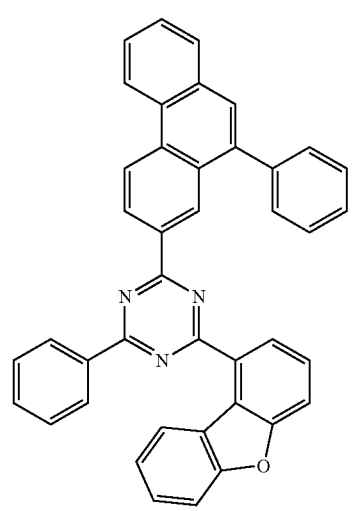
H2-162
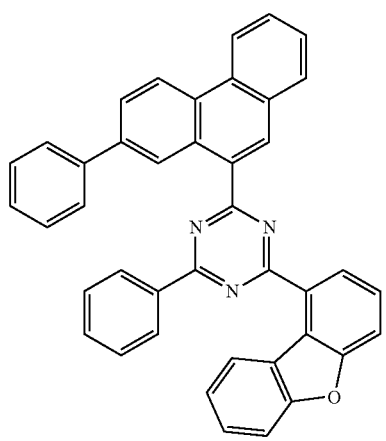
H2-163
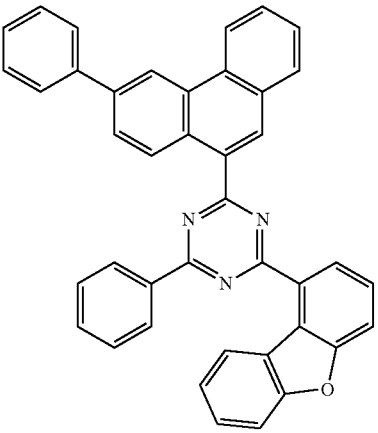
H2-164
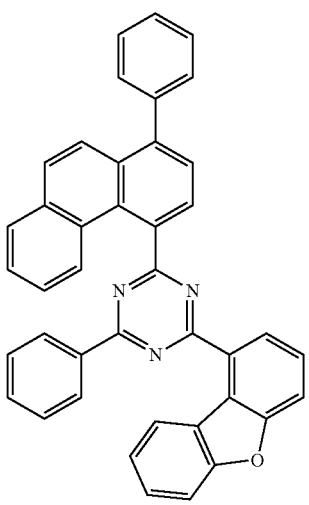
H2-165
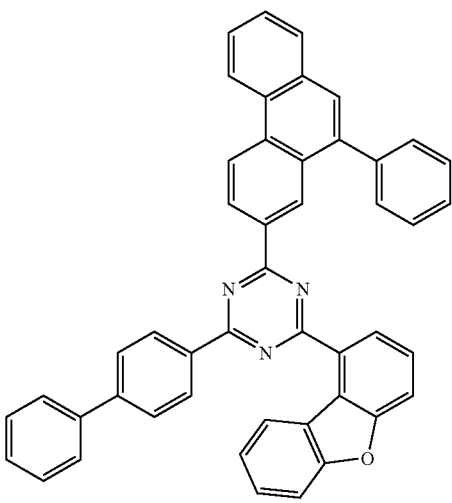

H2-166
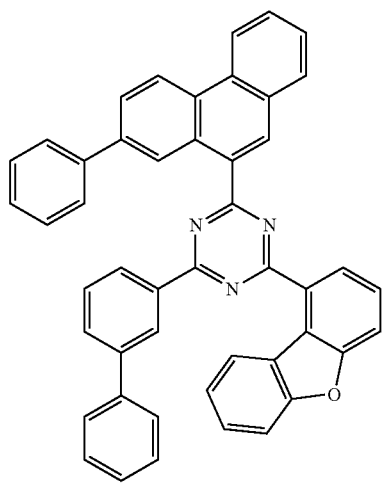
H2-169
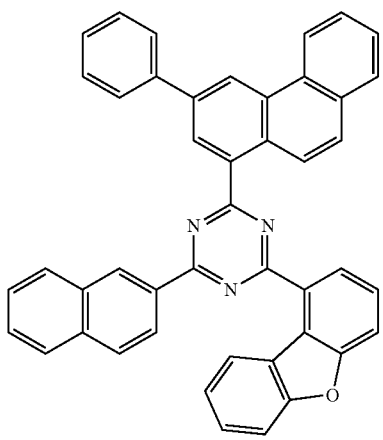
H2-167
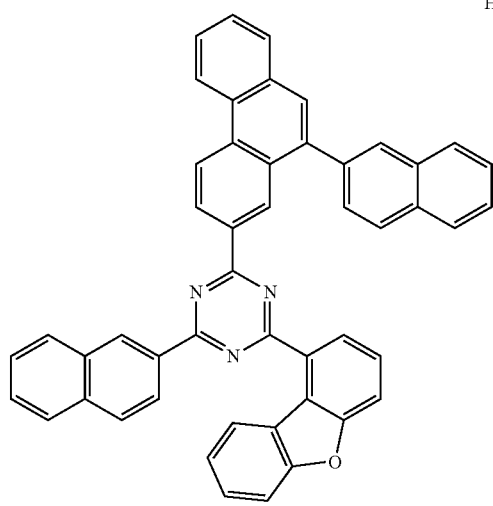
H2-170
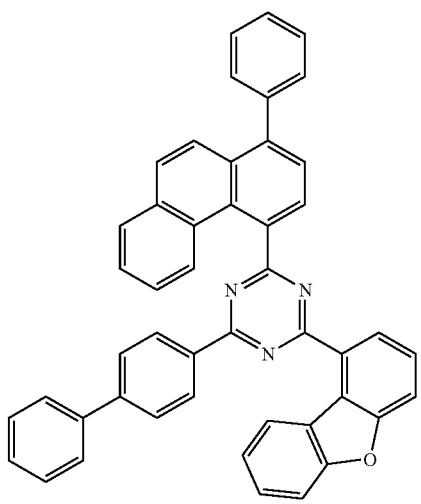
H2-168
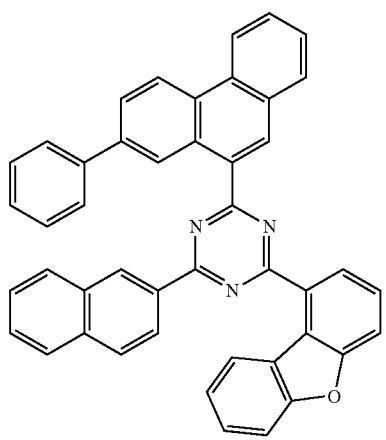
The combination of at least one of compounds H1-1 to H1-143 and at least one of compounds H2-1 to H2-170 may be used in an OLED.
In addition, the present disclosure provides the organic electroluminescent compound represented by the following formula 2'.
(2')
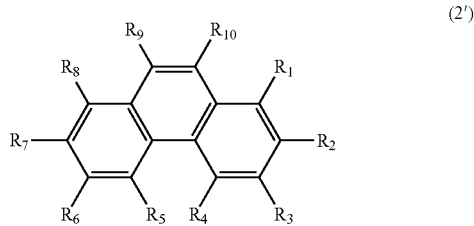

In formula 2', $R_1$ to $R_{10}$ are each independently represented by

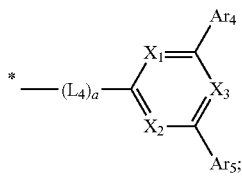

or represent hydrogen, deuterium, a halogen, a cyano, a substituted or unsubstituted (C1-C30)alkyl, a substituted or unsubstituted (C3-C30)cycloalkyl, a substituted or unsubstituted (3- to 7-membered)heterocycloalkyl, a substituted or unsubstituted (C6-C30)aryl, a substituted or unsubstituted (3- to 30-membered)heteroaryl, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, or a substituted or unsubstituted fused ring group of a (C3-C30) aliphatic ring(s) and a (C6-C30) aromatic ring(s), with a proviso that at least one of $R_1$ to $R_{10}$ is represented by

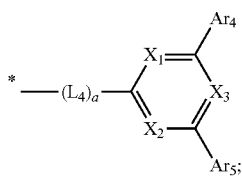

$L_4$ represents a single bond, a substituted or unsubstituted (C6-C30)cycloalkylene, or a substituted or unsubstituted (C10)arylene;

all of $X_1$ to $X_3$ represent N;

$Ar_4$ and $Ar_5$ each independently represent a substituted or unsubstituted (C6-C30)cycloalkyl, a substituted or unsubstituted (C6-C30)aryl, a substituted or unsubstituted (3- to 30-membered)heteroaryl, or a substituted or unsubstituted fused ring group of a (C3-C30) aliphatic ring(s) and a (C6-C30) aromatic ring(s), and $Ar_4$ and $Ar_5$ are the same as or different from each other;

with a proviso that when each of $Ar_4$ and $Ar_5$ represents an unsubstituted phenyl, an unsubstituted naphthyl, an unsubstituted biphenyl, an unsubstituted terphenyl, an unsubstituted phenanthrenyl, an unsubstituted triphenylenyl, an unsubstituted 1-dibenzofuranyl, an unsubstituted 1-dibenzothiophenyl, a phenyl substituted with a 1-dibenzofuranyl(s), a phenyl substituted with a 1-dibenzothiophenyl(s), a phenyl substituted with a 9-carbazolyl(s), an unsubstituted carbazolyl, a substituted or unsubstituted dibenzodioxynyl, a dibenzofuranyl fused to benzofuran, or a dibenzothiophenyl fused to benzothiophene, and $L_4$ represents a single bond, $L_4$ is not linked at the position of $R_9$ or $R_{10}$;

with a proviso that when $L_4$ represents a single bond and is linked at the position of $R_2$ or $R_7$, $Ar_4$ and $Ar_5$ each independently represent a phenyl unsubstituted or substituted with a (C6-C30)cycloalkyl(s); a naphthyl unsubstituted or substituted with a dibenzofuranyl(s), a dibenzothiophenyl(s) or a phenanthrenyl(s); an unsubstituted biphenyl; an unsubstituted terphenyl (except for the structure

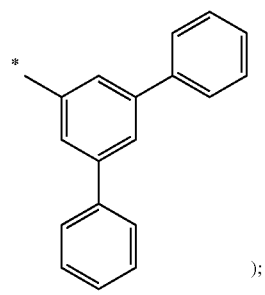 [SMILES: Cc1cc(-c2ccccc2)cc(-c2ccccc2)c1]

);

an unsubstituted phenanthrenyl; an unsubstituted triphenylenyl; an unsubstituted chrysenyl; an unsubstituted (C22)aryl; an unsubstituted 9,9-diphenylfluorenyl; an unsubstituted 7,7-dimethylbenzofluorenyl; an unsubstituted 9,9-diphenylsilafluorenyl; a fluorenyl substituted with a phenyl(s) and a (C6-C30)cycloalkyl(s); a fused ring group of a (C3-C10) aliphatic ring(s) and a (C6-C12) aromatic ring(s) substituted with a methyl(s); an unsubstituted phenylnaphthyl; an unsubstituted naphthylphenyl; an unsubstituted dibenzofuranyl; or an unsubstituted dibenzothiophenyl; and a represents an integer of 1 to 3, where if a is an integer of 2 or more, each of 1-4 may be the same or different.

The compound represented by formula 2' may be at least one selected from the following compounds, but is not limited thereto.

H2-1

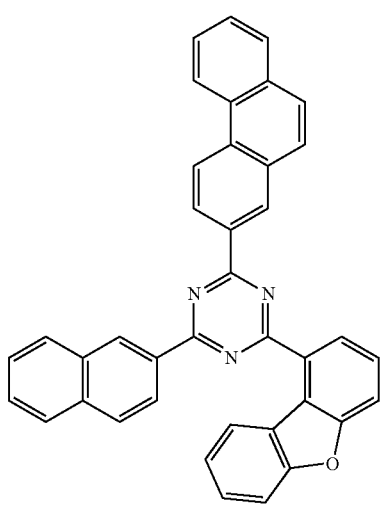

-continued
H2-2
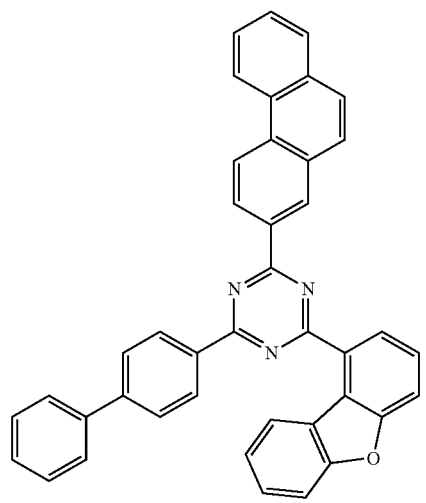
H2-3
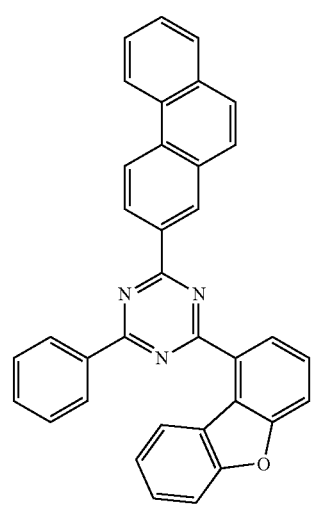
H2-7
-continued
H2-9
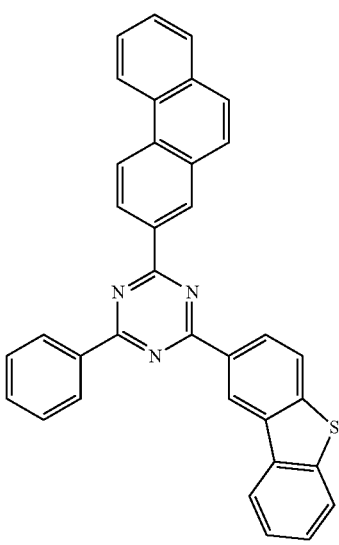
H2-10
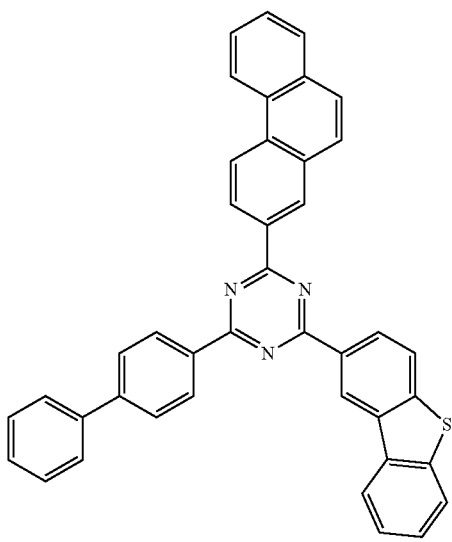
H2-11
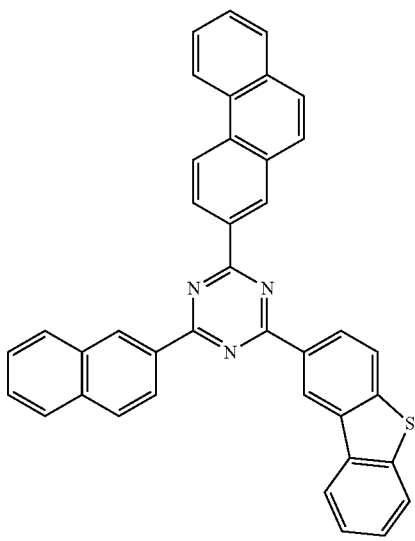

-continued
H2-12
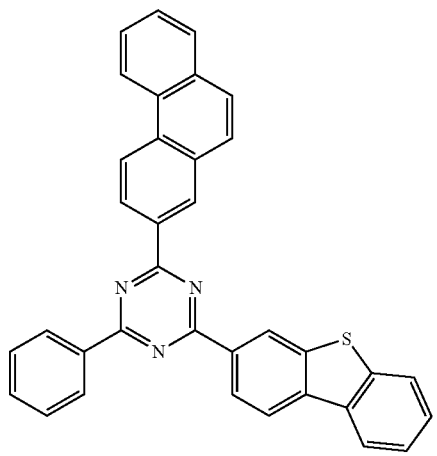
H2-13
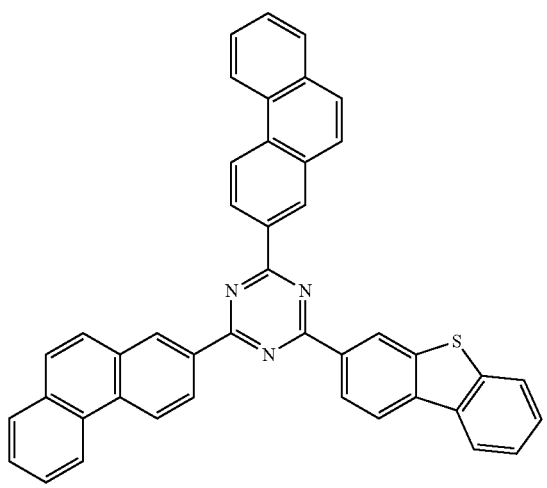
H2-14
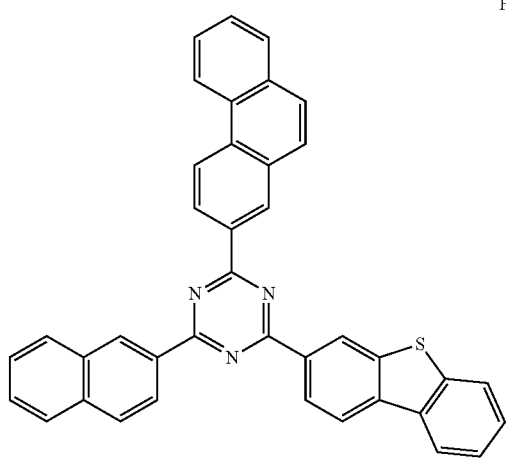
H2-15
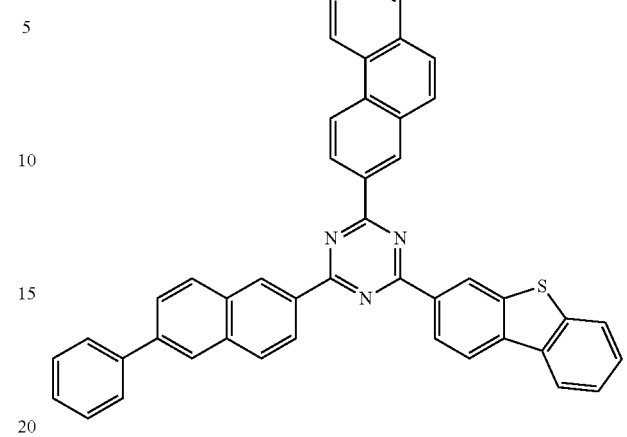
H2-16
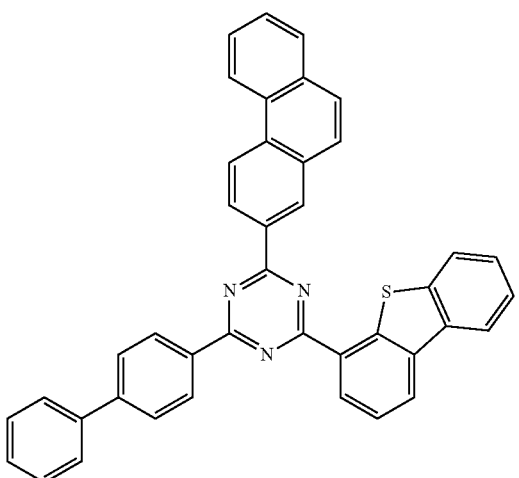
H2-17
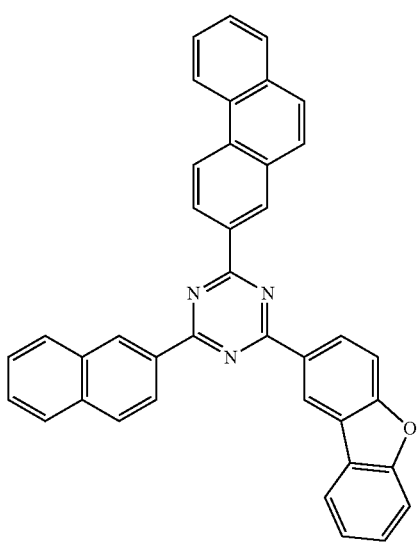

H2-18
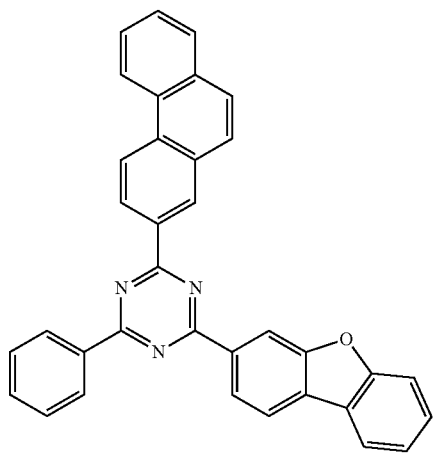
H2-19
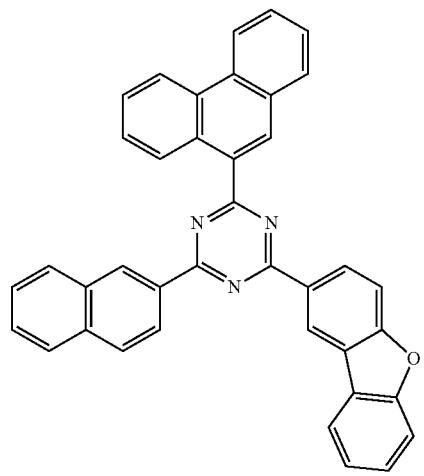
H2-20
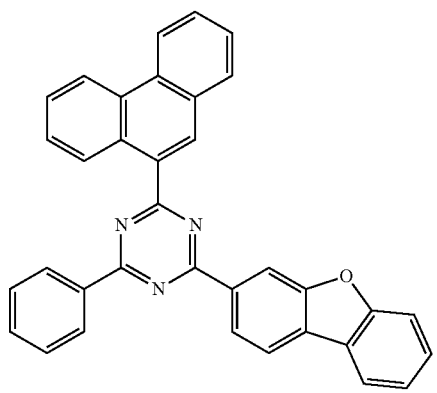
H2-21
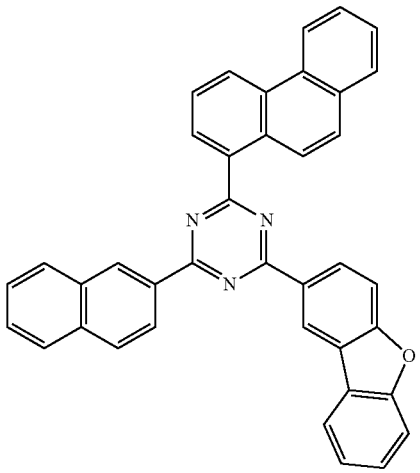
H2-22
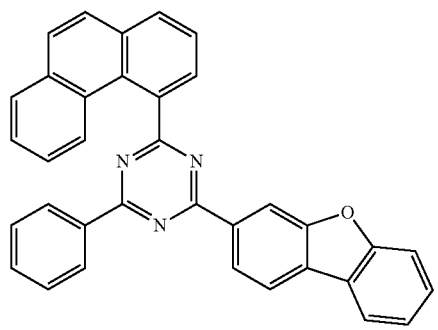
H2-23
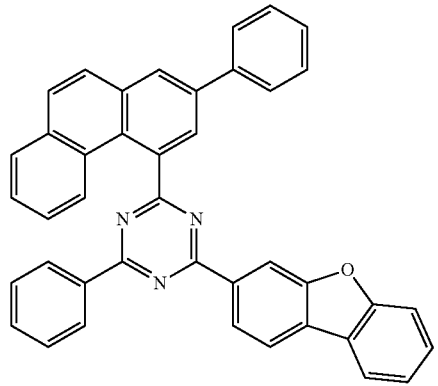

H2-24
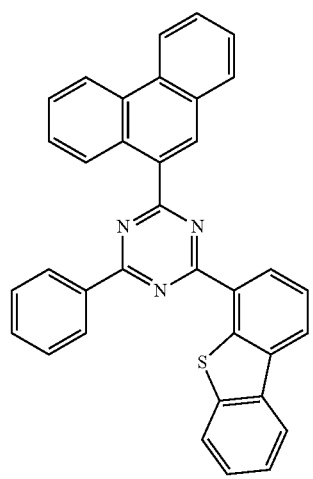
H2-25
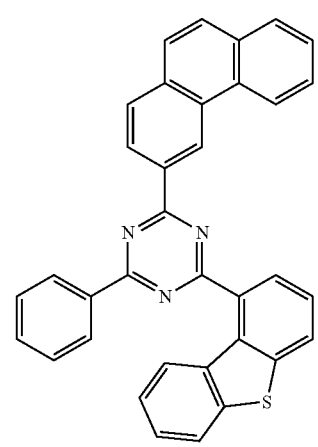
H2-27
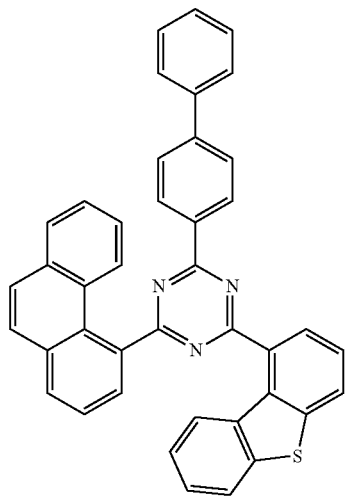
H2-29
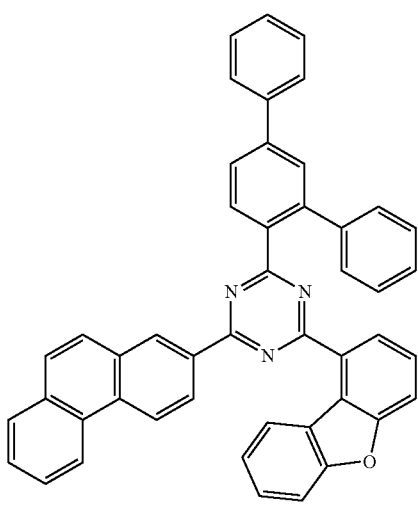
H2-35
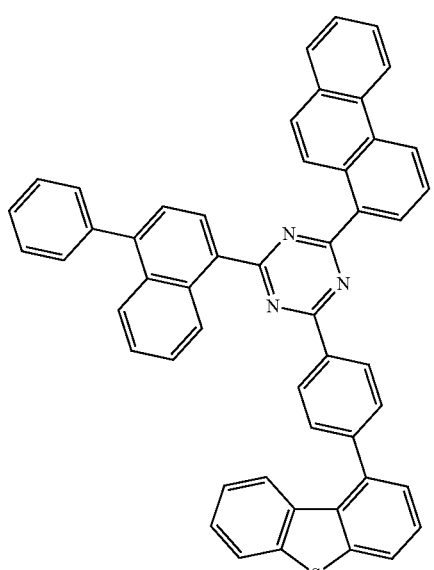
H2-36
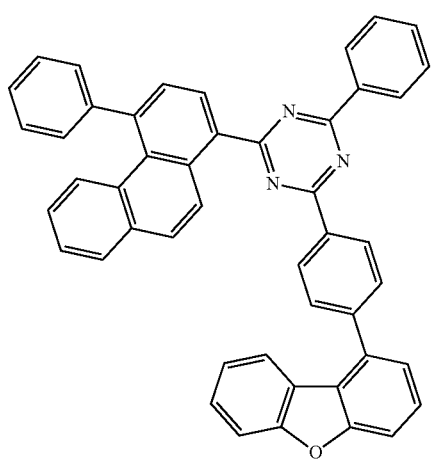

H2-37
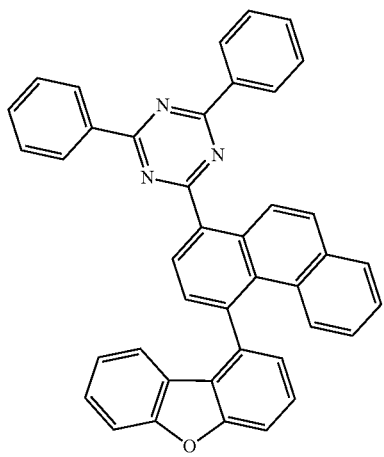
H2-38
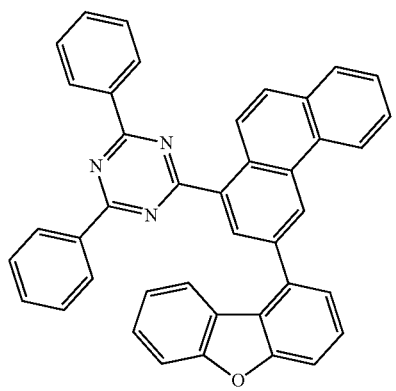
H2-39
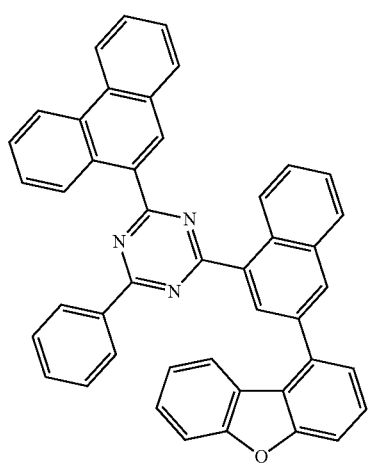
H2-40
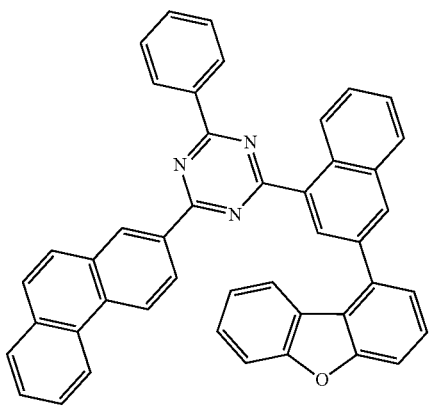
H2-41
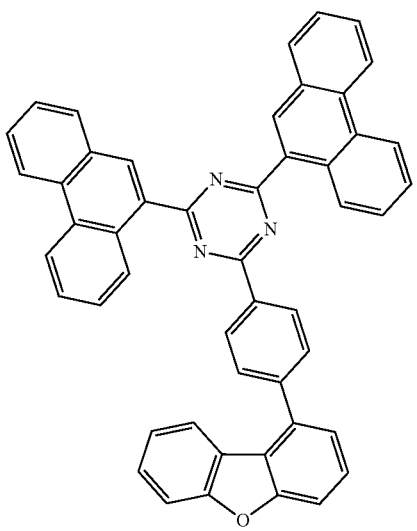
H2-42
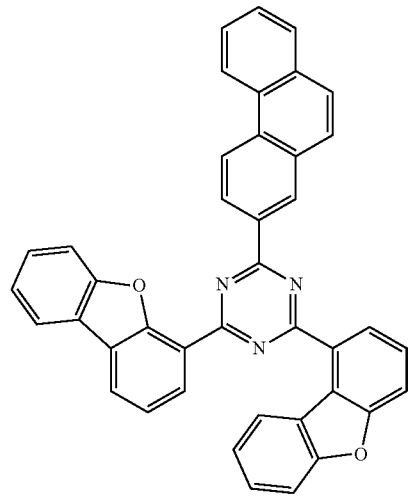

H2-43
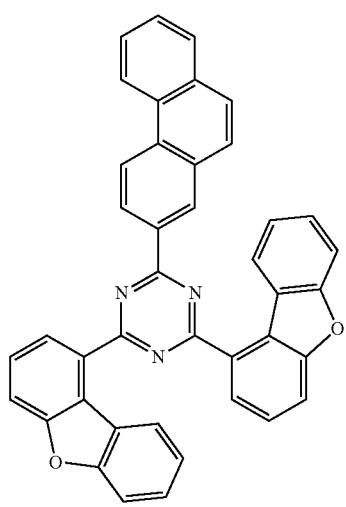
H2-48
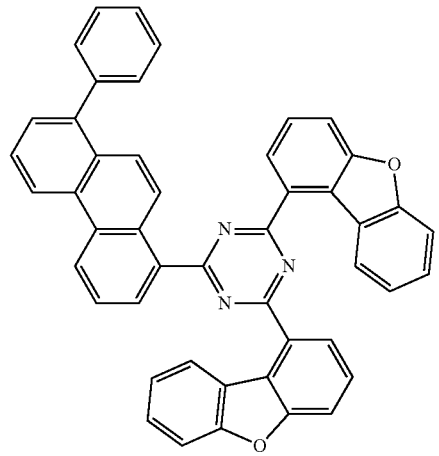
H2-45
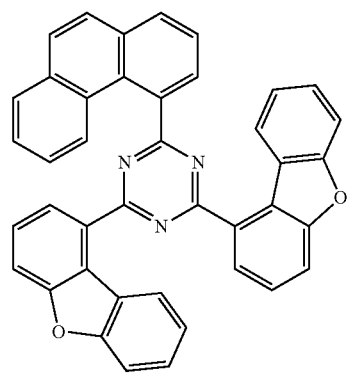
H2-49
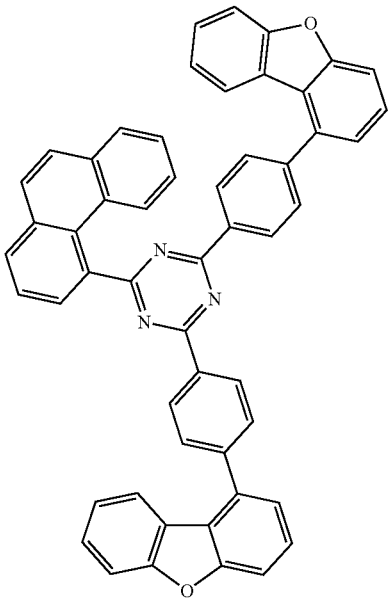
H2-46
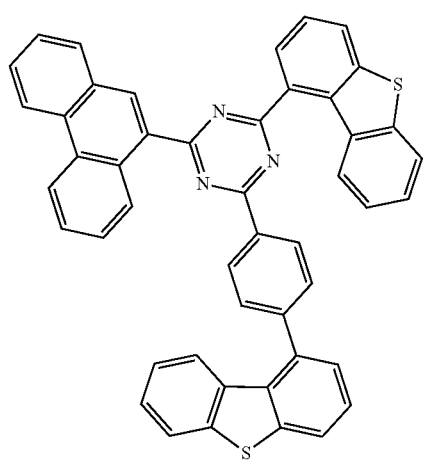
H2-50
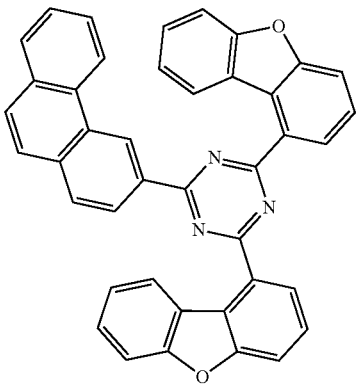

H2-51
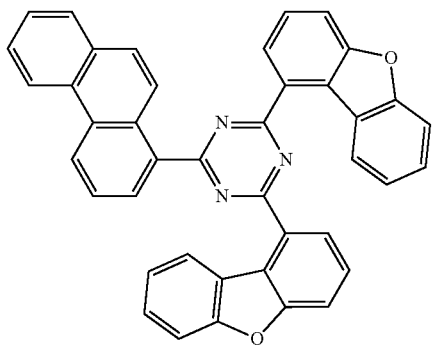
H2-53
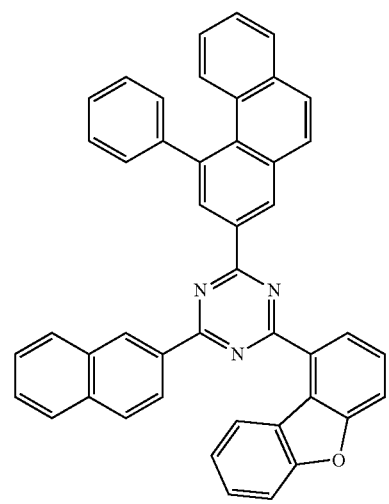
H2-54
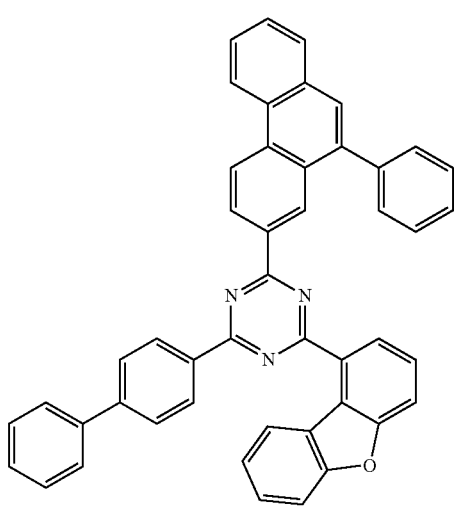
H2-55
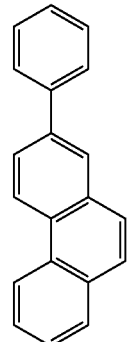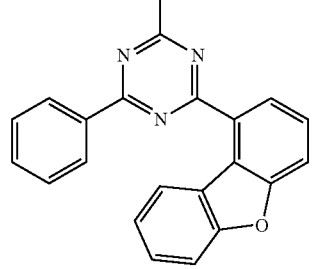
H2-58
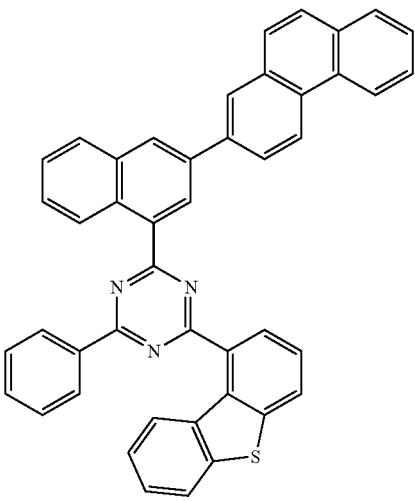
H2-61
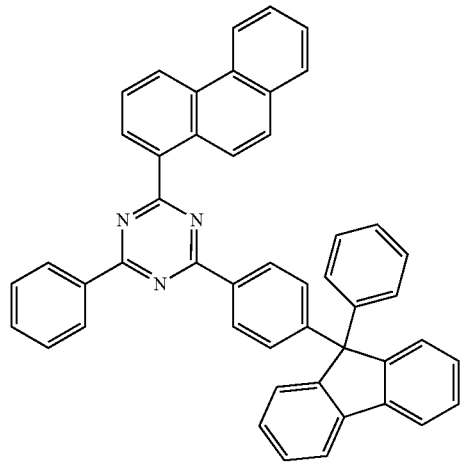

H2-62
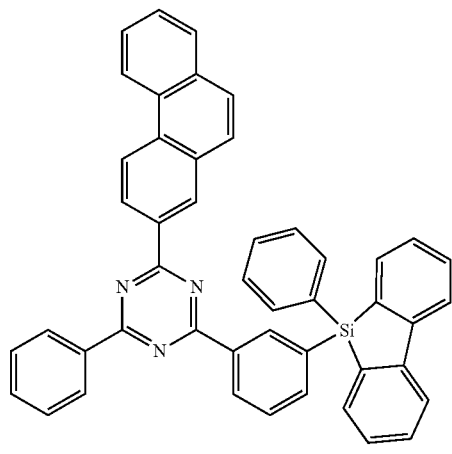
H2-65
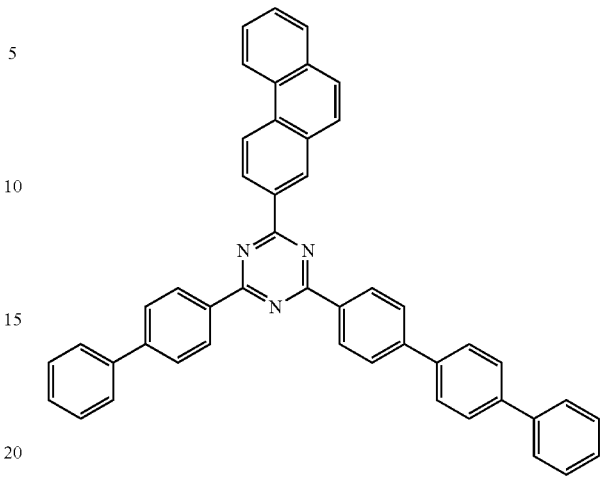
H2-63
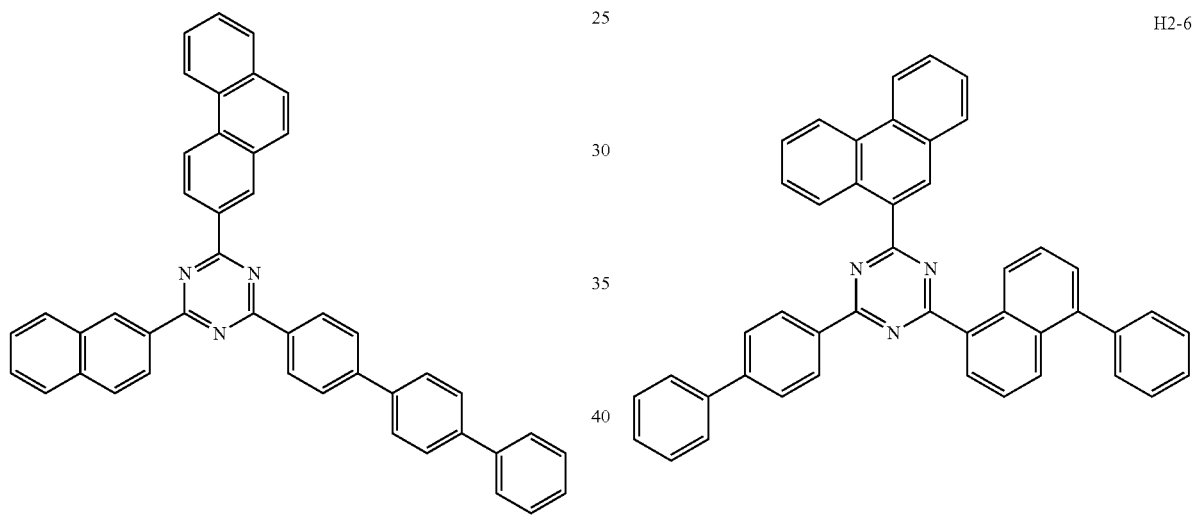
H2-66
H2-64
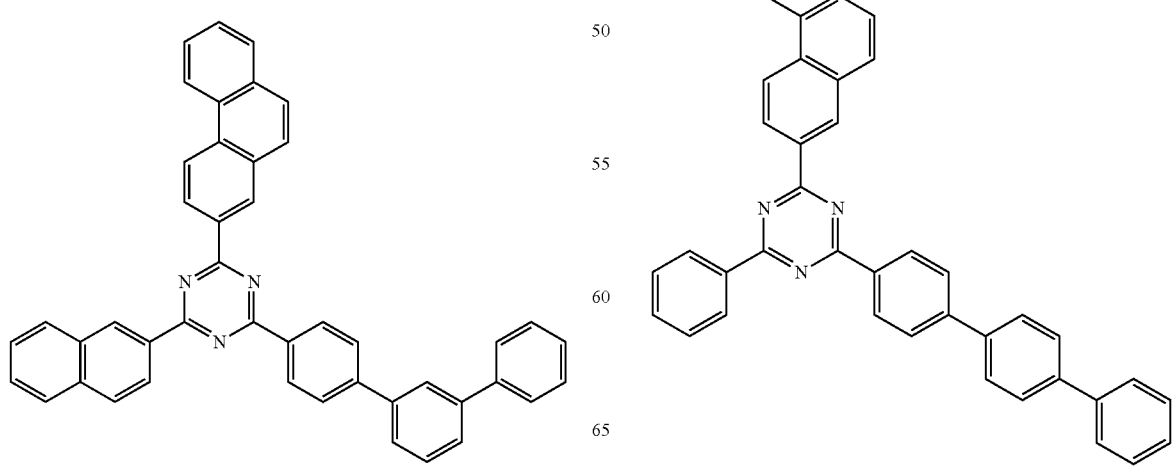
H2-67

H2-68
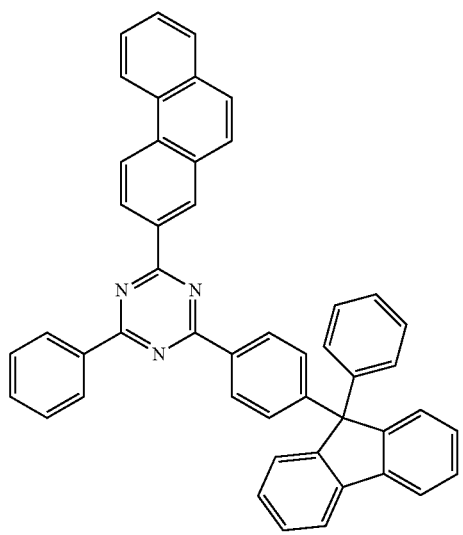
H2-71
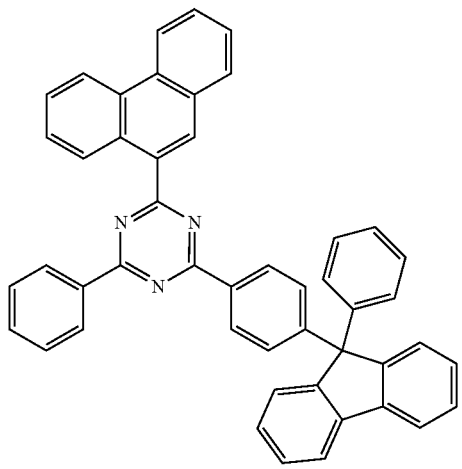
H2-69
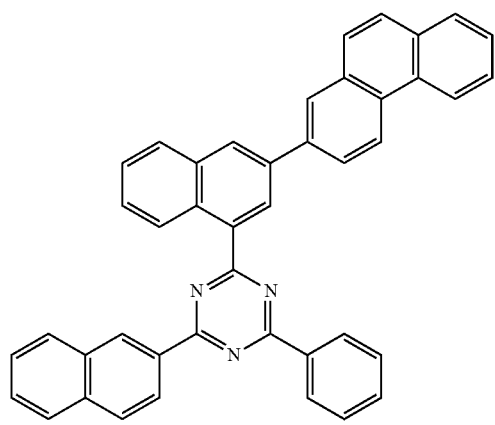
H2-73
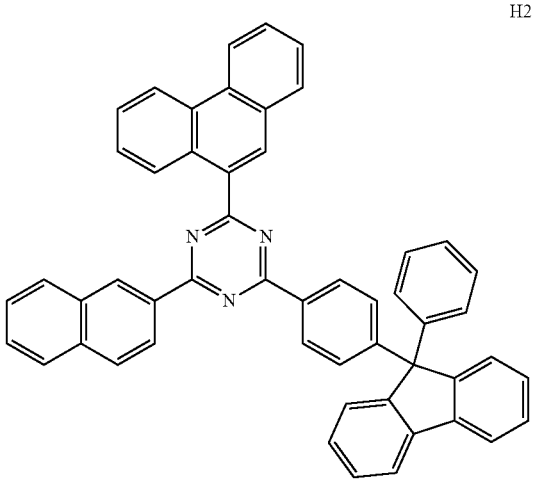
H2-70
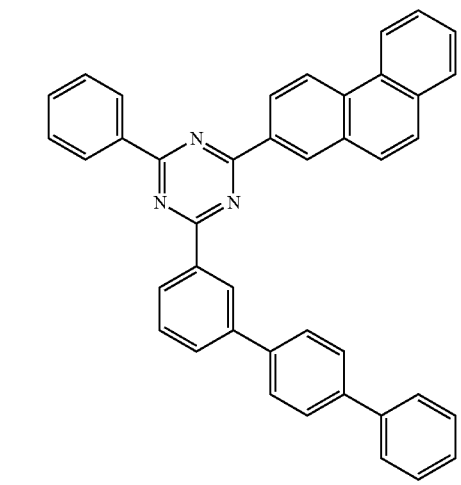
H2-74
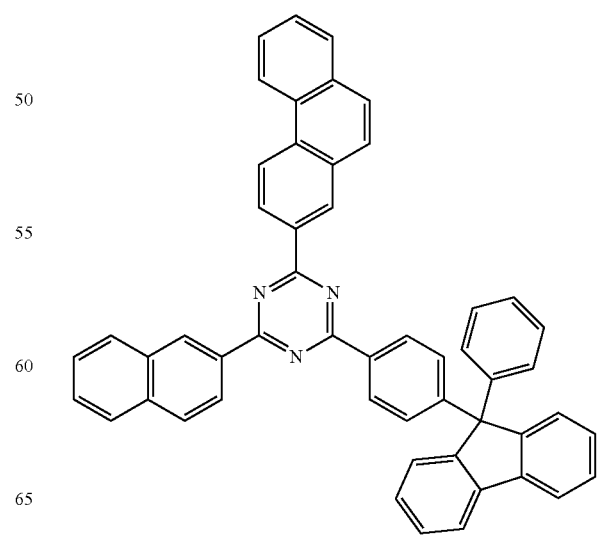

H2-75
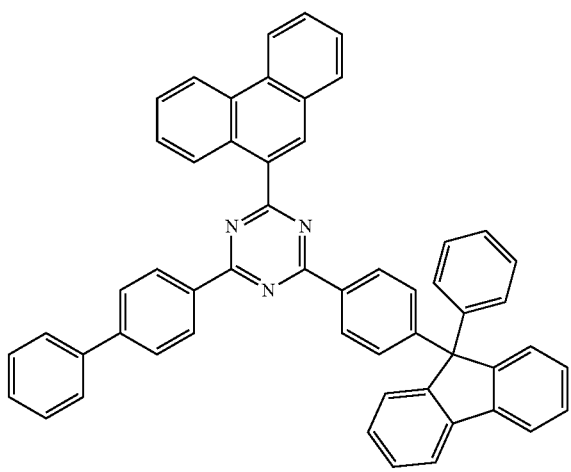
H2-79
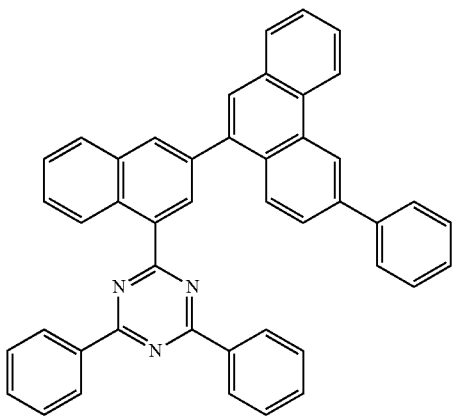
H2-77
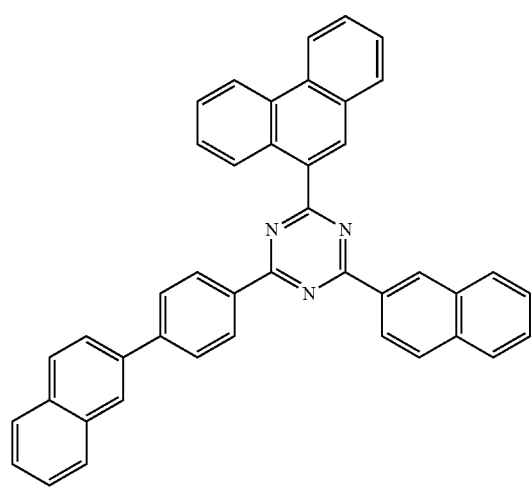
H2-80
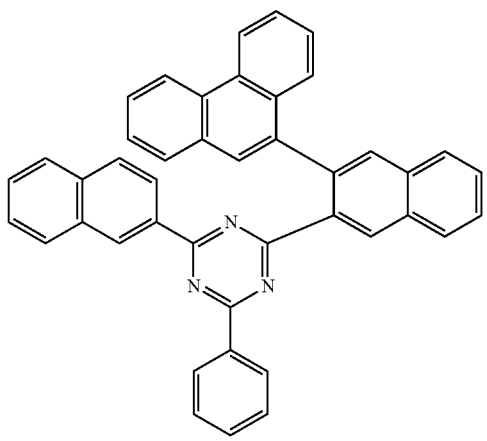
H2-78
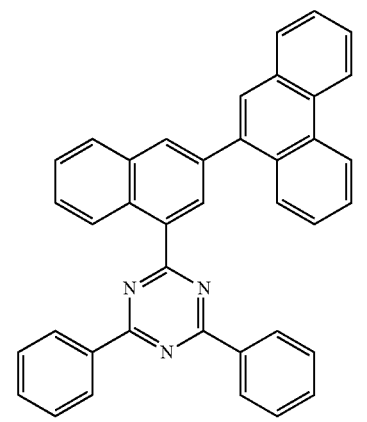
H2-81
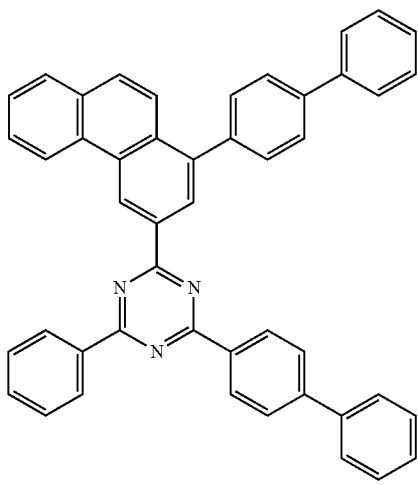

H2-82
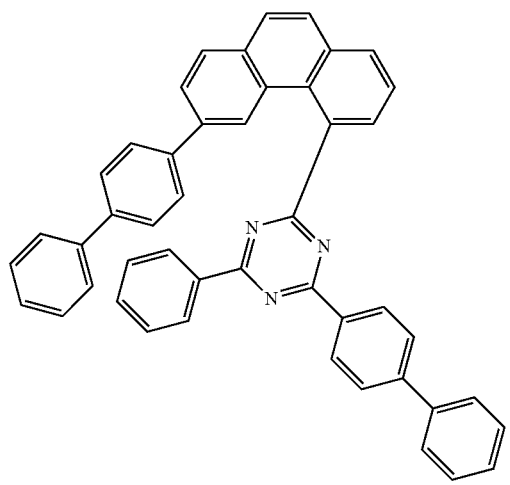
H2-83
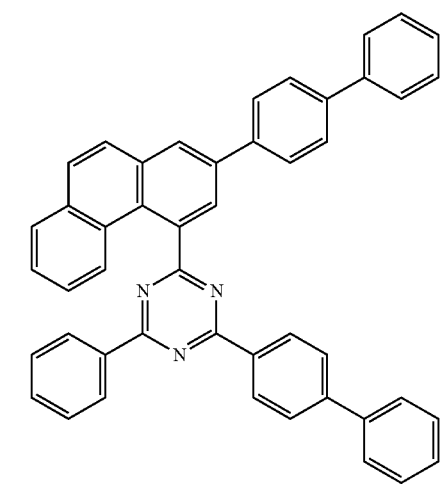
H2-84
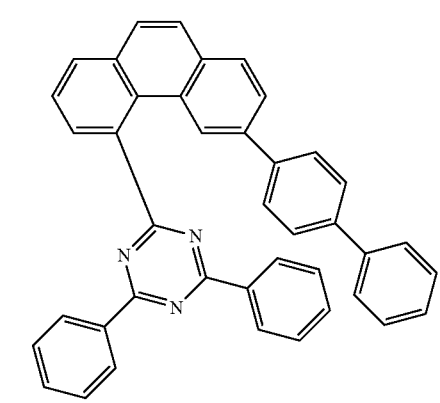
H2-90
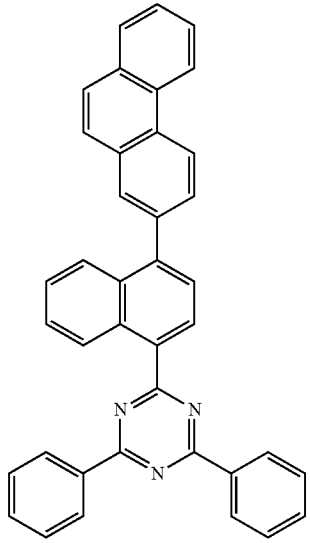
H2-91
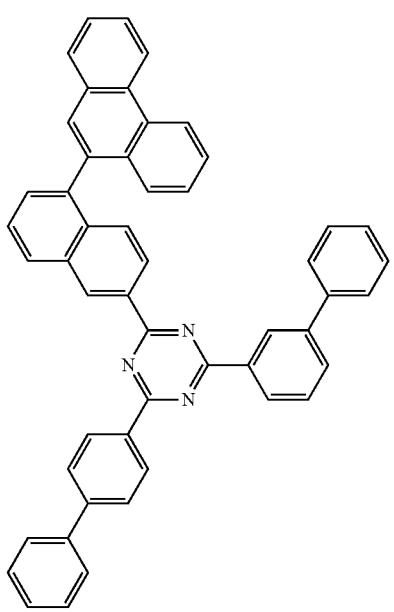

H2-92
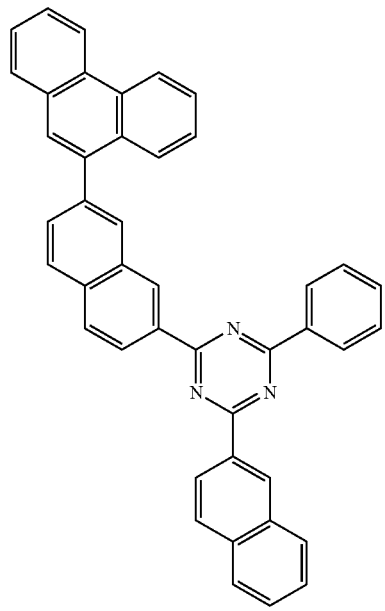
H2-95
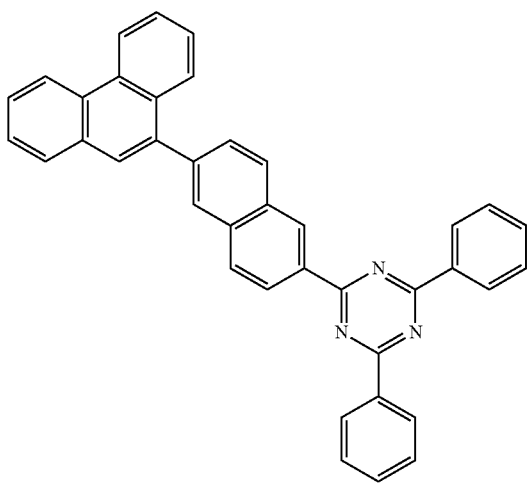
H2-96
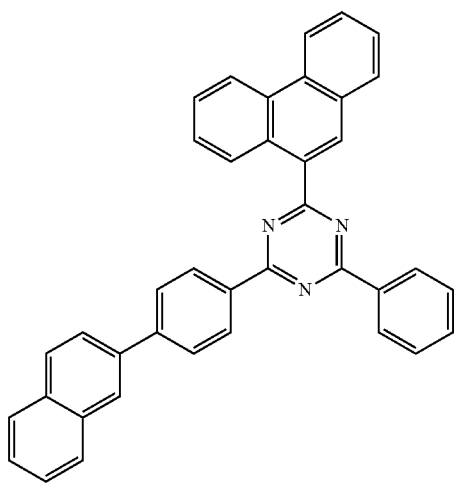
H2-97
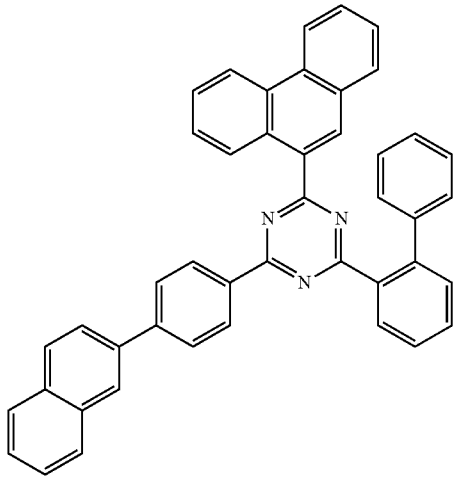
H2-98
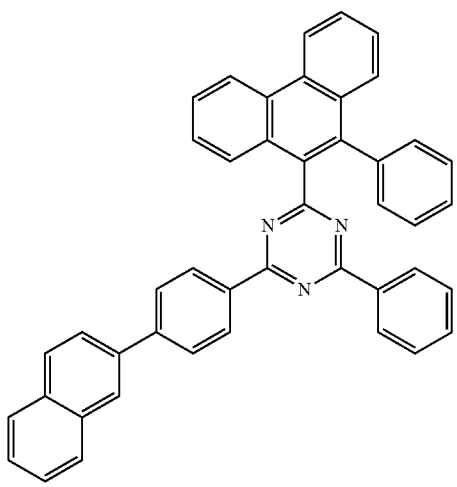
H2-99
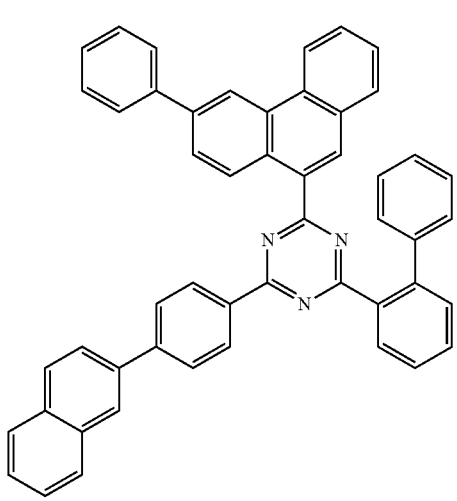

-continued
H2-100
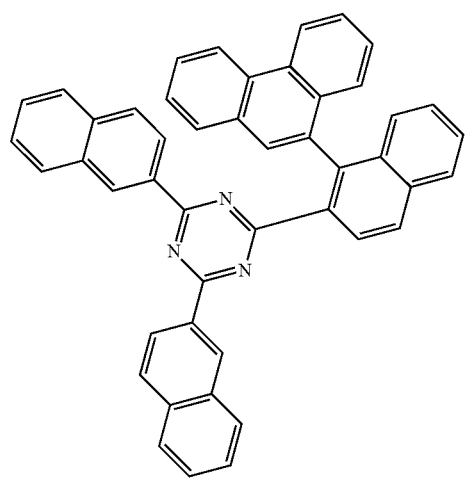
H2-101
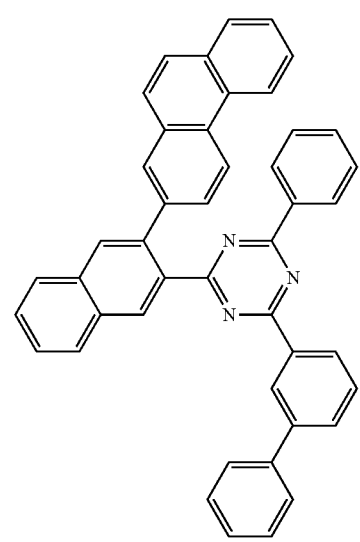
H2-102
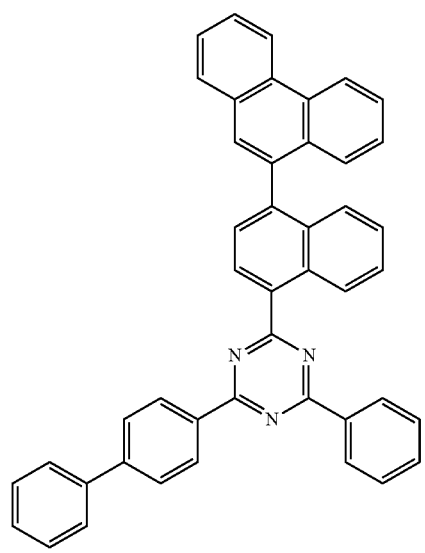
-continued
H2-103
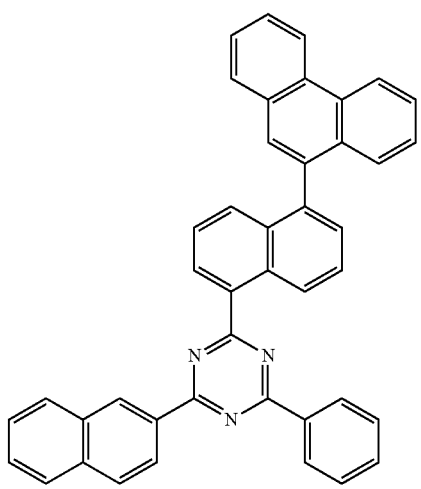
H2-104
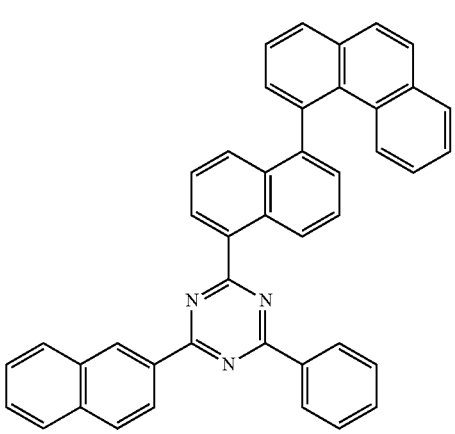
H2-105
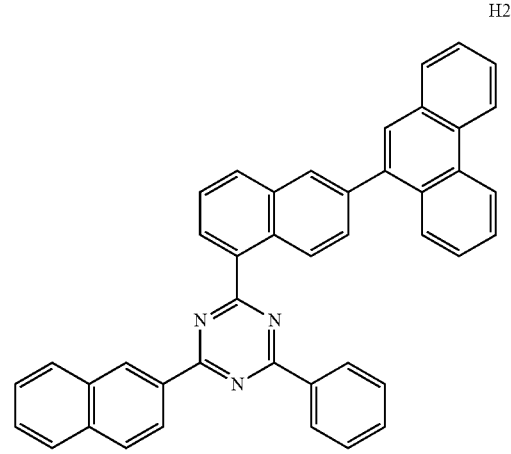

H2-106
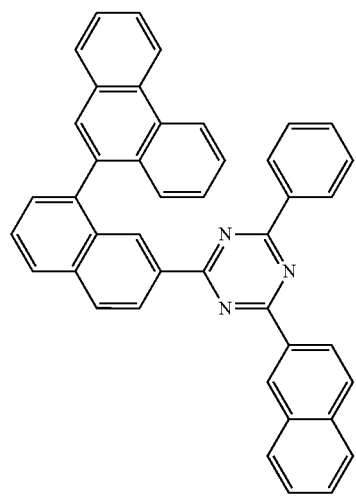
H2-109
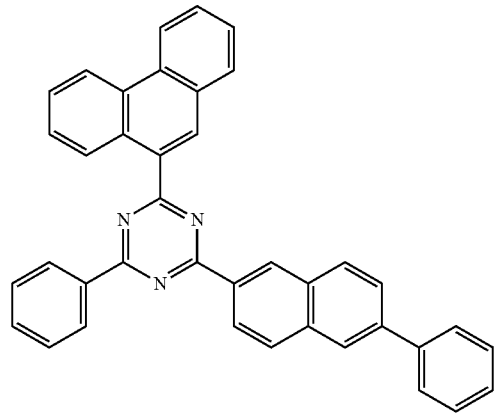
H2-107
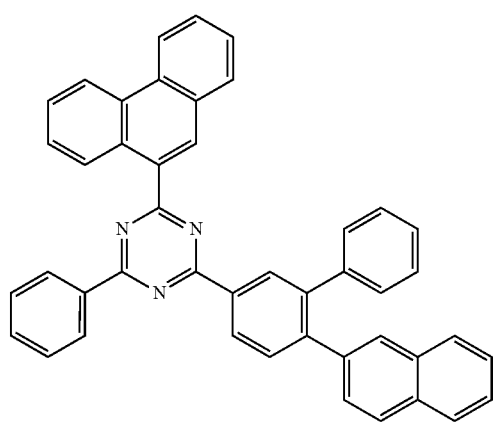
H2-111
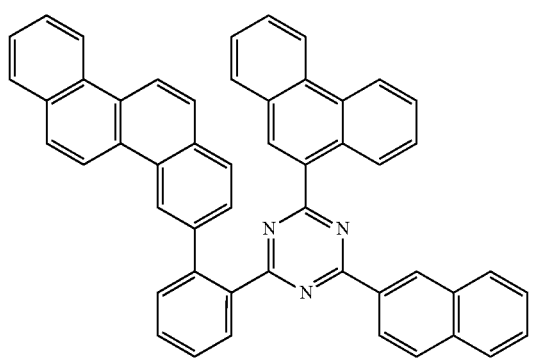
H2-108
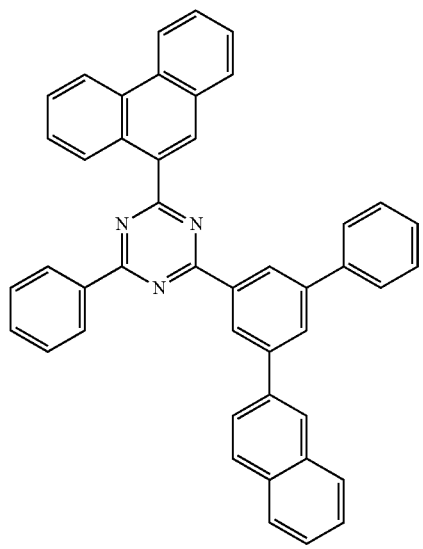
H2-112
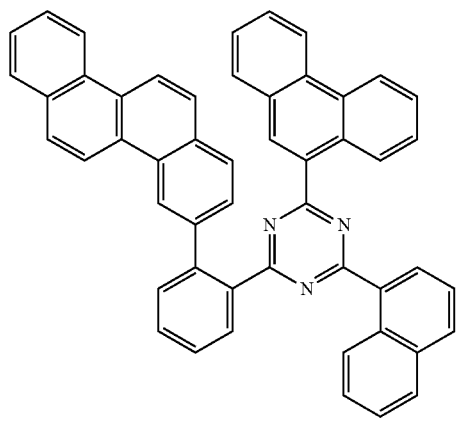

H2-113
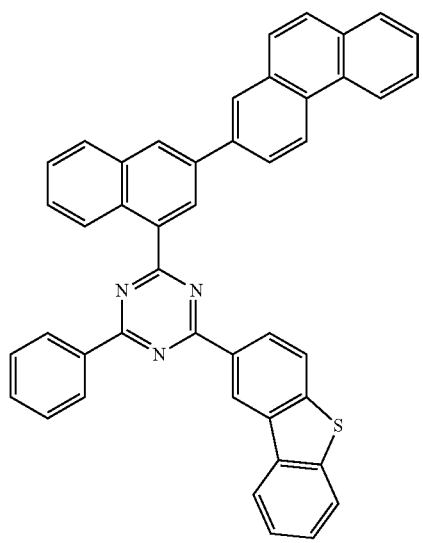
H2-120
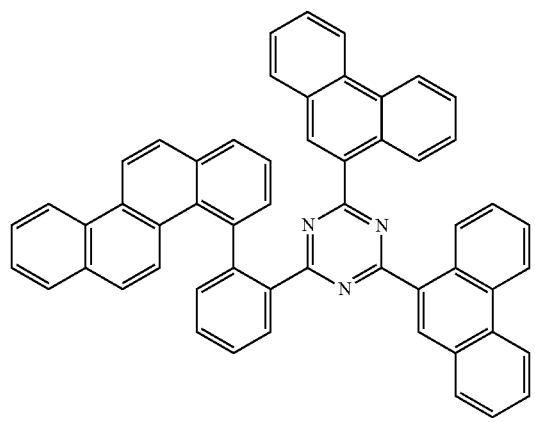
H2-118
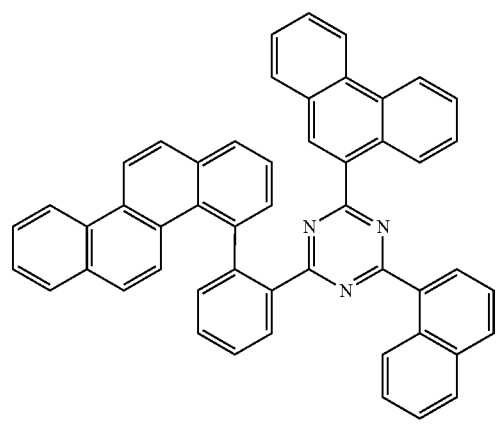
H2-121
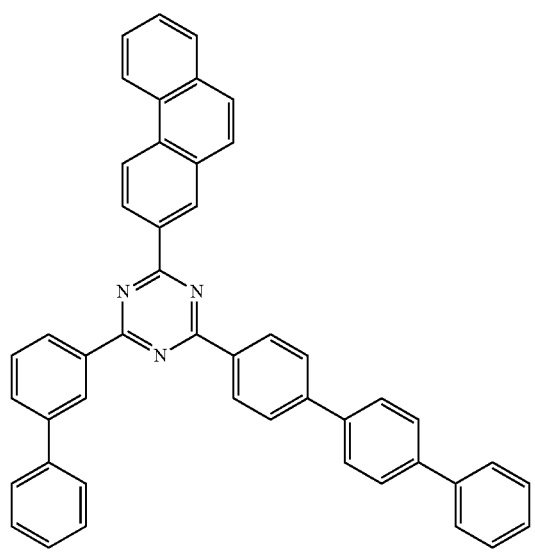
H2-119
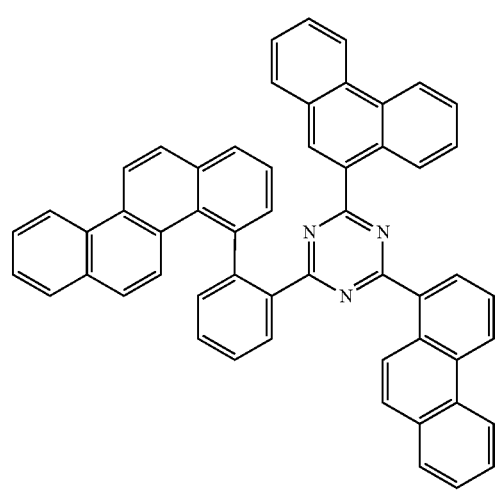
H2-122
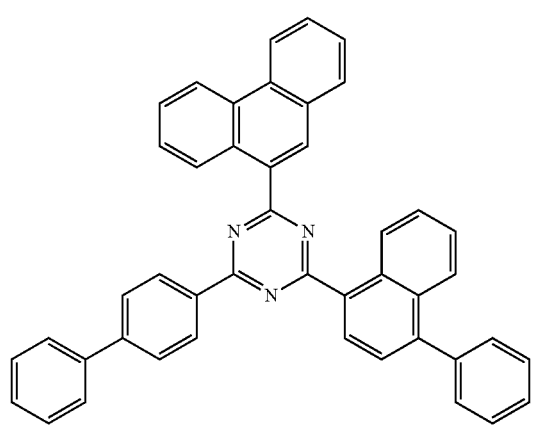

H2-124
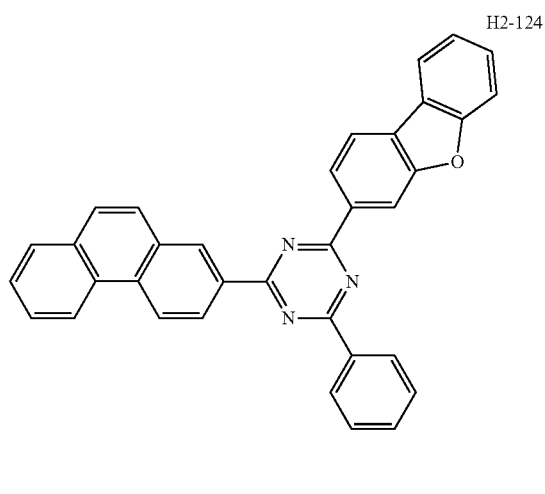
H2-137
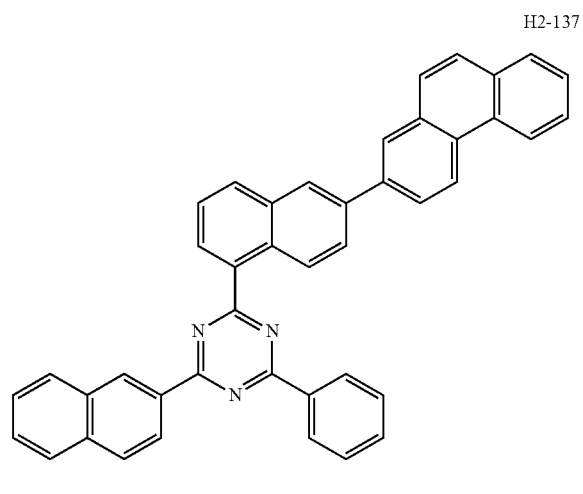
H2-125
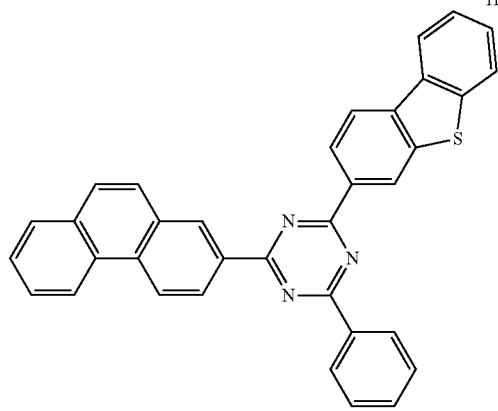
H2-138
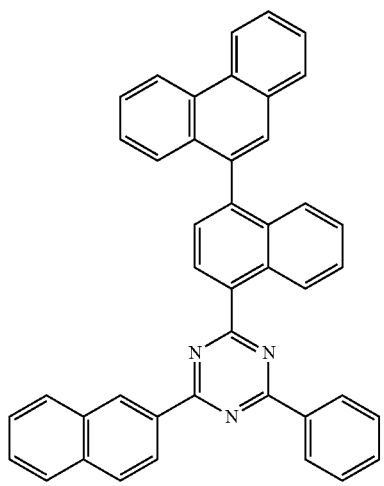
H2-136
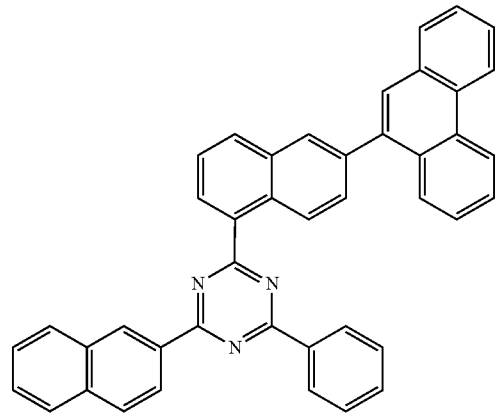
H2-140
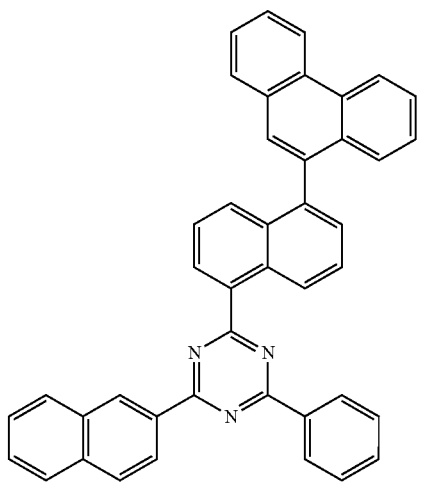

H2-141
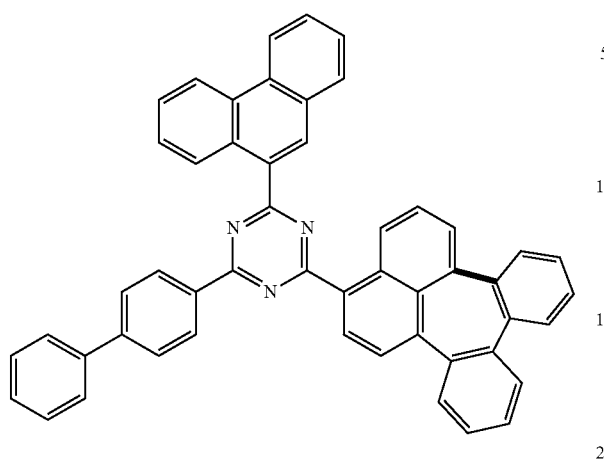
H2-144
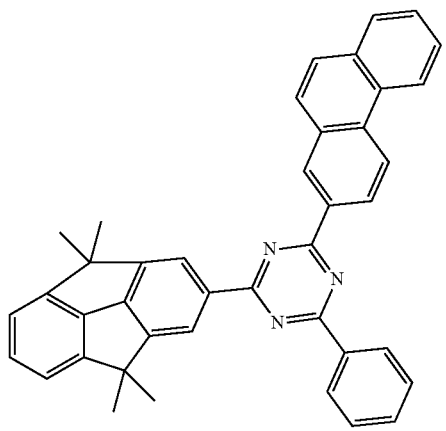
H2-142
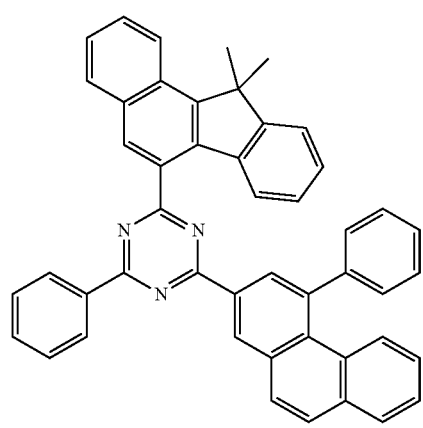
H2-145
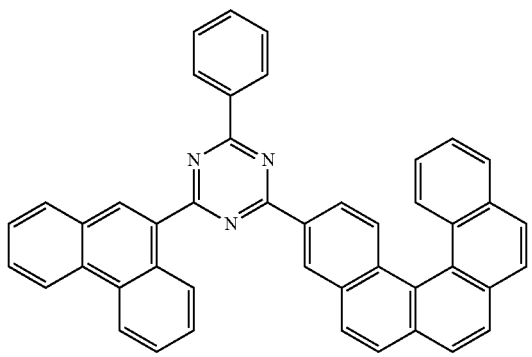
H2-143
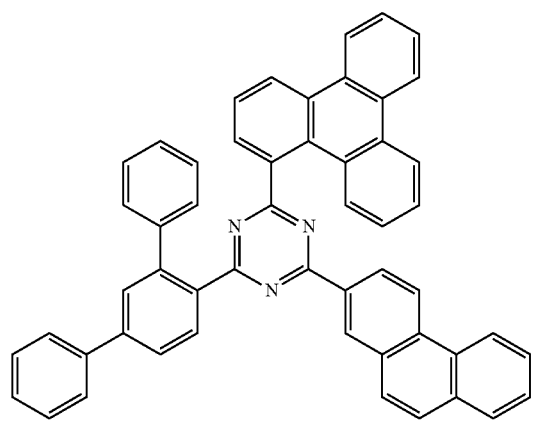
H2-146

H2-147
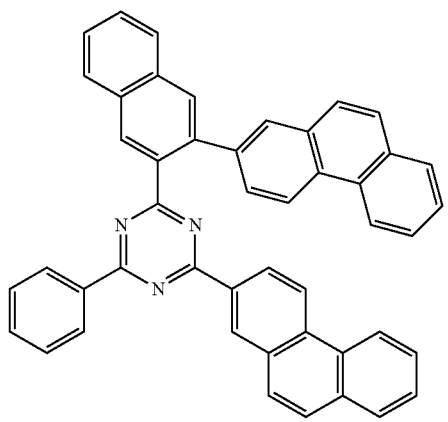
H2-148
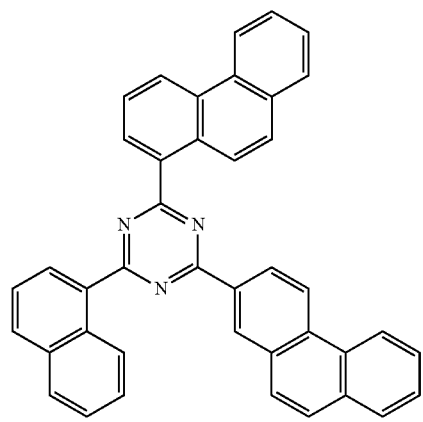
H2-149
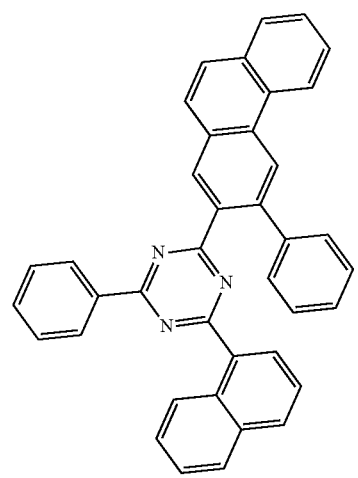
H2-153
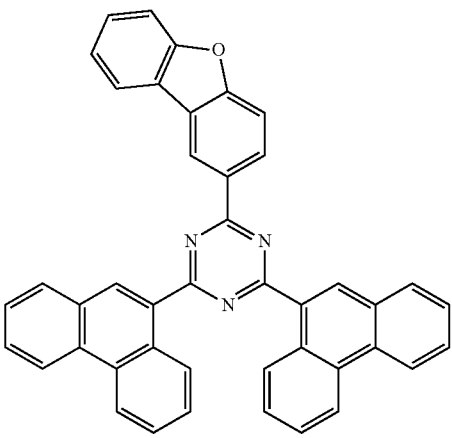
H2-156
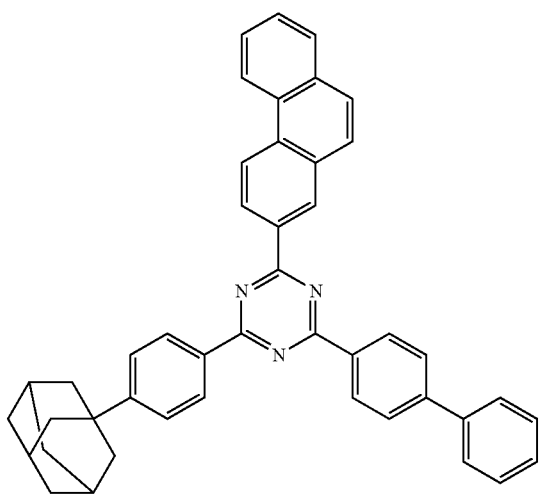
H2-157

-continued
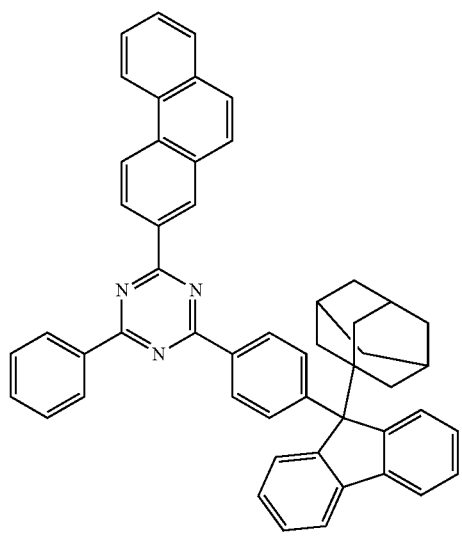
H2-158
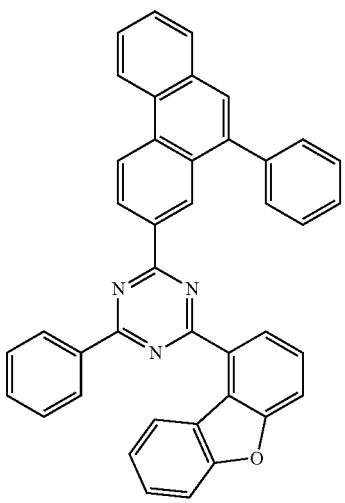
H2-161
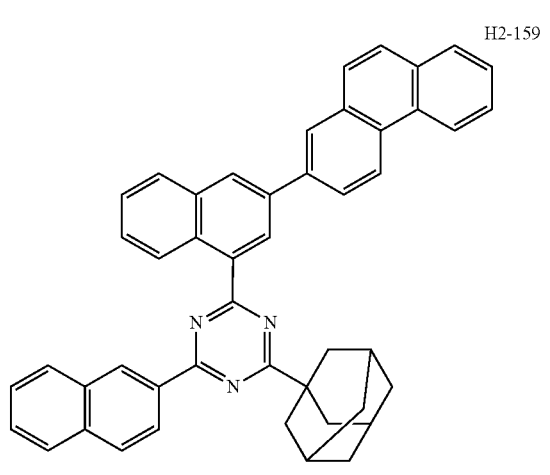
H2-159
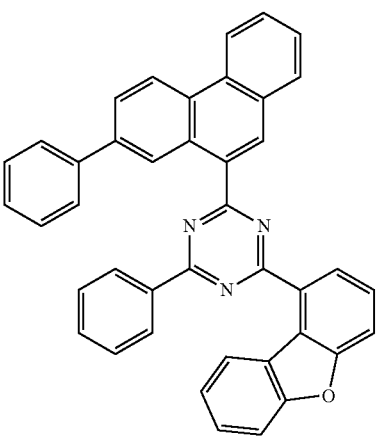
H2-162
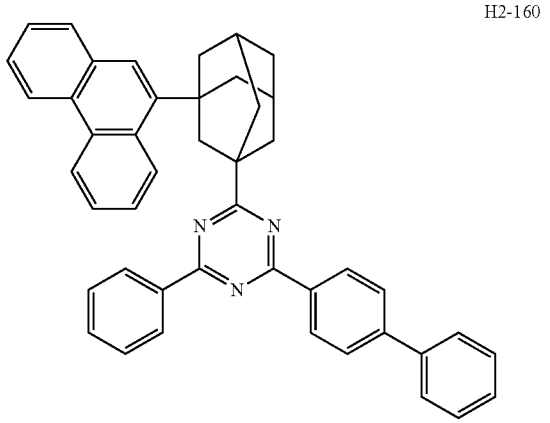
H2-160
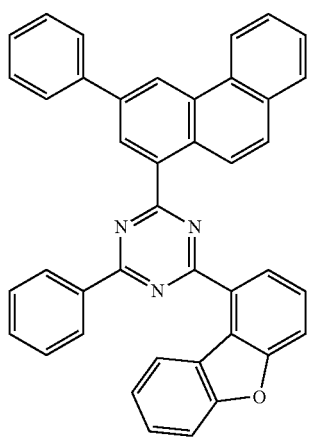
H2-163

H2-164
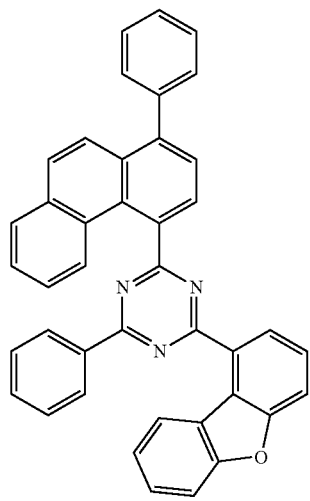
H2-165
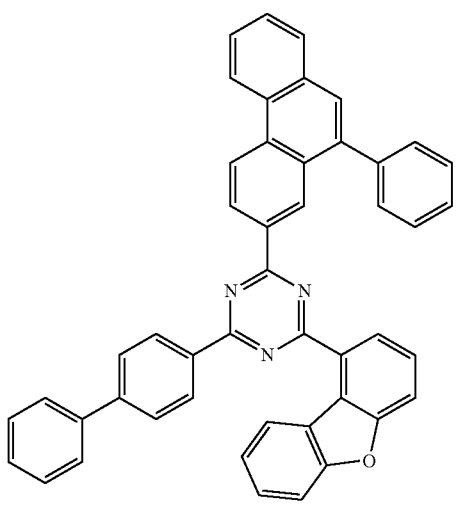
H2-166
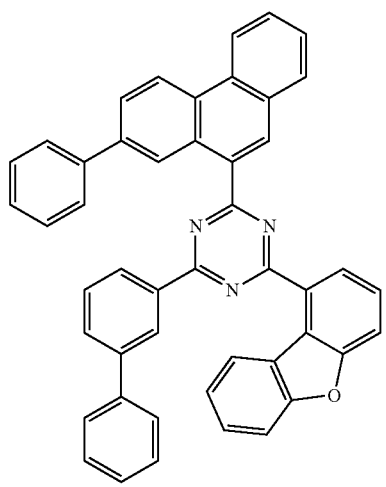
H2-167
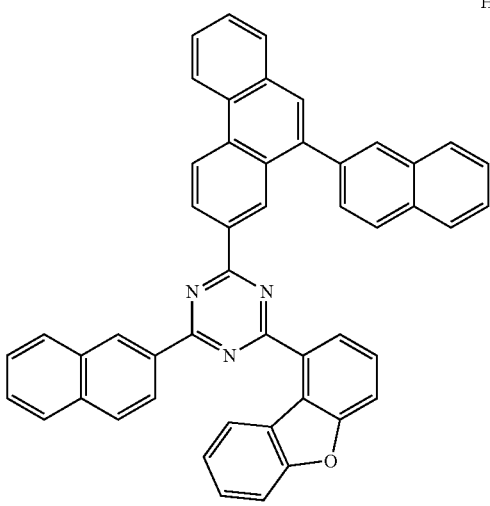
H2-168
H2-169
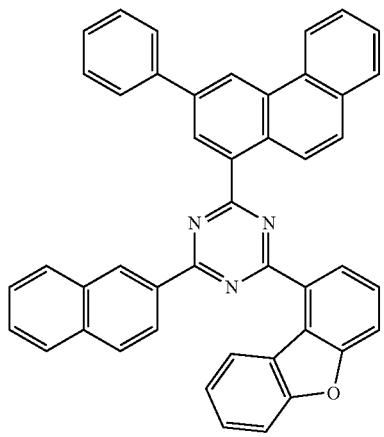

H2-170

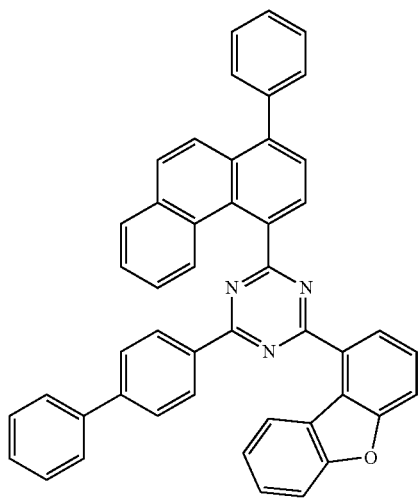

In addition, the present disclosure provides an OLED comprising the organic electroluminescent compound represented by formula 2'. Herein, the organic electroluminescent compound represented by formula 2' may be comprised in a light-emitting layer, an electron transport layer, or an electron buffer layer, but is not limited thereto.

The compound represented by formula 1 according to the present disclosure may be prepared by referring to a synthetic method known to one skilled in the art. For example, the compound represented by formula 1 can be prepared by referring to Korean Patent Application Laying-Open No. 10-2020-0007644 (published on Jan. 22, 2020), Korean Patent Application Laying-Open No. 10-2018-0099487 (published on Sep. 5, 2018), etc., but is not limited thereto.

The compound represented by formula 2 or 2' according to the present disclosure may be prepared by referring to a synthetic method known to one skilled in the art. For example, the compound represented by formula 2 or 2' according to the present disclosure may be prepared by referring to the following reaction scheme, but is not limited thereto.

[Reaction Scheme 1]

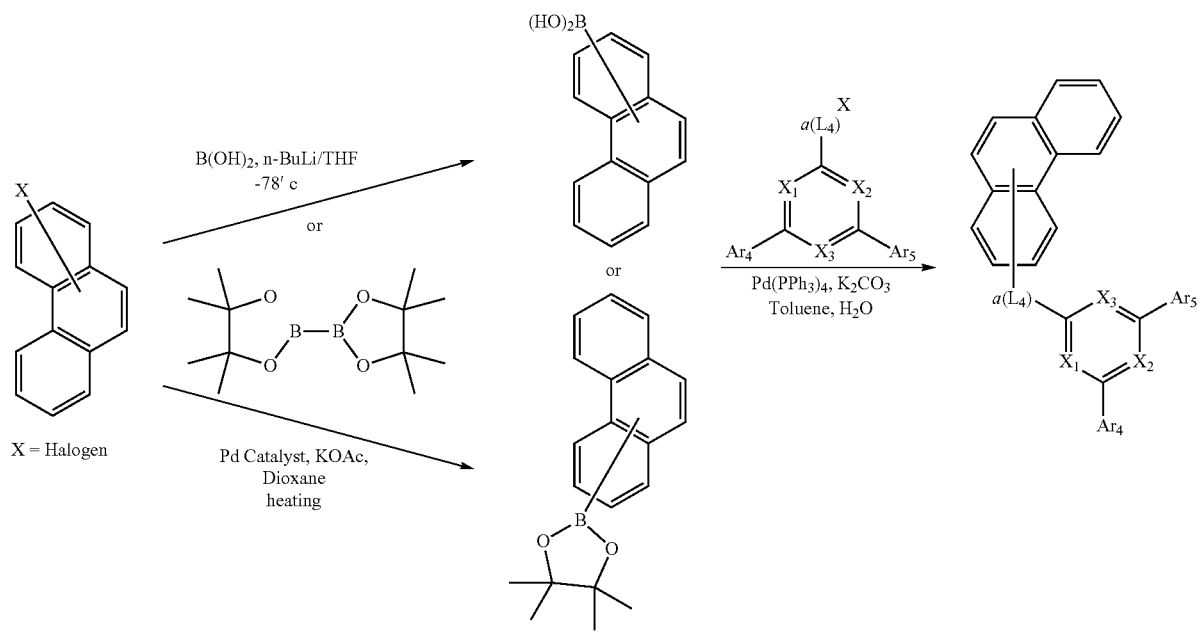

In reaction scheme 1, $X_1$ to $X_3$, $Ar_4$, $Ar_5$, $L_4$ and a are as defined in formula 2 or 2'.

Although illustrative synthesis examples of the compound represented by formula 2 or 2' of the present disclosure are described above, one skilled in the art will be able to readily understand that all of them are based on a Buchwald-Hartwig cross-coupling reaction, an N-arylation reaction, H-mont-mediated etherification reaction, a Miyaura borylation reaction, a Suzuki cross-coupling reaction, an intramolecular acid-induced cyclization reaction, a Pd(II)-catalyzed oxidative cyclization reaction, a Grignard reaction, a Heck reaction, a Cyclic Dehydration reaction, an $SN_1$ substitution reaction, an $SN_2$ substitution reaction, a Phosphine-mediated reductive cyclization reaction, etc., and the reactions above proceed even when substituents, which are defined in formula 2 or 2' but are not specified in the specific synthesis examples, are bonded.

The organic electroluminescent device according to the present disclosure may comprise an anode, a cathode, and at least one organic layer between the anode and cathode in which the organic layer may comprise a plurality of organic electroluminescent materials including the compound represented by formula 1 as the first organic electroluminescent material, and the compound represented by formula 2 as the second organic electroluminescent material. According to one embodiment of the present disclosure, the organic electroluminescent device according to the present disclosure may comprise an anode, a cathode, and at least one light-emitting layer between the anode and cathode in which the light-emitting layer may comprise the compound represented by formula 1 and the compound represented by formula 2.

The light-emitting layer includes a host and a dopant, in which the host includes a plurality of host materials, and the compound represented by formula 1 may be included as the first host compound of the plurality of host materials, and the compound represented by formula 2 may be included as the second host compound of the plurality of host materials. Herein, the weight ratio of the first host compound and the second host compound is about 1:99 to about 99:1, preferably about 10:90 to about 90:10, more preferably about 30:70 to about 70:30, even more preferably about 40:60 to about 60:40, and still more preferably about 50:50.

Herein, the light-emitting layer is a layer from which light is emitted, and may be a single layer or a multi-layer in which two or more layers are stacked. In the plurality of host materials of the present disclosure, all of the first host material and the second host material may be included in one layer, or the first host material and the second host material may be included in respective different light-emitting layers. According to one embodiment of the present disclosure, the doping concentration of the dopant compound with respect to the host compound in the light-emitting layer may be less than 20 wt %.

The organic electroluminescent device of the present disclosure may further comprise at least one layer selected from a hole injection layer, a hole transport layer, a hole auxiliary layer, a light-emitting auxiliary layer, an electron transport layer, an electron injection layer, an interlayer, an electron buffer layer, a hole blocking layer, and an electron blocking layer. According to one embodiment of the present disclosure, the organic electroluminescent device of the present disclosure may further comprise an amine-based compound besides the plurality of host materials of the present disclosure as at least one of a hole injection material, a hole transport material, a hole auxiliary material, a light-emitting material, a light-emitting auxiliary material, and an electron blocking material. In addition, according to one embodiment of the present disclosure, the organic electroluminescent device of the present disclosure may further comprise an azine-based compound besides the plurality of host materials of the present disclosure as at least one of an electron transport material, an electron injection material, an electron buffer material, and a hole blocking material.

The plurality of host materials according to the present disclosure may be used as a light-emitting material for a white organic light-emitting device. The white organic light-emitting device has been suggested to have various structures such as a side-by-side method, or a stacking method depending on the arrangement of R (Red), G (Green) or YG (yellowish green), and B (blue) light-emitting units, or CCM (color conversion material) method, etc. In addition, the plurality of host materials according to one embodiment of the present disclosure may also be applied to the organic electroluminescent device comprising a QD (quantum dot).

A hole injection layer, a hole transport layer, an electron blocking layer, or a combination thereof may be used between the anode and the light-emitting layer. The hole injection layer may be multilayers in order to lower the hole injection barrier (or hole injection voltage) from the anode to the hole transport layer or the electron blocking layer, wherein two compounds may be simultaneously used in each of the multilayers. In addition, the hole injection layer may be doped with p-dopant. The electron blocking layer may be placed between the hole transport layer (or hole injection layer) and the light-emitting layer, and may block the overflow of electrons from the light-emitting layer and confine the excitons in the light-emitting layer to prevent light leakage. The hole transport layer or the electron blocking layer may be multilayers, wherein a plurality of compounds may be used in each of the multilayers.

An electron buffer layer, a hole blocking layer, an electron transport layer, an electron injection layer, or a combination thereof may be used between the light-emitting layer and the cathode. The electron buffer layer may be multilayers for the purpose of controlling electron injection and improving interfacial properties between the light-emitting layer and the electron injection layer, wherein two compounds may be simultaneously used in each of the multilayers. The hole blocking layer or the electron transport layer may also be multilayers, wherein a plurality of compounds may be used in each of the multilayers. In addition, the electron injection layer may be doped with n-dopant.

Dopants comprised in the organic electroluminescent device of the present disclosure may be at least one phosphorescent or fluorescent dopant, preferably a phosphorescent dopant. The phosphorescent dopant materials applied to the organic electroluminescent device according to the present disclosure are not particularly limited, but may be a metallated complex compounds) of a metal atom(s) selected from iridium (Ir), osmium (Os), copper (Cu), and platinum (Pt), and in some case, may be preferably an ortho-metallated complex compound(s) of a metal atom(s) selected from iridium (Ir), osmium (Os), copper (Cu), and platinum (Pt), and in some case, may be more preferably an ortho-metallated iridium complex compound(s).

The dopant comprised in the organic electroluminescent device of the present disclosure may be the compound represented by the following formula 101, but is not limited thereto.

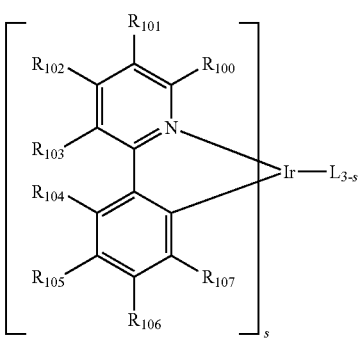

In formula 101,
L is selected from the following structures 1 to 3:

[Structure 1]

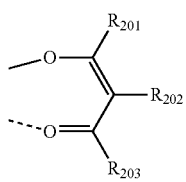

[Structure 2]

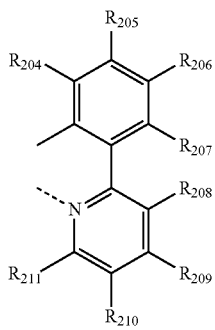

[Structure 3]

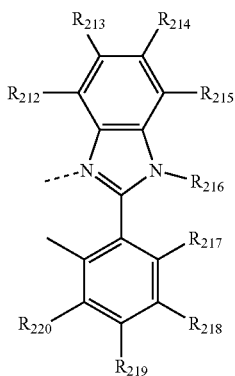

$R_{100}$ to $R_{103}$ each independently represent hydrogen, deuterium, a halogen, a (C1-C30)alkyl unsubstituted or substituted with deuterium and/or a halogen(s), a substituted or unsubstituted (C3-C30)cycloalkyl, a substituted or unsubstituted (C6-C30)aryl, a cyano, a substituted or unsubstituted (3- to 30-membered)heteroaryl, or a substituted or unsubstituted (C1-C30)alkoxy; or may be linked to an adjacent substituent(s) to form a ring(s), e.g., a substituted or unsubstituted quinoline, a substituted or unsubstituted isoquinoline, a substituted or unsubstituted benzofuropyridine, a substituted or unsubstituted benzothienopyridine, a substituted or unsubstituted indenopyridine, a substituted or unsubstituted benzofuroquinoline, a substituted or unsubstituted benzothienoquinoline, or a substituted or unsubstituted indenoquinoline, together with pyridine;

$R_{104}$ to $R_{107}$ each independently represent hydrogen, deuterium, a halogen, a (C1-C30)alkyl unsubstituted or substituted with deuterium and/or a halogen(s), a substituted or unsubstituted (C3-C30)cycloalkyl, a substituted or unsubstituted (C6-C30)aryl, a substituted or unsubstituted (3- to 30-membered)heteroaryl, a cyano, or a substituted or unsubstituted (C1-C30)alkoxy; or may be linked to an adjacent substituent(s) to form a ring(s), e.g., a substituted or unsubstituted naphthalene, a substituted or unsubstituted fluorene, a substituted or unsubstituted dibenzothiophene, a substituted or unsubstituted dibenzofuran, a substituted or unsubstituted indenopyridine, a substituted or unsubstituted benzofuropyridine, or a substituted or unsubstituted benzothienopyridine, together with benzene;

$R_{201}$ to $R_{220}$ each independently represent hydrogen, deuterium, a halogen, a (C1-C30)alkyl unsubstituted or substituted with deuterium and/or a halogen(s), a substituted or unsubstituted (C3-C30)cycloalkyl, or a substituted or unsubstituted (C6-C30)aryl; or may be linked to an adjacent substituent(s) to form a ring(s); and s represents an integer of 1 to 3.

The specific examples of the dopant compound are as follows, but are not limited thereto.

D-1

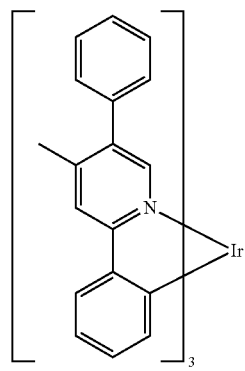

D-2

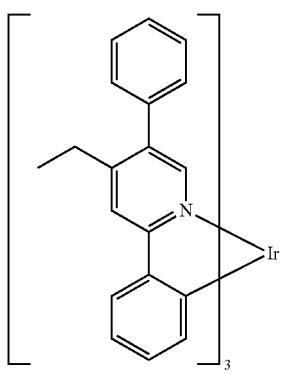

-continued
D-3
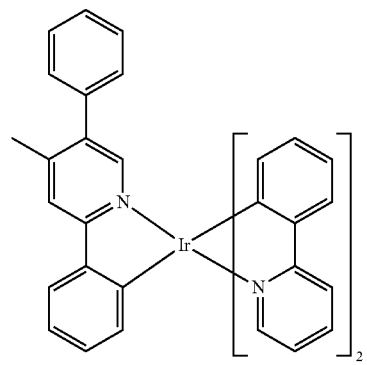
D-4
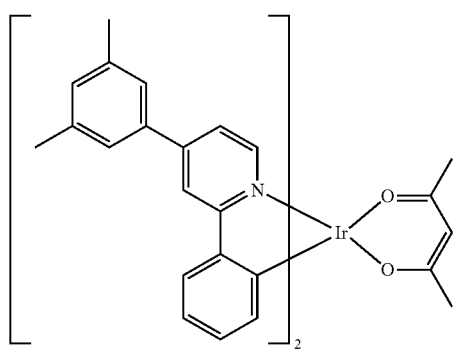
D-5
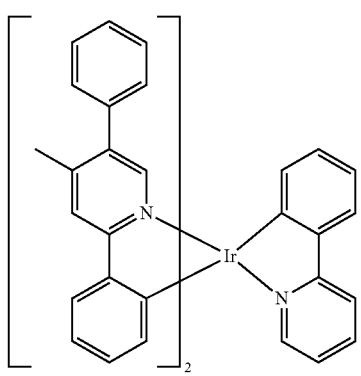
D-6
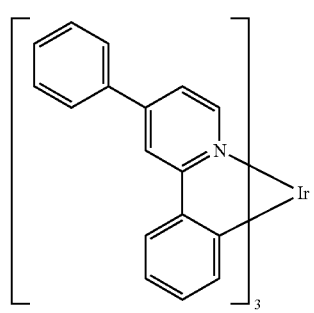
-continued
D-7
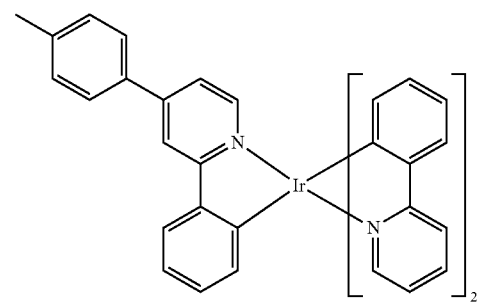
D-8
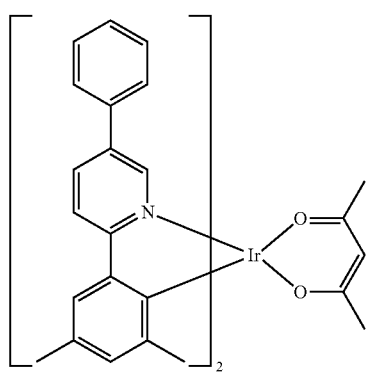
D-9
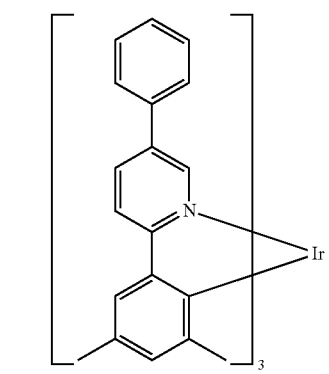
D-10
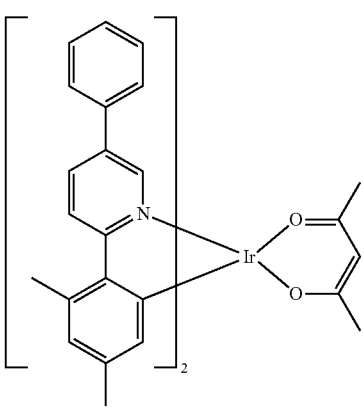

D-11
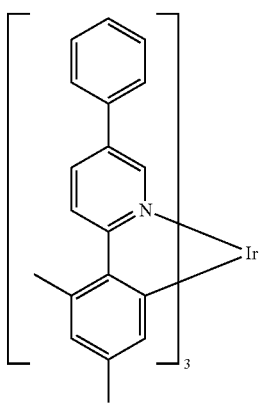
D-12
D-13
D-14
D-15
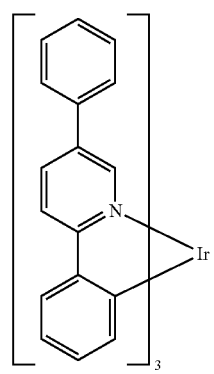
D-16
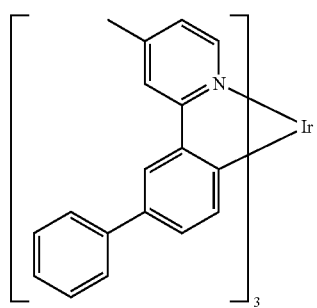
D-17
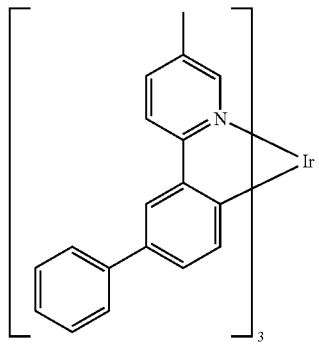
D-18
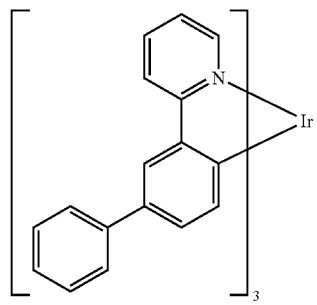

-continued
D-19
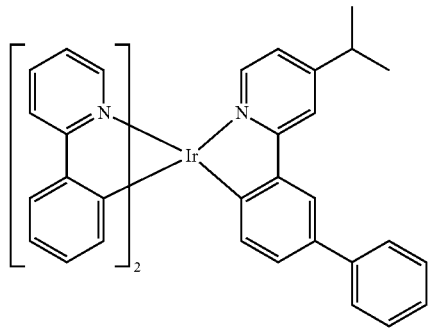
D-20
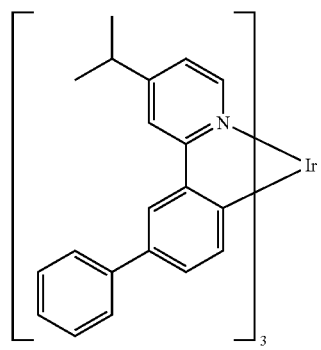
D-21
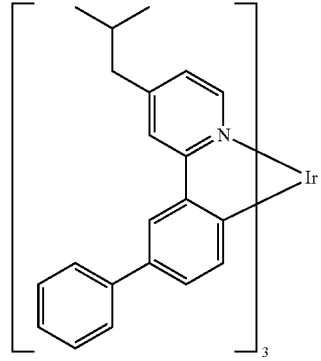
D-22
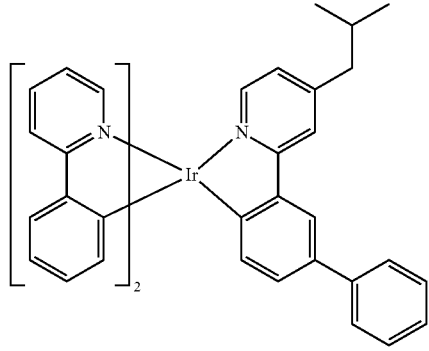
-continued
D-23
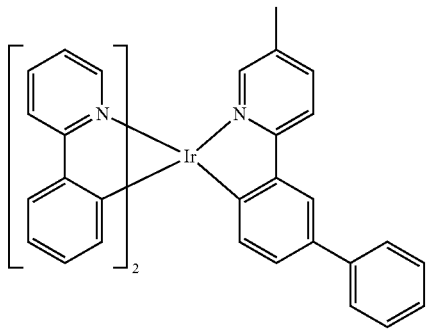
D-24
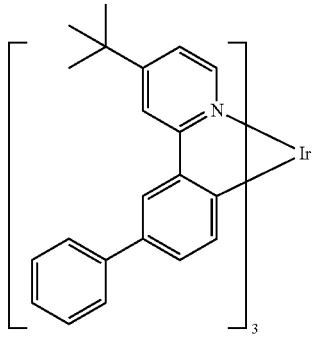
D-25
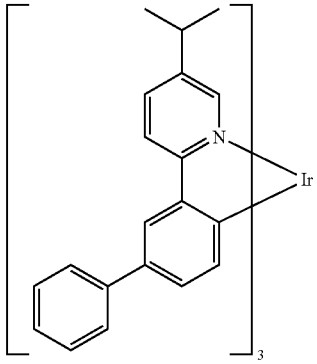
D-26
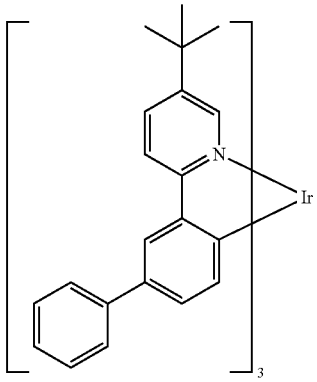

D-27
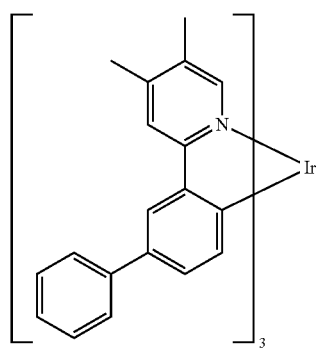
D-28
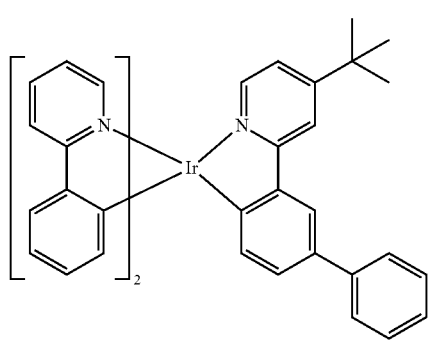
D-29
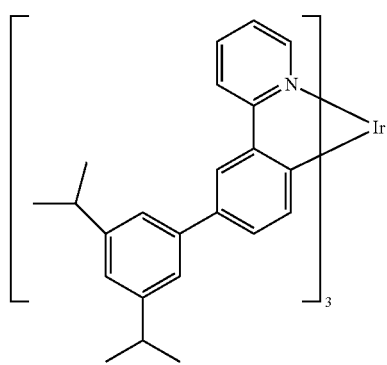
D-30
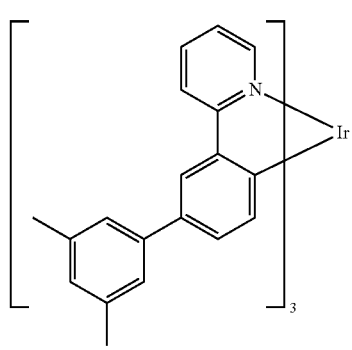
D-31
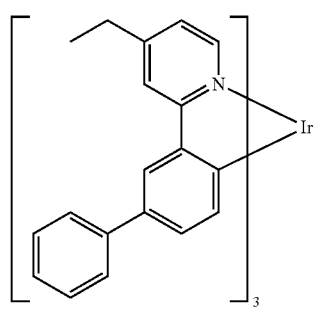
D-32
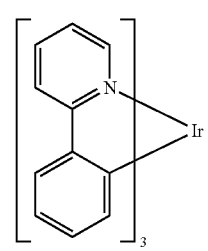
D-33
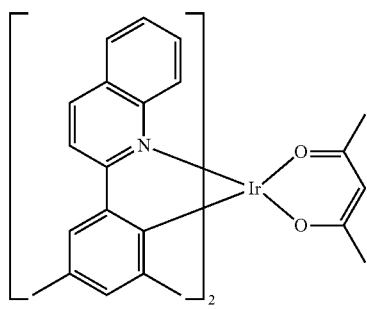
D-34
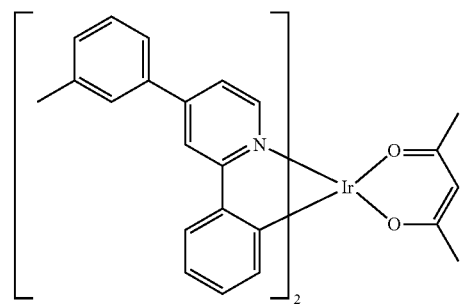
D-35
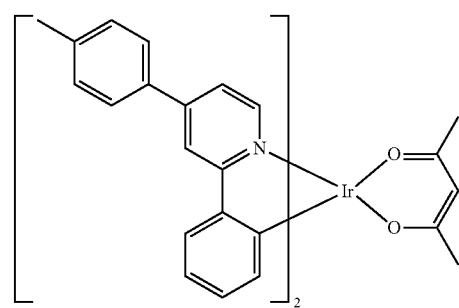

D-36 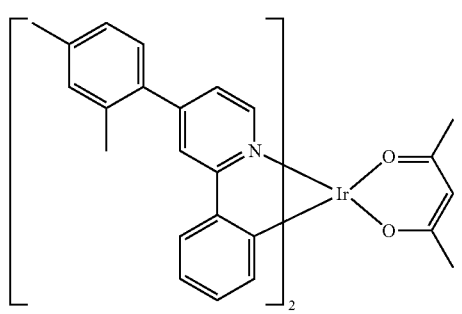
D-40 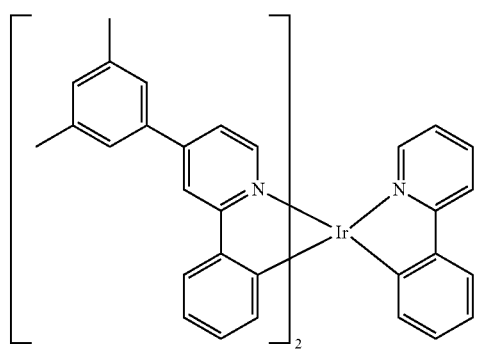
D-37 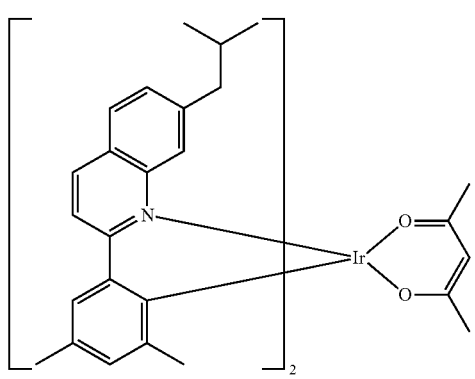
D-41 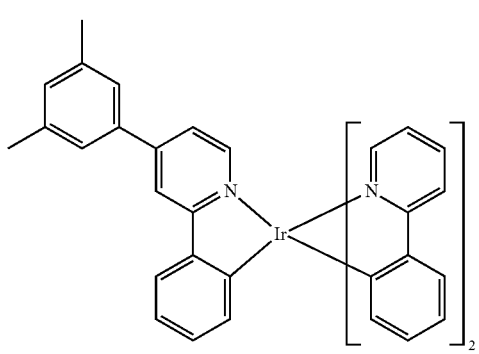
D-38 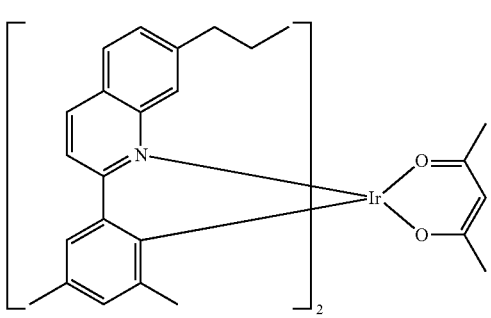
D-42 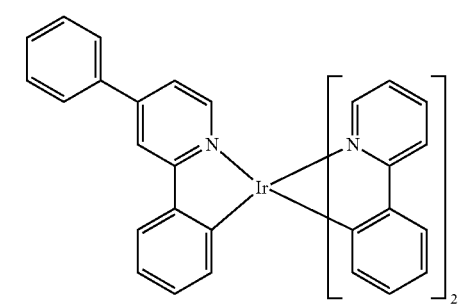
D-39 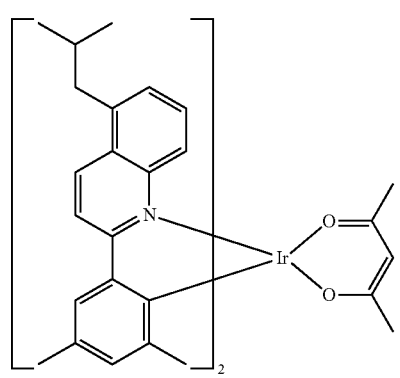
D-43 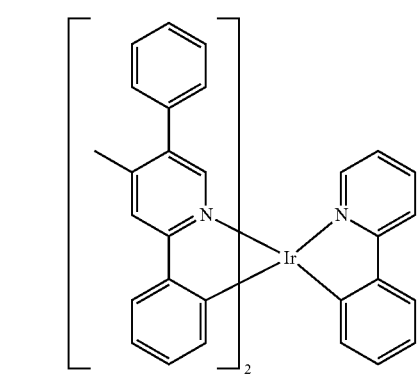

D-44
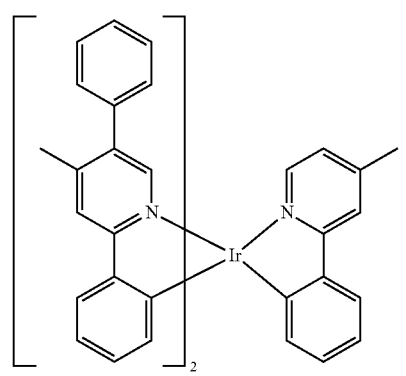
D-45
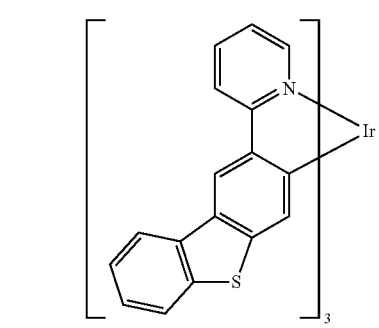
D-46
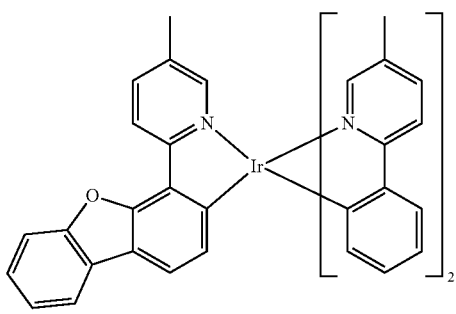
D-47
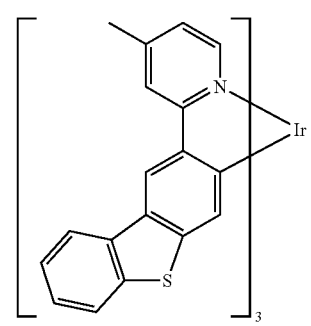
D-48
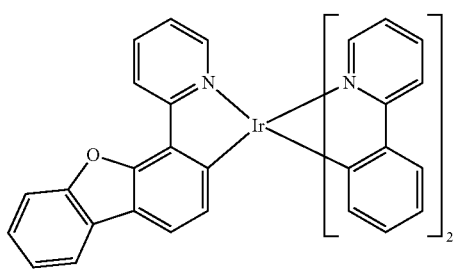
D-49
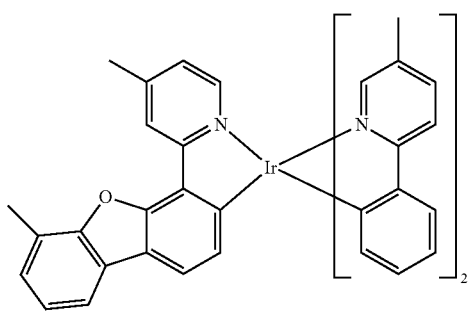
D-50
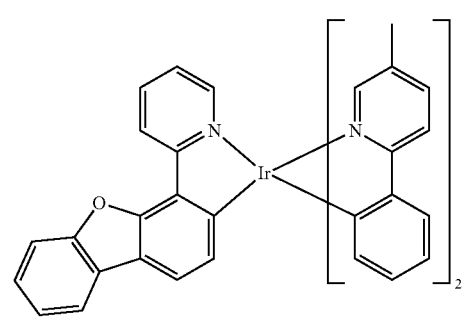
D-51
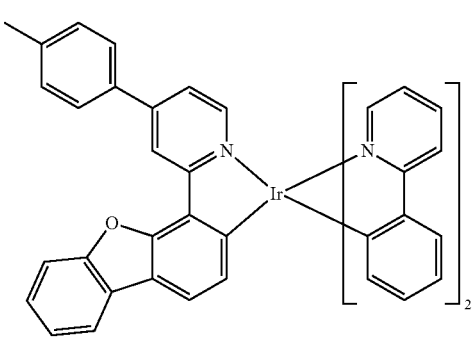
D-52
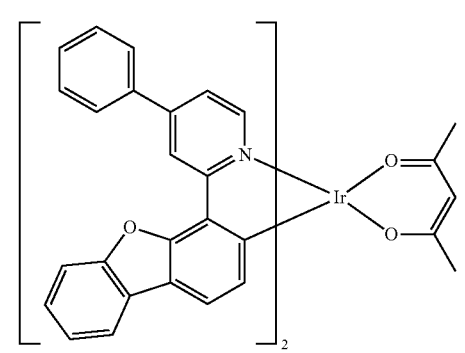
D-53
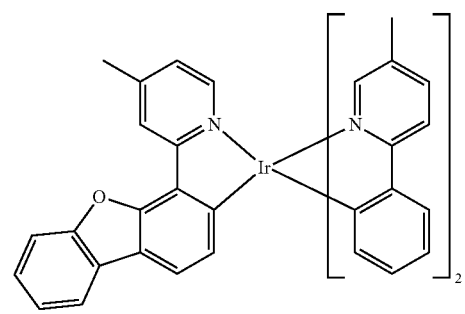

-continued
D-54
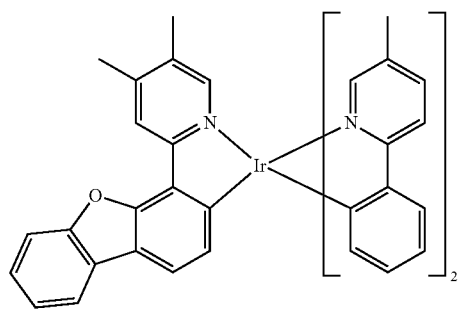
D-55
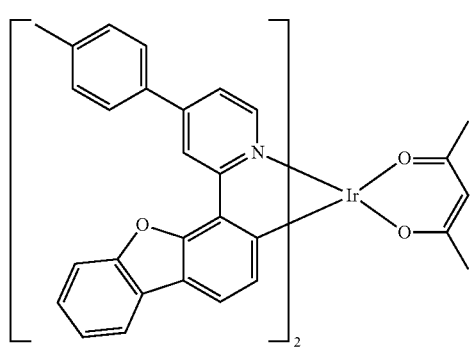
D-56
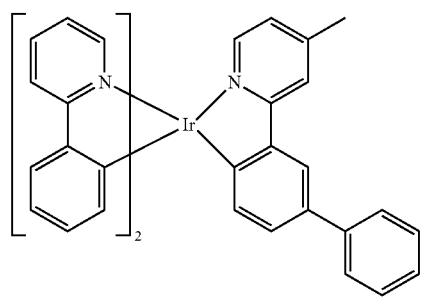
D-57
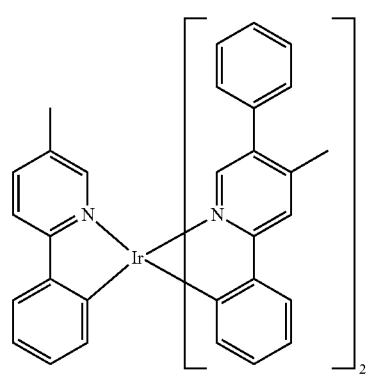
-continued
D-58
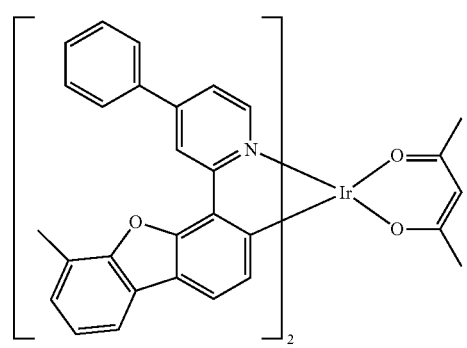
D-59
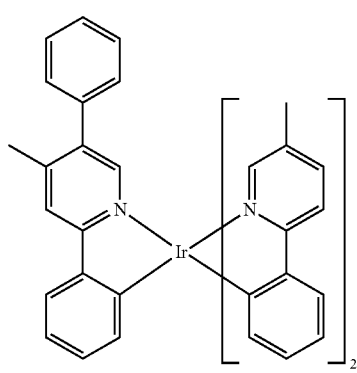
D-60
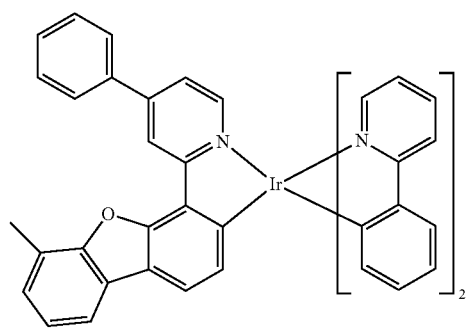
D-61
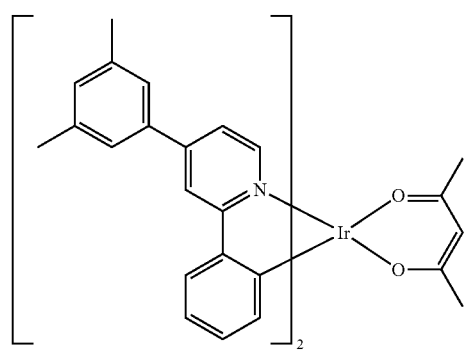

-continued
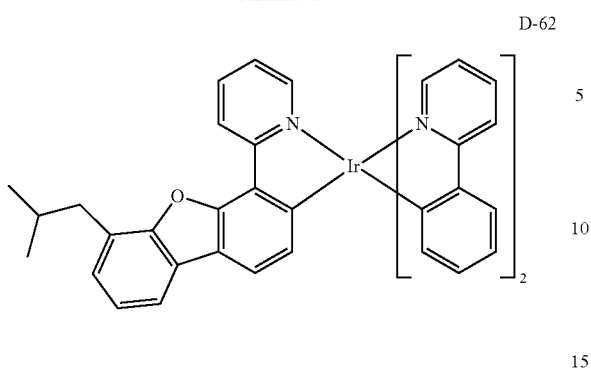 D-62
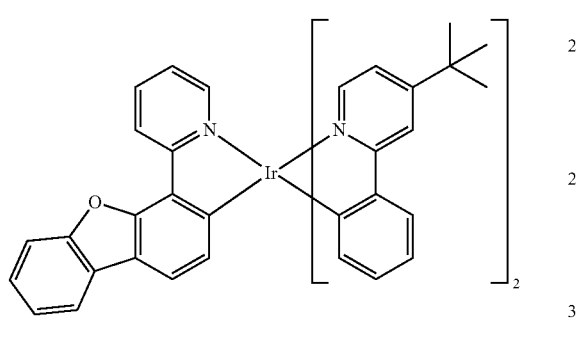 D-63
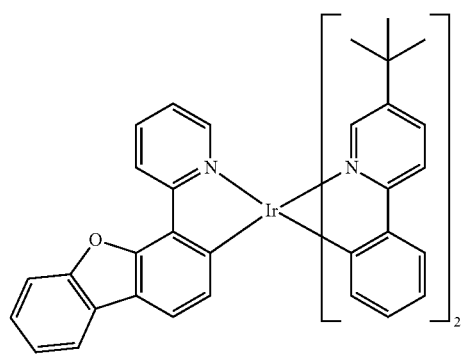 D-64
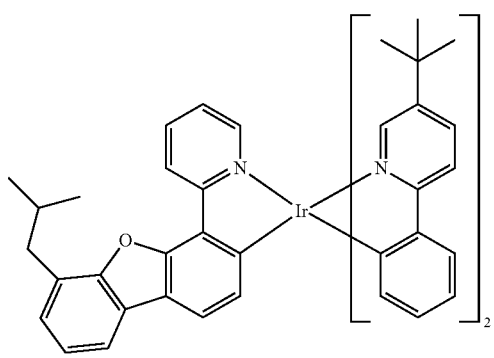 D-65
-continued
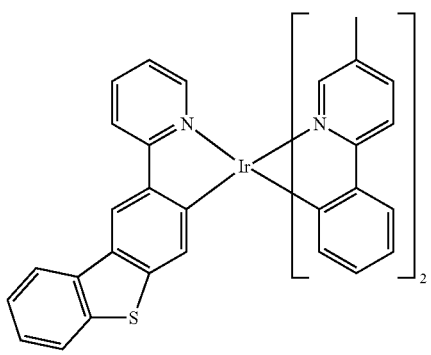 D-66
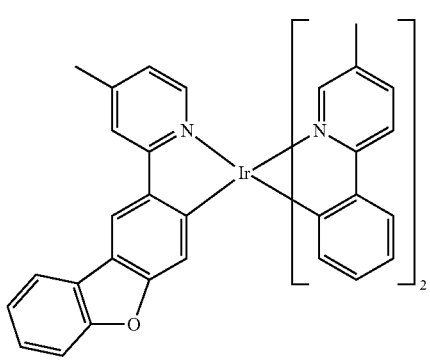 D-67
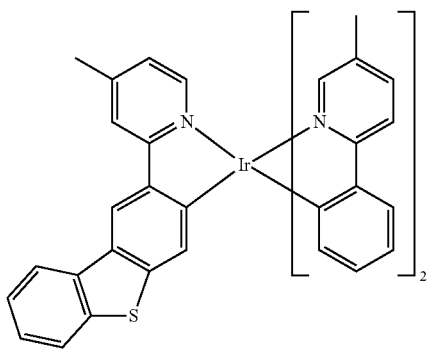 D-68
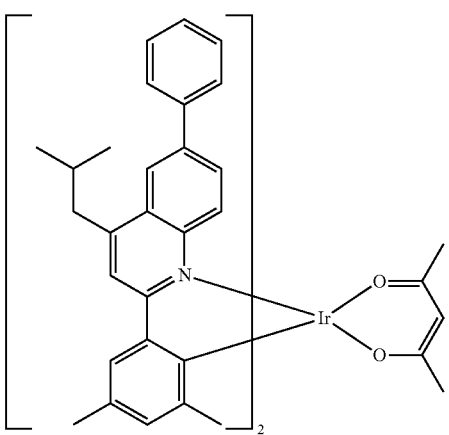 D-69

-continued
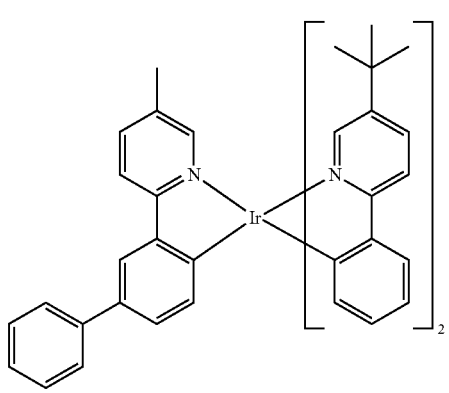
D-70
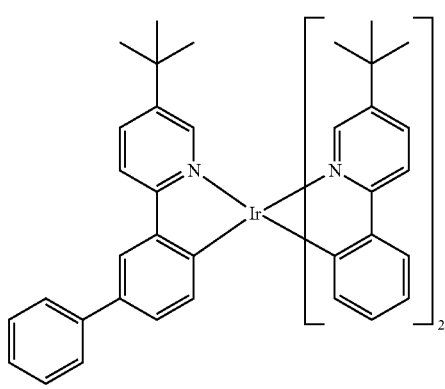
D-71
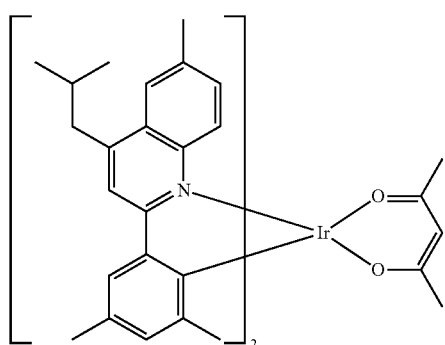
D-72
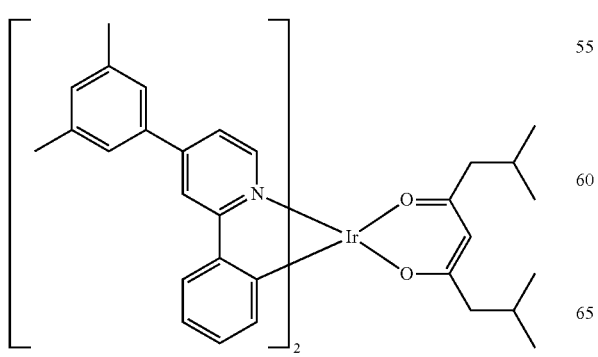
D-73
-continued
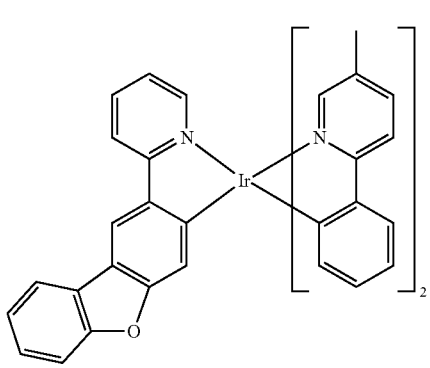
D-74
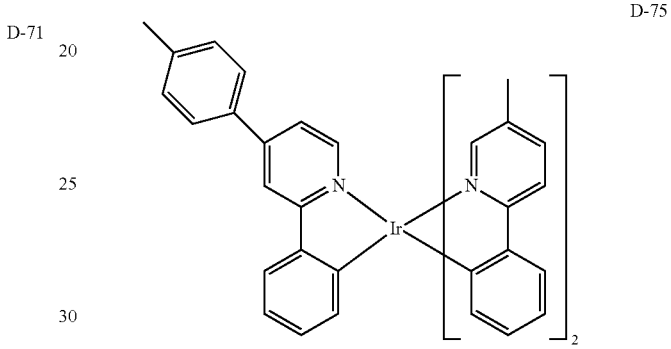
D-75
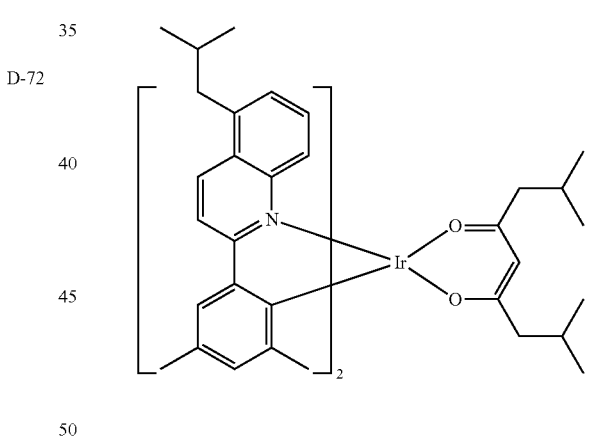
D-76
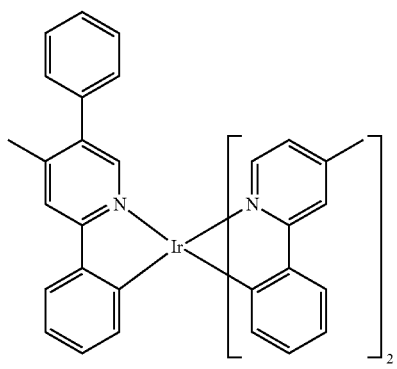
D-77

D-78
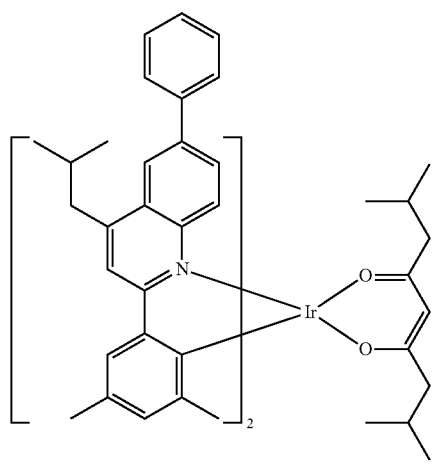
D-79
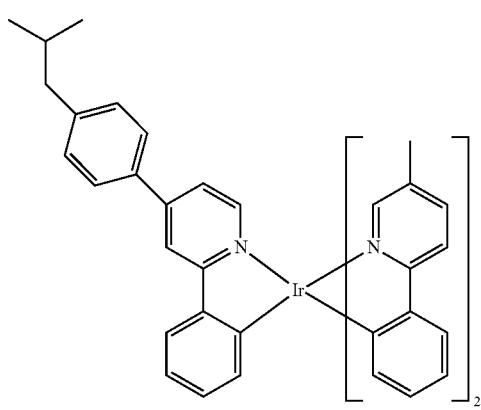
D-80
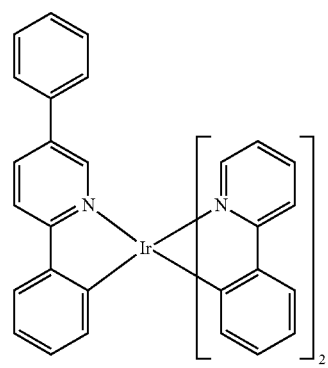
D-81
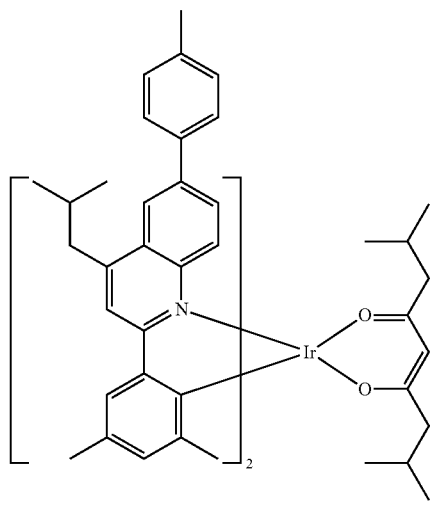
D-82
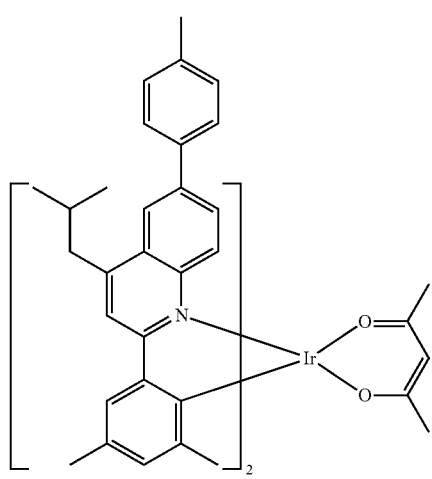
D-83
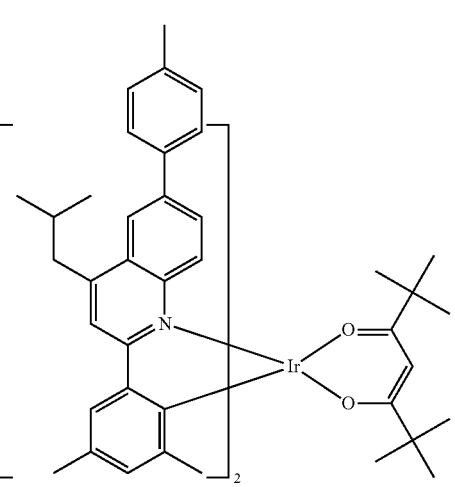

D-84
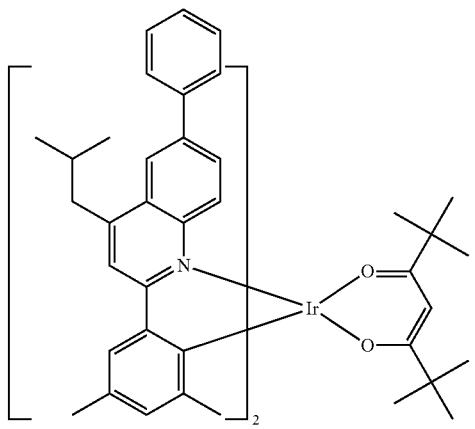
D-88
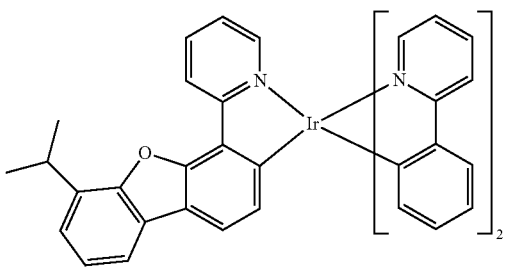
D-85
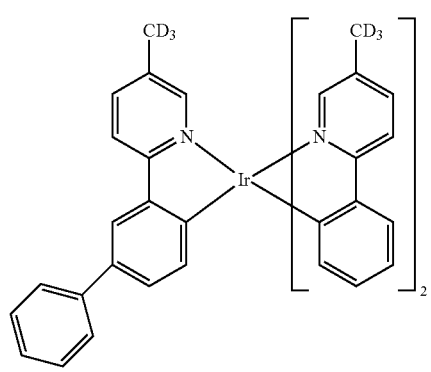
D-89
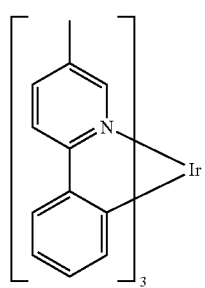
D-86
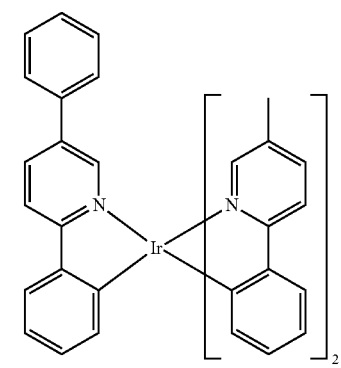
D-90
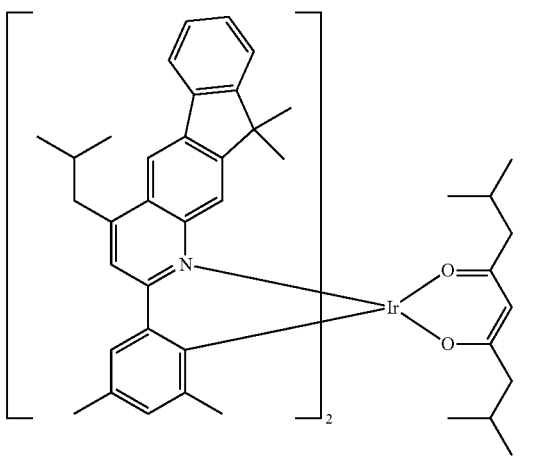
D-87
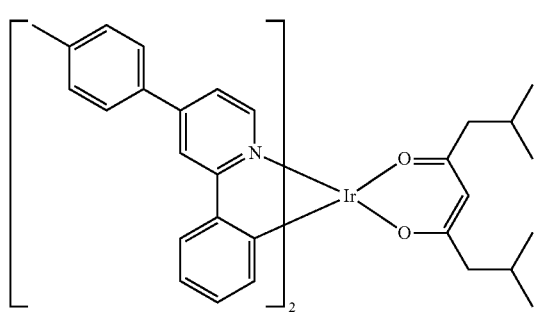
D-91
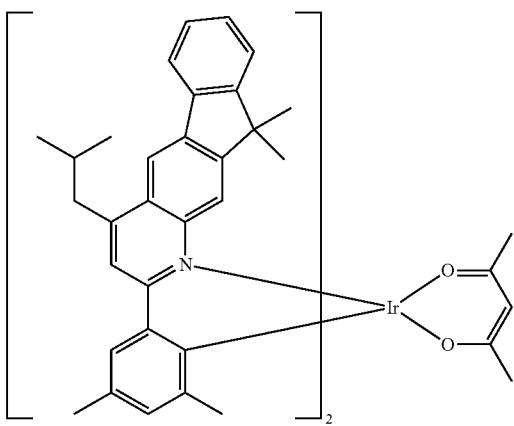

D-92
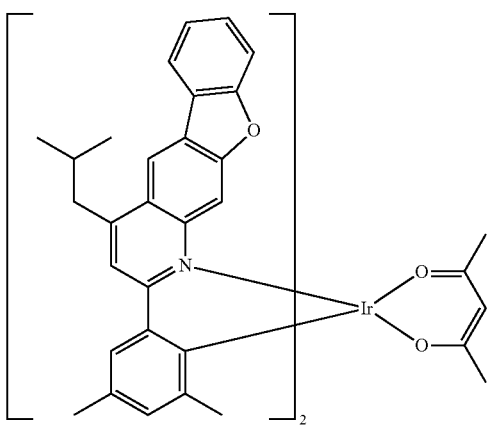
D-93
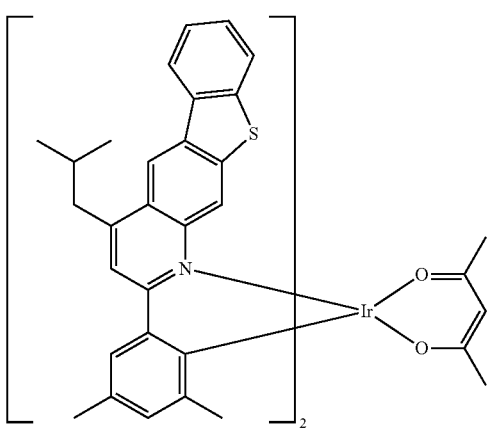
D-94
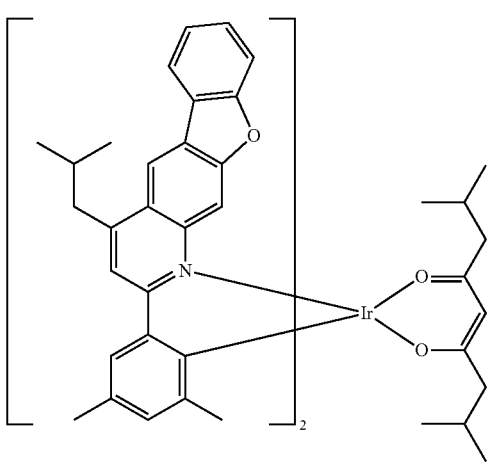
D-95
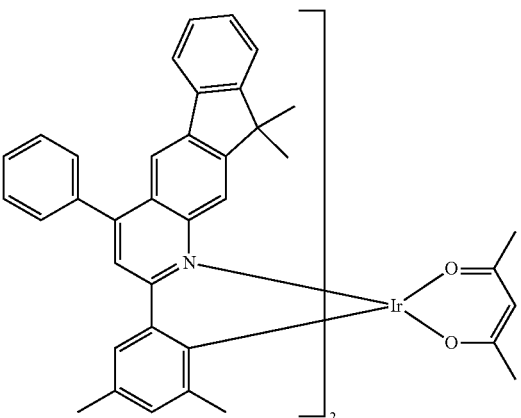
D-96
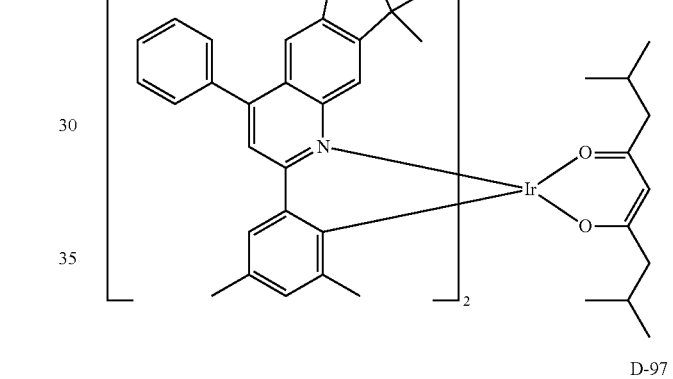
D-97
D-98
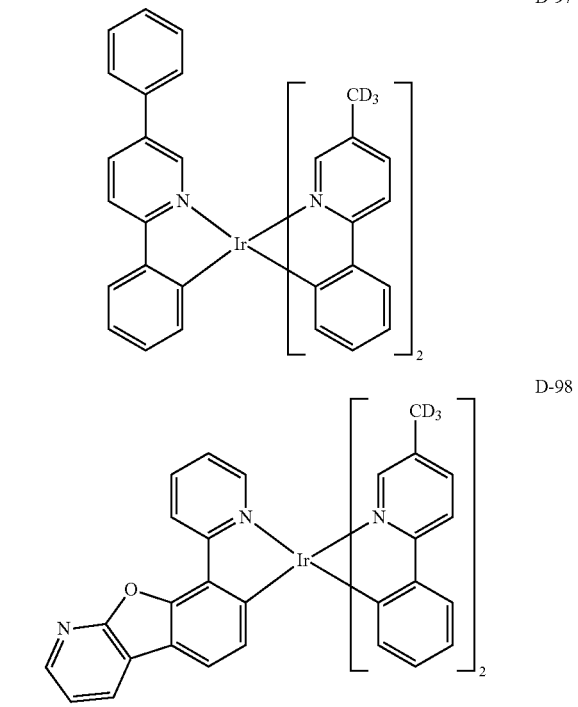

-continued
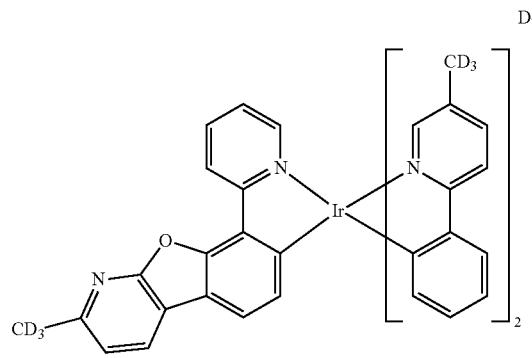
D-99
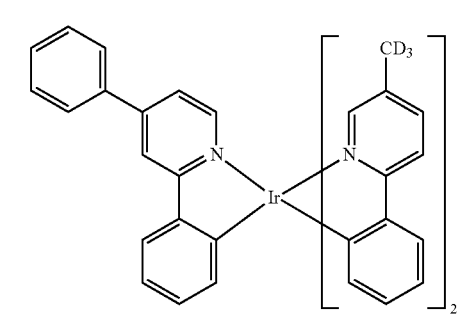
D-100
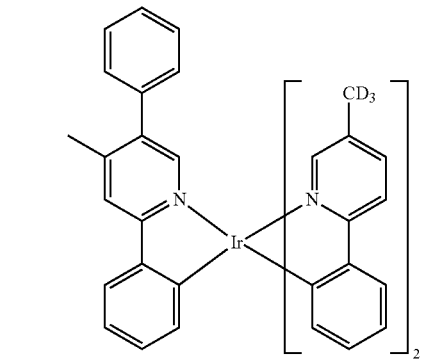
D-101
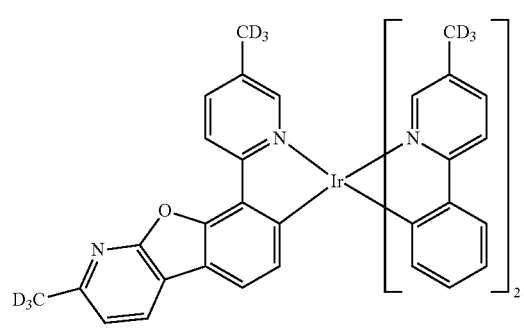
D-102
-continued
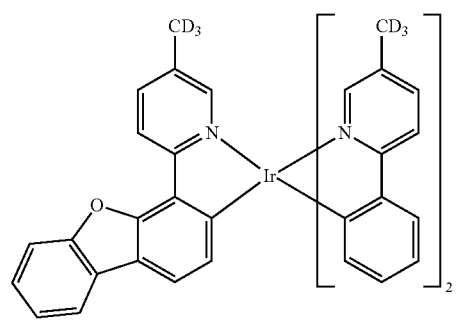
D-103
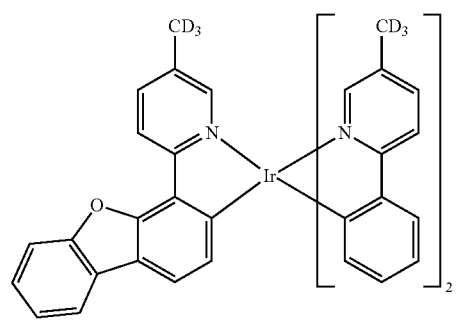
D-104
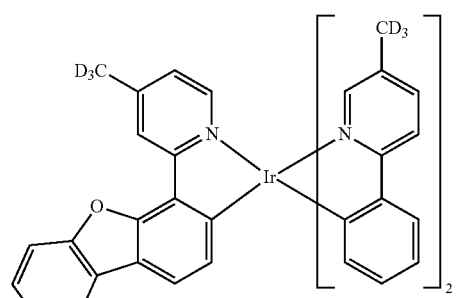
D-105
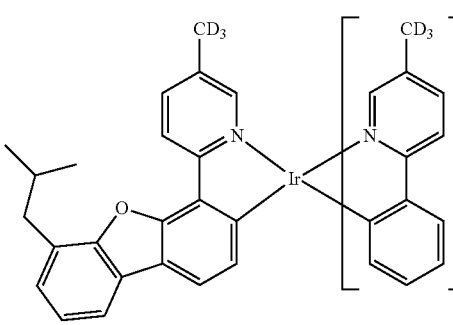
D-106
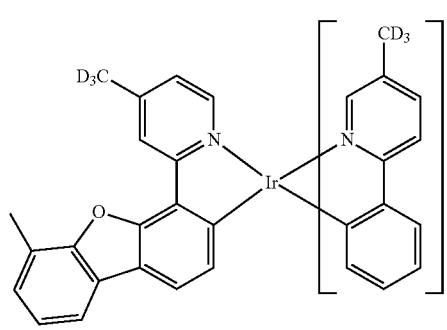
D-107

D-108
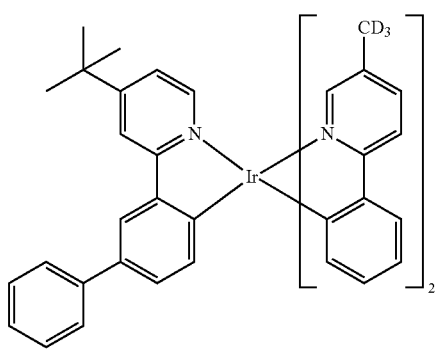
D-109
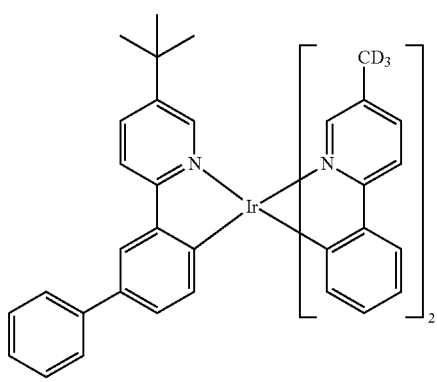
D-110
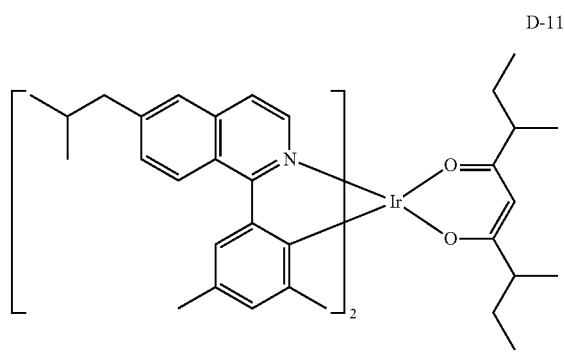
D-111
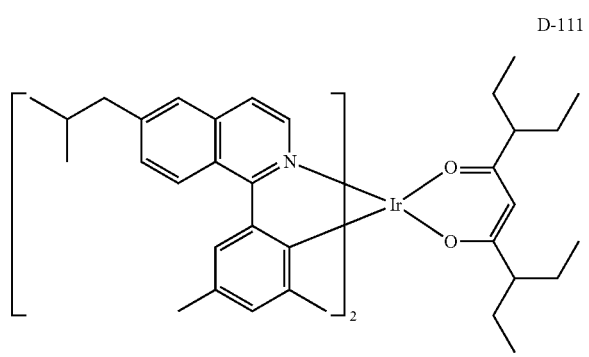
D-112
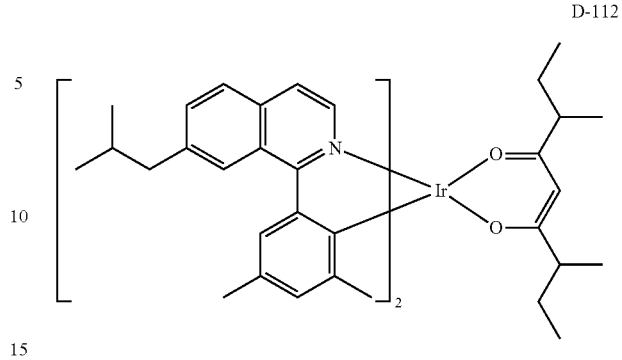
D-113
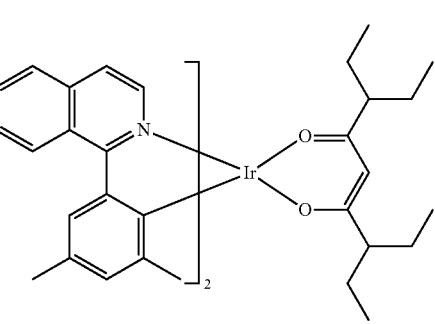
D-114
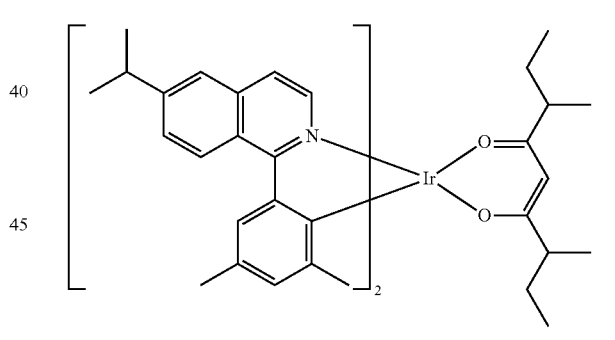
D-115
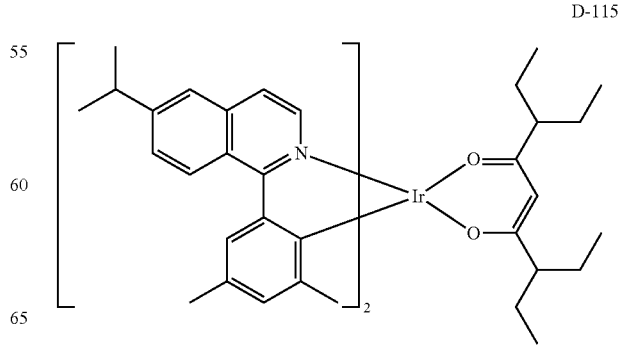

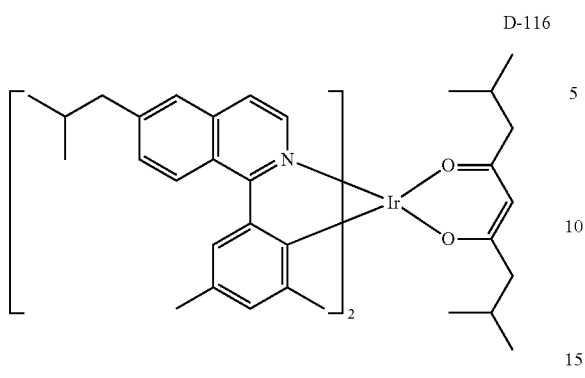
D-116
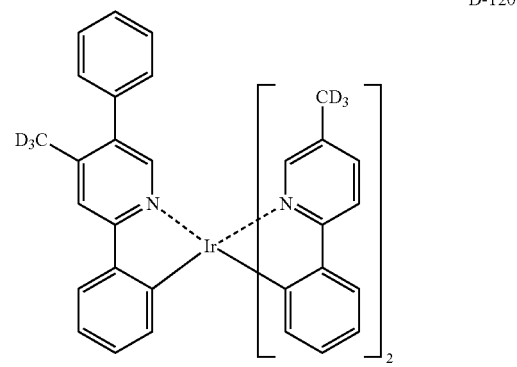
D-120
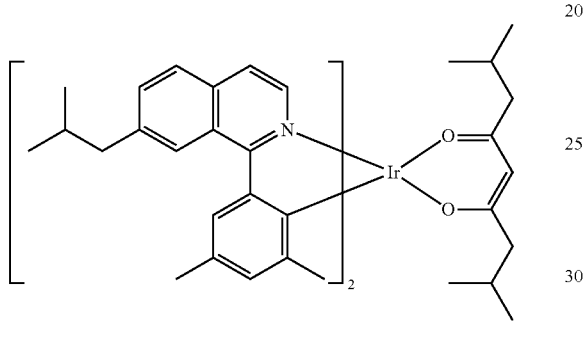
D-117
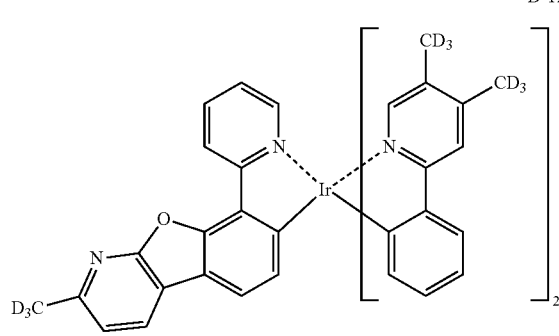
D-121
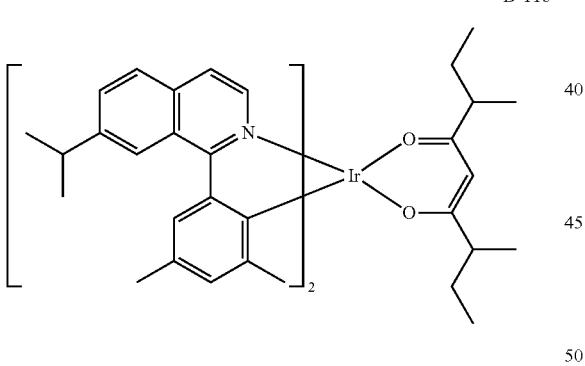
D-118
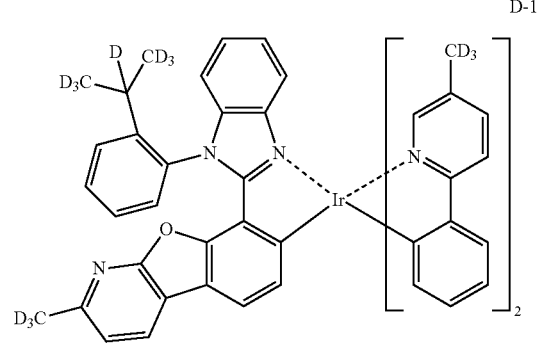
D-122
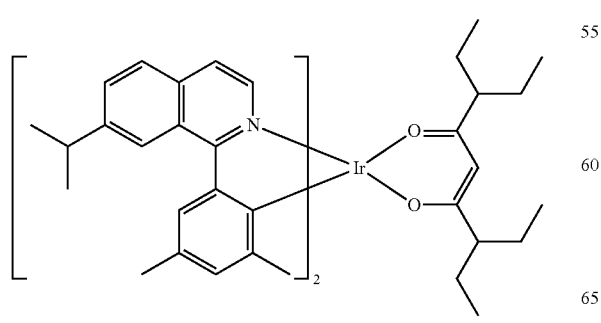
D-119
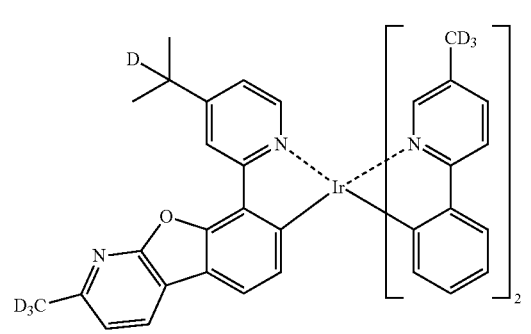
D-123

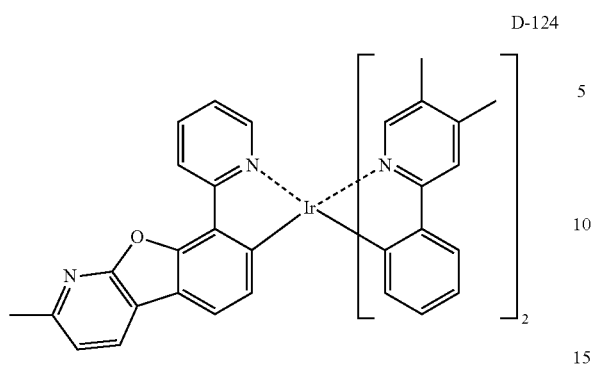
D-124
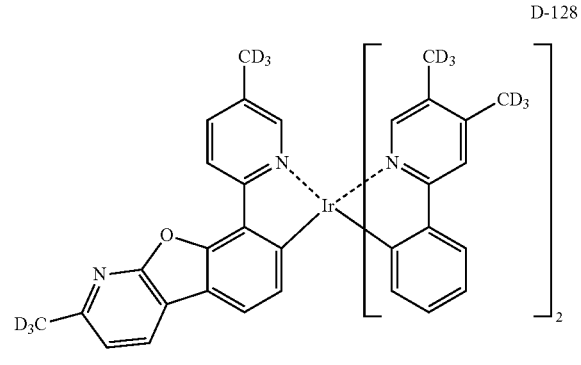
D-128
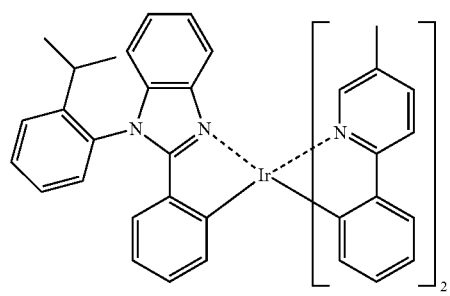
D-125
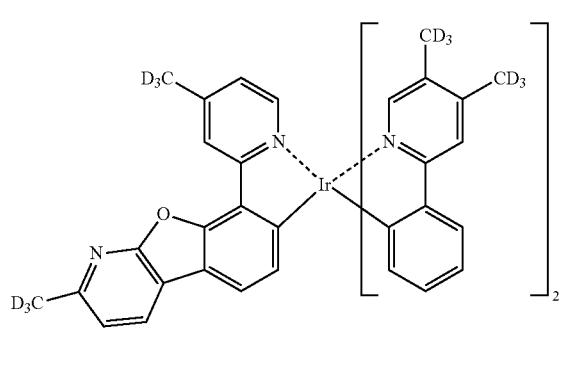
D-126
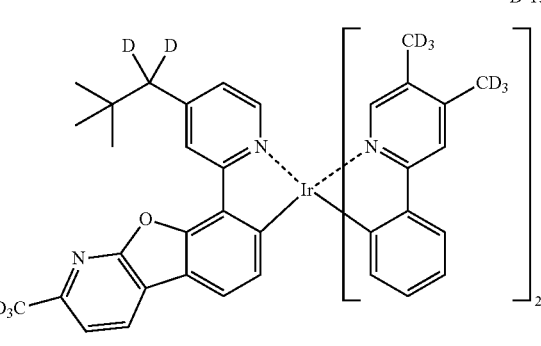
D-129
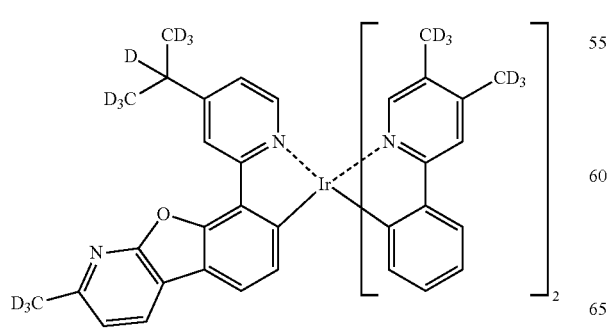
D-127
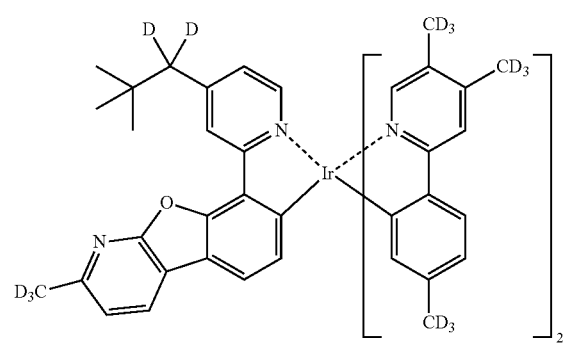
D-130
D-131

-continued
D-132
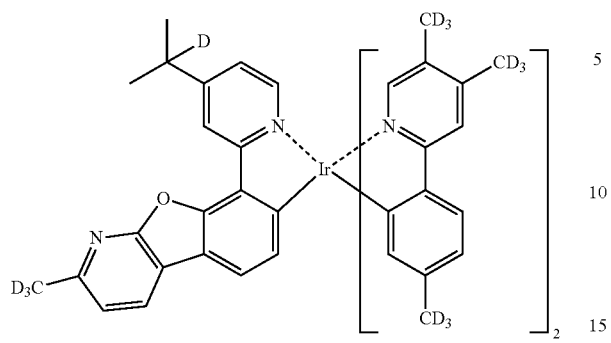
D-133
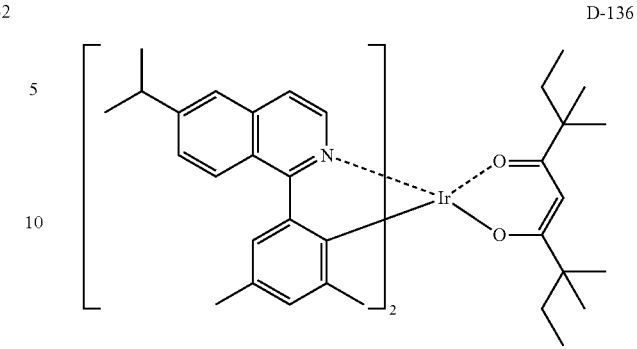
D-134
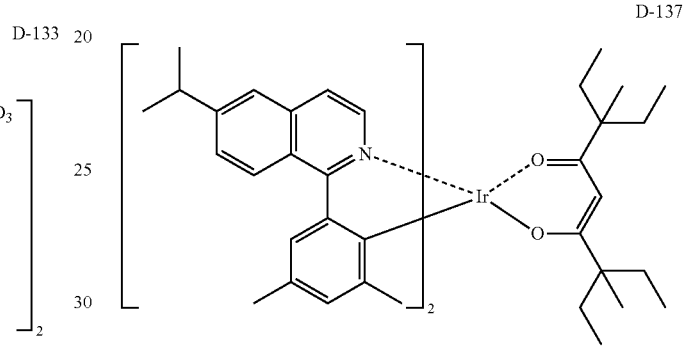
D-135
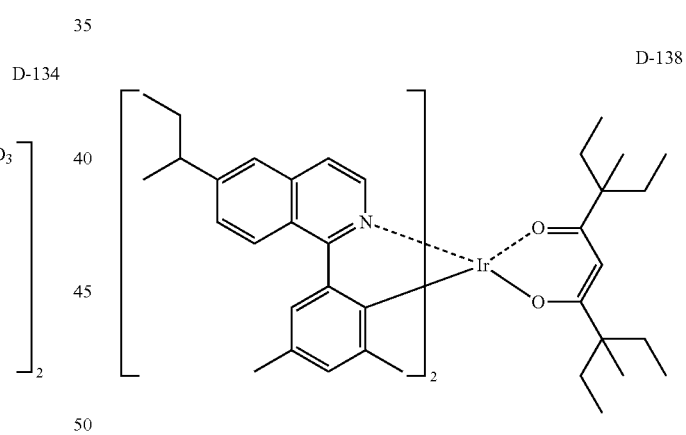
D-136
D-137
D-138
D-139
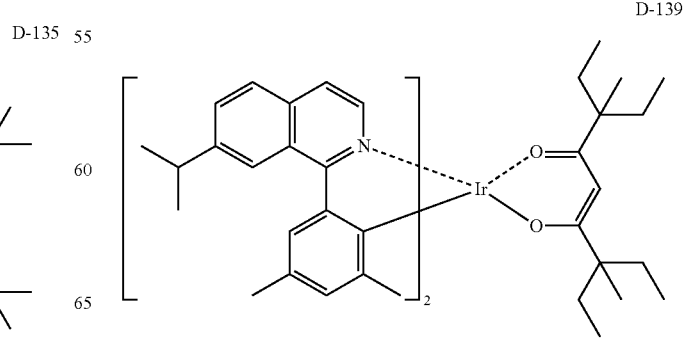

D-140
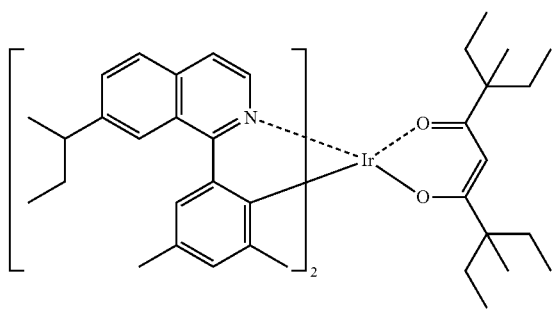
D-144
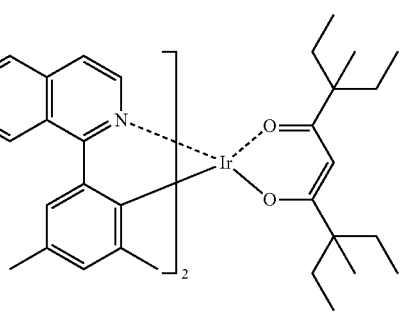
D-141
D-145
D-142
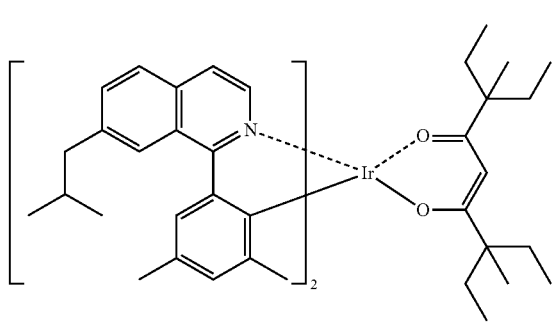
D-146
D-143
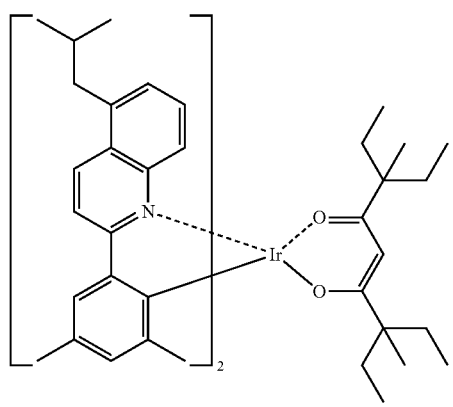
D-147
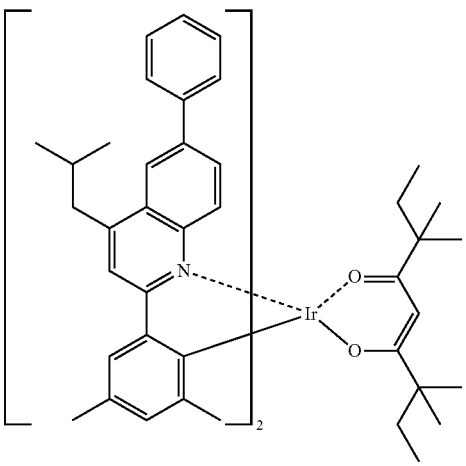

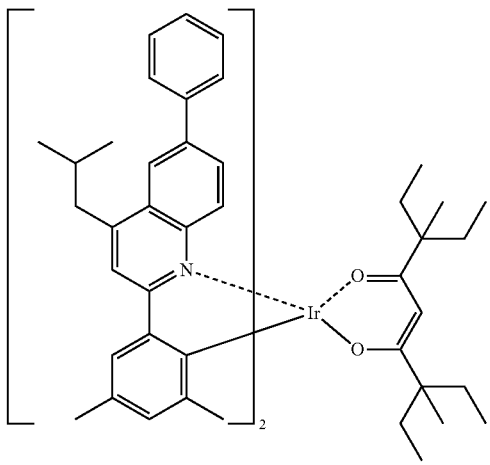

D-148

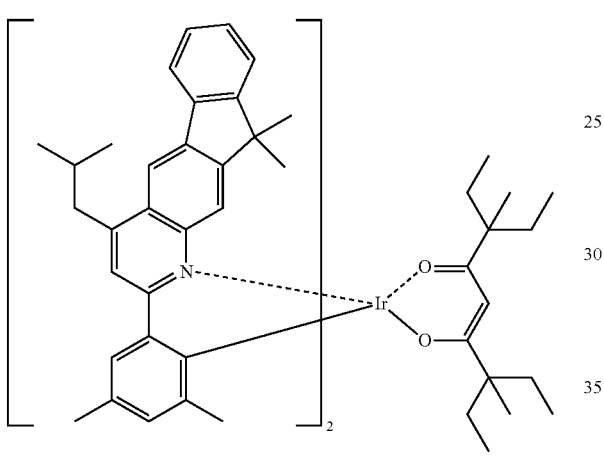

D-149

Each layer of the OLED of the present disclosure can be formed by either dry film-forming methods such as vacuum evaporation, sputtering, plasma, ion plating, etc., or wet film-forming methods such as ink jet printing, nozzle printing, slot coating, spin coating, dip coating, flow coating, etc.

When using a wet film-forming method, a thin film can be formed by dissolving or diffusing the materials forming each layer into any suitable solvent such as ethanol, chloroform, tetrahydrofuran, dioxane, etc. The solvent is not particularly limited as long as the material forming each layer is soluble or dispersible in the solvents, which do not cause any problems in forming a film.

In addition, the first and the second host compounds of the present disclosure may be film-formed by the above-listed methods, commonly by a co-evaporation process or a mixture-evaporation process. The co-evaporation is a mixed deposition method in which two or more materials are placed in a respective individual crucible source and a current is applied to both cells at the same time to evaporate the materials. The mixture-evaporation is a mixed deposition method in which two or more materials are mixed in one crucible source before evaporating them, and a current is applied to one cell to evaporate the materials. In addition, if the first and the second host compounds are present in the same layer or different layers in an OLED, the two host compounds may individually form films. For example, the second host compound may be deposited after depositing the first host compound.

The present disclosure may provide a display device by using the plurality of host materials including the compound represented by formula 1 and the compound represented by formula 2. That is, it is possible to produce a display system and a lighting system by using the plurality of host materials of the present disclosure. Specifically, a display system, for example, a display system for white organic light emitting devices, smart phones, tablets, notebooks, PCs, TVs, or cars; or a lighting system, for example, an outdoor or indoor lighting system, can be produced by using the plurality of host materials of the present disclosure.

Hereinafter, the preparation method of the compound of the present disclosure, and the properties thereof, and the properties of the OLED comprising the plurality of host materials of the present disclosure will be explained in detail with reference to the representative compounds of the present disclosure. However, the following examples are only to describe the characteristics of the OLED device comprising the compound according to the present disclosure and the plurality of host materials according to the present disclosure for a detailed understanding of the present disclosure, but the present disclosure is not limited to the following examples.

EXAMPLE 1

Preparation of Compound H2-68

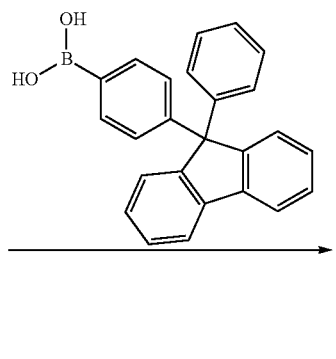

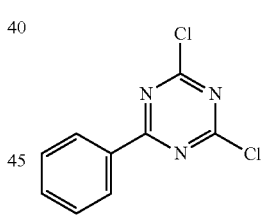

A

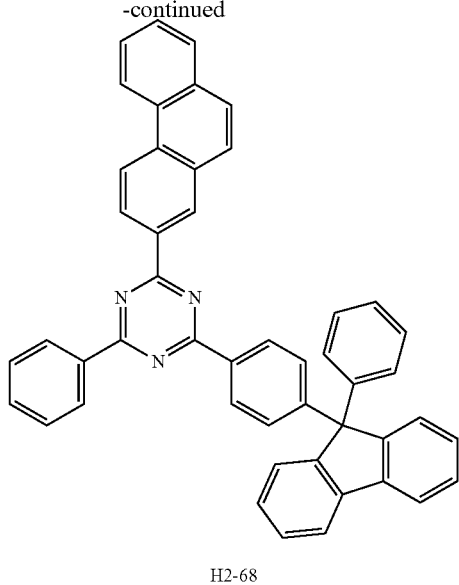

H2-68

Synthesis of Compound A 2,4-dichloro-6-phenyl-1,3,5-triazine (20 g, 55.2 mmol), (4-(9-phenyl-9H-fluorene-9-yl)phenyl)boronic acid (18.8 g, 83.1 mmol), Pd(PPh$_3$)$_4$ (4.8 g, 2.8 mmol), K$_2$CO$_3$ (23 g, 111 mmol), 140 mL of toluene, 40 mL of ethanol, and 40 mL of water were added to a flask, dissolved, and then refluxed at 120° C. for 2 hours. After completion of the reaction, the organic layer was extracted with ethyl acetate. After the residual moisture was removed with magnesium sulfate, the residue was dried, and separated by column chromatography to obtain 8 g of compound A (yield: 28%).

Synthesis of Compound H2-68

Compound A (8 g, 15.7 mmol), 4,4,5,5-tetramethyl-2-(phenanthrene-2-yl)-1,3,2-dioxaborolane (4.1 g, 18.4 mmol), Pd (PPh$_3$)$_4$ (1 g, 0.8 mmol), K$_2$CO$_3$ (4.4 g, 114 mmol), 40 mL of toluene, 10 mL of ethanol, and 10 mL of water were added to a flask, dissolved, and then refluxed at 120° C. for 2 hours. After completion of the reaction, the organic layer was extracted with ethyl acetate. After the residual moisture was removed with magnesium sulfate, the residue was dried, and separated by column chromatography to obtain 1.5 g of compound H2-68 (yield: 15%).

| Compound | MW | M.P. |
| --- | --- | --- |
| H2-68 | 649.80 | 234° C. |

EXAMPLE 2

Preparation of Compound H2-66

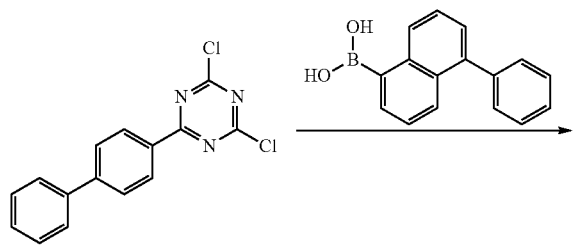

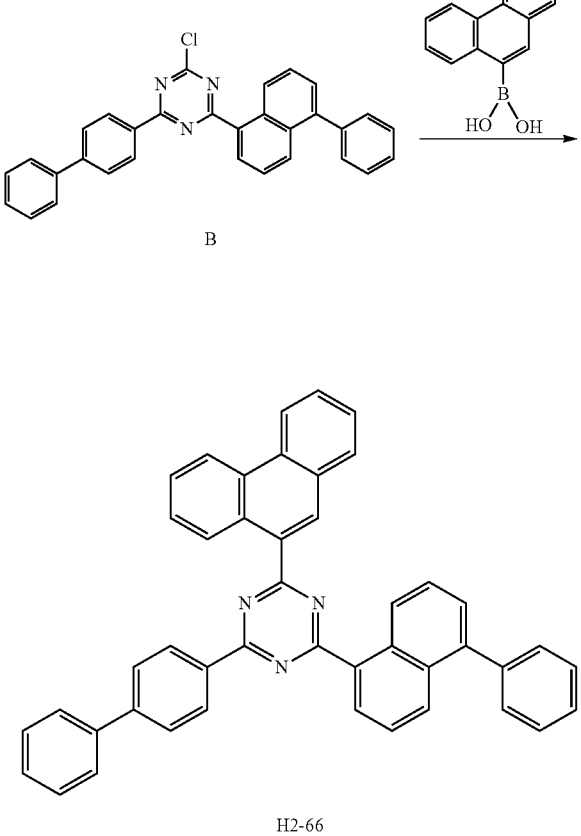

H2-66

Synthesis of Compound B 2-([1,1'-biphenyl]-4-yl)-4,6-dichloro-1,3,5-triazine (36.5 g, 120.7 mmol), (5-phenylnaphthalene-1-yl) boronic acid (15 g, 60.4 mmol), Pd(PPh$_3$)$_4$ (7 g, 3 mmol), K$_2$CO$_3$ (33 g, 120.8 mmol), 300 mL of toluene, 100 mL of ethanol, and 100 mL of water were added to a flask, dissolved, and then refluxed at 120° C. for 2 hours. After completion of the reaction, the organic layer was extracted with ethyl acetate. After the residual moisture was removed with magnesium sulfate, the residue was dried, and separated by column chromatography to obtain 22 g of compound B (yield: 77%).

Synthesis of Compound H2-66

Compound B (22 g, 46.8 mmol), phenanthrene-9-yl boronic acid (15 g, 70.2 mmol), Pd(PPh$_3$)$_4$ (2.8 g, 2.5 mmol), K$_2$CO$_3$ (13 g, 94 mmol), 120 mL of toluene, 40 mL of ethanol, and 40 mL of water were added to a flask, dissolved, and then refluxed at 120° C. for 2 hours. After completion of the reaction, the organic layer was extracted with ethyl acetate. After the residual moisture was removed with magnesium sulfate, the residue was dried, and separated by column chromatography to obtain compound 5.2 g of H2-66 (yield: 18%).

| Compound | MW | M.P. |
| --- | --- | --- |
| H2-66 | 611.75 | 222° C. |

EXAMPLE 3

Preparation of Compound H2-137

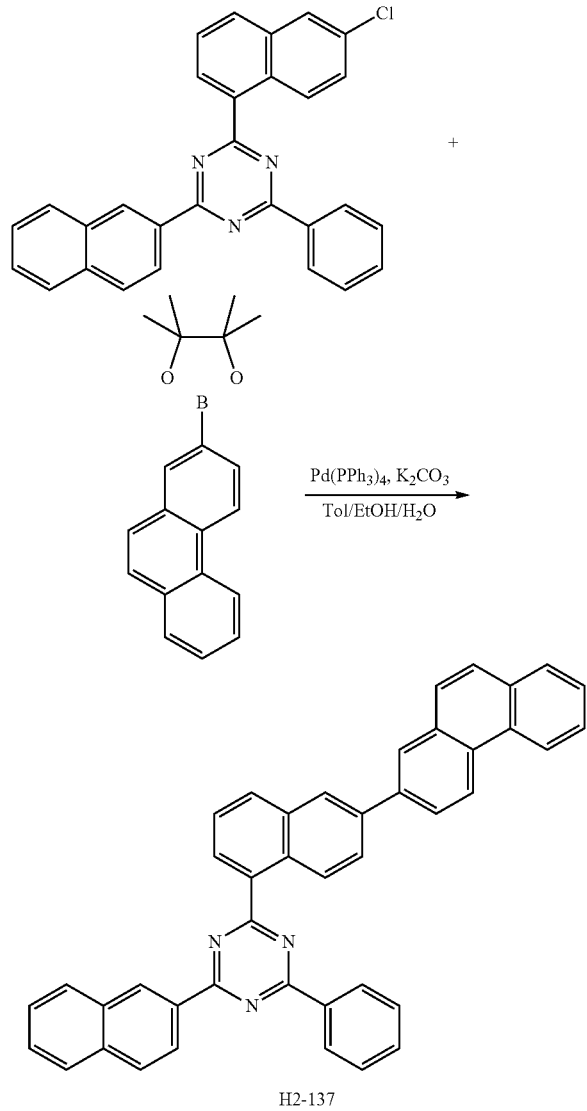

2-(6-chloronaphthalene-1-yl)-4-(naphthalene-2-yl)-6-phenyl-1,3,5-triazine (5 g, 11.28 mmol), 4,4,5,5-tetramethyl-2-(phenanthrene-2-yl)-1,3,2-dioxaborolane (4.1 g, 12.41 mmol), Pd(PPh$_3$)$_4$ (0.6 g, 0.56 mmol), K$_2$CO$_3$ (3.2 g, 23 mmol), 30 mL of toluene, 10 mL of ethanol, and 10 mL of water were added to a flask, dissolved, and then refluxed at 120° C. for 2 hours. After completion of the reaction, the mixture was cooled to room temperature, and the resulting solid was filtered under reduced pressure. The solid was dissolved in phenyl chloride, filtered through silica with methylene chloride (MC), and recrystallized with o-xylene to obtain compound 2.7 g of H2-137 (yield: 40%).

| Compound | MW | M.P. |
| --- | --- | --- |
| H2-137 | 499.5 | 243.7° C. |

EXAMPLE 4

Preparation of Compound H2-3

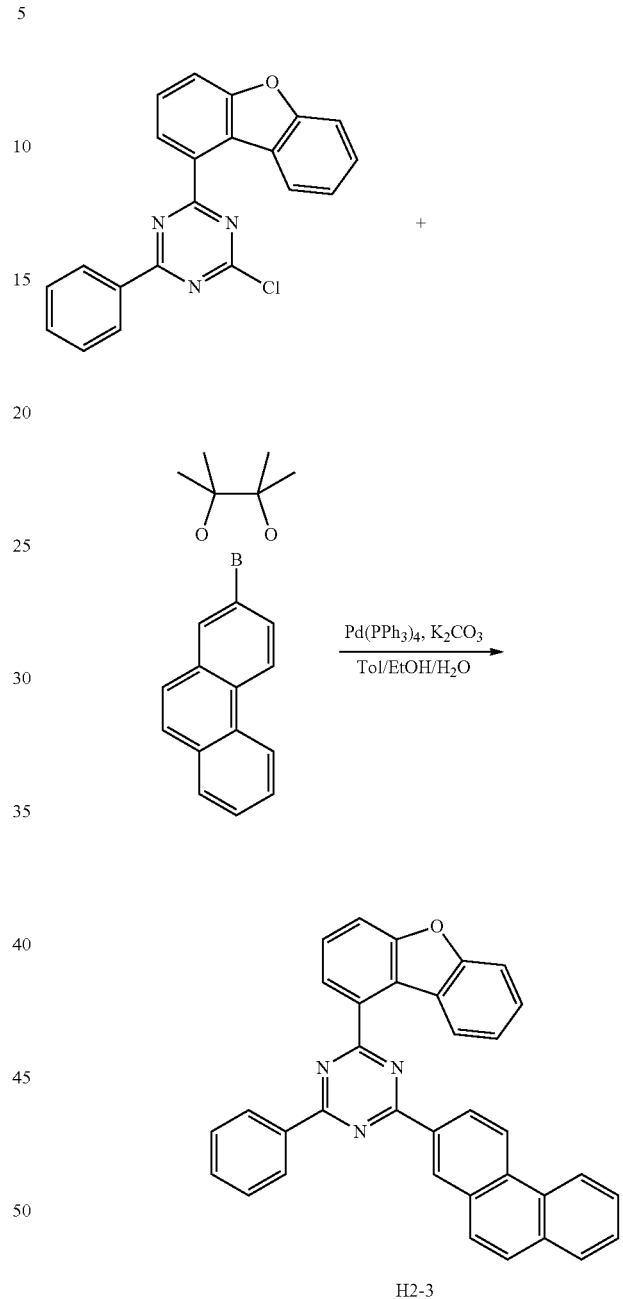

2-chloro-4-(dibenzo[b,d]furan-1-yl)-6-phenyl-1,3,5-triazine (8.7 g, 24.33 mmol), 4,4,5,5-tetramethyl-2-(phenanthrene-2-yl)-1,3,2-dioxaborolane (7.4 g, 24.33 mmol), Pd(PPh$_3$)$_4$ (1.4 g, 1.216 mmol), K$_2$CO$_3$ (10 g, 72.96 mmol), 148 mL of toluene, 37 mL of ethanol, and 37 mL of water were added to a flask, dissolved, and then refluxed at 140° C., for 2 hours. After completion of the reaction, the mixture was cooled to room temperature, and the resulting solid was filtered under reduced pressure. The solid was dissolved in phenyl chloride, filtered through silica with MC, and recrystallized with o-xylene to obtain 4.3 g of compound H2-3 (yield: 35%).

| Compound | MW | M.P. |
|---|---|---|
| H2-3 | 499.5 | 243.7° C. |

EXAMPLE 5

Preparation of Compound H2-2

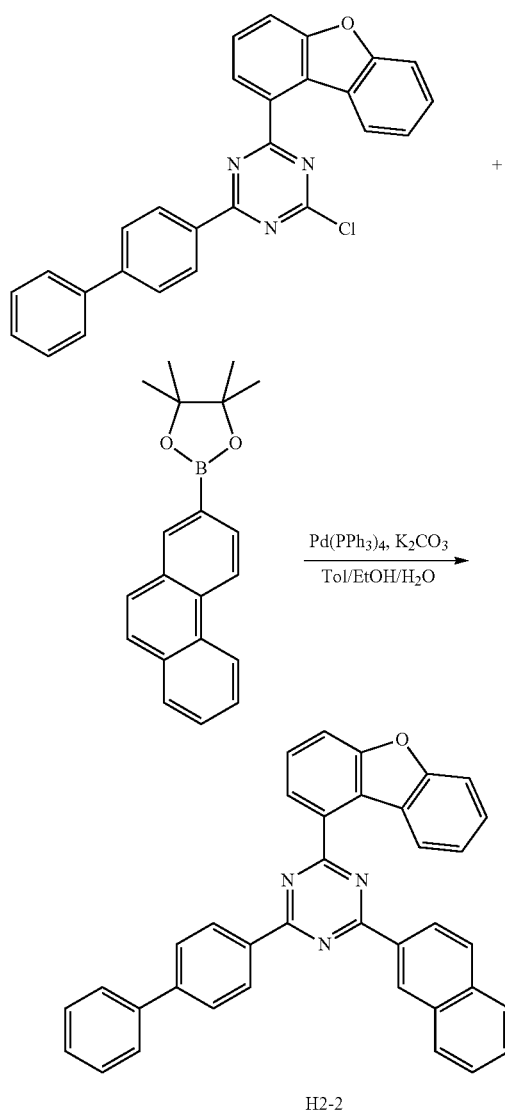

H2-2

2-([1,1'-biphenyl]-4-yl)-4-chloro-6-(dibenzo[b,d]furan-1-yl)-1,3,5-triazine (7.7 g, 17.75 mmol), 4,4,5,5-tetramethyl-2-(phenanthrene-2-yl)-1,3,2-dioxaborolane (5.4 g, 17.75 mmol), Pd(PPh$_3$)$_4$ (1 g, 0.887 mmol), K$_2$CO$_3$ (7.3 g, 53.27 mmol), 108 mL of toluene, 27 mL of ethanol, and 27 mL of water were added to a flask, dissolved, and then refluxed at 140° C. for 2 hours. After completion of the reaction, the mixture was cooled to room temperature, and the resulting solid was filtered under reduced pressure. The solid was dissolved in phenyl chloride, filtered through silica with MC, and recrystallized with o-xylene to obtain compound 5.2 g of H2-5 (yield: 50%).

| Compound | MW | M.P. |
|---|---|---|
| H2-2 | 575.6 | 295° C. |

EXAMPLE 6

Preparation of Compound H2-67

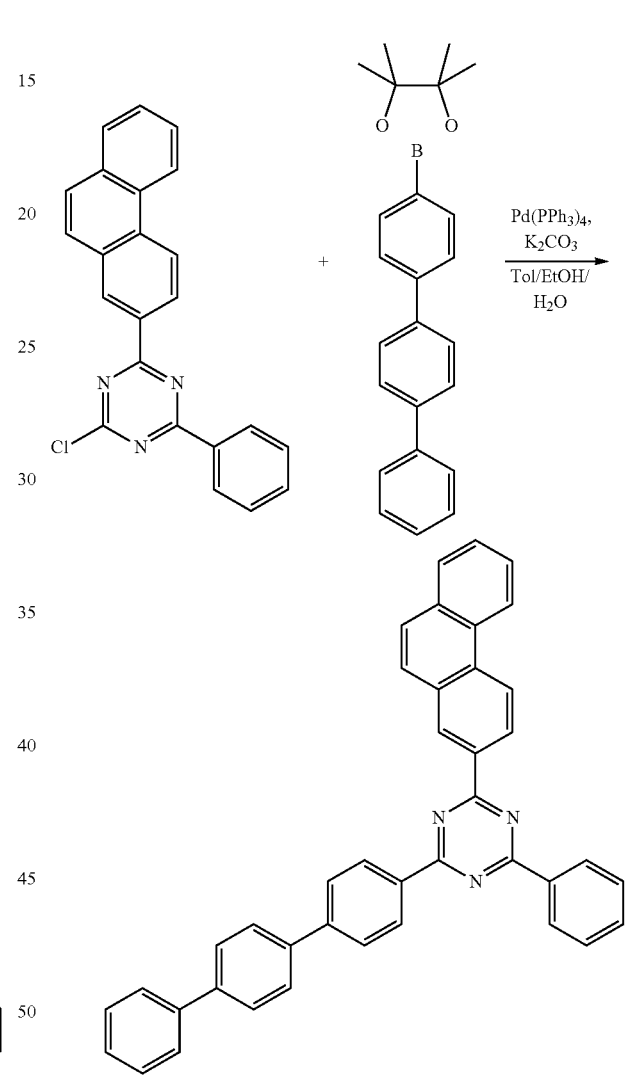

H2-67

2-chloro-4-(phenanthrene-2-yl)-6-phenyl-1,3,5-triazine (4.5 g, 12.23 mmol), 2-([1,1':4',1''-terphenyl]-4-yl)-4,4,5,5-tetramethyl-1,3,2-dioxaborolane (4.3 g, 12.23 mmol), Pd(PPh$_3$)$_4$ (0.7 g, 0.611 mmol) K$_2$CO$_3$ (5 g, 36.70 mmol), 80 mL of toluene, 20 mL of ethanol, and 20 mL of water were added to a flask, dissolved, and then refluxed at 140° C. for 2 hours. After completion of the reaction, the mixture was cooled to room temperature, and the resulting solid was filtered under reduced pressure. The solid was dissolved in phenyl chloride, filtered through silica with MC, and recrystallized with o-xylene to obtain compound 3.3 g of H2-67 (yield: 48%).

| Compound | MW | M.P. |
|---|---|---|
| H2-67 | 561.6 | 325.6° C. |

EXAMPLE 7

Preparation of Compound H2-1

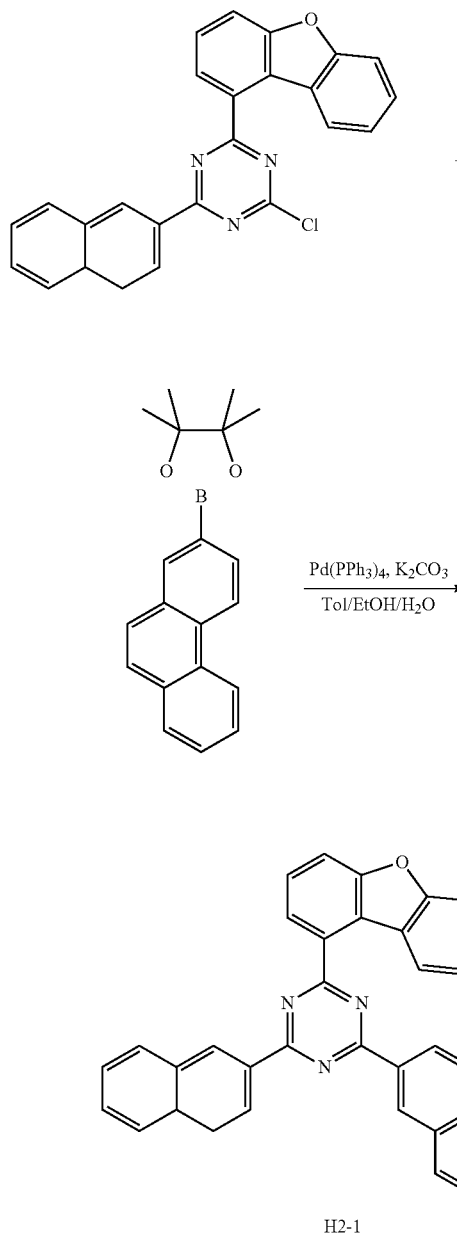

H2-1

2-chloro-4-(dibenzo[b,d]furan-1-yl)-6-(4,4a-dihydronaphthalene-2-yl)-1,3,5-triazine (8.8 g, 21.61 mmol), 4,4,5,5-tetramethyl-2-(phenanthren-2-yl)1,3,2-dioxaborolane (7.2 g, 23.77 mmol), Pd(PPh₃)₄ (1.2 g, 1.080 mmol), K₂CO₃ (9 g, 64.85 mmol), 140 mL of toluene, 35 mL of ethanol, and 35 mL of water were added to a flask, dissolved, and then refluxed at 140° C. for 3 hours. After completion of the reaction, the mixture was cooled to room temperature, and the resulting solid was filtered under reduced pressure. The solid was dissolved in phenyl chloride, filtered through silica with MC, and recrystallized with o-xylene to obtain 6.8 g of compound H2-1 (yield: 57.6%).

| Compound | MW | M.P. |
|---|---|---|
| H2-1 | 549.6 | 271.5° C. |

EXAMPLE 8

Preparation of Compound H2-161

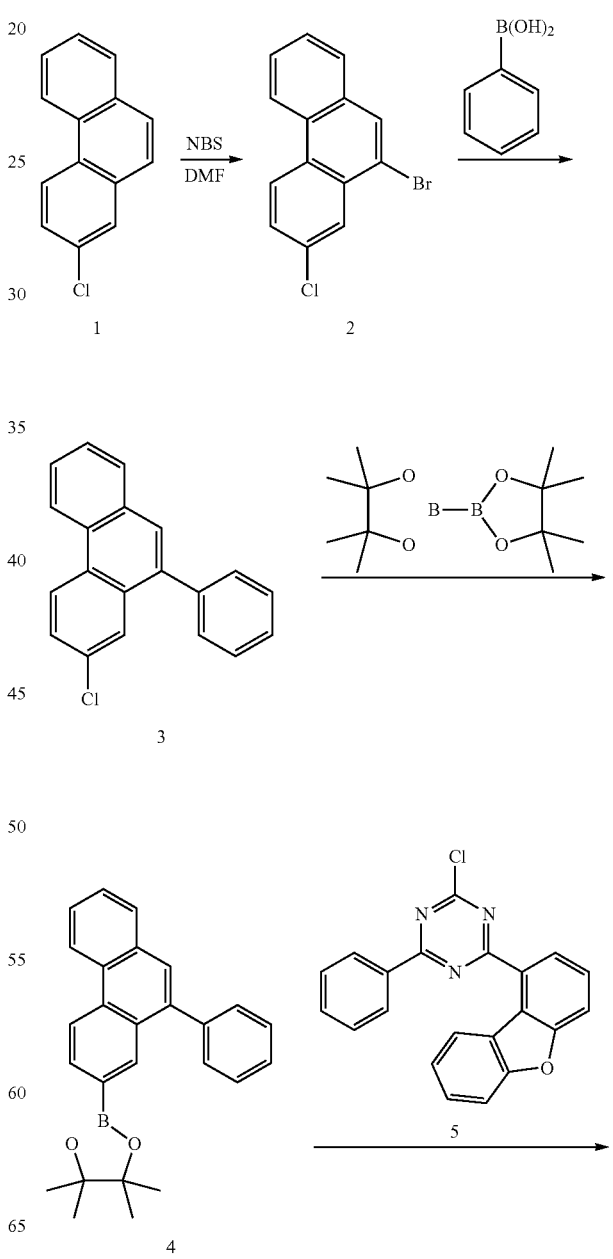

-continued

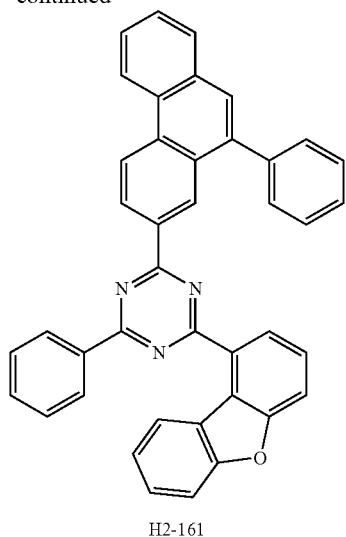

H2-161

Synthesis of Compound 2

Compound 1 (10 g, 47.1 mmol) and 300 mL of dimethylformamide were added to a flask, and dissolved, and then N-bromosuccinimide (67 g, 377 mmol) was slowly added, and refluxed at 150° C. for 1 hour. After completion of the reaction, the organic layer was extracted with ethyl acetate. After the residual moisture was removed with magnesium sulfate, the residue was dried, and separated by column chromatography to obtain 7 g of compound 2 (yield: 51%).

Synthesis of Compound 3 compound 2 (9.2 g, 31.7 mmol), phenylboronic acid (4.3 g, 34.8 mmol), Pd(PPh$_3$)$_4$ (2 g, 1.6 mmol), K$_2$CO$_3$ (11 g, 80 mmol), 90 mL of toluene, 30 mL of ethanol, and 30 mL of water were added to a flask, dissolved, and then refluxed at 120° C. for 2 hours. After completion of the reaction, the organic layer was extracted with ethyl acetate. After the residual moisture was removed with magnesium sulfate, the residue was dried, and separated by column chromatography to obtain 7 g of compound 3 (yield: 76%).

Synthesis of Compound 4

Compound 3 (9.5 g, 33 mmol), 4,4',4',5,5,5',5'-octamethyl-2,2'-bi(1,3,2-dioxaborolane) (12.6 g, 49.5 mmol), potassium acetate (8.1 g, 82.5 mmol), 2-dicyclohexylphosphino-2',6'-dimethoxybiphenyl (41 g, 99 mmol), Pd$_2$(dba)$_3$ (1.5 g, 1.65 mmol), and 500 mL of dioxane were added to a flask, dissolved, and then refluxed at 120° C. for 2 hours. After completion of the reaction, the organic layer was extracted with ethyl acetate. After the residual moisture was removed with magnesium sulfate, the residue was dried, and separated by column chromatography to obtain 10 g of compound 4 (yield: 79%).

Synthesis of Compound H2-161

Compound 4 (15 g, 40 mmol), 2-chloro-4-(dibenzo[b,d]furan-1-yl)-6-phenyl-1,3,5-triazine (compound 5) (16 g, 44 mmol), Pd(PPh$_3$)$_4$ (2.4 g, 2 mmol), K$_2$CO$_3$ (11 g, 80 mmol), 100 mL of toluene, 20 mL of ethanol, and 20 mL of water were added to a flask, dissolved, and then refluxed at 120° C. for 2 hours. After completion of the reaction, the organic layer was extracted with ethyl acetate. After the residual moisture was removed with magnesium sulfate, the residue was dried, and separated by column chromatography to obtain compound 8 g of H2-161 (yield: 34%).

| Compound | MW | M.P. |
|---|---|---|
| H2-161 | 575.67 | 270° C. |

DEVICE EXAMPLES 1 TO 16

Producing a Red Light-Emitting OLED Deposited with a Plurality of Host Materials According to the Present Disclosure as a Host OLEDs according to the present disclosure were produced. A transparent electrode indium tin oxide (ITO) thin film (10 Ω/sq) on a glass substrate for an OLED (GEOMATEC CO., LTD., Japan) was subjected to an ultrasonic washing with acetone and isopropyl alcohol, sequentially, and then was stored in isopropyl alcohol. The ITO substrate was then mounted on a substrate holder of a vacuum vapor deposition apparatus. Compound HI-1 shown in Table 2 was introduced into a cell of the vacuum vapor deposition apparatus, and compound HT-1 shown in Table 2 was introduced into another cell. The two materials were evaporated at different rates to deposit a hole injection layer with a thickness of 10 nm by doping compound HI-1 in an amount of 3 wt % based on the total amount of compound HI-1 and compound HT-1. Subsequently, compound HT-1 was deposited on the hole injection layer to form a first hole transport layer having a thickness of 80 nm. Subsequently, compound HT-2 was introduced into another cell of the vacuum vapor deposition apparatus and was evaporated by applying an electric current to the cell, thereby depositing a second hole transport layer with a thickness of 60 nm on the first hole transport layer. After forming the hole injection layer and the hole transport layers, a light-emitting layer was deposited thereon as follows. The first host compounds and the second host compounds described in Table 1 were introduced into two cells of the vacuum vapor deposition apparatus as hosts, and compound D-39 was introduced into another cell as a dopant. The two host materials were evaporated at a rate of 1:1 and the dopant material was simultaneously evaporated at a different rate, and the dopant was deposited in a doping amount of 3 wt % based on the total amount of the hosts and the dopant to form a light-emitting layer having a thickness of 40 nm on the second hole transport layer. Subsequently, compound ETL-1 and compound EIL-1 were deposited at a weight ratio of 50:50 as electron transport materials to form an electron transport layer having a thickness of 35 nm on the light-emitting layer. After depositing compound EIL-1 as an electron injection layer having a thickness of 2 nm on the electron transport layer, an Al cathode having a thickness of 80 nm was deposited on the electron injection layer by another vacuum vapor deposition apparatus. All the materials used for producing the OLED were purified by vacuum sublimation at $10^{-6}$ torr.

COMPARATIVE EXAMPLES 1 TO 4

Producing a Red Light-Emitting OLED Deposited with a Plurality of Host Materials Not in Accordance with the Present Disclosure as a Host OLEDs were produced in the same manner as in Device Examples 1 to 16, except that the compounds described in Table 1 were used as a host of the light-emitting layer.

COMPARATIVE EXAMPLES 5 AND 6

Producing an OLED Comprising a Single Host

OLEDs were produced in the same manner as in Device Examples 1 to 16, except that the second host compound described in Table 1 was used alone as a host of the light-emitting layer.

The driving voltage, the luminous efficiency, and the light-emitting color at a luminance of 1,000 nit, and the time taken for luminance to decrease from 100% to 95% at a luminance of 5,000 nit (lifespan: T95) of the OLEDs produced in Device Examples 1 to 16, and Comparative Examples 1 to 6 are provided in Table 1 below:

TABLE 1

| | First Host | Second Host | Driving Voltage (V) | Luminous Efficiency (cd/A) | Light-Emitting Color | Lifespan (T95, hr) |
|---|---|---|---|---|---|---|
| Device Example 1 | H1-46 | H2-1 | 3.1 | 34.7 | red | 879 |
| Device Example 2 | H1-141 | H2-1 | 3.1 | 35.5 | red | 522 |
| Device Example 3 | H1-28 | H2-1 | 3.0 | 35.2 | red | 629 |
| Device Example 4 | H1-15 | H2-4 | 3.1 | 35.0 | red | 572 |
| Device Example 5 | H1-12 | H2-4 | 2.9 | 34.7 | red | 509 |
| Device Example 6 | H1-5 | H2-4 | 2.9 | 34.7 | red | 465 |
| Device Example 7 | H1-28 | H2-4 | 3.0 | 35.1 | red | 444 |
| Device Example 8 | H1-15 | H2-5 | 3.1 | 36.5 | red | 748 |
| Device Example 9 | H1-142 | H2-5 | 2.9 | 36.6 | red | 527 |
| Device Example 10 | H1-5 | H2-5 | 2.9 | 36.0 | red | 594 |
| Device Example 11 | H1-143 | H2-5 | 3.0 | 36.4 | red | 405 |
| Device Example 12 | H1-46 | H2-3 | 3.1 | 34.9 | red | 689 |
| Device Example 13 | H1-46 | H2-2 | 3.1 | 35.3 | red | 584 |
| Device Example 14 | H1-15 | H2-137 | 3.2 | 34.8 | red | 540 |
| Device Example 15 | H1-15 | H2-151 | 3.3 | 35.7 | red | 518 |
| Device Example 16 | H1-135 | H2-151 | 2.9 | 36.5 | red | 678 |
| Comparative Example 1 | C-1 | H2-137 | 3.5 | 34.1 | red | 155 |
| Comparative Example 2 | C-1 | H2-1 | 3.3 | 33.6 | red | 91 |
| Comparative Example 3 | C-1 | H2-4 | 3.3 | 32.8 | red | 79 |
| Comparative Example 4 | C-1 | H2-5 | 3.3 | 34.4 | red | 134 |
| Comparative Example 5 | — | H2-4 | 3.5 | 28.9 | red | 14.0 |
| Comparative Example 6 | — | H2-5 | 3.4 | 30.9 | red | 6.8 |

It can be seen that the OLEDs using the plurality of host materials according to the present disclosure exhibit excellent lifespan characteristics, while exhibiting a driving voltage and luminous efficiency equivalent or superior than the OLEDs including the conventional host or the conventional combination of host materials.

DEVICE EXAMPLES 17 TO 19

Producing an OLED Comprising an Organic Electroluminescent Compound According to the Present Disclosure as a Host OLEDs were produced in the same manner as in Device Examples 1 to 16, except that the compounds described in Table 2 were used alone as a host of the light-emitting layer.

COMPARATIVE EXAMPLES 7 AND 8

Producing an OLED Comprising a Comparative Compound as a Host

OLEDs were produced in the same manner as in Device Examples 1 to 16, except that the compounds described in Table 2 were used alone as a host of the light-emitting layer.

The driving voltage, and the light-emitting color at a luminance of 1,000 nit, and the time taken for luminance to decrease from 100% to 95% at a luminance of 5,000 nit (lifespan: T95) of the OLEDs produced in Device Examples 17 to 19, and Comparative Examples 7 and 8 are provided in Table 2 below:

TABLE 2

| | Host | Driving Voltage (V) | Light-Emitting Color | Lifespan (T95, hr) |
|---|---|---|---|---|
| Device Example 17 | H2-66 | 4.4 | red | 37 |
| Device Example 18 | H2-137 | 3.8 | red | 25.2 |
| Device Example 19 | H2-3 | 3.4 | red | 18.7 |
| Comparative Example 7 | T-1 | 4.2 | red | 4.2 |
| Comparative Example 8 | T-2 | 4.3 | red | 1.3 |

It can be seen that the OLEDs comprising the compounds according to the present disclosure exhibits excellent lifespan characteristics while exhibiting a driving voltage equivalent to the OLEDs including the conventional host compound.

The compounds used in the Device Examples and the Comparative Examples are shown in Table 3 below.

TABLE 3
| Hole Injection Layer/ Hole Transport Layer | 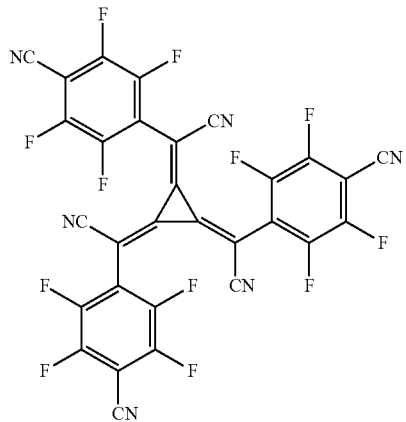 |
HI-1
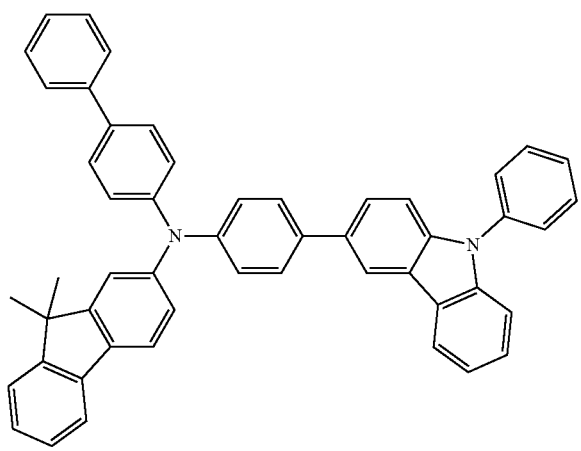
HT-1
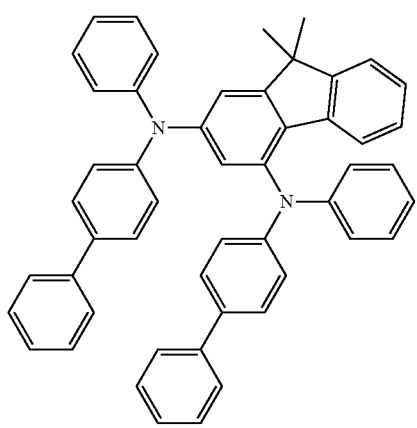
HT-2

TABLE 3-continued
Light-
Emitting
Layer
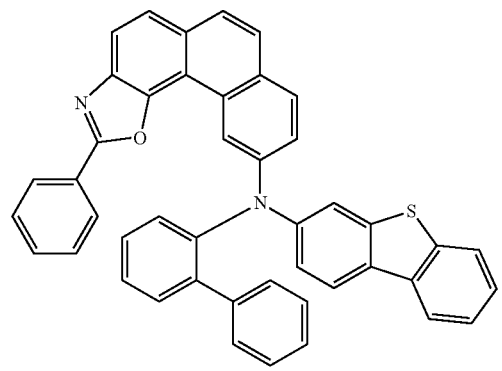
H1-5
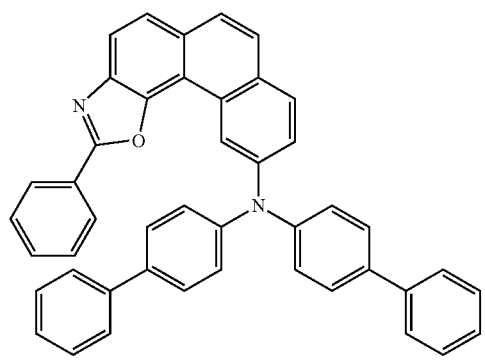
H1-12
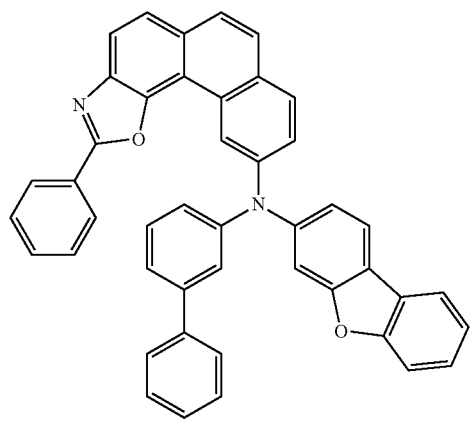
H1-15

TABLE 3-continued
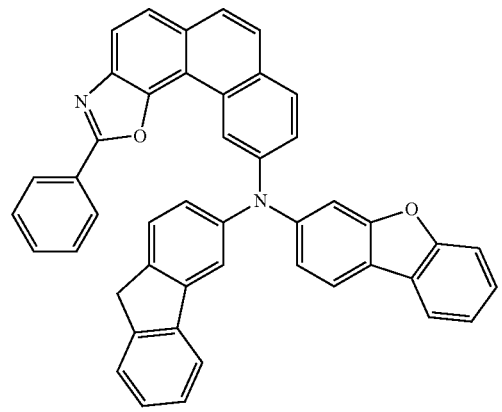
H1-28
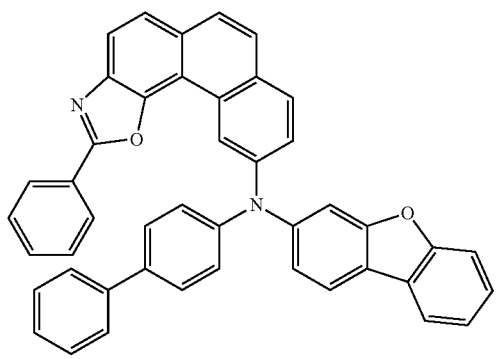
H1-46
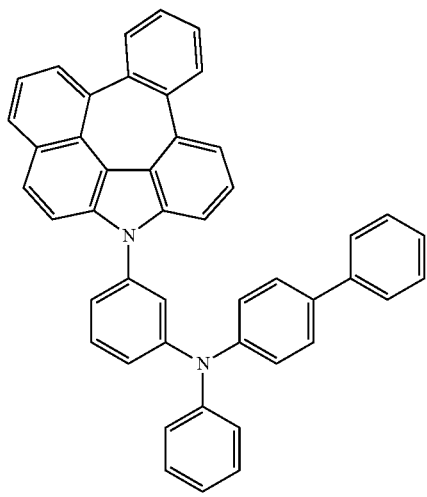
H1-135

TABLE 3-continued
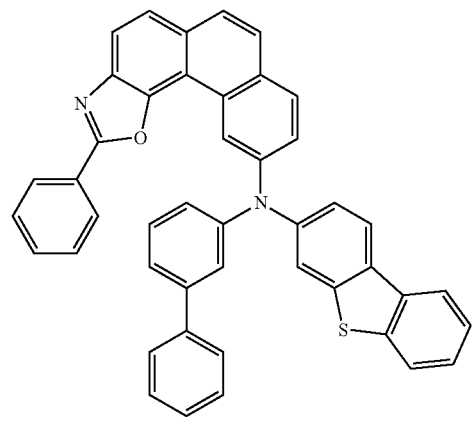
H1-141
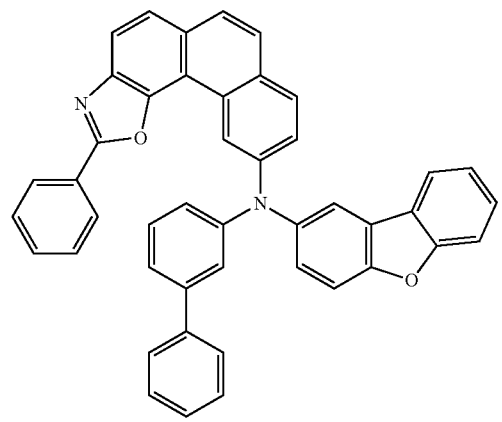
H1-142
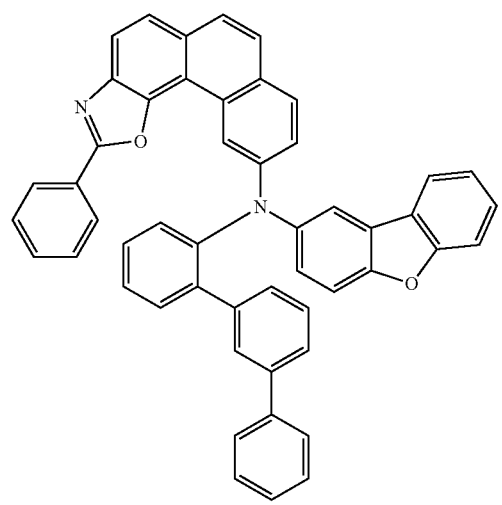
H1-143

TABLE 3-continued
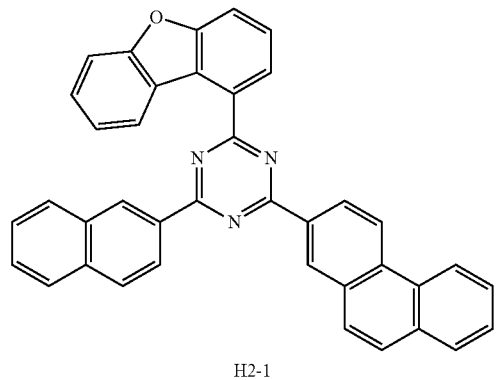 [SMILES: c1ccc2cc(-c3nc(-c4ccc5c(ccc6ccccc65)c4)nc(-c4cccc5oc6ccccc6c45)n3)ccc2c1 ; "H2-1"]
H2-1
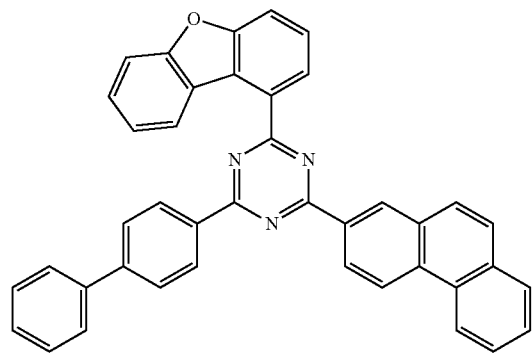
H2-2
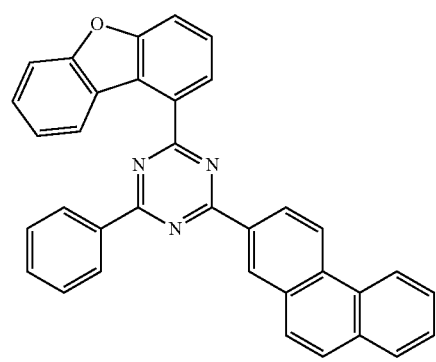
H2-3

TABLE 3-continued
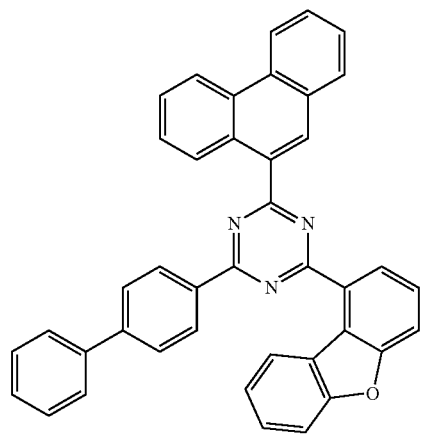
H2-4
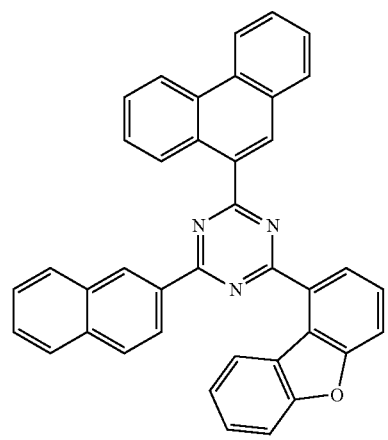
H2-5
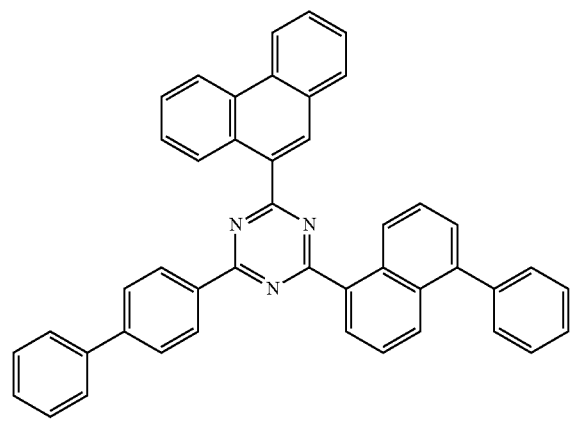
H2-66

TABLE 3-continued
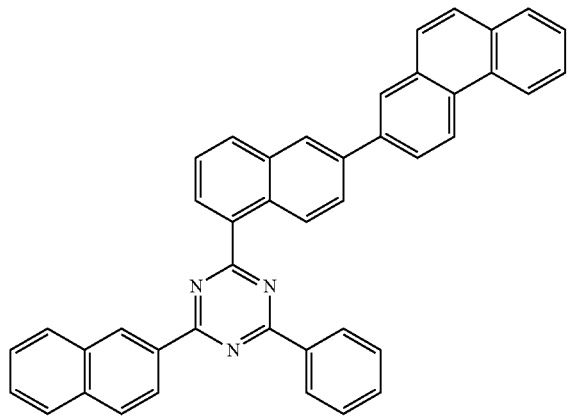
H2-137
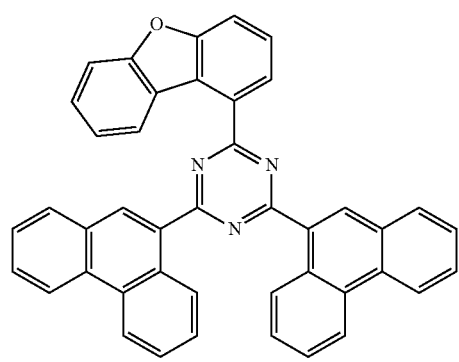
H2-151
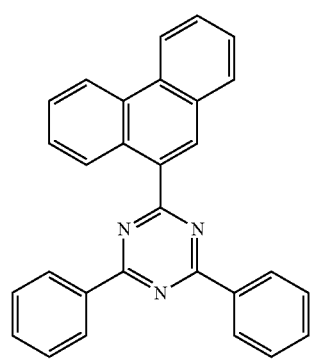
T-1

TABLE 3-continued
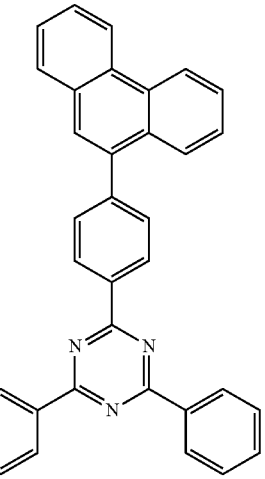
T-2
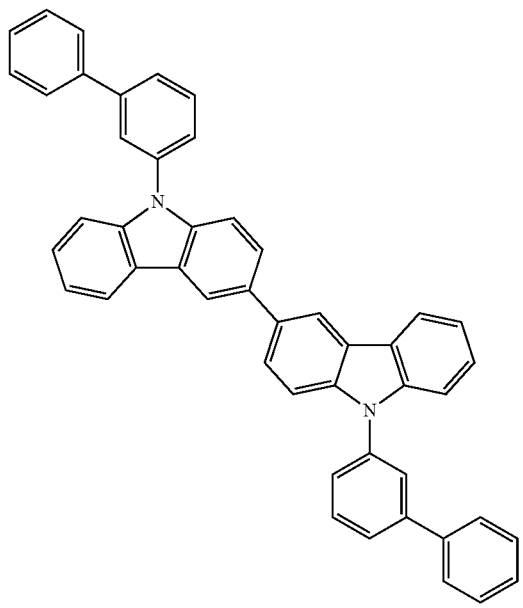
C-1
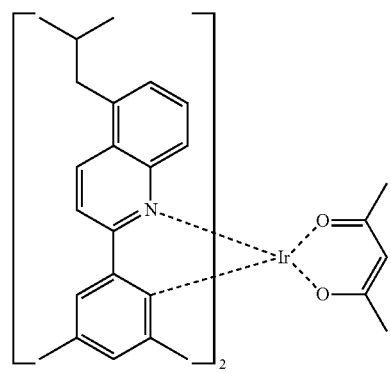
D-39

TABLE 3-continued

Electron Transport Layer/ Electron Injection Layer

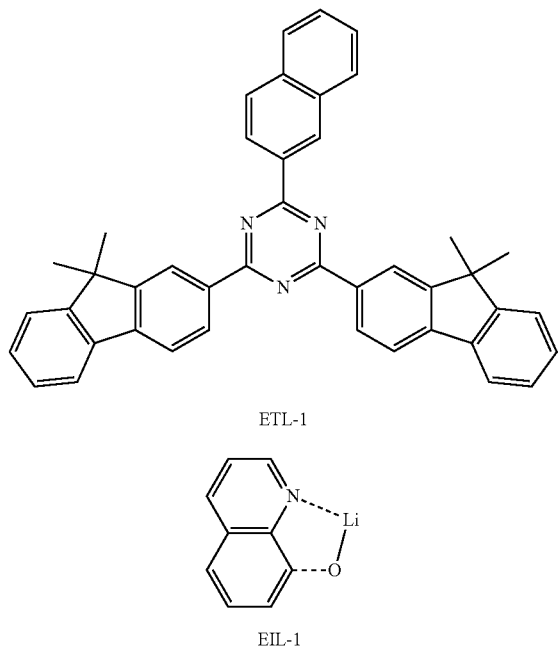

ETL-1

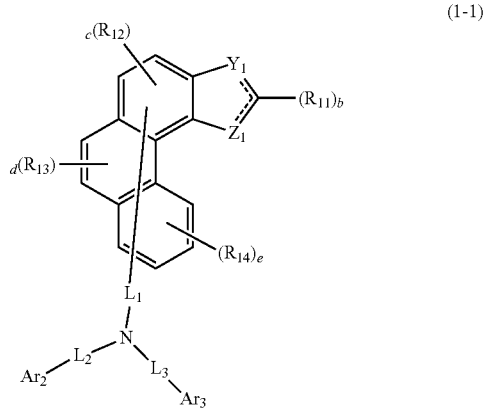

EIL-1

The invention claimed is:

1. A plurality of host materials comprising at least one first host compound and at least one second host compound, wherein the first host compound is represented by the following formula 1-1, and the second host compound is represented by the following formula 2-3:

(1-1)

in formula 1-1, $L_1$ to $L_3$ each independently represent a single bond, a substituted or unsubstituted (C1-C30)alkylene, a substituted or unsubstituted (C6-C30)arylene, a substituted or unsubstituted (3- to 30-membered)heteroarylene, or a substituted or unsubstituted (C3-C30)cycloalkylene;

$Ar_2$ and $Ar_3$ each independently represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted fused ring group of a (C3-C30) aliphatic ring(s) and a (C6-C30) aromatic ring(s), or $-L_a-N(Ar_a)(Ar_b)$;

$L_a$ each independently represents a single bond, a substituted or unsubstituted (C6-C30)arylene, or a substituted or unsubstituted (3- to 30-membered)heteroarylene;

$Ar_a$ and $Ar_b$ each independently represent hydrogen, a substituted or unsubstituted (C1-C30)alkyl, a substituted or unsubstituted (C2-C30)alkenyl, a substituted or unsubstituted fused ring group of a (C3-C30) aliphatic ring(s) and a (C6-C30) aromatic ring(s), a substituted or unsubstituted (C6-C30)aryl, or a substituted or unsubstituted (3- to 30-membered)heteroaryl;

with the proviso that the case where all of $L_1$ to $L_3$ represent single bonds, and all of $Ar_2$ and $Ar_3$ represent hydrogen is excluded;

$Y_1$ and $Z_1$ each independently represent —N=, —NR$_{21}$—, —O— or —S—, with a proviso that one of $Y_1$ and $Z_1$ represents —N=, and the other of $Y_1$ and $Z_1$ represents —NR$_{21}$—, —O— or —S—;

$R_{11}$ represents a substituted or unsubstituted (C6-C30) aryl, or a substituted or unsubstituted (3- to 30-membered)heteroaryl;

$R_{12}$ to $R_{14}$ each independently represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted fused ring group of a (C3-C30) aliphatic ring(s) and a (C6-C30) aromatic ring(s), or -L$_c$-N(Ar$_e$)(Ar$_f$), or may be linked to an adjacent substituent(s) to form a ring(s);

L$_c$ each independently represents a single bond, a substituted or unsubstituted (C6-C30)arylene, or a substituted or unsubstituted (3- to 30-membered)heteroarylene;

Ar$_e$ and Ar$_f$ each independently represent hydrogen, a substituted or unsubstituted (C1-C30)alkyl, a substituted or unsubstituted (C2-C30)alkenyl, a substituted or unsubstituted fused ring group of a (C3-C30) aliphatic ring(s) and a (C6-C30) aromatic ring(s), a substituted or unsubstituted (C6-C30)aryl, or a substituted or unsubstituted (3- to 30-membered)heteroaryl; and b represents an integer of 1, c and d each independently represent an integer of 1 or 2, e represents an integer of 1 to 4, where if c to e are an integer of 2 or more, each of R$_{12}$ to each of R$_{14}$ may be the same or different;

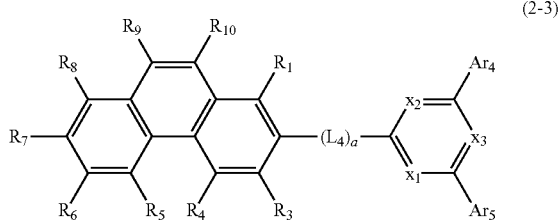

(2-3)

in formula 2-3,

R$_1$ and R$_3$ to R$_{10}$ are each independently represent hydrogen, deuterium, a halogen, a cyano, a substituted or unsubstituted (C1-C30)alkyl, a substituted or unsubstituted (C3-C30)cycloalkyl, a substituted or unsubstituted (3- to 7-membered)heterocycloalkyl, a substituted or unsubstituted (C6-C30)aryl, a substituted or unsubstituted (3- to 30-membered)heteroaryl, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted fused ring group of a (C3-C30) aliphatic ring(s) and a (C6-C30) aromatic ring(s), or -L$_b$-N(Ar$_c$)(Ar$_d$); or may be linked to an adjacent substituent(s) to form a ring(s);

L$_b$ each independently represents a single bond, a substituted or unsubstituted (C6-C30)arylene, or a substituted or unsubstituted (3- to 30-membered)heteroarylene;

Ar$_c$ and Ar$_d$ each independently represent hydrogen, a substituted or unsubstituted (C1-C30)alkyl, a substituted or unsubstituted (C2-C30)alkenyl, a substituted or unsubstituted fused ring group of a (C3-C30) aliphatic ring(s) and a (C6-C30) aromatic ring(s), a substituted or unsubstituted (C6-C30)aryl, or a substituted or unsubstituted (3- to 30-membered)heteroaryl;

L$_4$ represents a single bond, a substituted or unsubstituted (C6-C30)cycloalkylene, a substituted or unsubstituted (C6-C30)arylene, or a substituted or unsubstituted (3- to 30-membered)heteroarylene;

X$_1$ to X$_3$ each independently represent N or CH, with a proviso that at least one of X$_1$ to X$_3$ is N;

Ar$_4$ and Ar$_5$ each independently represent a substituted or unsubstituted (C6-C30)cycloalkyl, a substituted or unsubstituted (C6-C30)aryl, a substituted or unsubstituted (3- to 30-membered)heteroaryl, or a substituted or unsubstituted fused ring group of a (C3-C30) aliphatic ring(s) and a (C6-C30) aromatic ring(s), with the proviso that if the substituted or unsubstituted (3- to 30-membered) heteroaryl is a substituted or unsubstituted dibenzofuranyl or dibenzothiophenyl, Ar$_4$ and Ar$_5$ cannot both represent a substituted or unsubstituted dibenzofuranyl or dibenzothiophenyl; and a represents an integer of 1 to 3, where if a is an integer of 2 or more, each of L$_4$ may be the same or different.

2. The plurality of host materials according to claim 1, wherein the substituent(s) of the substituted alkyl(ene), the substituted alkenyl, the substituted aryl(ene), the substituted heteroaryl(ene), the substituted cycloalkyl(ene), the substituted heterocycloalkyl, the substituted alkoxy, the substituted trialkylsilyl, the substituted dialkylarylsilyl, the substituted alkyldiarylsilyl, the substituted triarylsilyl, and the substituted fused ring group of an aliphatic ring(s) and an aromatic ring(s), each independently, are at least one selected from the group consisting of deuterium; a halogen; a cyano; a carboxyl; a nitro; a hydroxyl; a phosphine oxide; a (C1-C30)alkyl; a halo(C1-C30)alkyl; a (C2-C30)alkenyl; a (C2-C30)alkynyl; a (C1-C30)alkoxy; a (C1-C30)alkylthio; a (C3-C30)cycloalkyl; a (C3-C30)cycloalkenyl; a (3- to 7-membered)heterocycloalkyl; a (C6-C30)aryloxy; a (C6-C30)arylthio; a (3- to 30-membered)heteroaryl unsubstituted or substituted with at least one of deuterium and a (C6-C30)aryl(s); a (C6-C30)aryl unsubstituted or substituted with at least one of deuterium and a (3- to 30-membered)heteroaryl(s); a tri(C1-C30)alkylsilyl; a tri(C6-C30)arylsilyl; a di(C1-C30)alkyl(C6-C30)arylsilyl; a (C1-C30)alkyldi(C6-C30)arylsilyl; a fused ring group of a (C3-C30) aliphatic ring(s) and a (C6-C30) aromatic ring(s); an amino; a mono- or di-(C1-C30)alkylamino; a mono- or di-(C2-C30)alkenylamino; a mono- or di-(C6-C30)arylamino; a mono- or di-(3- to 30-membered)heteroarylamino; a (C1-C30)alkyl(C2-C30)alkenylamino; a (C1-C30)alkyl(C6-C30)arylamino; a (C1-C30)alkyl (3- to 30-membered)heteroarylamino; a (C2-C30)alkenyl (C6-C30)arylamino; a (C2-C30)alkenyl (3- to 30-membered)heteroarylamino; a (C6-C30)aryl (3- to 30-membered)heteroarylamino; a (C1-C30)alkylcarbonyl; a (C1-C30)alkoxycarbonyl; a (C6-C30)arylcarbonyl; a (C6-C30)arylphosphine; a di(C6-C30)arylboronyl; a di(C1-C30)alkylboronyl; a (C1-C30)alkyl(C6-C30)arylboronyl; a (C6-C30)aryl (C1-C30)alkyl; and a (C1-C30)alkyl(C6-C30)aryl.

3. The plurality of host materials according to claim 1, wherein the compound represented by formula 1-1 is at least one selected from the following compounds:

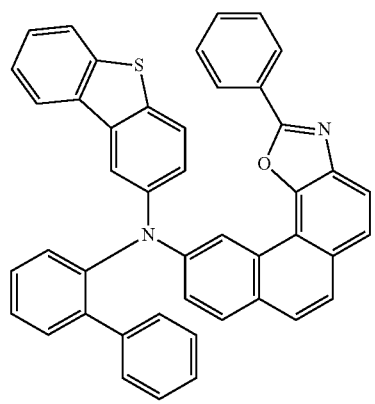

H1-1

-continued
H1-2
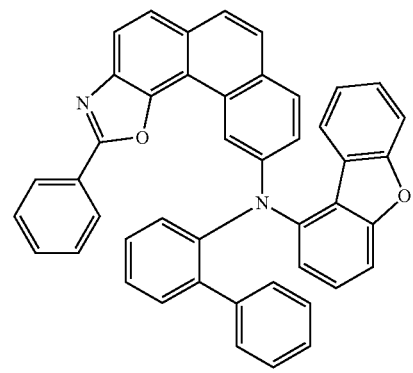
H1-3
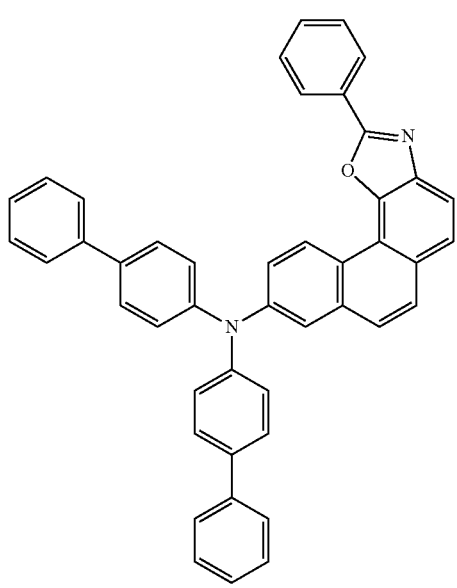
H1-4
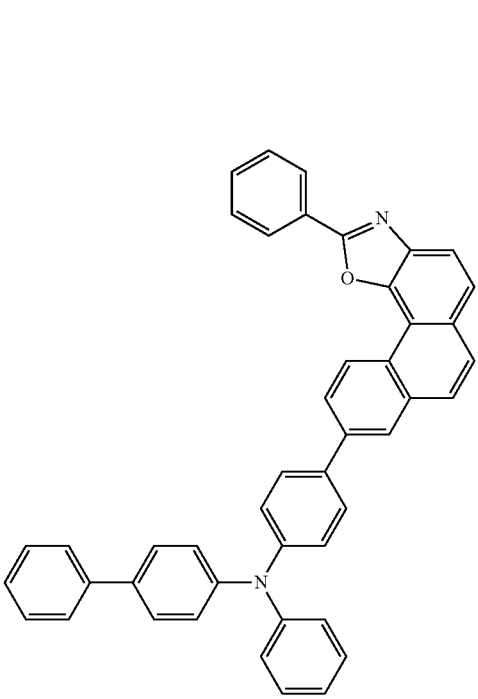
-continued
H1-5
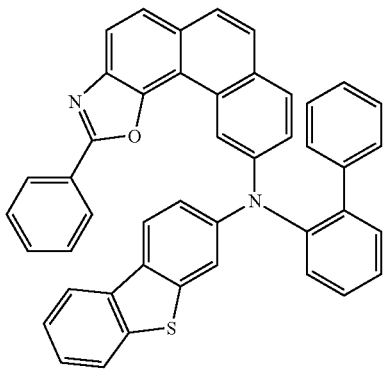
H1-6
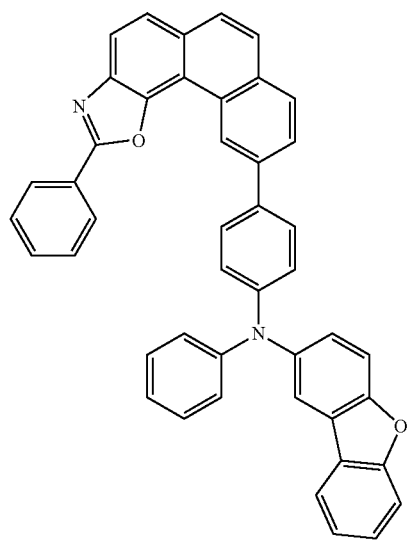
H1-7
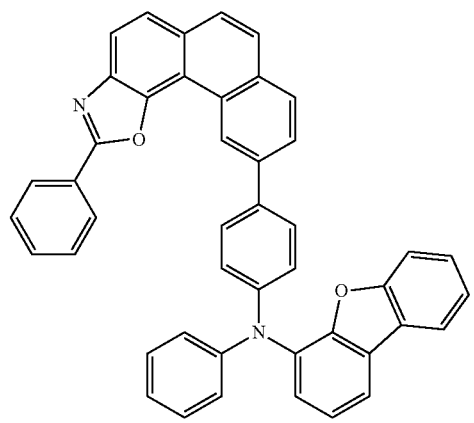

H1-8
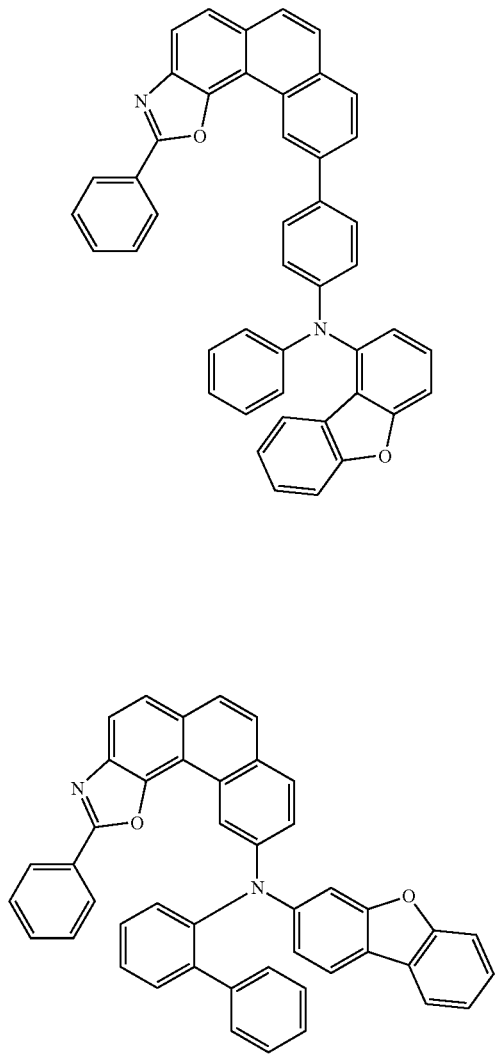
H1-9
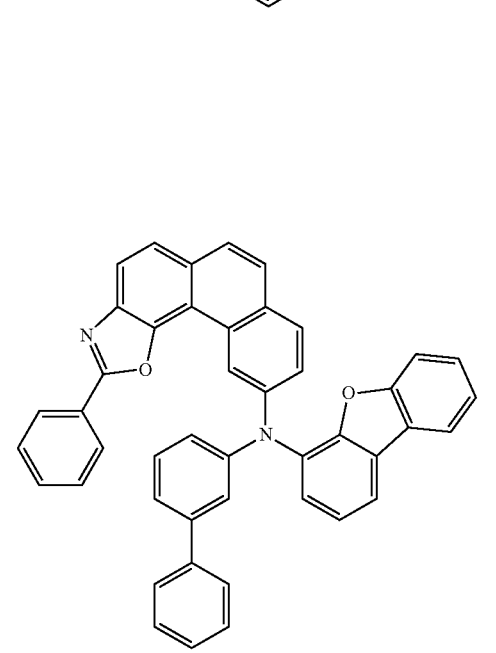
H1-11
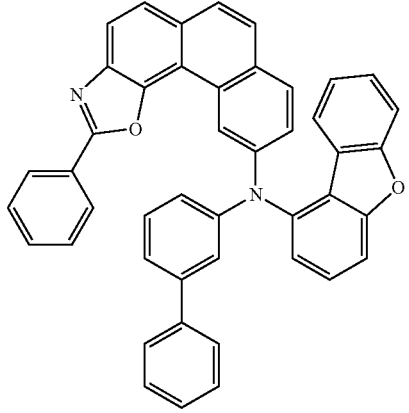
H1-12
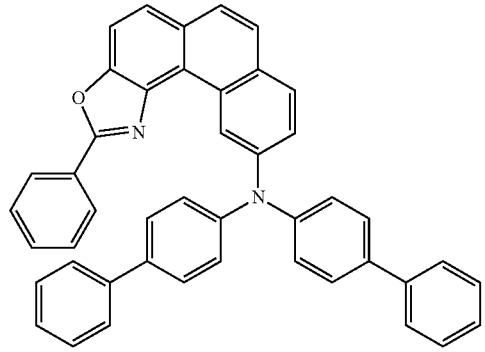
H1-13
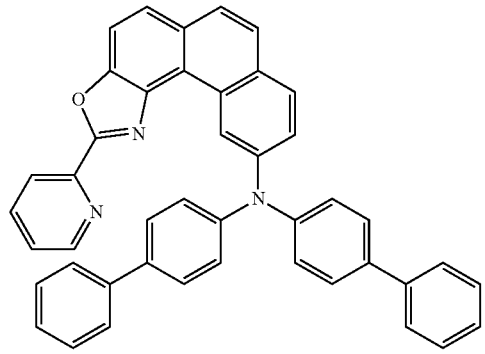
H1-10
H1-14
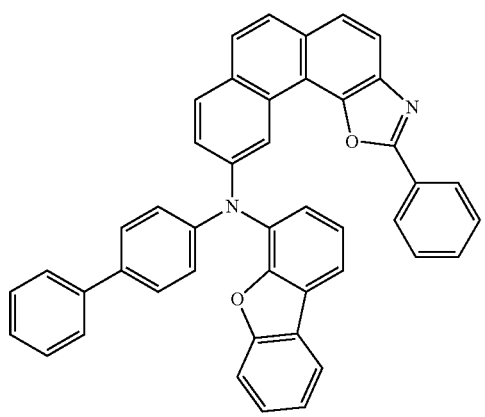

H1-15
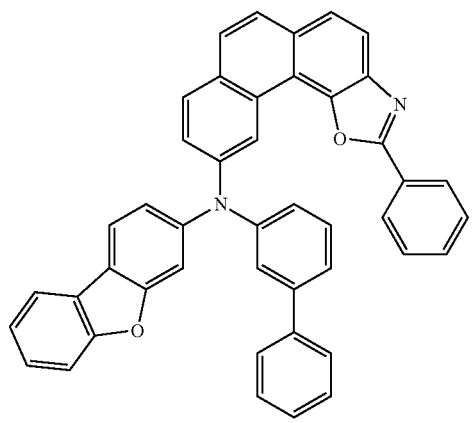
H1-16
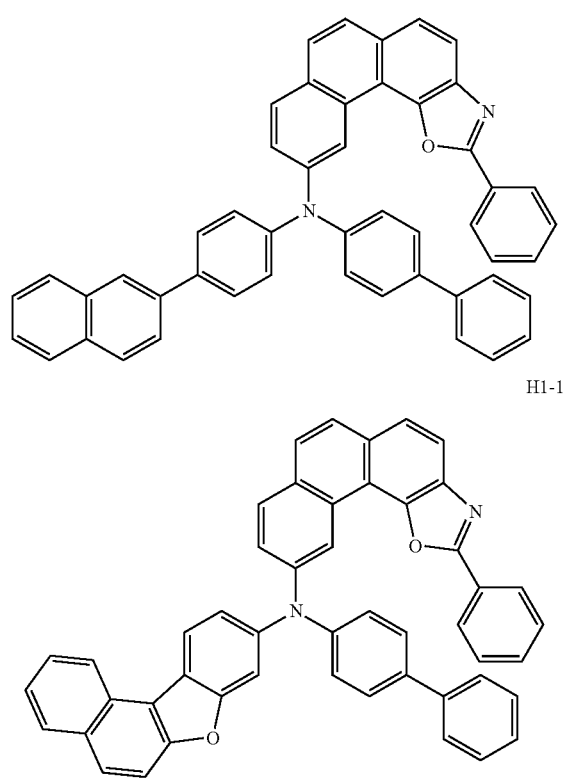
H1-17
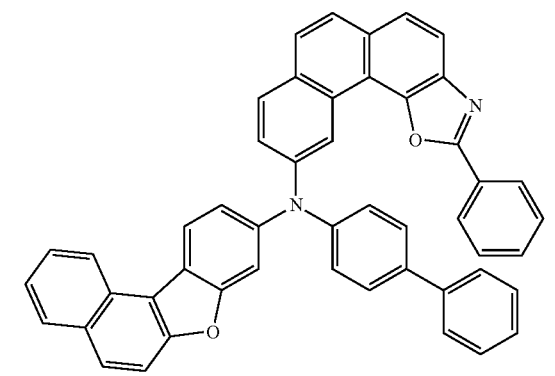
H1-18
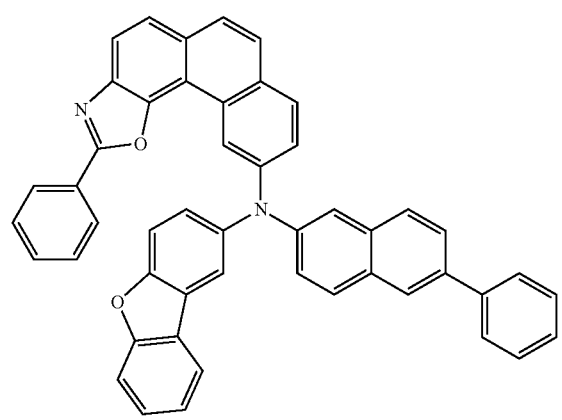
H1-19
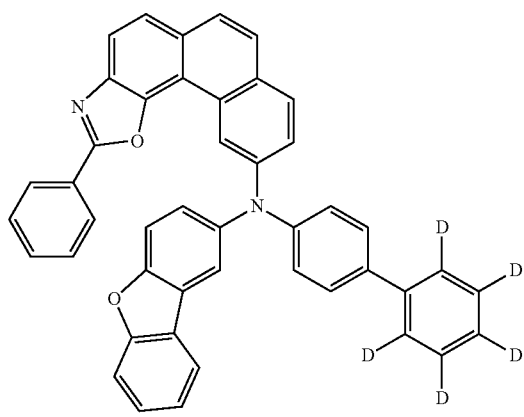
H1-20
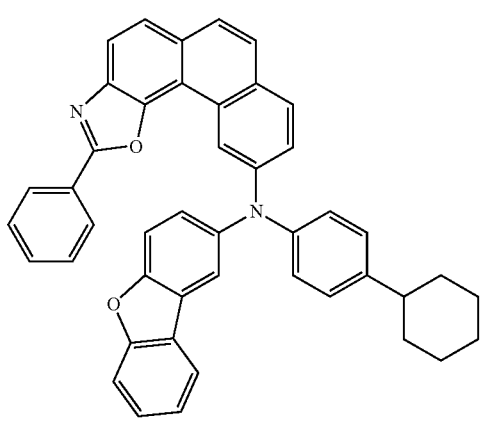
H1-21
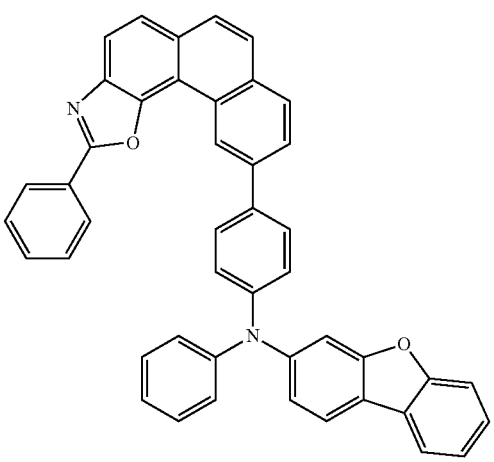

H1-22
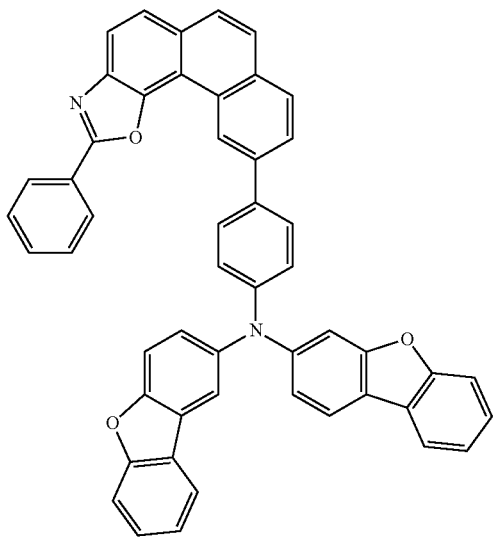
H1-25
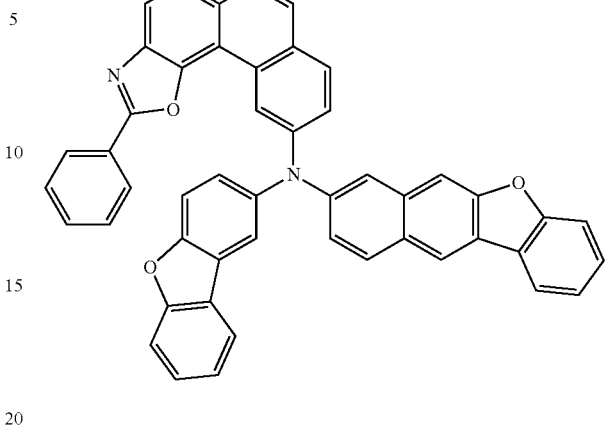
H1-23
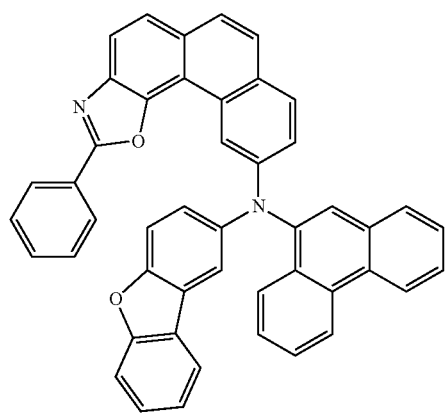
H1-26
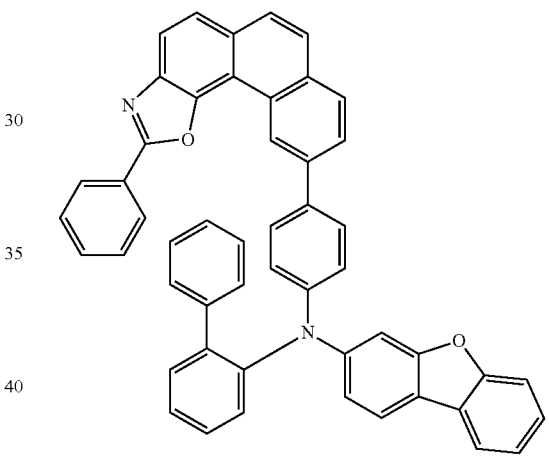
H1-24
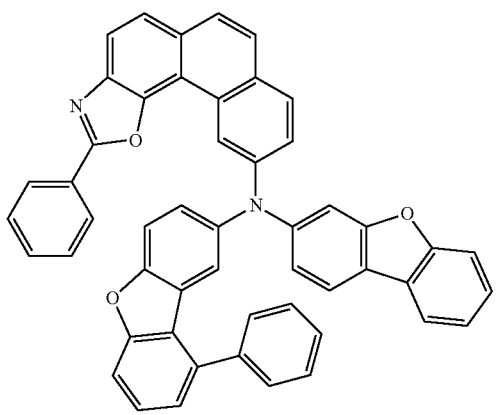
H1-27
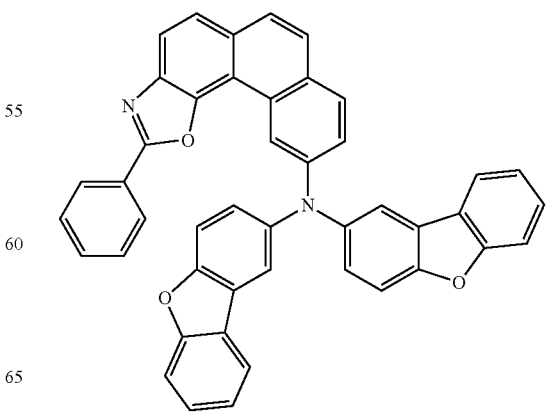

H1-28
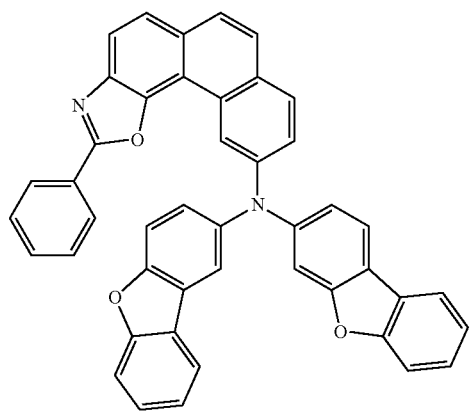
H1-29
H1-30
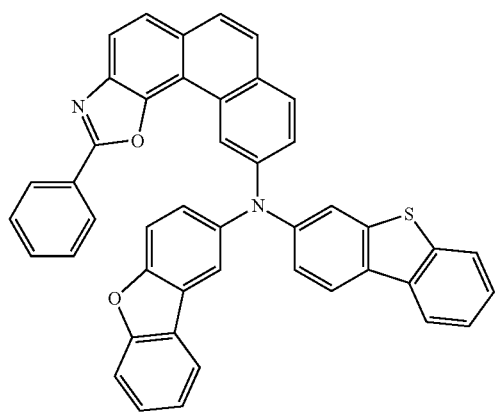
H1-31
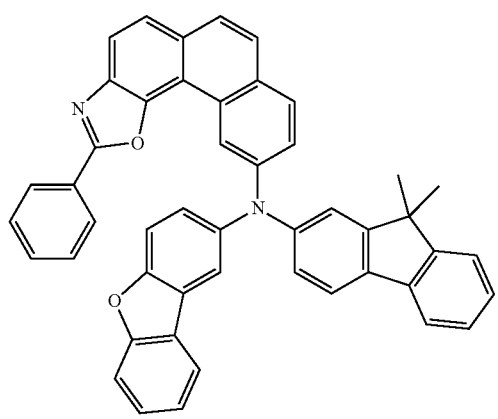
H1-32
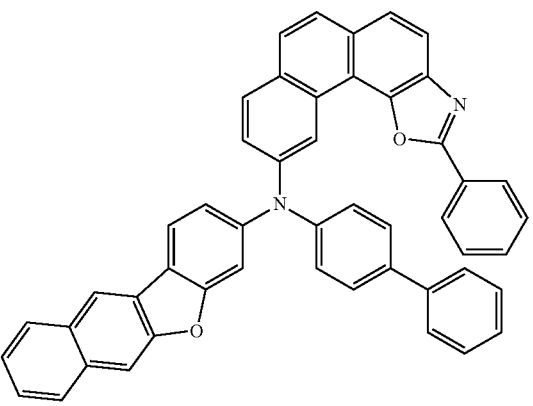
H1-33
H1-34
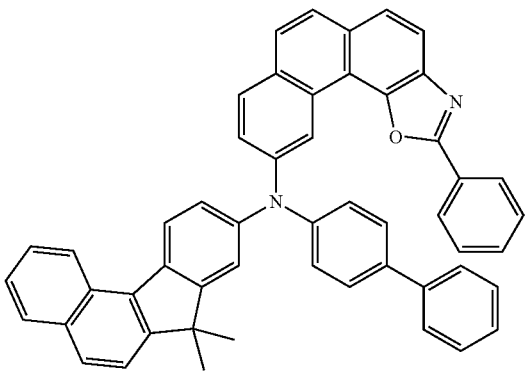

H1-35
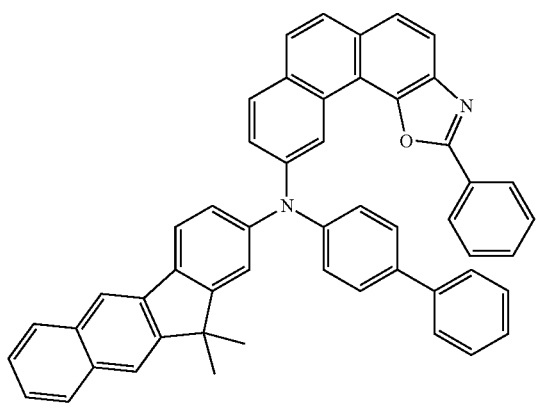
H1-36
H1-37
H1-38
H1-39
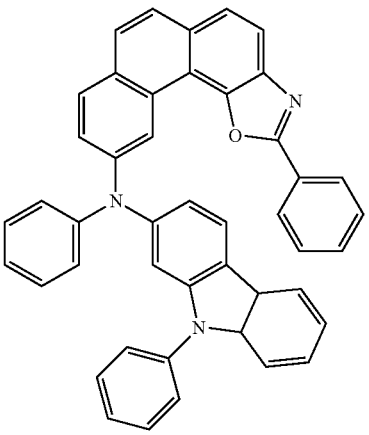
H1-40
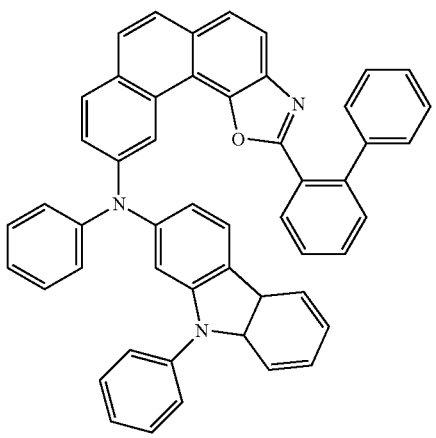
H1-41
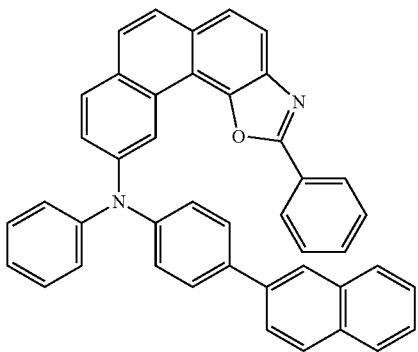
H1-42
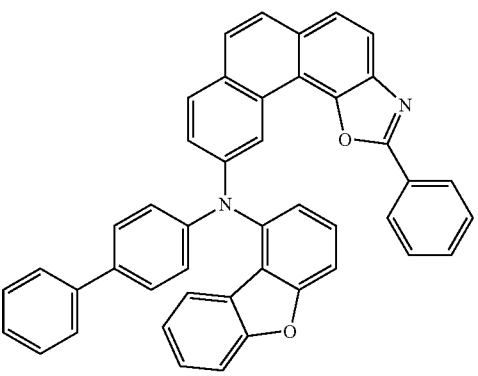

H1-43
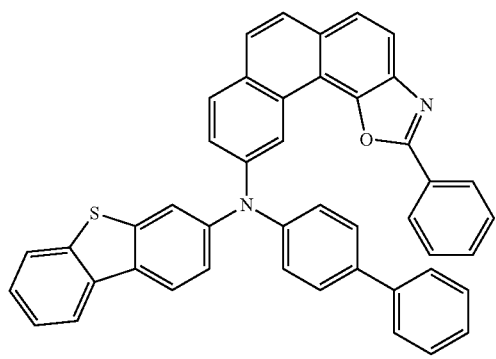
H1-44
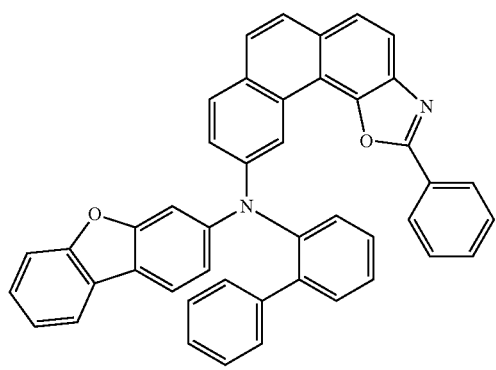
H1-45
H1-46
H1-47
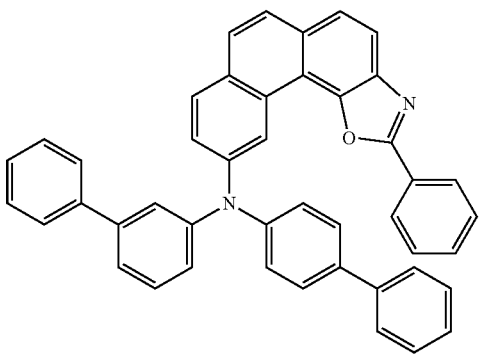
H1-48
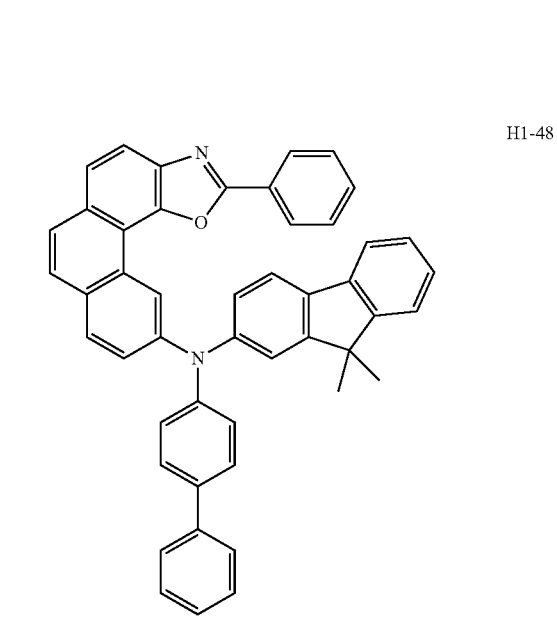
H1-49
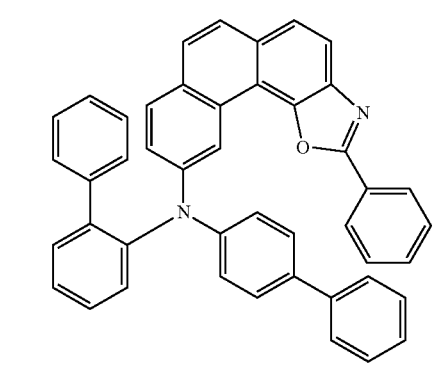

H1-50
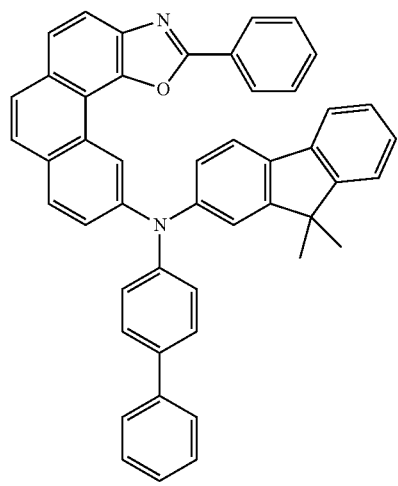
H1-53
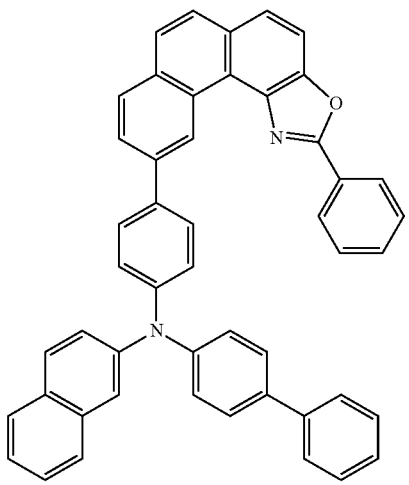
H1-51
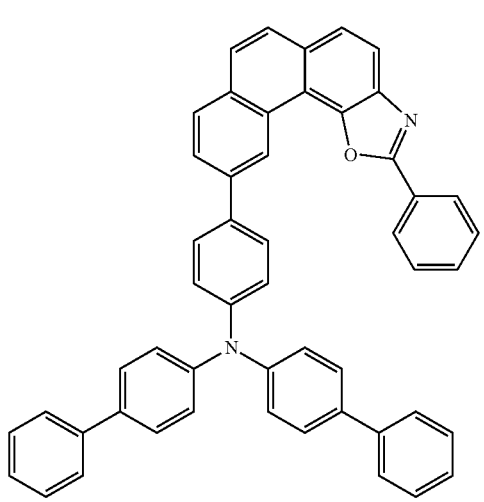
H1-54
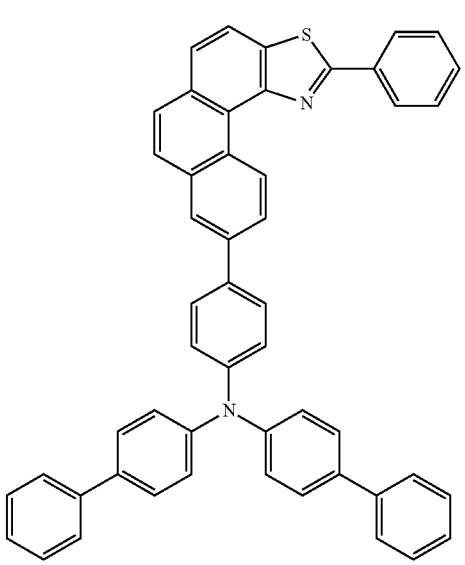
H1-52
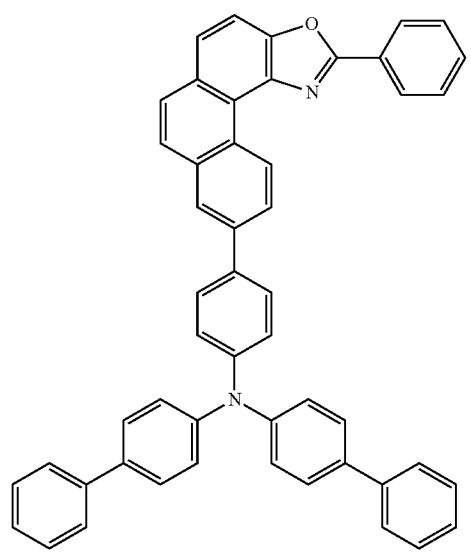
H1-55
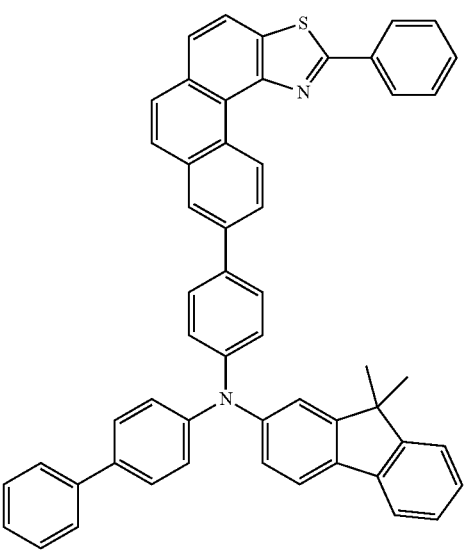

-continued
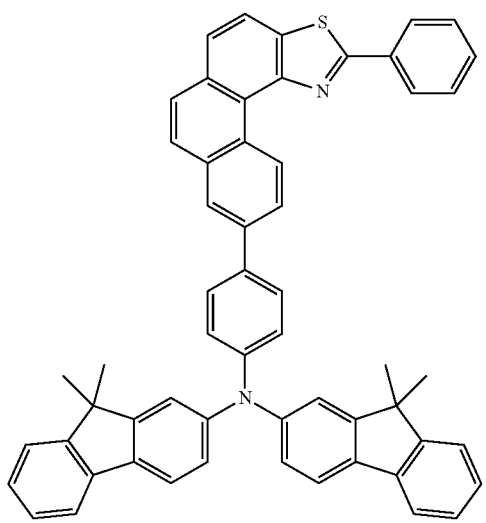
H1-56
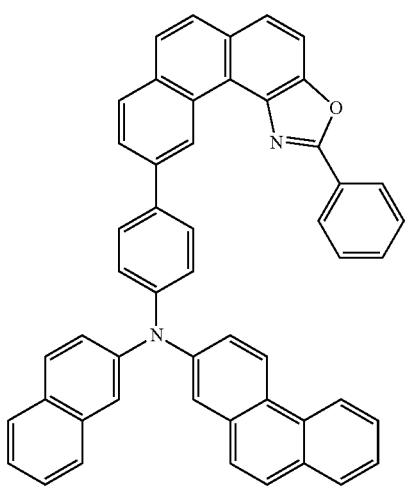
H1-59
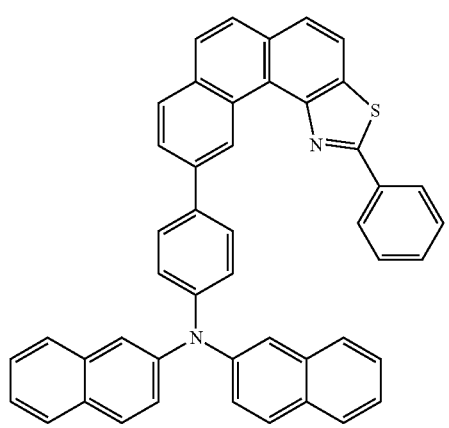
H1-57
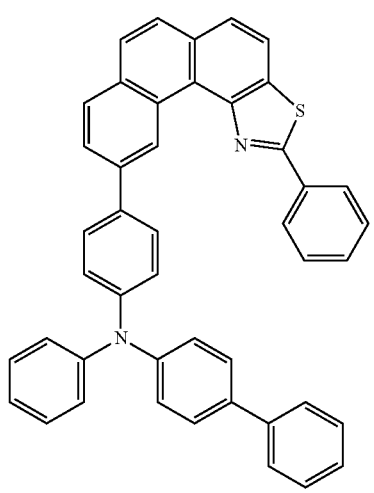
H1-60
H1-58
H1-61

-continued
H1-62
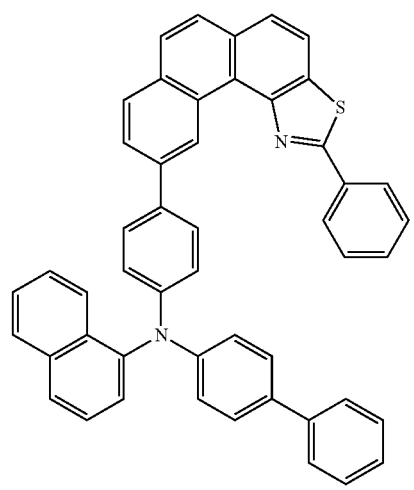
H1-63
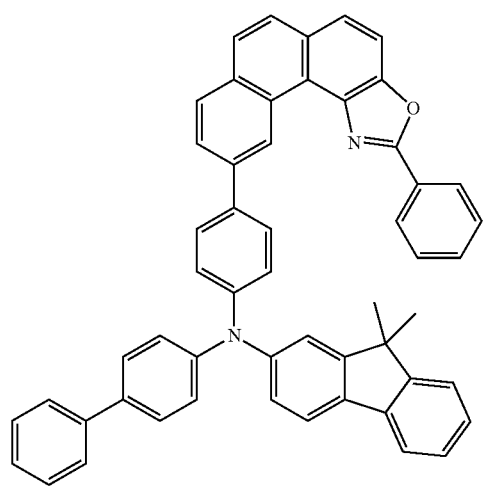
H1-64
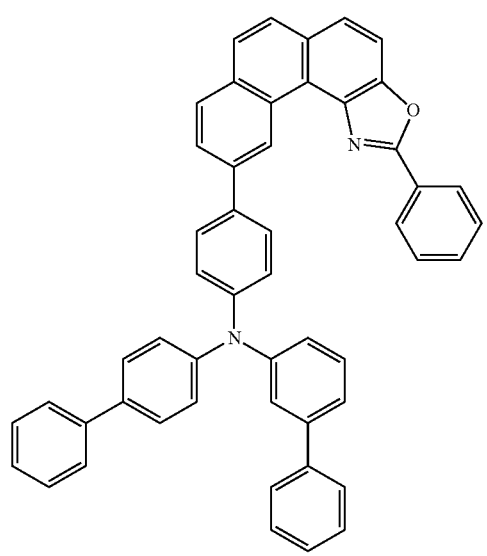
-continued
H1-65
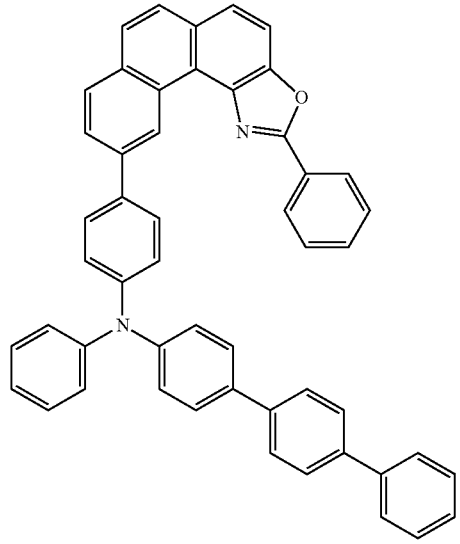
H1-66
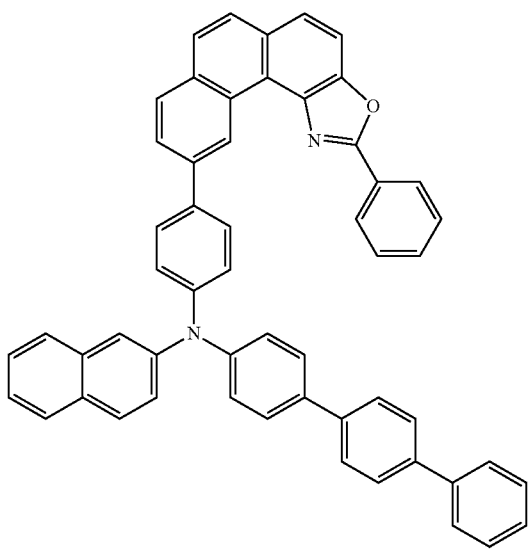
H1-67
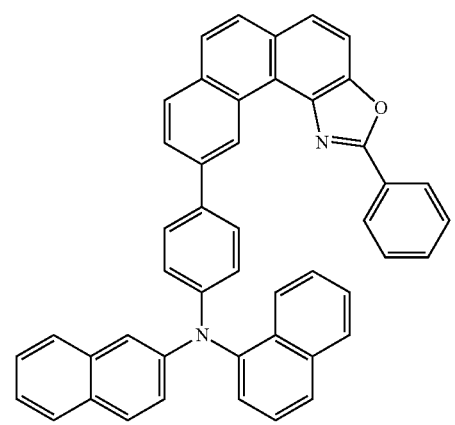

-continued
H1-68
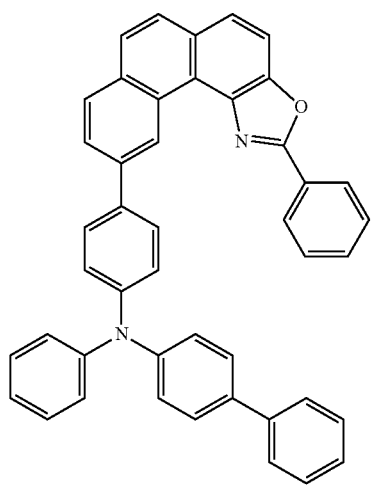
H1-69
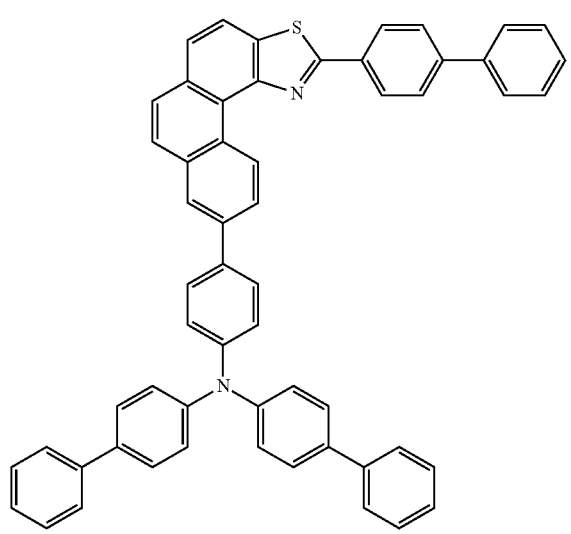
H1-70
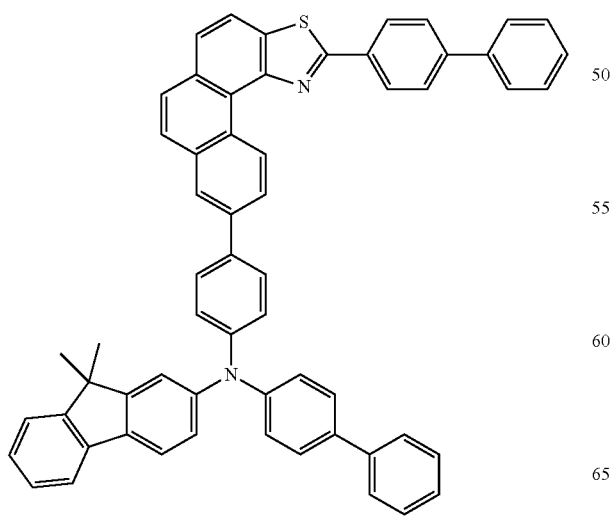
-continued
H1-71
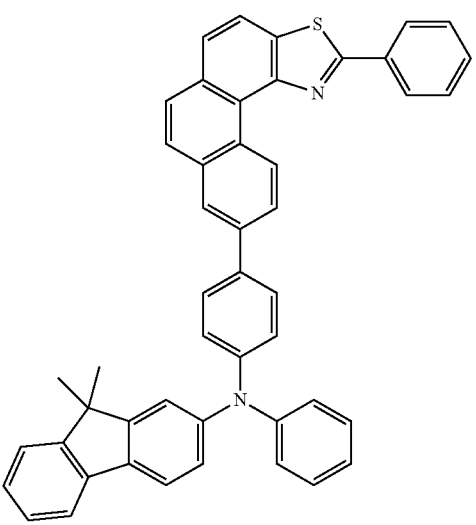
H1-72
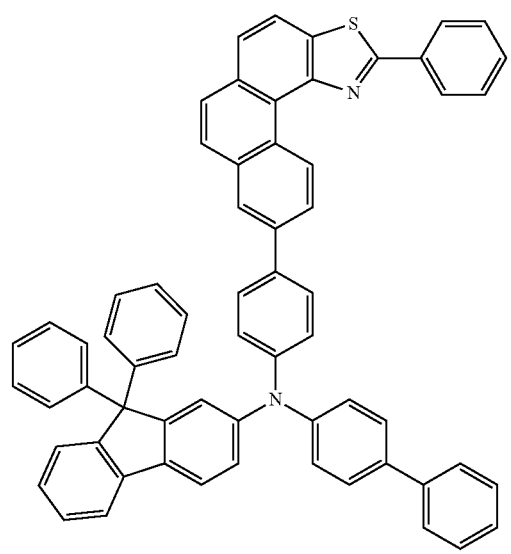
H1-73
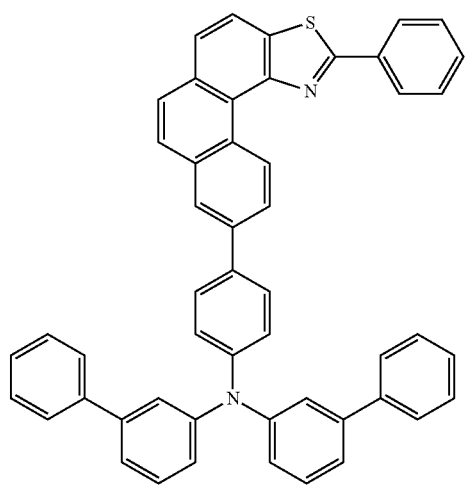

-continued
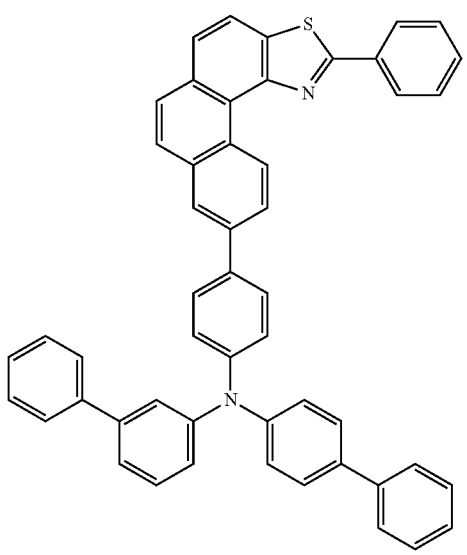
H1-74
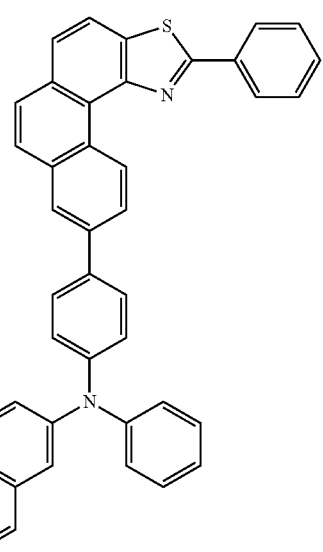
H1-75
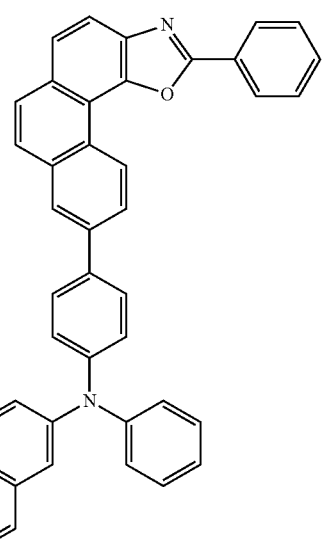
H1-76
-continued
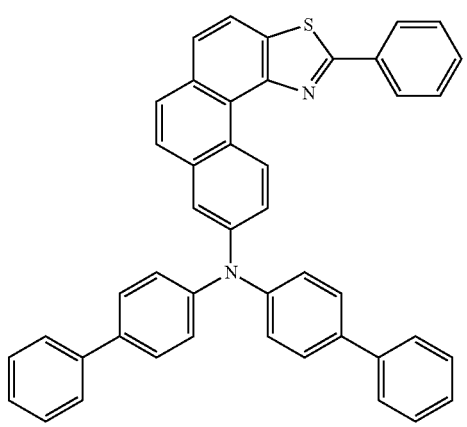
H1-77
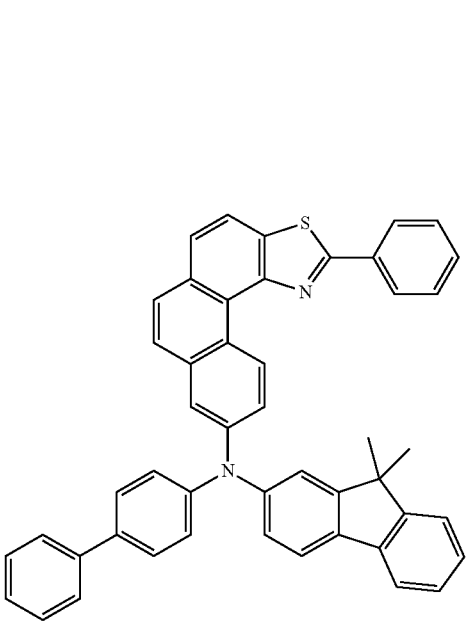
H1-78
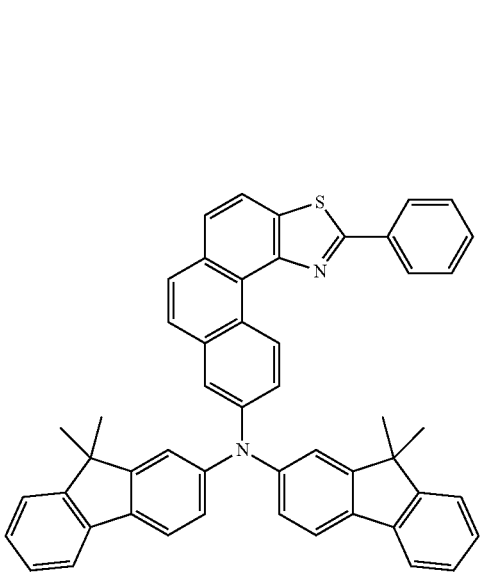
H1-79

H1-80
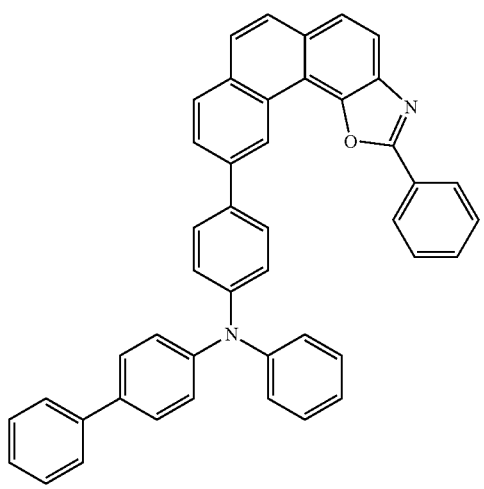
H1-81
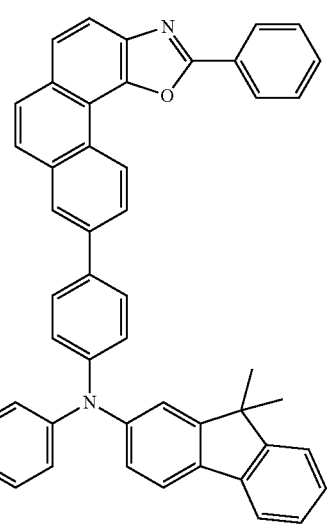
H1-82
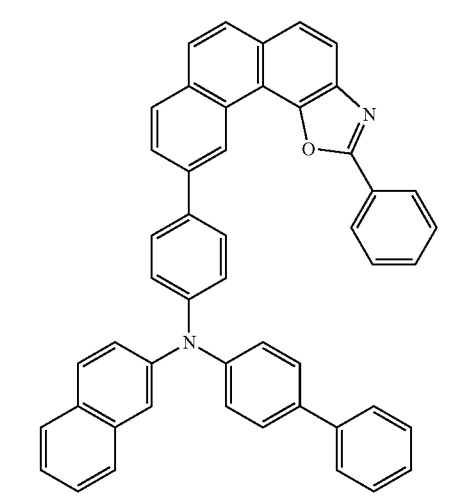
H1-83
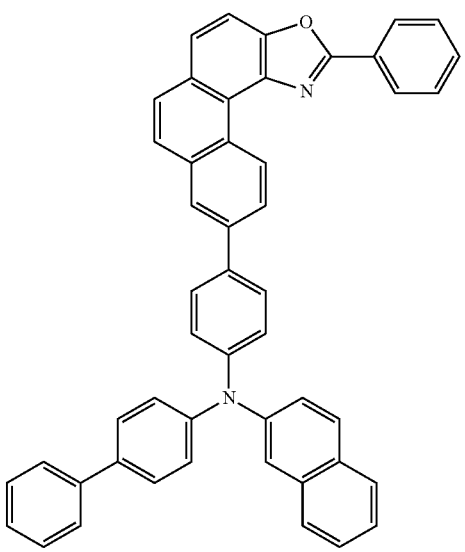
H1-84
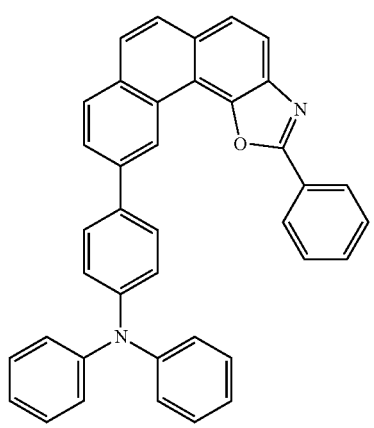
H1-85
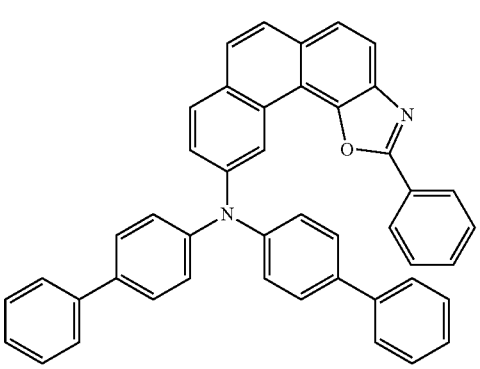

H1-86
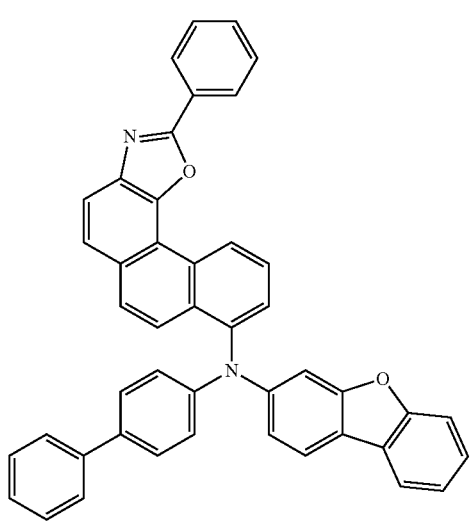
H1-87
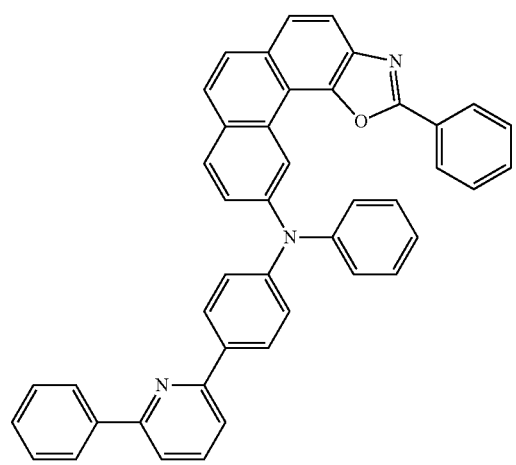
H1-88
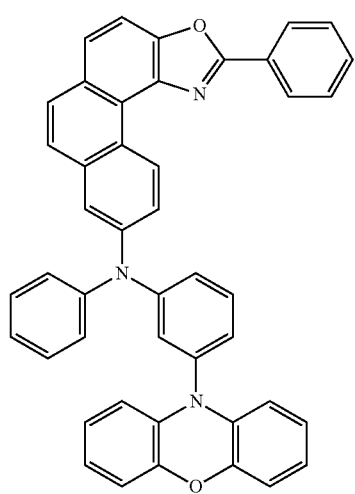
H1-89
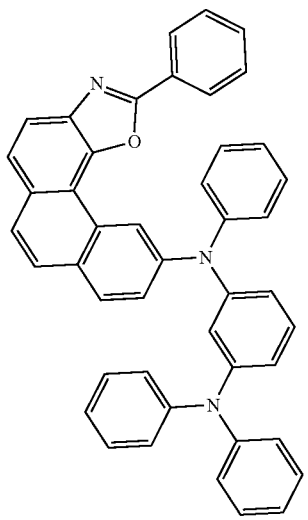
H1-90
H1-91
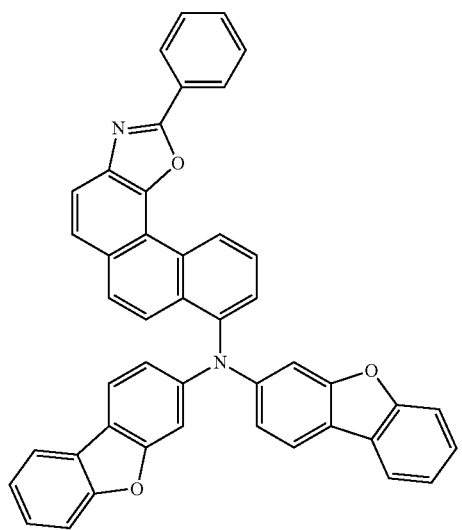

H1-92
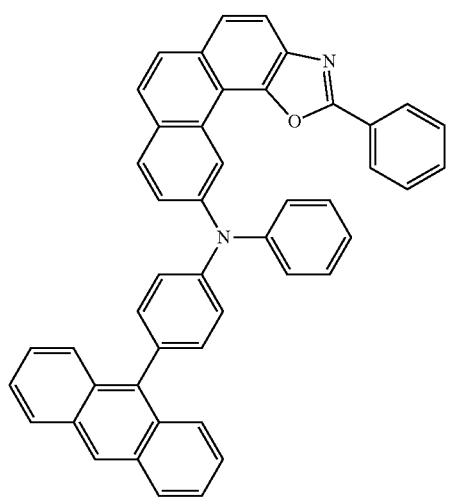
H1-93
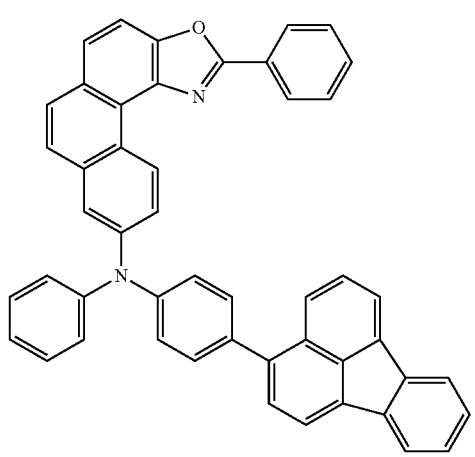
H1-94
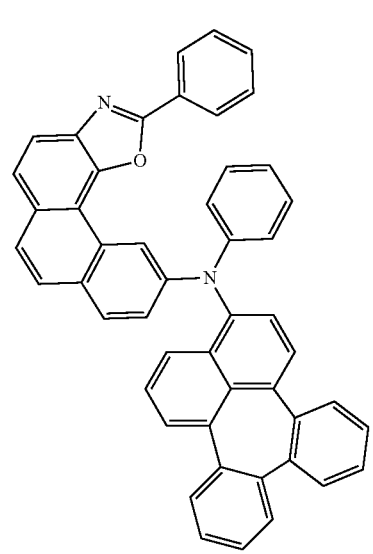
H1-95
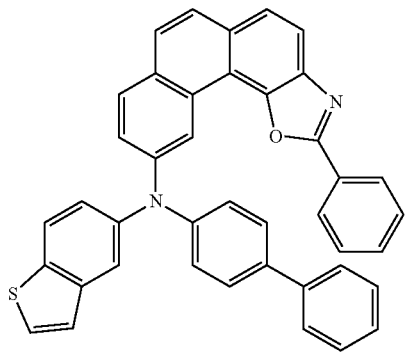
H1-96
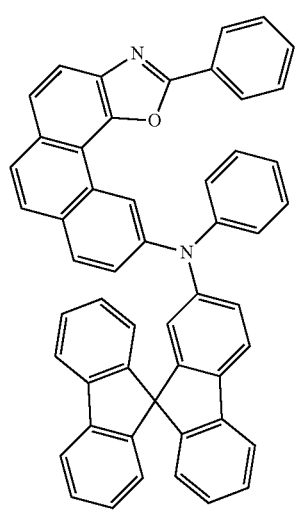
H1-97
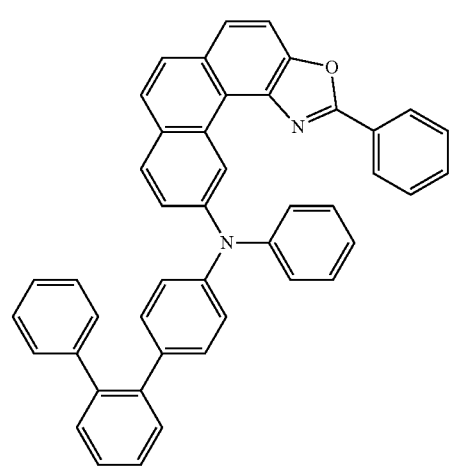

H1-98
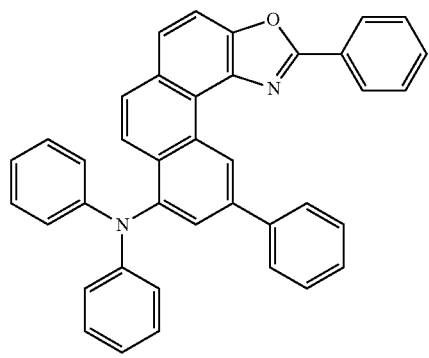
H1-101
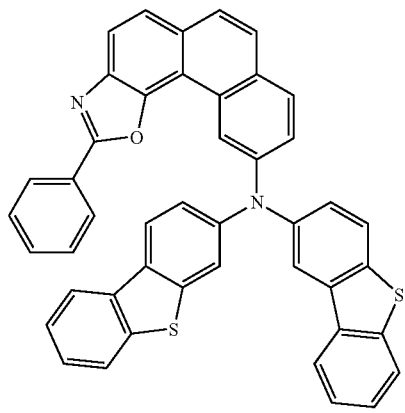
H1-99
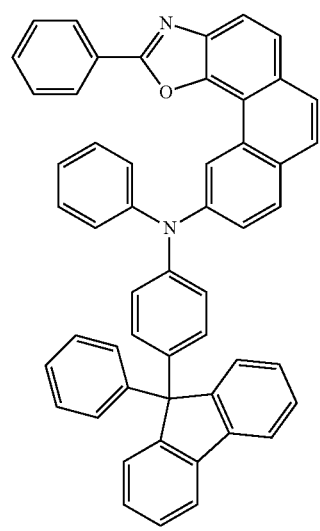
H1-102
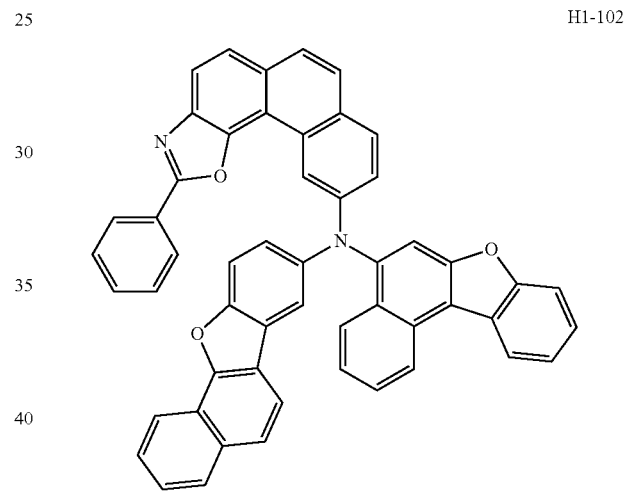
H1-100
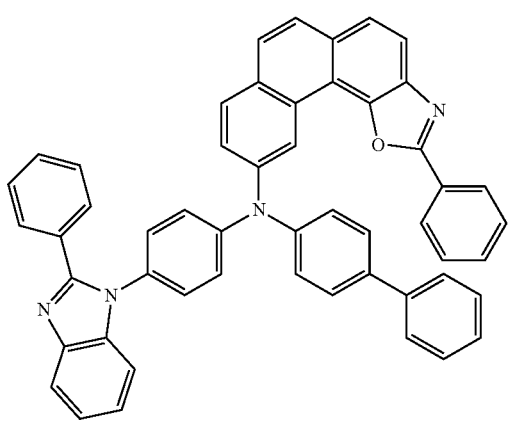
H1-103
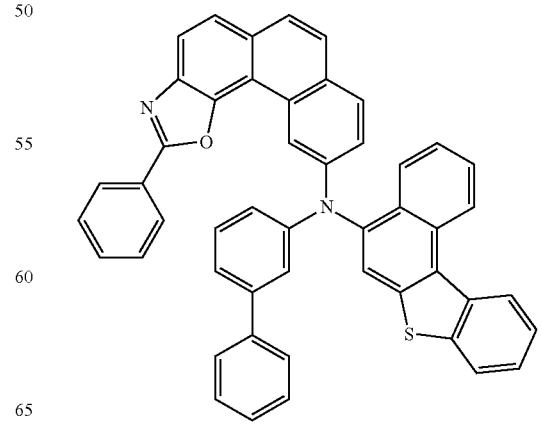

H1-104
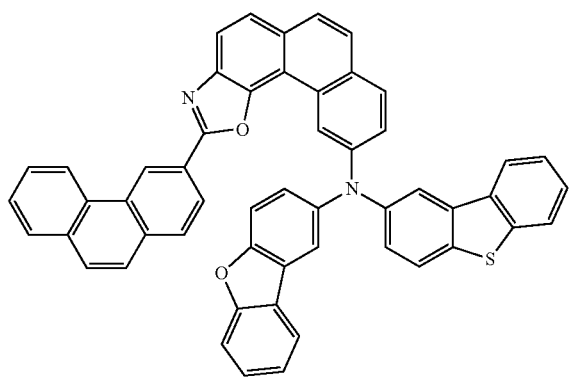
H1-105
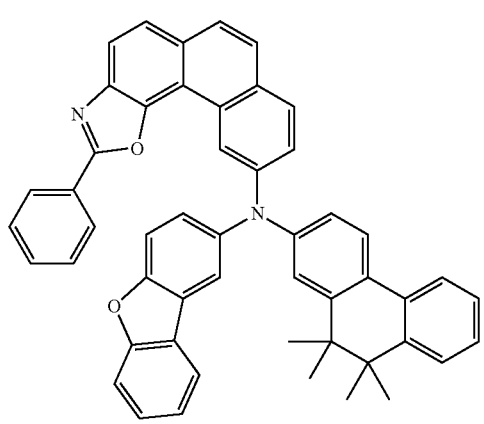
H1-106
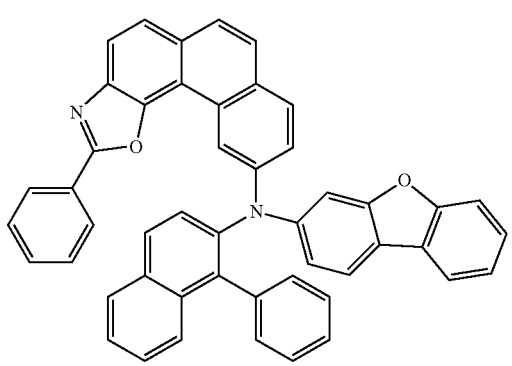
H1-107
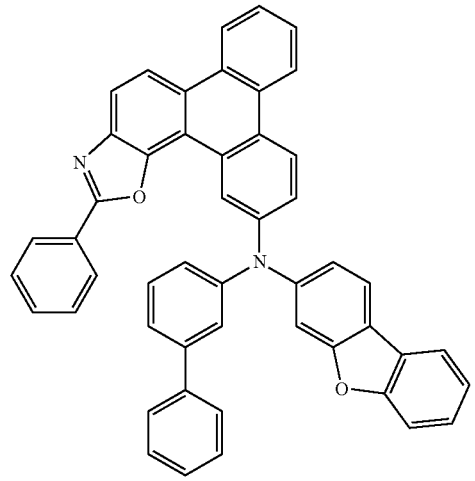
H1-108
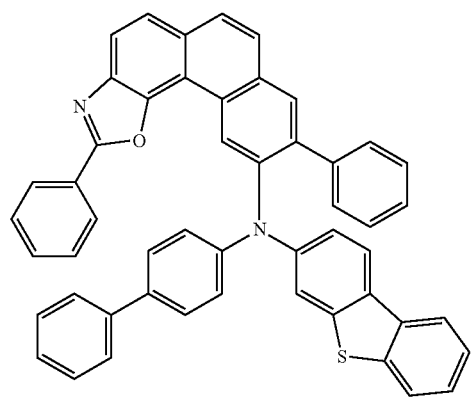
H1-109
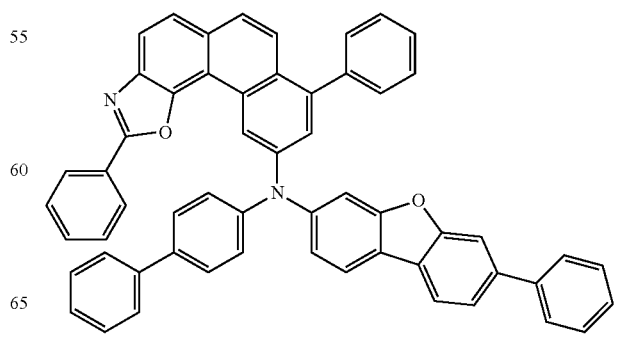

H1-110
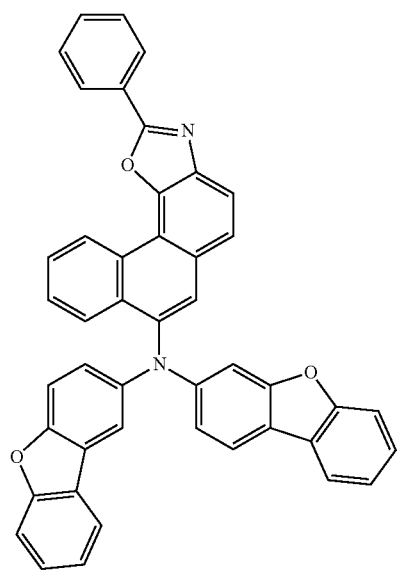
H1-111
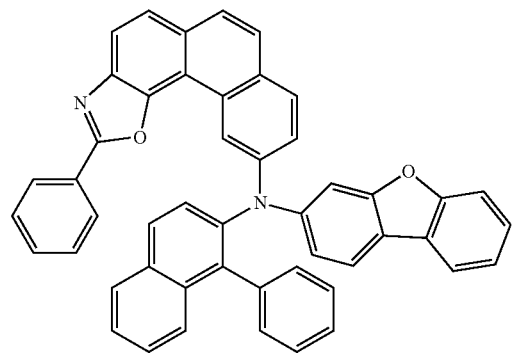
H1-112
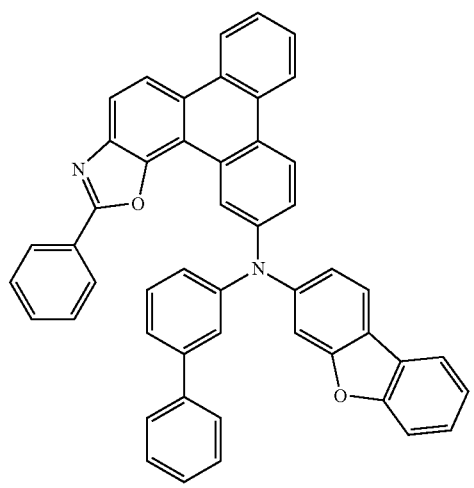
H1-113
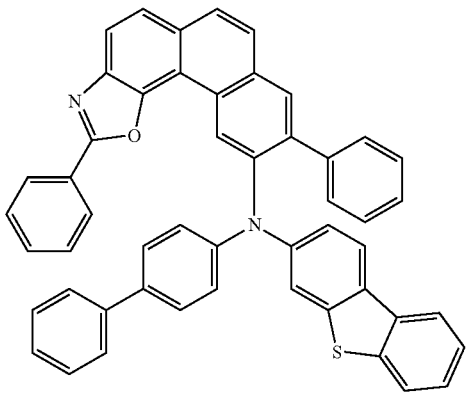
H1-114
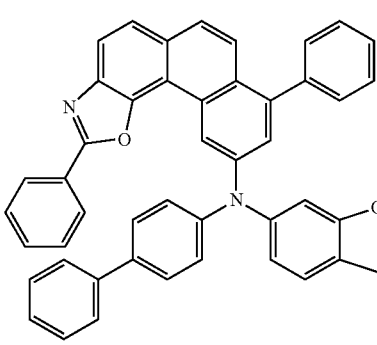
H1-115
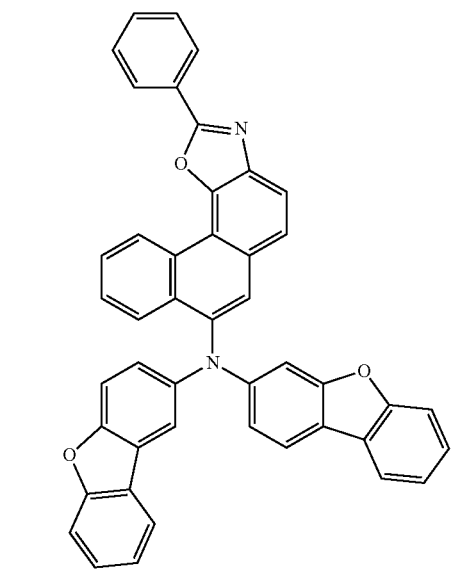

H1-116
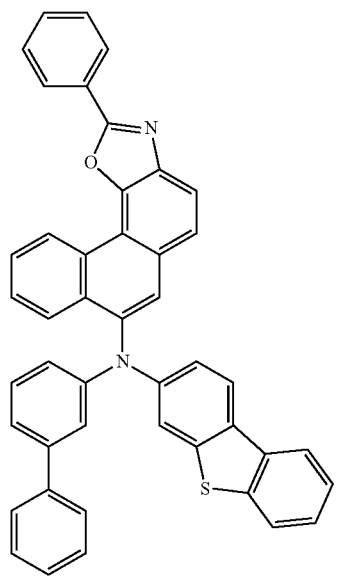
H1-118
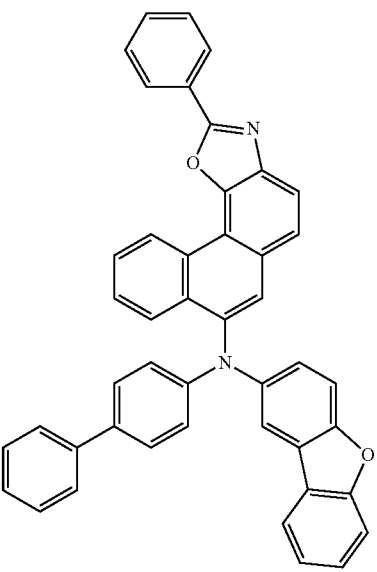
H1-117
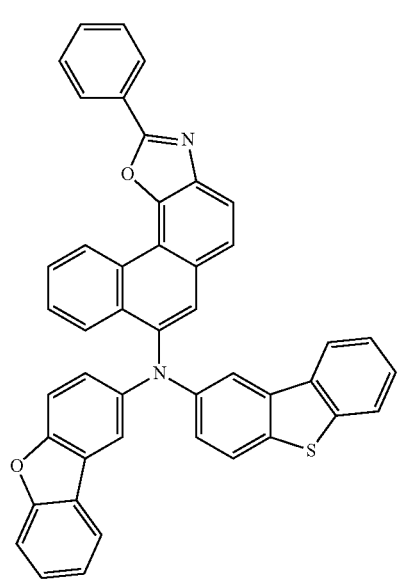
H1-119
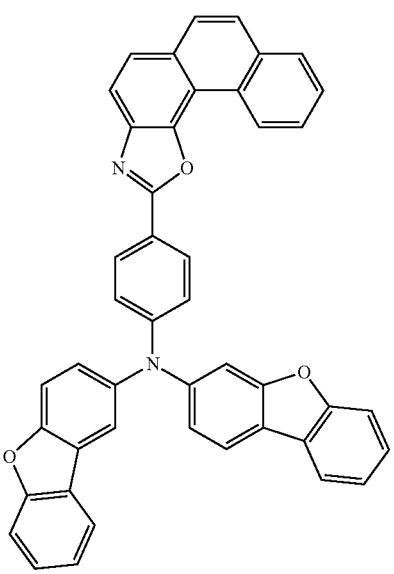

H1-120
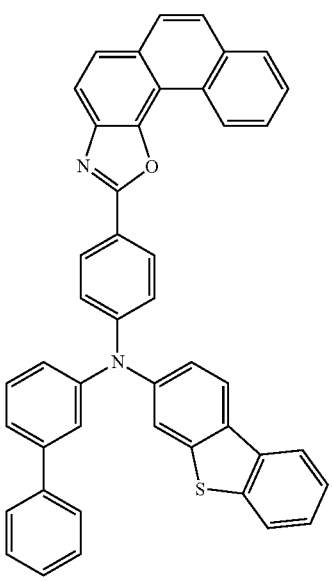
H1-142
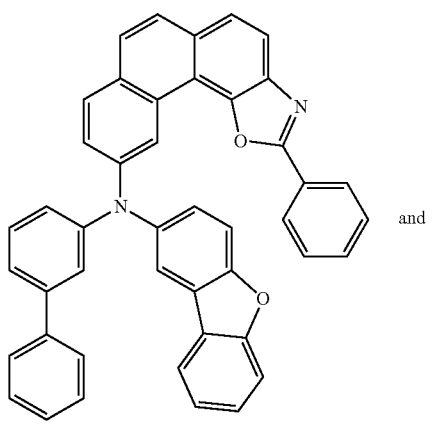
and
H1-132
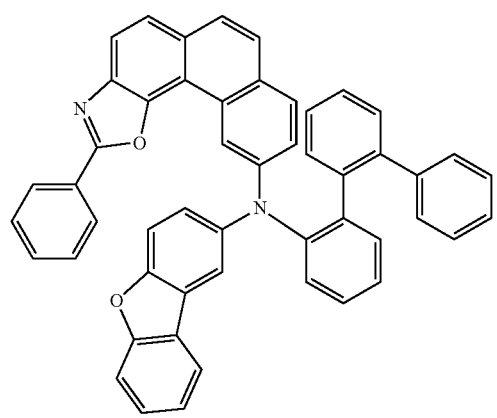
H1-143
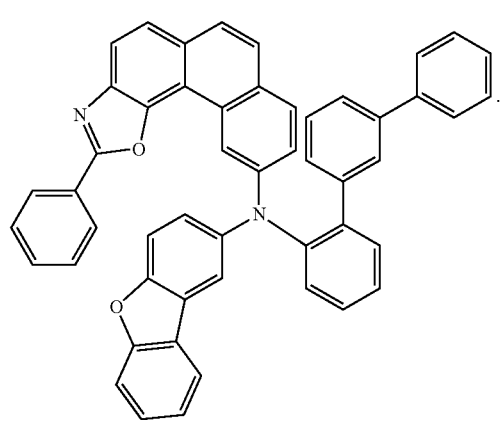
4. The plurality of host materials according to claim 1, wherein the compound represented by formula 2-3 is at least one selected from the following compounds:
H1-141
H2-1

-continued
H2-2
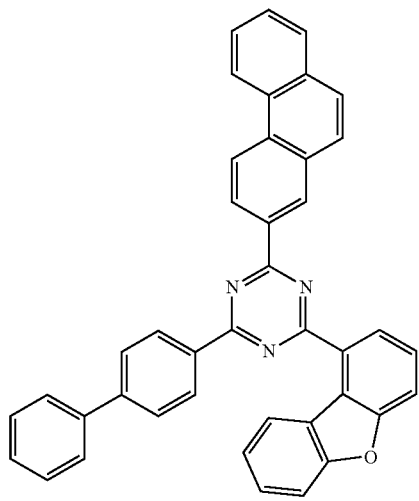
H2-3
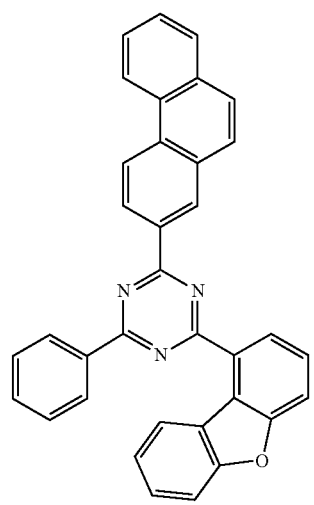
H2-7
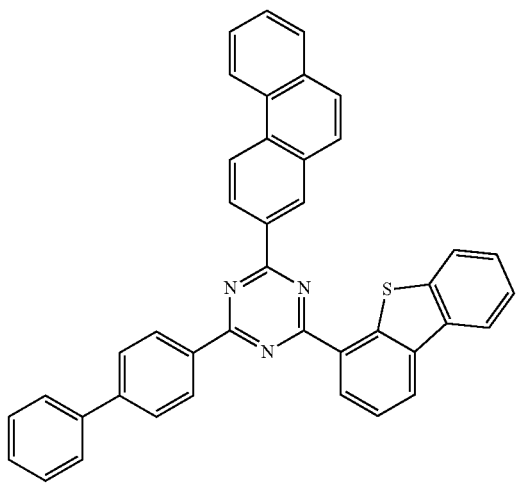
-continued
H2-9
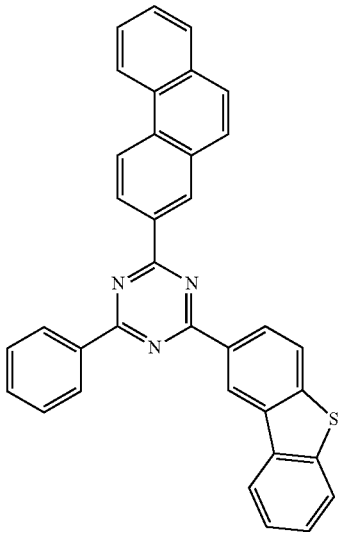
H2-10
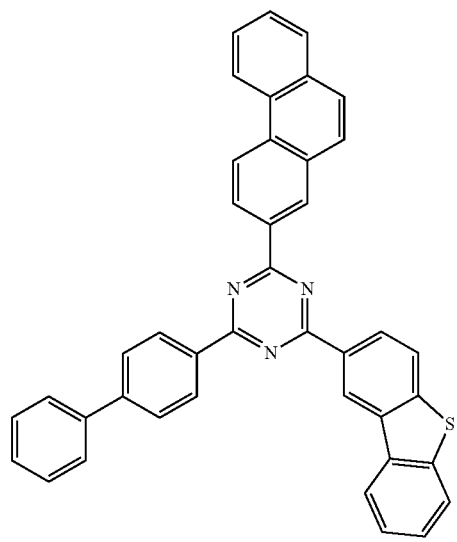
H2-11
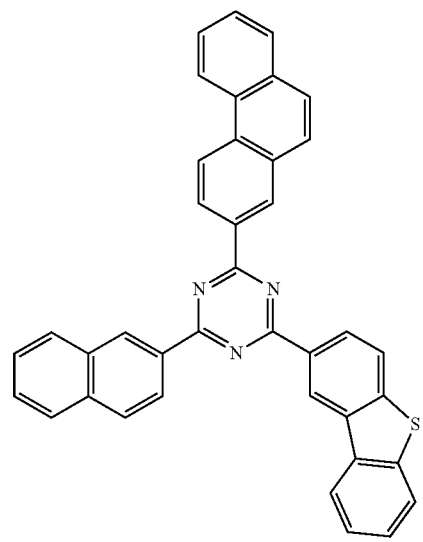

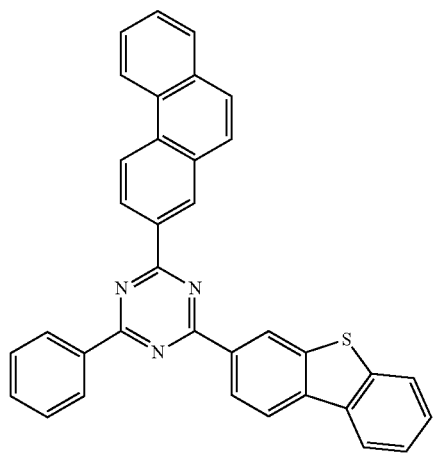
H2-12
H2-13
H2-14
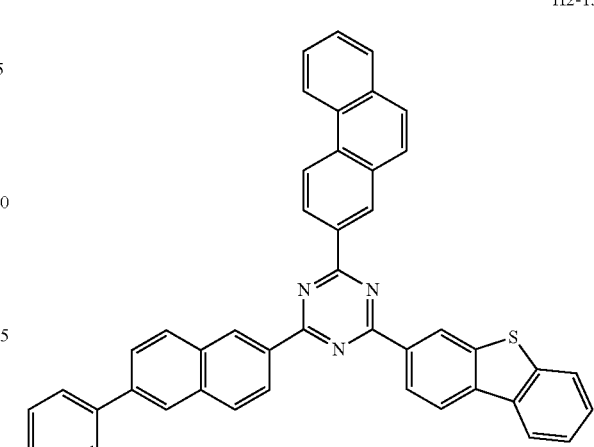
H2-15
H2-16
H2-17

H2-18
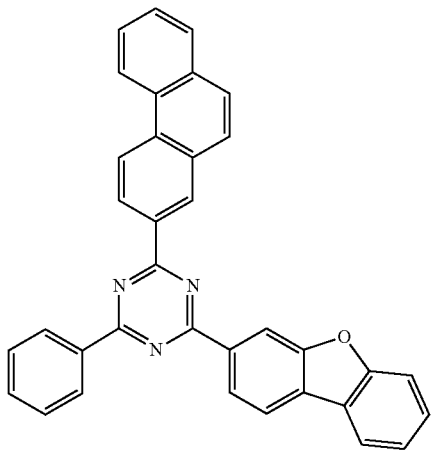
H2-29
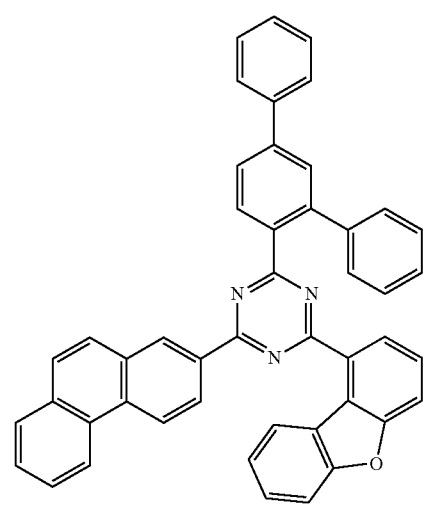
H2-40
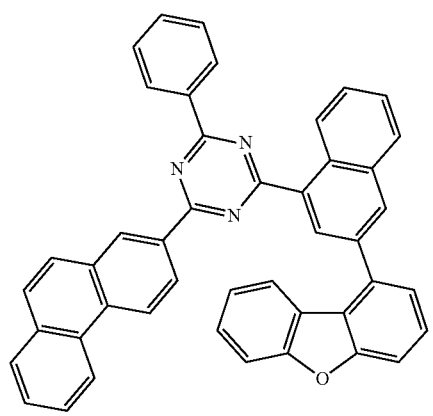
H2-53
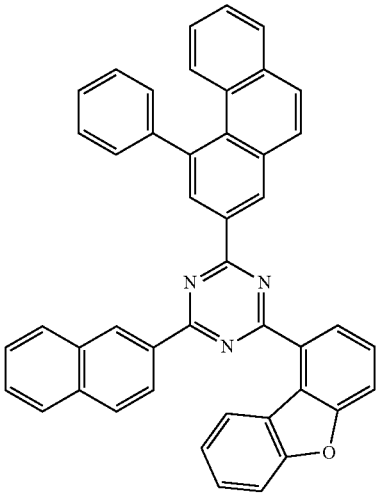
H2-54
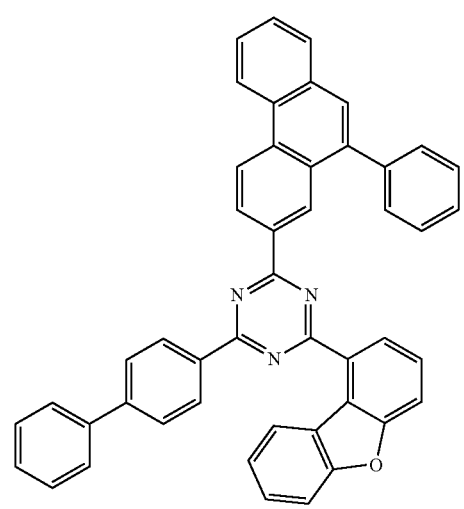
H2-55
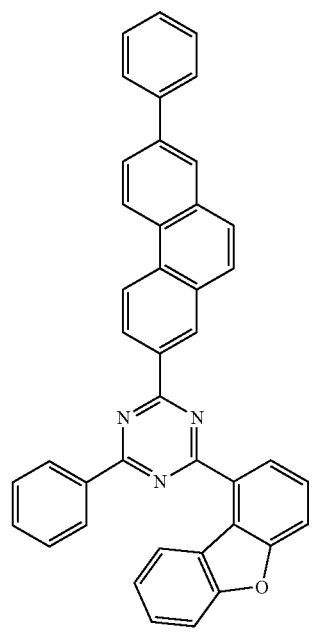

H2-58
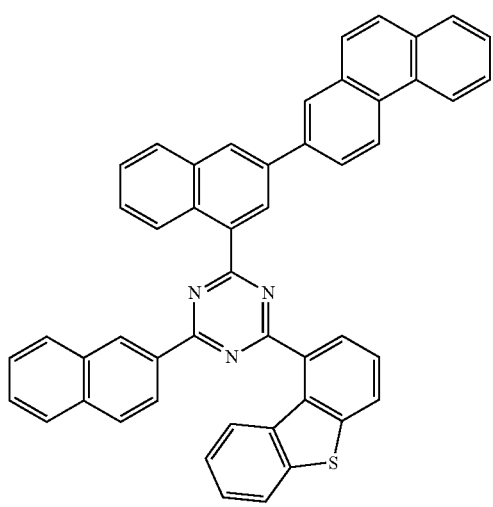
H2-59
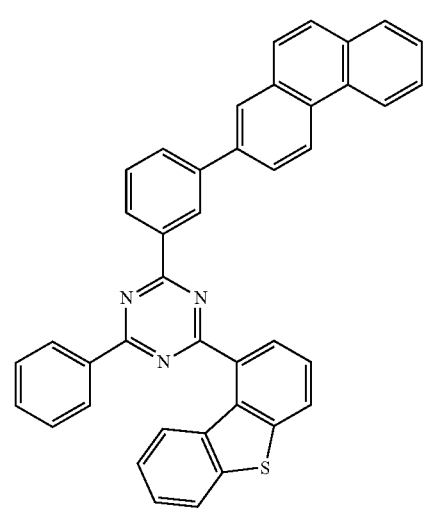
H2-62
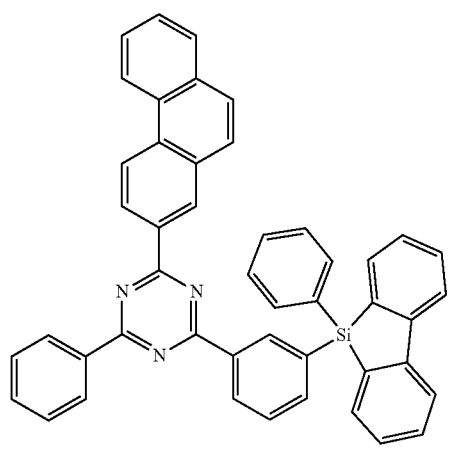
H2-63
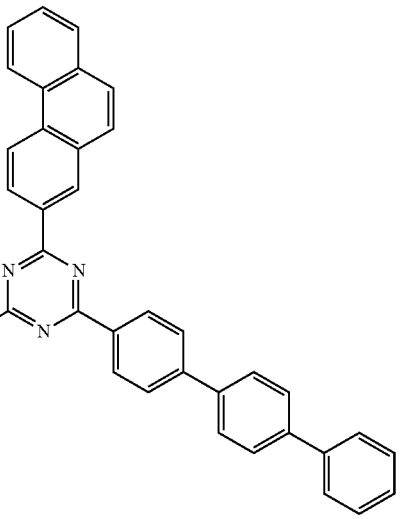
H2-64
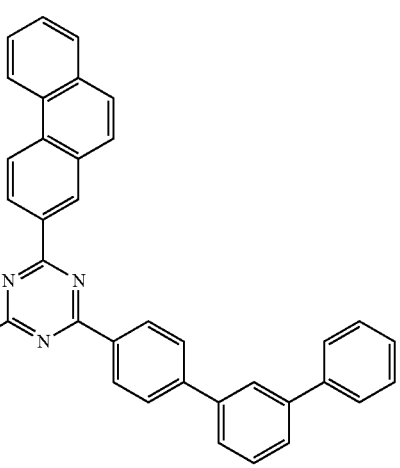
H2-65
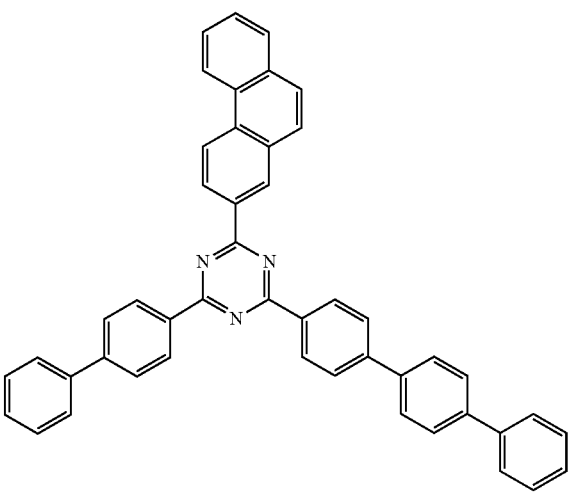

-continued
H2-67
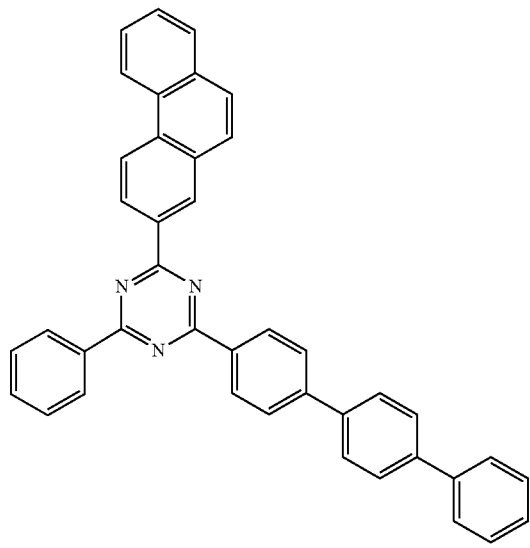
H2-68
H2-69
H2-70
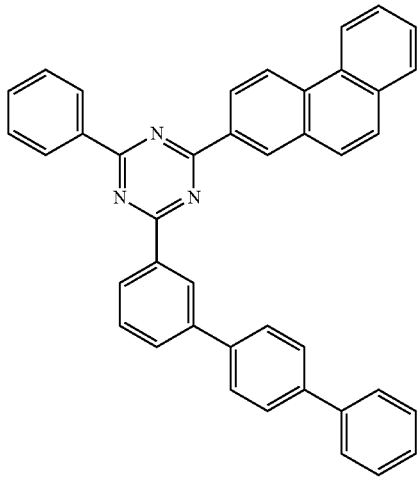
H2-74
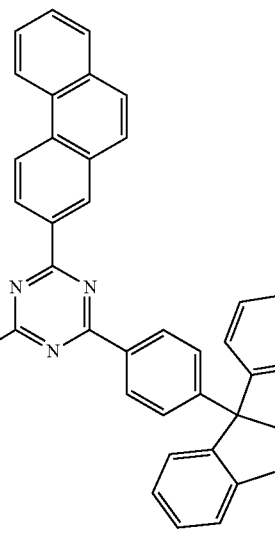
H2-87
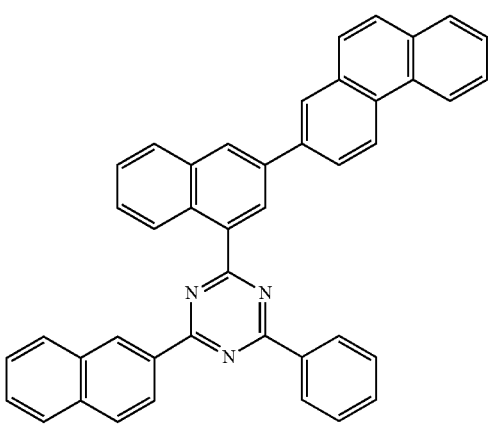

-continued
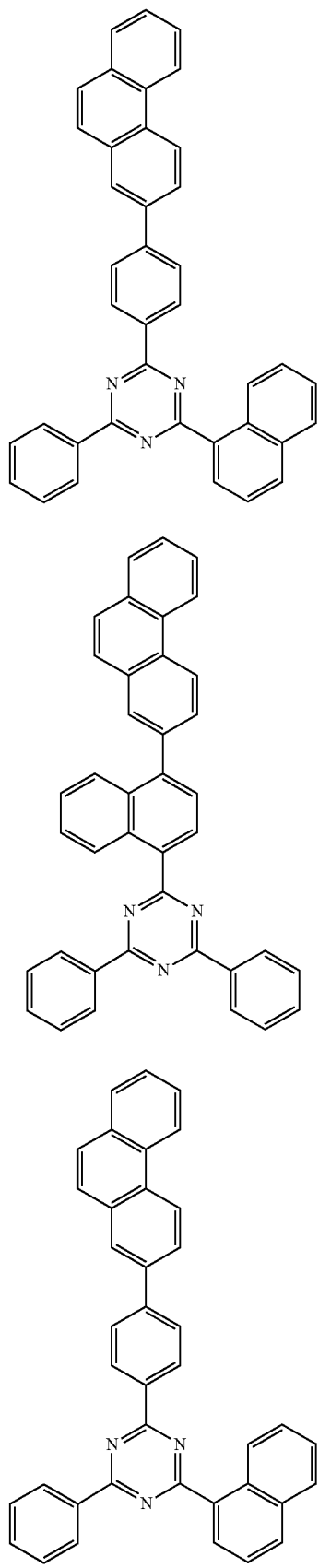
H2-89
H2-90
H2-94
-continued
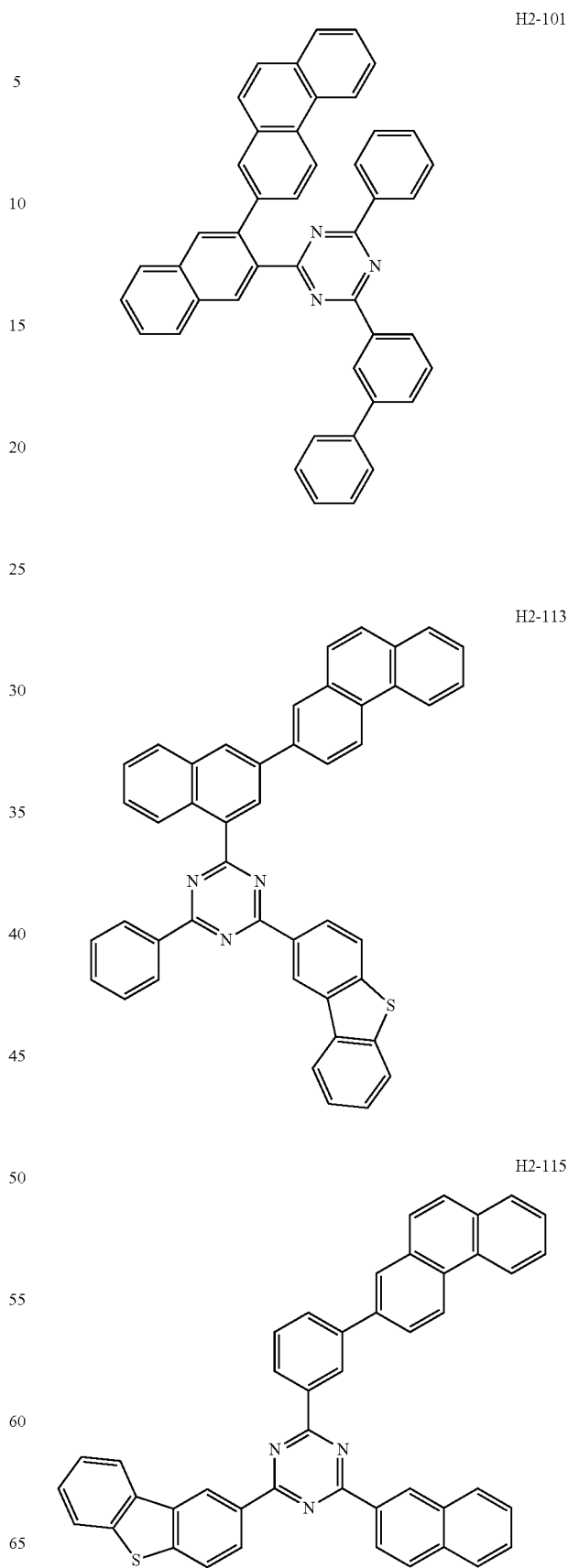
H2-101
H2-113
H2-115

H2-121
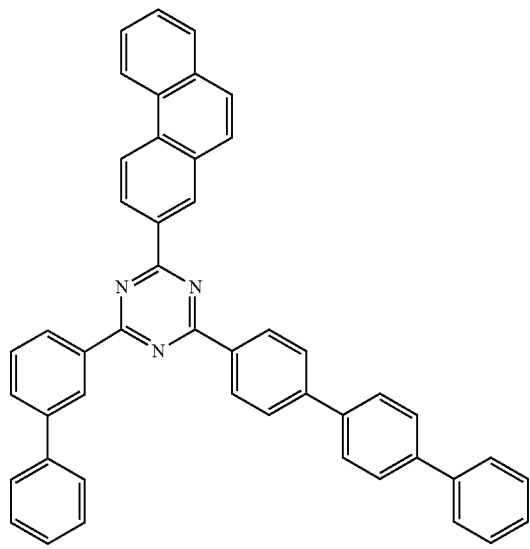
H2-124
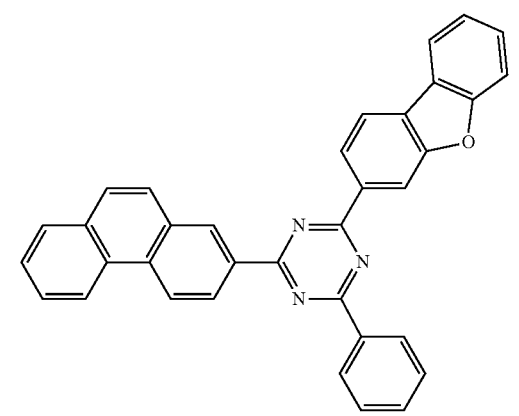
H2-125
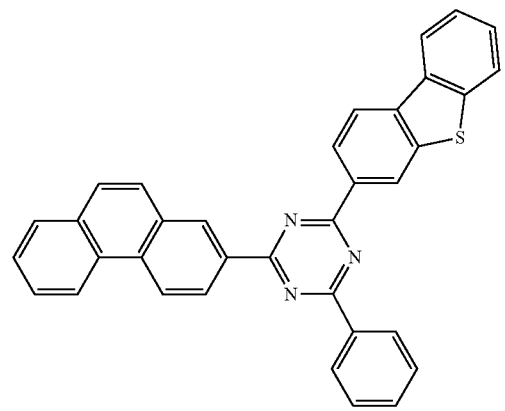
H2-137
H2-142
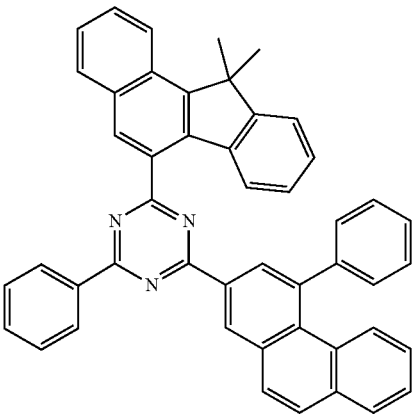
H2-143
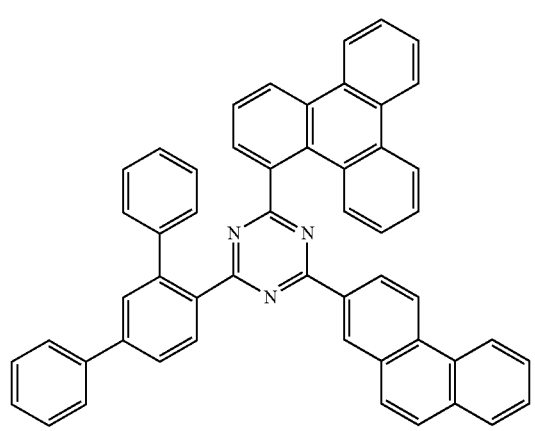

-continued
H2-144
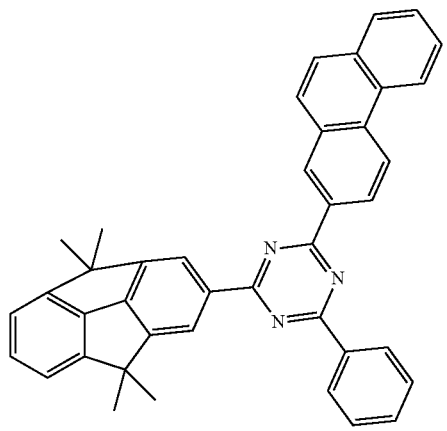
H2-145
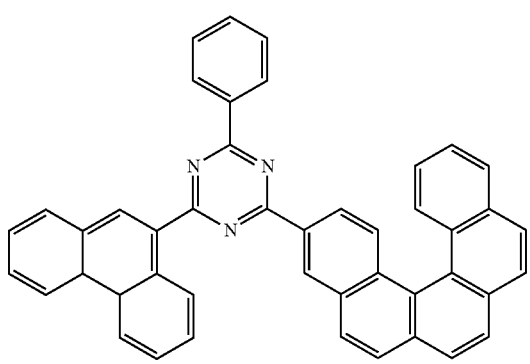
H2-147
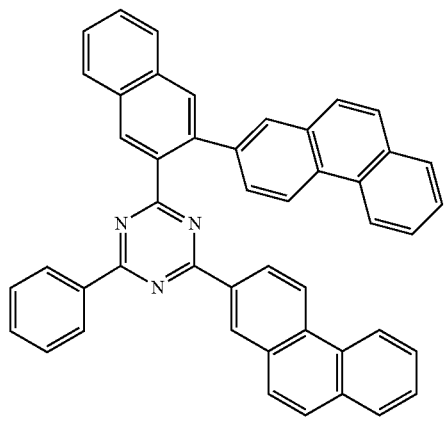
H2-148
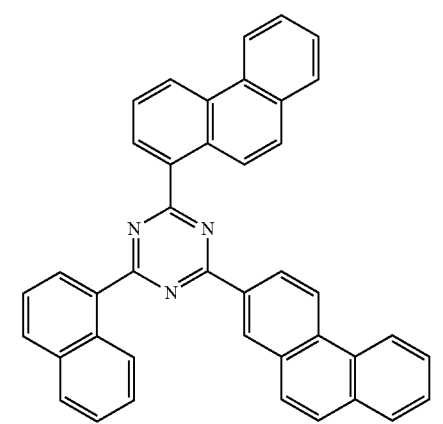
-continued
H2-149
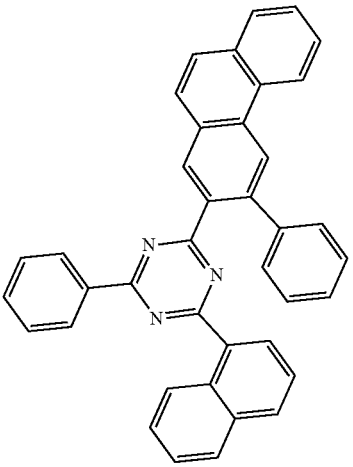
H2-152
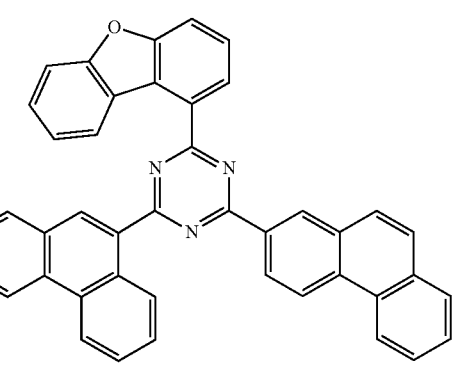
H2-155
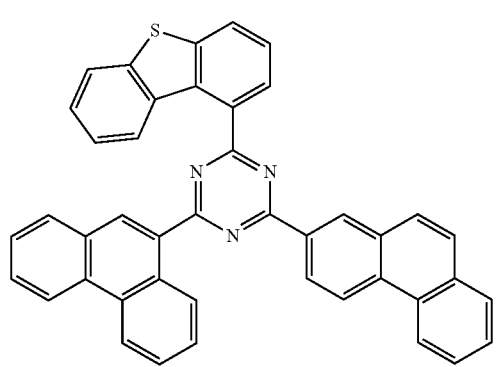

H2-157
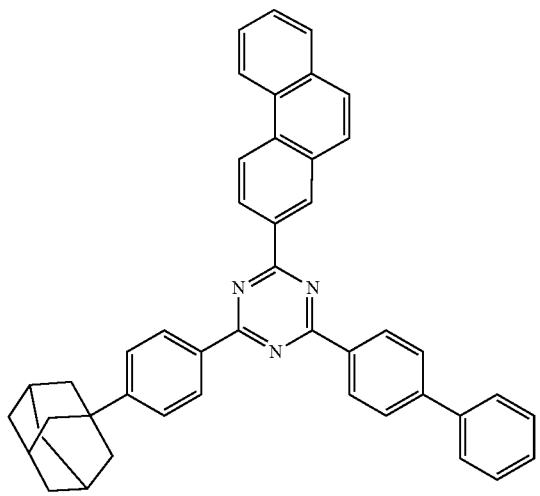
H2-158
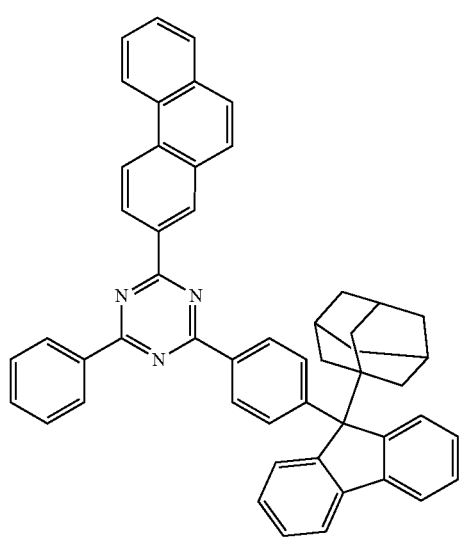
H2-159
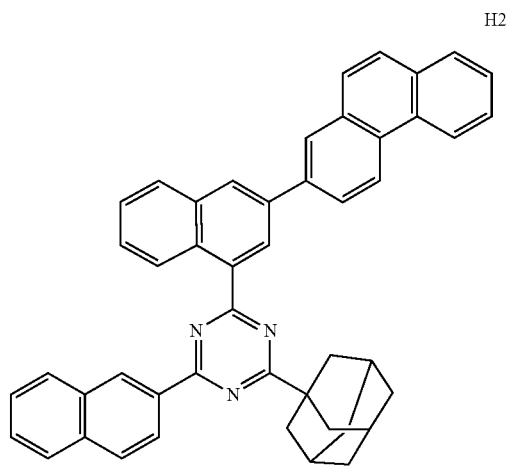
H2-161
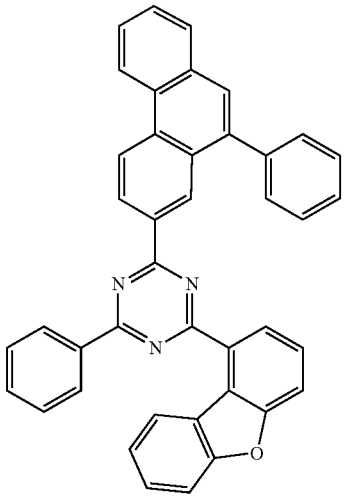
H2-165
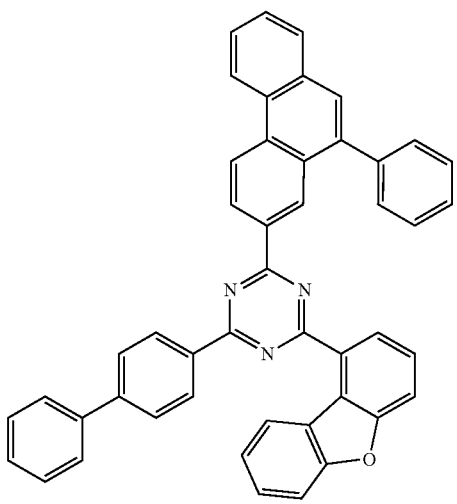
and
H2-167
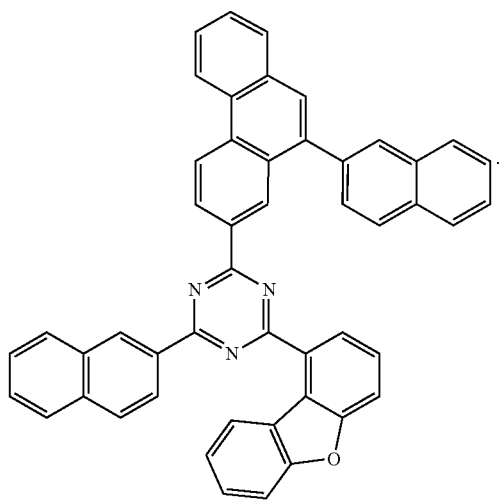
5. An organic electroluminescent device comprising an anode, a cathode, and at least one light-emitting layer between the anode and the cathode, wherein at least one of the light-emitting layers comprises the plurality of host materials according to claim 1.

\* \* \* \* \*